US008964998B1

(12) United States Patent
McClain

(10) Patent No.: US 8,964,998 B1
(45) Date of Patent: Feb. 24, 2015

(54) SYSTEM FOR DYNAMIC SPECTRAL CORRECTION OF AUDIO SIGNALS TO COMPENSATE FOR AMBIENT NOISE IN THE LISTENER'S ENVIRONMENT

(75) Inventor: David McClain, Tucson, AZ (US)

(73) Assignee: Sound Enhancement Technology, LLC, Tucson, AZ (US)

( * ) Notice: Subject to any disclaimer, the term of this patent is extended or adjusted under 35 U.S.C. 154(b) by 378 days.

(21) Appl. No.: 13/491,373

(22) Filed: Jun. 7, 2012

Related U.S. Application Data

(60) Provisional application No. 61/494,227, filed on Jun. 7, 2011, provisional application No. 61/527,757, filed on Aug. 26, 2011, provisional application No. 61/544,263, filed on Oct. 6, 2011, provisional application No. 61/632,401, filed on Oct. 7, 2011, provisional application No. 61/632,402, filed on Oct. 7, 2011, provisional application No. 61/564,956, filed on Nov. 30, 2011, provisional application No. 61/564,965, filed on Nov. 30, 2011.

(51) Int. Cl.
*H03G 3/22* (2006.01)
*H03G 7/00* (2006.01)

(52) U.S. Cl.
USPC ............................................. 381/57; 381/106

(58) Field of Classification Search
CPC .............................. H03G 3/32; G10L 19/0204
USPC .............. 381/57, 71.1–71.12, 94.1–94.8, 86, 381/106; 704/500, E21.001; 700/94
See application file for complete search history.

(56) References Cited

U.S. PATENT DOCUMENTS

| 2005/0135635 A1* | 6/2005 | Prince ............................. 381/86 |
| 2008/0137874 A1* | 6/2008 | Christoph ....................... 381/57 |
| 2009/0089054 A1* | 4/2009 | Wang et al. .................. 704/233 |

* cited by examiner

*Primary Examiner* — Vivian Chin
*Assistant Examiner* — Ammar Hamid

(57) ABSTRACT

The present invention features systems for dynamically adjusting audio signals by applying a gain to the signal in a spectrally varying manner to compensate for ambient noise, such that the sound is perceived to be unchanged in volume and spectral composition by the listener. The system obtains a threshold elevation for each frequency component by analyzing the spectral composition of the ambient noise. This threshold elevation is then used by a psychoacoustic model of hearing to determine an appropriate gain adjustment for the corresponding frequency component of the source signal which will make that source signal perceived by the human ear to be just as loud as if the noise were not present.

19 Claims, 12 Drawing Sheets

Block Diagram of Implementation of Noise Correction System

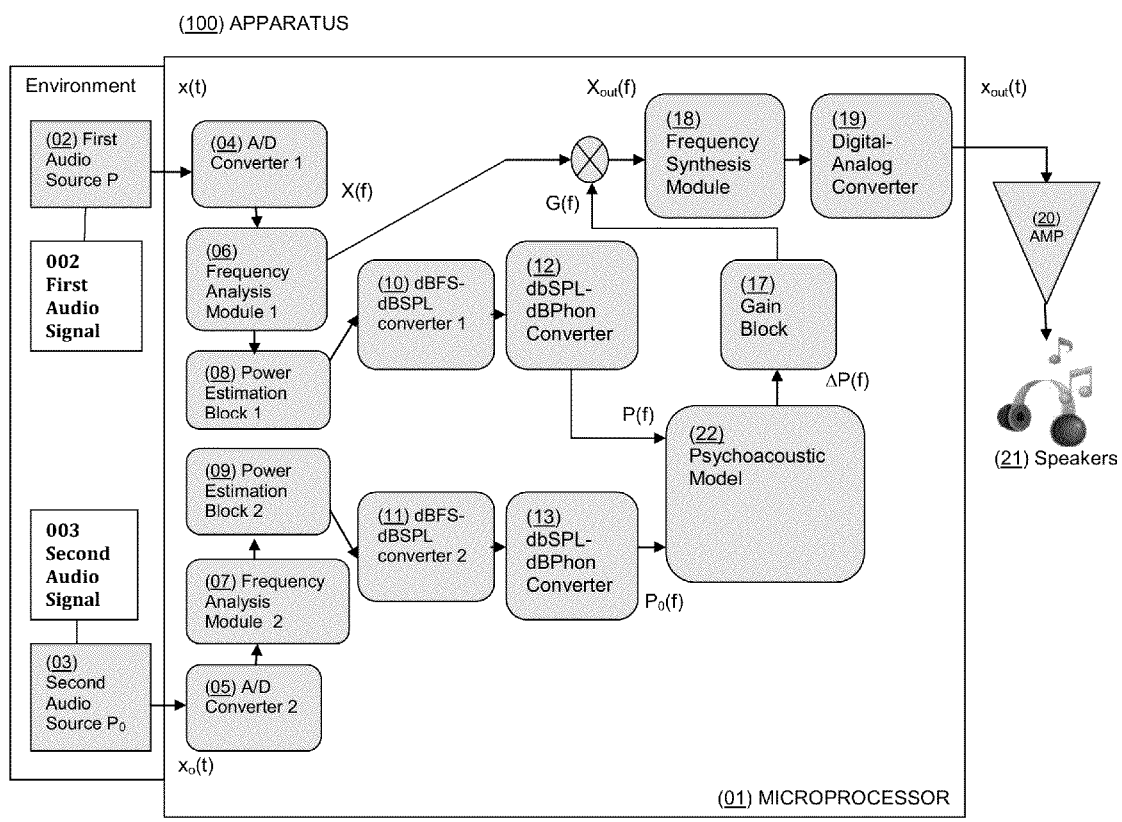
FIG.1. Block Diagram of Implementation of Noise Correction System

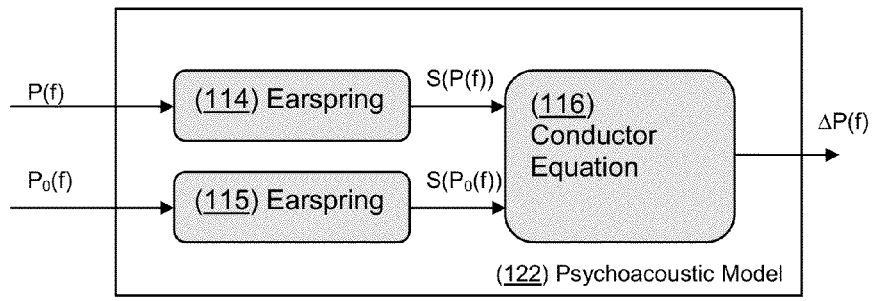
FIG. 2. Psychoacoustic model using explicit computation of the Earpsring Equation
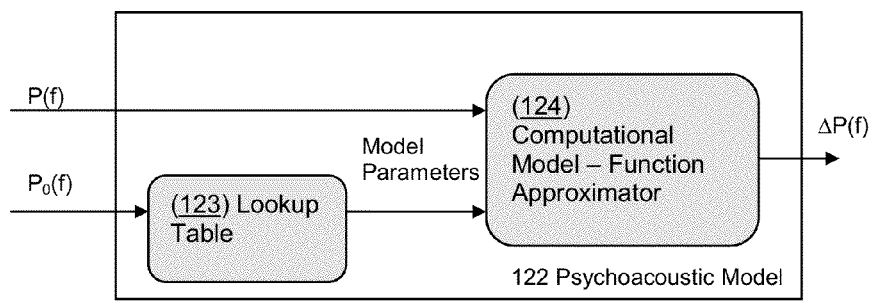
FIG 3. Psychoacoustic model, where the model uses a function approximator that has been fit against the Earspring and Conductor equation solutions
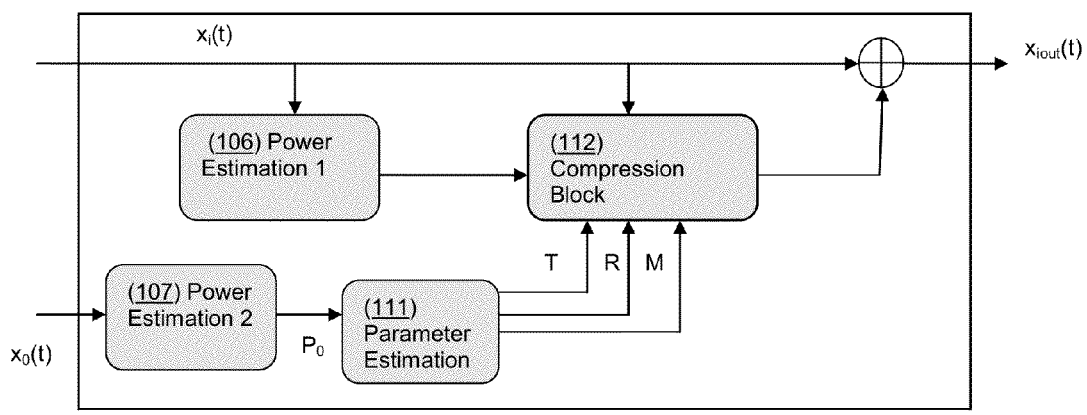
FIG 4. Parallel Compression Approximation to Psychoacoustic Model for a subband

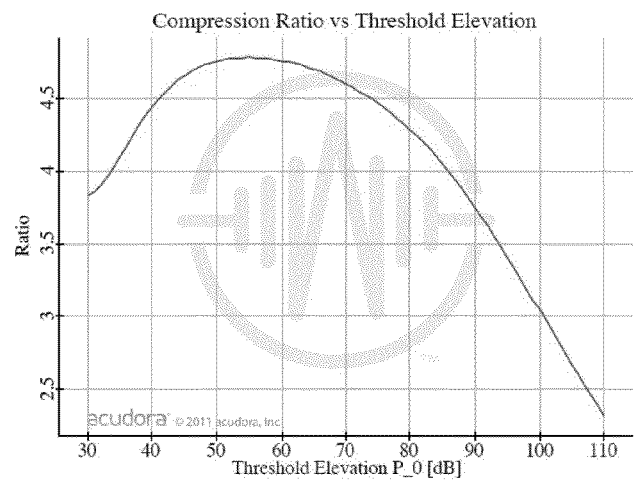
FIG. 5. Compression Ratio vs. Threshold Elevation match to Psychoacoustic model
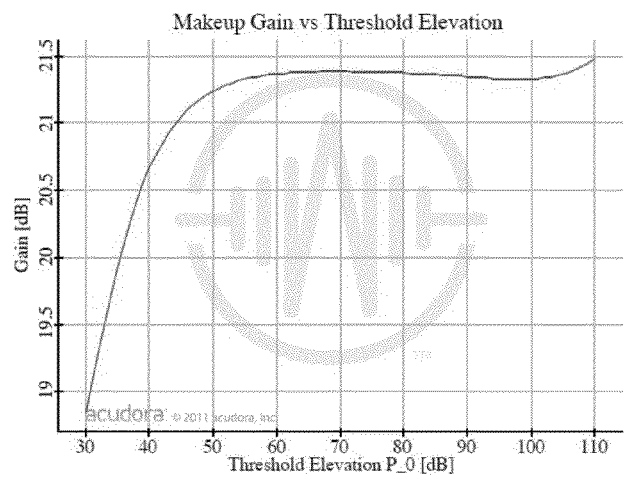
FIG. 6. Makeup Gain vs. Threshold Elevation match to Psychoacoustic model

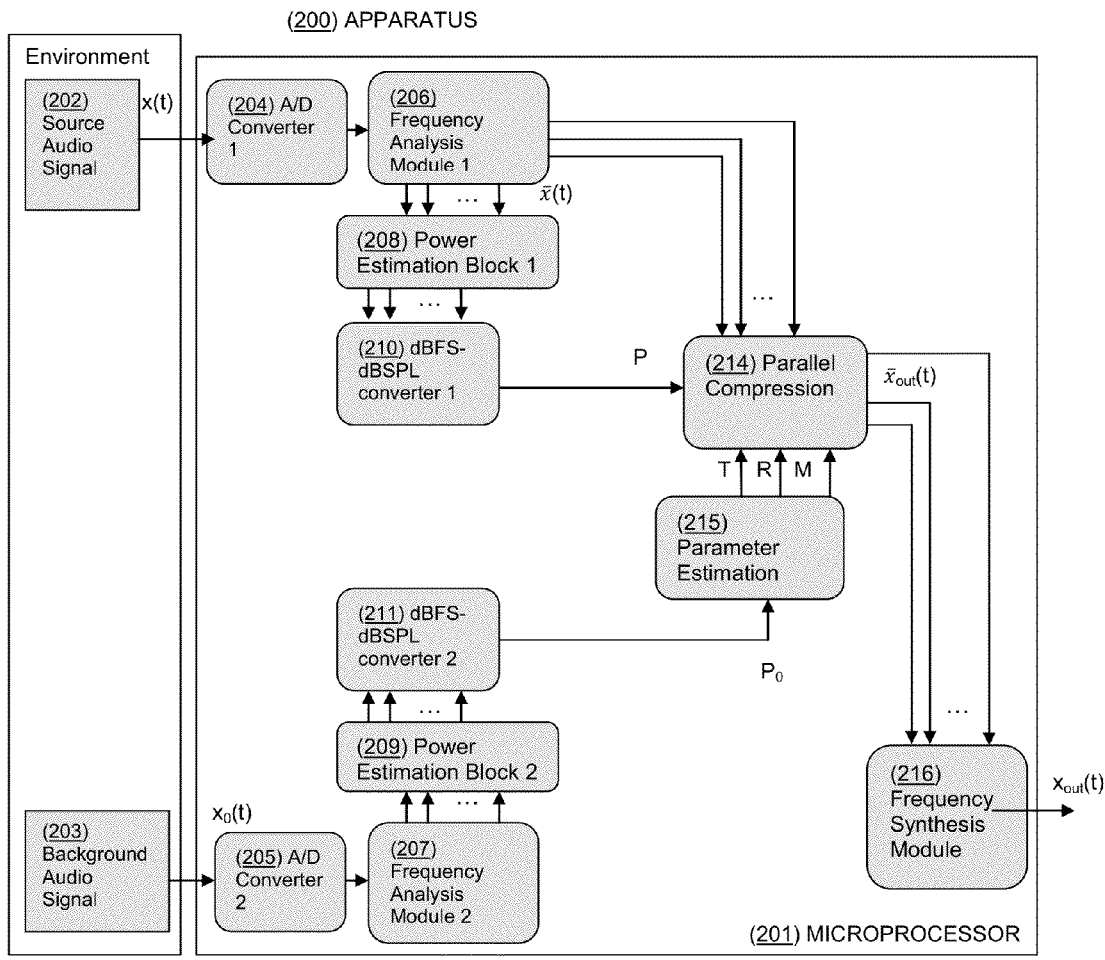
FIG. 7. System Architecture using parallel compression to implement non-linear psychoacoustic dynamic range compression for ambient noise compensation.

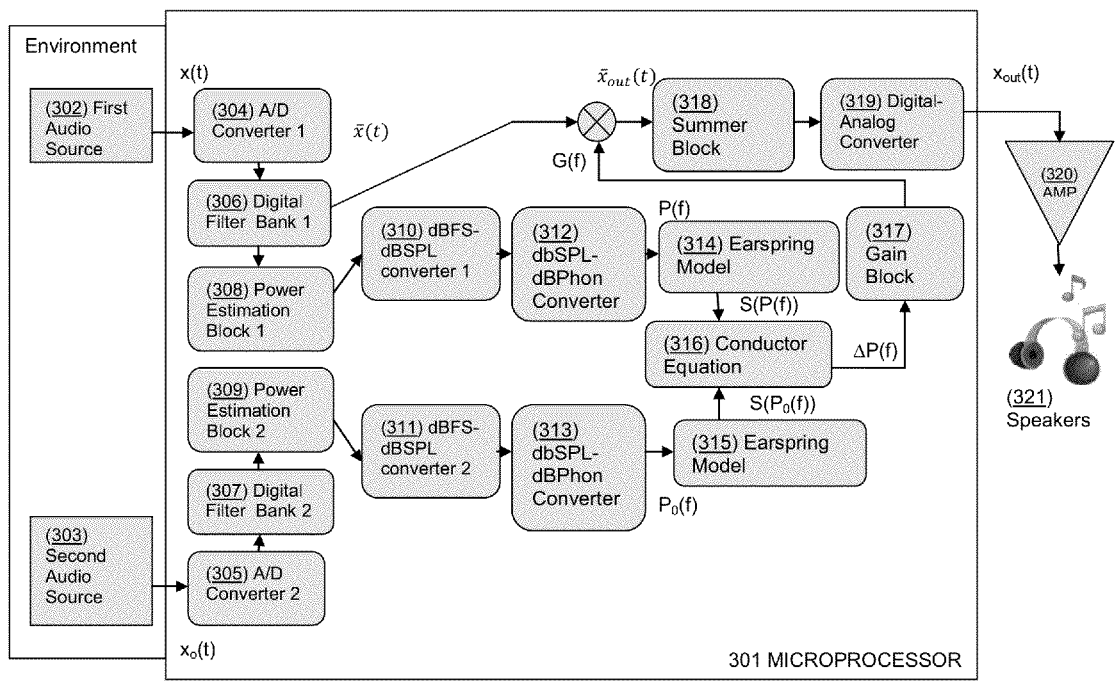
FIG. 8. Systems Implementation using Earspring model and Conductor Equation.

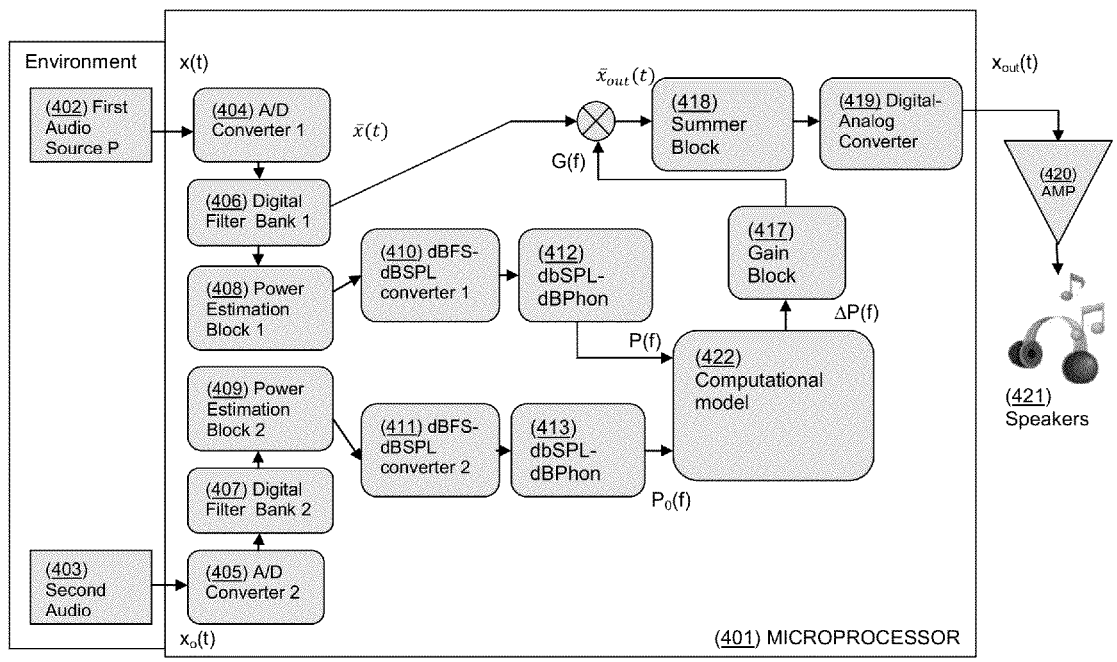
Fig 9. Implementation using a computational model that approximates Earspring solutions

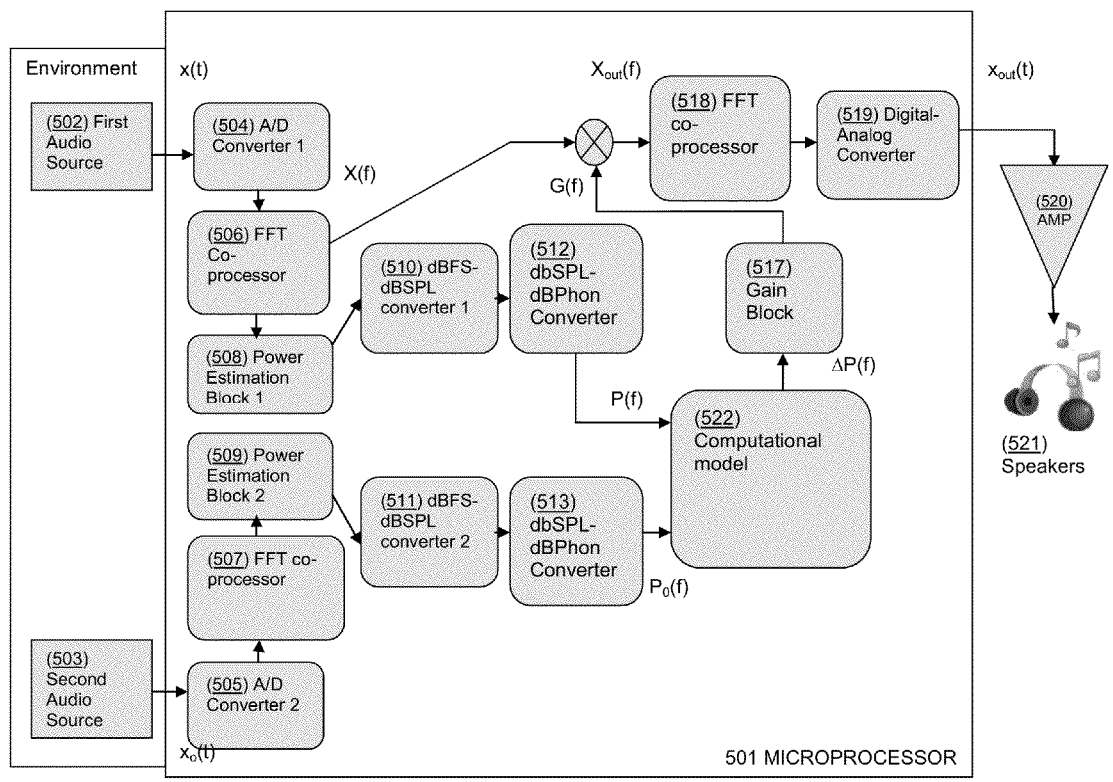
FIG 10. Implementation using Fourier transforms and computing corrections in the frequency domain.

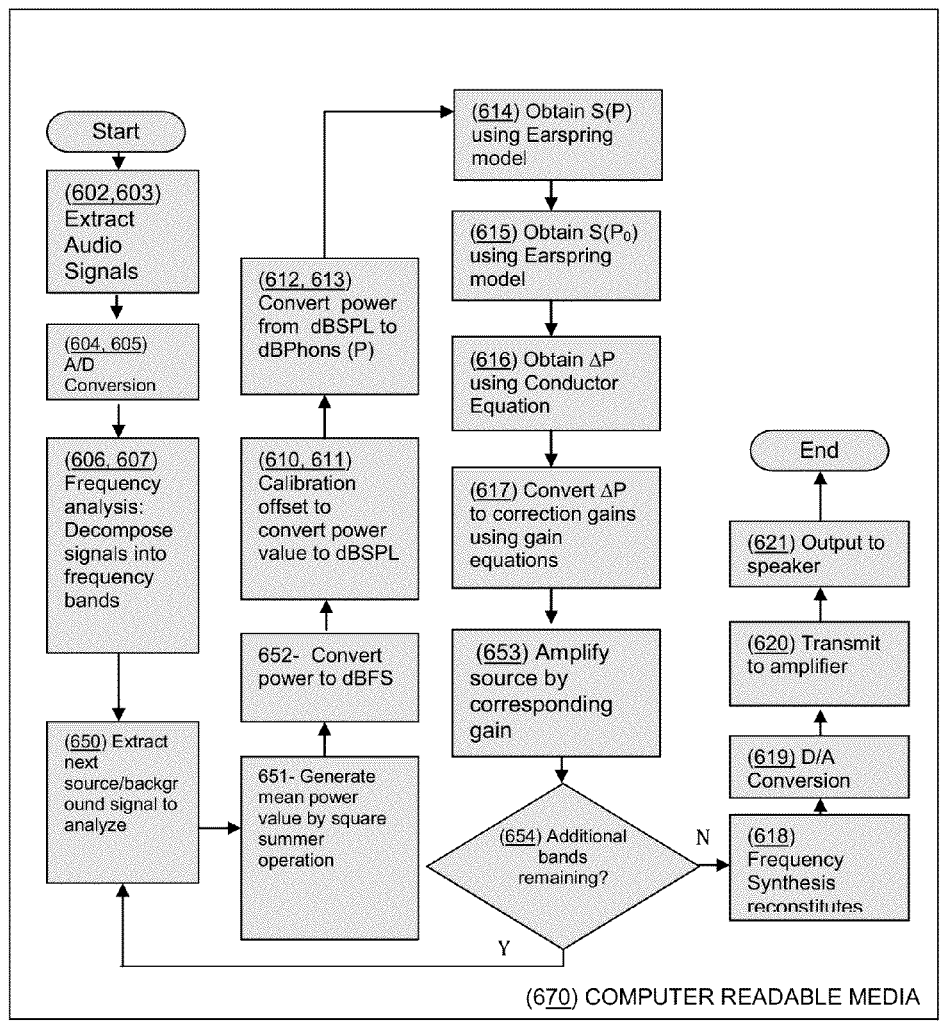
FIG. 11. Series Software implementation using Earspring equation

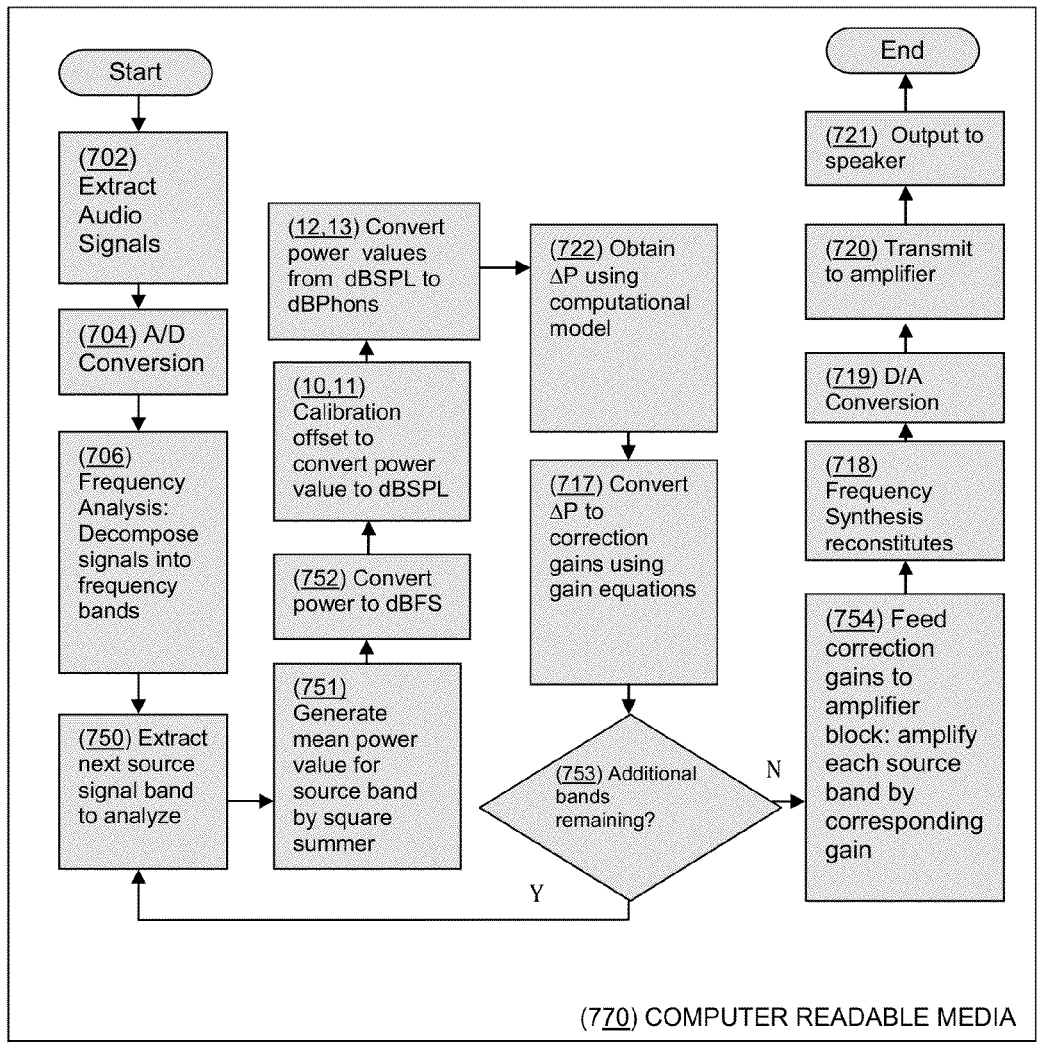
FIG. 12. Series Software implementation using computational model

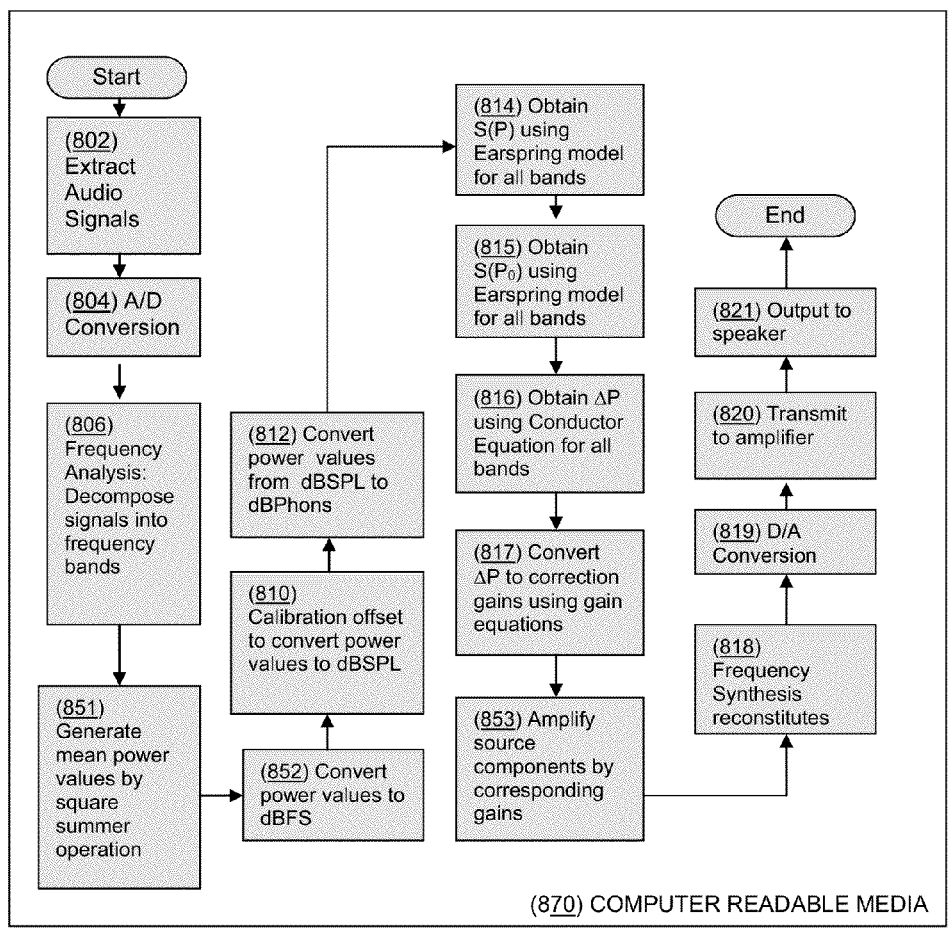
FIG 13. Software implementation using parallel structure and Earspring model

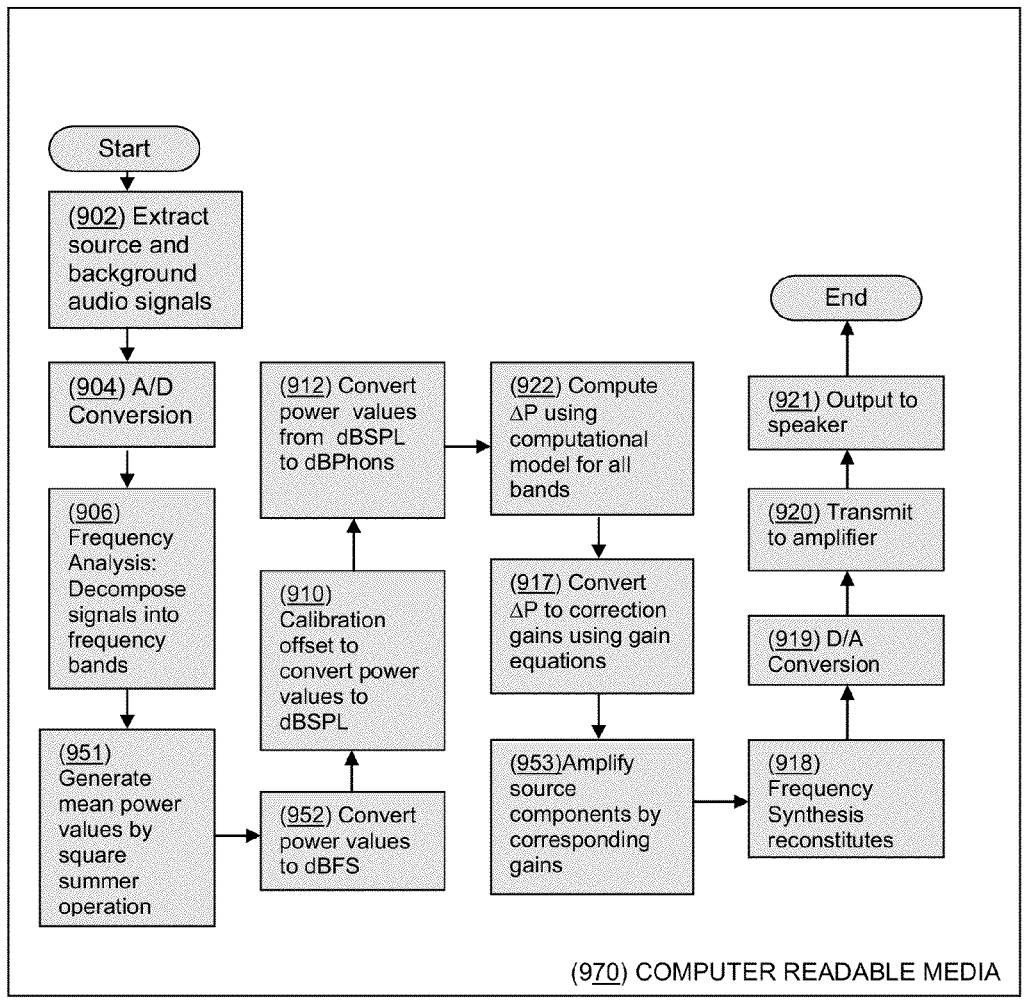
FIG 14. Parallel Software Implementation using Computational Model

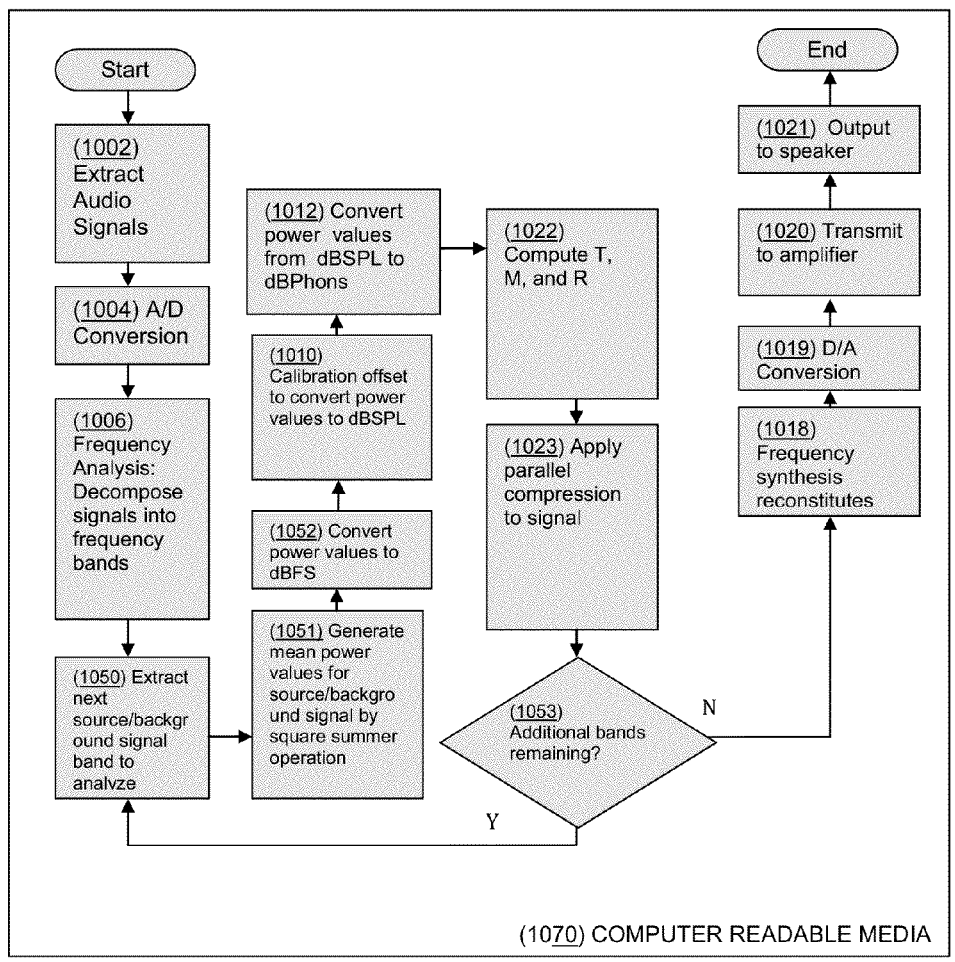
FIG. 15. Process flow of corrective system, using parallel compression to approximate the desired compression curves

SYSTEM FOR DYNAMIC SPECTRAL CORRECTION OF AUDIO SIGNALS TO COMPENSATE FOR AMBIENT NOISE IN THE LISTENER'S ENVIRONMENT

CROSS REFERENCE

The present non-provisional patent application claims benefit to the earlier priority date of provisional patent applications, Ser. No. 61/494,227, filed Jun. 7, 2011, application Ser. No. 61/544,263 filed Oct. 6, 2011, application Ser. No. 61/632,402, filed Oct. 7, 2011, application Ser. No. 61/564,956 filed Nov. 30, 2011, application Ser. No. 61/527,757, filed Aug. 26, 2011, application Ser. No. 61/632,401 filed Oct. 7, 2011, application Ser. No. 61/564,965, filed Nov. 30, 2011, the disclosures of which are incorporated in their entirety herein by reference.

BACKGROUND OF INVENTION

The present invention relates to the field of audio processing and more specifically to systems, devices, and methods to compensate for noise in a listener's environment.

There are many systems for the application of filtering to noise suppression of an audio signal. In most cases, these inventions relate to the removal of noise that is present in the audio signal from the origin or introduced into the signal through processing and transmission. Various forms of filtering may be applied which suppresses the noise signal in whole or in part. Generally, these systems have adverse impacts upon the quality of the original signal. However, these systems do not address noise in the environment of the listener, which cannot be filtered.

Conversely, systems for the suppression of noise in the listener's environment also exist. These systems generally use noise cancellation to remove the disrupting external signal by adding sound projected through headphones which has the effect of countering the sound waves produced by the noise. In this case, the noise is completely canceled and listener is generally unaware of the existence of the external noise, a result which can reduce the awareness of the listener to potential dangers in the environment.

In some prior art systems, dynamic volume compensation may be used to raise the volume of a source signal of interest over ambient background noise. However, these systems increase the gain in a spectrally uniform manner, raising the volume of all frequency components equally. This effect can distort the perception of music and speech due to the nonlinear behavior of the human ear with respect to frequency and volume.

Microphones and mechanical systems (e.g., computer software) can measure dBSPL; a sound (e.g., 40 dBSPL) at particular frequency (e.g., 1 kHz) sounds just as loud as the sound (e.g., 40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Since the human ear dynamically adjusts to sound intensity levels, the presence of background noise alters the threshold at which sounds begin to be perceived. As a result, ambient noise at a given frequency may make sounds at those frequencies that would otherwise be perceptible imperceptible in the presence of ambient noise. In order for the sound to be heard it must be amplified over the background noise. The volume of the ambient noise therefore represents a degree of hearing impairment or baseline threshold elevation over which the sound must be amplified to be perceived.

This effect varies according to the spectral composition of the noise, that is, spectral components that are sufficiently far from the spectral composition of the noise will remain perceptible. Consequently, using the total intensity of the background noise to raise the intensity of the source uniformly will overly amplify bands which are not affected, possibly raising the volume to damaging levels. In order to amplify only those components which need compensation, the gains to the source signal must vary by spectral band, according to the spectral composition of the noise.

Moreover, due to the nonlinear response of the human ear, using the spectral intensity of the background noise at a particular band as the gain for the source at that band will produce excessive amplification. In order to compute the correct gain a nonlinear psychoacoustic model must be used to compute an appropriate gain for each frequency. The intensity of the background noise as well as the source signal at a given frequency are inputs to this model, and the output is a desired gain for the source signal at that frequency.

The perceived loudness of sound can be modeled by a harmonic oscillator with spring constant that varies according to the mean power of vibration. This model is called the Earspring model. The Earspring equation 10,11 is written $[d^2/dt^2 + 2\beta(d/dt) + k(1+\gamma\gamma<y^2>)]y(t) = \eta F(t)$, where $t$=time, $y(t)$=amplitude of vibration, $F(t)$=driving force in terms of Phons amplitude or sound intensity, $<y^2>$=mean power of vibration or $S(P)$, identified as the Sones power in the following equations, $\beta$=damping constant, $k$=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force $F(t)$, which we will consider to be a sinusoid at a given frequency and amplitude, for which the amplitude is P in dBPhons, a solution to the earspring equation $y(t)$ can be found, for a particular set of boundary conditions, which is the steady state response to the forcing function. Transforming into the frequency domain we can obtain the mean power of vibration $<y^2>=\frac{1}{2}|Y|^2$, which can be rewritten as $S(P)$.

A possible set of boundary parameters comprises (i) a Sones ratio between the hearing threshold level and the reference level of 40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

We can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

The present invention features systems for dynamically adjusting audio signals by applying a gain to the signal in a spectrally varying manner to compensate for a noise source in the environment of the listener, such that the sound is perceived by the listener to be unchanged in loudness and spectral composition. The system obtains a threshold elevation for each frequency component by analyzing the spectral composition of the ambient noise. This threshold elevation is then used by a psychoacoustic model of hearing to determine an appropriate gain adjustment for the corresponding frequency component of the source signal which will make that component perceived by the human ear to be just as loud as if the noise were not present. After applying the gains to the source signal, the resulting signal is output to the speaker. The system allows a listener to hear without distortion, over ambient noise, by applying a gain to the source that varies according to the spectral composition of the noise, rather than cancelling the noise, or applying a uniform volume adjustment to the source. The perceived spectral composition of the source is thus adjusted without the removal of the noise signal. Systems may be incorporated into apparatuses including but not limited to mobile phones and music players.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

GLOSSARY OF TERMS

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12;
   where P=Phons amplitude of a source signal of interest
   F=Frequency
   dBSPL=decibels according to sound pressure
   dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.

11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component can may comprises a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.
20. Gain Block component—This component applies the gains to each corresponding frequency component or band. In some embodiments, the term gain block component is used interchangeably with a "means for applying gains to a audio signal." Said means may be, for example, an amplifier, or gain block component.
21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.
22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.
23. Inverse Fourier Transform: A mathematical operation which computes a time domain signal corresponding to a given frequency spectrum.
24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F\_kHz)=26.811(1+1.960/F\_kHz)-0.53$$

In some embodiments, the term kHz frequency to critical band center frequency converter is used interchangeably with a "means for converting a frequency component or series of frequency components to critical band frequency. Said mean may be, for example, a summer.
25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.
26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G = g0 + (P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical parameter value that when input to the Personalized Sound adjustment, generates may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference. In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

34. where G is the gain ratio, PSIG is the signal intensity at a frequency in units of power, PNOISE is the signal intensity of the background noise, PTHRQ is the absolute threshold of hearing, and α=0.2 is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.
35. RF Transceiver: Radio Frequency Transmitter/Receiver—this device interfaces directly with the antenna and can modulate an audio signal with its radio carrier frequency for transmission as well as demodulate a received radio frequency signal
36. Source signal: The Source signal, as used herein refers to a portion of the first audio signal or the audio signal of interest at a given frequency component.
37. Speaker: The speaker can be any speaker or the like capable of receiving and projecting a sound signal adjusted or corrected by the present invention.
38. Storage media: A computer readable media used for storing data, such as a hard disk, RAM, or flash memory
39. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.
40. Threshold elevation: Threshold elevations correlate to the minimum sound pressures required to perceive sounds at various frequencies.

Additional Terms:
1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.
2. dBSPL: Decibels sound power level—a unit of measure of sound intensity at the ear
3. dBSPL to dBPhon Conversion equation: This equation converts sound pressure level to Phons in decibels:

$$P_{dBPhon}(F) = \frac{P_{dBSPL}(F) - ATH(F)}{1 + kATH(F)}$$

where
F=Frequency
ATH=Absolute Threshold of Hearing
P=Phons amplitude of a source signal of interest
dBSPL=decibels according to sound pressure
4. dBFS to dBSPL Converter: This equation converts the audio signal power from audio power in decibels to audio sound pressure level in decibels
5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
6. Gain Equation: This equation converts the gain in Phons to a gain in sound pressure level $$\Delta P_{dBSPL}(F) = \Delta P_{dBPhon}(F)(1 + kATH(F))$$

where:
F=Frequency
ATH=Absolute Threshold of Hearing
P=Phons amplitude of a source signal of interest
dBSPL=decibels according to sound pressure
K=−1/120 when ATH(F)>0
=+1/240 when ATH(F)<0
7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
8. Phons: Phons are objective units of sound intensity impinging upon the ear. Sound power may be converted from decibels (dBFS) to Phons using a conversion first to dBSPL then to Phons
9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
10. Sones: Sones are subjective units of perceived sound loudness.
11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

BRIEF DESCRIPTION OF THE DRAWINGS

FIG. 1 is a drawing of a possible systems architecture of the present invention.
FIG. 2. diagrams an implementation of the Psychoacoustic model of the present invention using analytical solutions to the Earspring model.

FIG. 3. diagrams an implementation of the Psychoacoustic model in which a Numerical approximation to the solutions is made using a function approximator for which parameters have been stored in memory.

FIG. 4. diagrams an implementation in which parallel compression (aka New York Compression) is used to approximate the solutions to the Earspring and conductor equations, where the parameters used by the parallel compression are dynamically varied in accordance with the background noise.

FIG. 5 shows a plot of the compression ratio as a function of threshold elevation needed to model the compression curves produced by the Earspring/Conductor model using dynamic parallel compression.

FIG. 6 shows a plot of the makeup gain as a function of threshold elevation needed to model the compression curves produced by the Earspring/Conductor model using dynamic parallel compression.

FIG. 7. is a drawing of a possible systems architecture of the present invention, where dynamic parallel compression is integrated into the system to approximate the Earspring and Conductor equations.

FIG. 8. is a drawing of a possible embodiment for the systems architecture of the present invention using solutions to the Earspring equation and Conductor equation to compute gains.

FIG. 9. is a drawing of a possible embodiment for the systems architecture of the present invention using a computational model fit against solutions to the Earspring and conductor equations.

FIG. 10. is a drawing of a possible embodiment for the systems architecture of the present invention using Fourier transforms to compute gains at each point in the frequency spectrum.

FIG. 11. is a drawing of a possible process flow for the present invention, using the Earspring equation and a series architecture.

FIG. 12. is a drawing of a possible process flow for the present invention, using a computational model and a series architecture.

FIG. 13. is a drawing of a possible process flow for the present invention, using a parallel architecture and the Earspring equation.

FIG. 14. is a drawing of a possible process flow for the present invention, using a parallel architecture and a computational model fit against solutions to the Earspring equation.

FIG. 15. is a drawing of a possible process flow for the present invention, using a parallel architecture and a computational model fit against solutions to the Earspring equation.

DESCRIPTION OF PREFERRED EMBODIMENTS

Apparatus

As shown in FIG. 1, in some embodiments, the present invention can comprise an apparatus 100, effective in enhancing an audio signal, by applying corrective gains to a plurality of frequency components which constitute a first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the background noise $P_0$, wherein corrective gains are generated for each channel by solving for a correction gain $\Delta P$ for the signal which will suffice to raise the volume of each channel so that the user will perceive it above background noise, by the loudness amount equivalent to how it would be perceived in a noiseless environment the apparatus 100 comprising:
(a) a first audio source 02, configured to extract the first audio signal where the first audio signal is a broadband audio signal of interest, the first audio source operatively connected to a microprocessor 01;
(b) a second audio source 03, configured for extracting ambient broadband audio in the environment, the second audio source operatively connected to the microprocessor 01;
(c) the microprocessor 01, operatively connected to the first audio source 02, the second audio source 03, a Speaker 20, and an Amplifier 19; the microprocessor 01: configured to execute applications for:
  i. a first Analog to Digital converter 04;
  ii. a second Analog to Digital converter 05;
  iii. a first Frequency Analysis Module 06;
  iv. a second Frequency Analysis Module 07;
  v. a first Power Estimator Block 08;
  vi. a second Power Estimator Block 09;
  vii. a first dBFS to dBSPL Converter 10;
  viii. a second dBFS to dBSPL Converter 11;
  ix. a first dBSPL to dB Phon Converter 12;
  x. a second dBSPL to dB Phon Converter 13;
  xi. a Psychoacoustic model 22;
  xii. a Gain Block component 17;
  xiii. a Frequency Synthesis Module 18; and
  xiv. a Digital to Analog Converter 19;

whereupon (i) the first audio source 02 extracts the first audio signal x(t), where the first audio signal is then transmitted to the first Analog to Digital Converter 04 thereby converting the first audio signal into digital format; and simultaneously, (ii) the second audio source 03 extracts a second audio signal $x_0(t)$, where said second audio signal is then transmitted to the second Analog to Digital Converter 05 thereby converting the second audio signal into digital format;

whereupon the first audio signal and the second audio signal are fed, respectively, through the First Frequency Analysis Module 06 and Second Frequency Analysis Module 07 breaking down each respective audio signal into separate components;

whereupon the apparatus 100 identifies the source signal and the background signal corresponding to a frequency 50 and said signals are thereafter transmitted to the microprocessor 01;

whereupon both the source signal and the background signal are fed, respectively, through the first Power Estimator 08 and the Second Power Estimator 09, which compute power values for the various channels, whereby said power values are then fed into the dB Converter to generate power values for the source signal $P_{dBFS}(f)$ and the background signal $P_{0\_dBFS}(f)$ in dBFS 52;

whereupon (i) the microprocessor 01 completes a calibration offset such that a first dBFS to dBSPL Converter 10 converts the power value of the source signal from dBFS to dBSPL, and (ii) the microprocessor 01 completes a calibration offset such that a second dBFS to dBSPL Converter 11 converts the power value of the background signal from dBFS to dBSPL, producing $P_{dBSPL}(f)$ and $P_{0\_dBSPL}(f)$;

whereupon (i) a first dBSPL-dB Phon Converter 12 converts the power value of the source signal to dB Phons by applying a dBSPL to dBPhon Conversion equation, giving P(f) and (ii) a second dBSPL-dB Phon Converter 13 converts the power value of the background signal to dB Phons by applying the dBSPL to dBPhon Conversion equation, giving $P_0(f)$;

whereupon the microprocessor 01 applies the power value of the source signal and the power value of the background signal, now in dB Phons, to the psychoacoustic model 22 whereupon the microprocessor 01 calculates ΔP(f) in dBPhons
whereupon the microprocessor 01 calculates a correction gain of power to the source signal G(f), at the frequency, in dBSPL, based on the value of ΔP(f) in dB Phons, using the Gain Block component 17 which utilizes the Gain equation;
whereupon the apparatus 100 reconstitutes the first audio signal with the corrective gain to the source signal corresponding to the frequency, comprising:
  (i) multiplying the source signal at the frequency according to the corresponding corrective gain ΔP(f);
  (ii) using the Frequency Synthesis Module 18, to reconstitute the resulting audio signal
whereupon the corrected audio signal is fed through the Digital to Analog Converter 19, resulting in analog signal $x_{out}(t)$;

As shown in FIG. 2, in some embodiments, the psychoacoustic model involves analytically computing, using the Earspring equation the value in Sones of the input signal at a given frequency S(P) 114, along with the estimated hearing loss due to background noise in Sones at that frequency $S(P_0)$ 115, and applying these values to the conductor equation to derive a gain in Phons for the signal that will correct for the perceived hearing loss, the Conductor Equation 116 being, $$S(P)=S(P+\Delta P)-S(P_0)+S(0) \text{ or,}$$

$$\Delta P=S^{-1}(S(P)+S(P_0)-S(0))-P$$

As shown in FIG. 3, in some embodiments, the psychoacoustic model can use a numerical estimate of these equations, combining the conductor equation and the Earspring equation solutions into one equation. In this embodiment, a function approximator 124, such as a quadratic estimate, linear regression with quadratic feature, neural network, or other computational model, can be fit against the solutions to the Earspring equation, and the parameters of the model then stored in memory in a lookup table 123. During operation, these parameters can be retrieved by the microprocessor from a lookup table, and used to compute an approximate value for ΔP for any given P and $P_0$.

As shown in FIG. 4, in some embodiments, an alternative means of effectuating the gains demanded by the psychoacoustic model is to harness an existing sound processing technique known as parallel compression. Parallel compression involves compressing a copy of an original signal using linear compression 112, and subsequently adding this compressed signal back into the original signal. This results in a non-linear compression curve that amplifies low sounds below a certain threshold. The shape of the compression curve is controlled by a number of parameters including the threshold (T), compression ratio (R), and makeup gain (M), and applies gains that vary depending on the power of the signal of interest 106. By varying these parameters, the parallel compression curves can be made to approximate the compression curve that would otherwise be produced by applying the psychoacoustic model. This is done by fitting the parameters against the desired characteristics of the psychoacoustic model using a least-squares error fit. These parameters are then stored in memory in a lookup table 111, or computed using a formula and may be retrieved in real time to dynamically update the parallel compression block 112. Thus, these parameters must be updated at each time step account for the changing noise. In this case, the noise power 107 is used to determine the parameters of the compression gain. Typically the T parameter is chosen to be the threshold elevation (or noise power) minus 20 dB. From that point makeup gain and compression ratio are found using standard curves that have been derived by fitting against the psychoacoustic model. Plots of the parameters used for varying threshold elevations are shown in FIG. 5 and FIG. 6. Here we can see that the desired compression ratio has an "upside down U" shape for varying threshold elevations.

As shown in FIG. 7, in some embodiments, the present invention comprises, an apparatus 200, effective in enhancing an audio signal, by applying corrective gains to a plurality of frequency components which constitute a first audio signal, wherein the gains are applied using a parallel compression technique, where the parameters of the parallel compression are determined by fitting the compression curves against a non-linear psychoacoustic model, where the parameters depend upon the power of a background noise signal $P_0$, and where the compression is applied to the first audio signal, the apparatus 200 comprising:
  a) a first audio source 202, configured to extract the first audio signal where the first audio signal is a broadband audio signal of interest, the first audio source operatively connected to a microprocessor 201;
  b) a second audio source 203, configured for extracting ambient broadband audio in the environment, the second audio source operatively connected to the microprocessor 201;
  c) the microprocessor 201, operatively connected to the first audio source 202, the second audio source 203, a Speaker 220, and an Amplifier 219; the microprocessor 201 configured to execute applications for:
    i. a first Analog to Digital converter 204;
    ii. a second Analog to Digital converter 205;
    iii. a first Frequency Analysis Module 206;
    iv. a second Frequency Analysis Module 207;
    v. a first Power Estimator Block 208;
    vi. a second Power Estimator Block 209;
    vii. a first dBFS to dBSPL Converter 210;
    viii. a second dBFS to dBSPL Converter 211;
    ix. a first dBSPL to dB Phon Converter 212;
    x. a second dBSPL to dB Phon Converter 213;
    xi. a lookup table 215;
    xii. a parallel compression module 214;
    xiii. a Frequency Synthesis Module 218; and
    xiv. a Digital to Analog Converter 219;
whereupon (i) the first audio source 202 extracts the first audio signal x(t), where the first audio signal is then transmitted to the first Analog to Digital Converter 204 thereby converting the first audio signal into digital format; and simultaneously, (ii) the second audio source 203 extracts a second audio signal $x_0(t)$, where said second audio signal is then transmitted to the second Analog to Digital Converter 205 thereby converting the second audio signal into digital format;
whereupon the first audio signal and the second audio signal are fed, respectively, through the first First Frequency Analysis Module 206 and Second Frequency Analysis Module 207 breaking down each respective audio signal into separate components;
whereupon, for each frequency component, the apparatus 200 identifies the source signal and the background signal corresponding to a frequency 250 and said signals are thereafter transmitted to the microprocessor 201;
whereupon, for each frequency component, both the source signal and the background signal are fed, respectively, through the first Power Estimator 208 and the Second Power Estimator 209, which compute power values for the various channels, whereby said power values are then fed into the dB Converter to generate power values for the source signal $P_{dBFS}(f)$ and the background signal $P_{0\_dBFS}(f)$ in dBFS 252; whereupon, for each frequency component, (i) the microprocessor 201 completes a calibration offset such that a first dBFS to dBSPL Converter 210 converts the power value of the source signal from dBFS to dBSPL, and (ii) the microprocessor 201 completes a calibration offset such that a second dBFS to dBSPL Converter 211 converts the power value of the background signal from dBFS to dBSPL, producing $P_{dBSPL}(f)$ and $P_{0\_dBSPL}(f)$;

whereupon, for each frequency component, (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0(f)$;

whereupon, for each frequency component, the microprocessor 201 uses the power value of the background signal to determine parameters T, R, and M for the parallel compression module 215, whereupon, for each frequency component, the parallel compression 215 module amplifies the source signal, by the compressive gains determined by the parameters, whereupon the parallel compression module sums the amplified source signal with the original source signal, to produce a corrected source signal, whereupon the apparatus 200 reconstitutes the plurality of frequency components of the corrected source signal using the Frequency Synthesis Module 218, to produce a corrected output audio signal;

whereupon the corrected audio signal is fed through the Digital to Analog Converter 19, resulting in analog signal $x_{out}(t)$;

As shown in FIG. 8, in some embodiments, the present invention comprises digital filter banks 306, 307 composed of IIR filters, in which case the frequency synthesis module is a summer block 318 that adds together the separate channels produced by the digital filer.

As shown in FIG. 9, in some embodiments, a combination of different types of frequency analysis modules and psychoacoustic models may be used, for instance combining digital filter banks and a computational model for the psychoacoustic model.

As shown in FIG. 10, in some embodiments, Fourier transforms may be used, using FFT co-processors to speed computation, in which case the frequency synthesis module is an FFT co-processor that performs an inverse Fourier transform on the signal.

In some embodiments, all or part of the present invention could be implemented using a parallel processing architecture such that some or all of the set of computations from step 5 to 10 above may be computed simultaneously using multiple processing units.

Computer Readable Media

In some embodiments, as explained by FIG. 11-14, the present invention can exist in major part on a computer medium, 670 storing a set of instructions executable by one or more processors, where the computer-readable medium 670 is effective in producing proper hearing corrections across a spectrum of frequencies by applying corrective gains of amplitude to a plurality of channels which constitute a first audio signal, wherein corrective gains are generated for each channel by solving for a correction value of ΔP for a source signal, wherein said source signal is a channel of the audio signal corresponding to a particular frequency, where ΔP is derived from a novel Conductor Equation 616, $$S(P)=S(P+\Delta P)-S(P_0)+S(0) \text{ or,}$$

$$\Delta P=S^{-1}(S(P)+S(P_0)-S(0))-P,$$

where S(P)=a Sones equation from an EarSpring equation solution 614, as a function of Phons Pressure, P=a Phons amplitude of a source signal of interest, ΔP=the gain needed to make a source signal appear at proper loudness for impaired hearing, and $P_0$=an elevated threshold in Phons of impaired hearing, the computer-readable medium comprising:

(a) code for solving for S(P) of the Conductor Equation which comprises:
  (i) code for extracting a power value of the source signal at a frequency, in dBFS with a first power estimator block, comprising:
    (A) extracting the first audio signal x(t) 602, said first audio signal comprising a plurality of channels corresponding to varying frequencies, where said first audio signal is then transmitted to an Analog to Digital Converter thereby converting the signal into digital format 604;
    (B) feeding the first audio signal through a first digital filter bank 606 where the first audio signal is broken down into separate channels corresponding to varying Frequencies f;
    (C) identifying a source signal, wherein the source signal is a particular channel of the first audio signal corresponding to the frequency 650;
    (D) feeding the source signal through a squared summer equation 651 whereby the source signal is squared and added up N times, whereby the sum of the signal at the end block divided by N generates a mean power value for the source signal, whereby said power value is then fed into a dB Converter to generate a power value for the source in dBFS 652, $P_{dBFS}(f)$;
  (ii) code for calculating a calibration offset to convert the power value of the source signal $P_{dBFS}(f)$ in dBFS to a power value $P_{dBSPL}(f)$ in dBSPL 610 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
  (iii) code for converting the power value of the source signal to dB Phons by applying a dBSPL to dBPhon Conversion equation 612, producing P(f);
  (iv) code for applying the power value of the source signal P(f), now in dB Phons, to the EarSpring equation 614 in order to obtain the power value of the source signal in Sones, or S(P(f));

(b) code for solving for $S(P_0)$ of the Conductor Equation which comprises:
  (i) code for extracting a power value $P_0(f)$ of the background signal at the frequency, in dBFS with a second Power Estimator Block, comprising:
    (A) extracting a second audio signal $x_o(t)$ 603, said second audio signal comprising a plurality of channels corresponding to varying frequencies, where said second audio signal is then transmitted to a second analog to digital Converter 605 thereby converting the signal into digital format;

(B) feeding the second audio signal through a second Digital Filter Bank 607 where the second audio signal is broken down into separate channels $X_0(f)$ corresponding to varying frequencies;

(C) identifying the background signal 650, wherein the background signal is a particular channel $X_0(f)$ of the audio signal corresponding to the frequency;

(D) feeding the background signal through a squared summer equation 651 whereby the background signal is squared and added up N times, whereby the sum of the signal at the end block divided by N generates a mean power value for the signal, whereby said power value is then fed into a dB Converter to generate a power value for the background signal in dBFS 652, producing $P_{0\_dBFS}(f)$;

(ii) code for calculating a calibration offset to convert the power value of the background signal $P_{0\_dBFS}(f)$ in dBFS to a power value $P_{0\_dBSPL}(f)$ in dBSPL using the calibration equation 611 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;

(iii) code for converting the power value of the background signal to dB Phons by applying the dBSPL to dBPhon Conversion equation 613, producing $P_0(f)$;

(iv) code for applying the power value of the background signal, now in dB Phons, to the EarSpring equation 615 in order to obtain the power value of the background signal in Sones, or $S(P_0)$;

(c) code for using $S(P(f))$ and $S(P_0(f))$ to solve for $\Delta P(f)$ using the Conductor equation 616 which results in the Conductor equation 616 generating a $\Delta P(f)$ in dBPhons;

(d) code for calculating a correction gain of power $G(f)$, for a frequency f, in dBSPL based on the value of $\Delta P(f)$ in dB Phons, using a Gain equation 617;

(e) code for reconstituting the first audio signal with the corrective gain to the source signal at the frequency, comprising (i) feeding the correction gain to an amplifier wherein the amplifier multiplies the source signal at the frequency by the corrective gain $\Delta P(f)$ 653;

(ii) combining, using a Summer Block 618, the channels of the corrected audio signal to reconstitute the corrected output $x_{out}(t)$;

(f) code for feeding the first audio signal through a Digital to Analog Converter 619;

(g) code for transmitting the first audio signal, now in analog format, to the Amplifier 620; and (h) code for causing the Amplifier 620 to output the audio signal, now containing the corrective gain at the frequency, to a Speaker 620 where the Speaker 620 outputs the audio signal with the corrective gain at the frequency;

wherein the EarSpring equation is $[d^2/dt^2+2\beta(d/dt)+k(1+\gamma\gamma<y^2>)]y(t)=\eta F(t)$, where t=time, y(t)=amplitude of vibration, F(t)=driving force, identified as the Phons amplitude in the following equations, $<y^2>$=mean power of vibration or S(P), identified as the Sones power in the following equations, $\beta$=damping constant, k=spring constant, and $\gamma$=coefficient of power dependence of spring constant, and $\eta$=the scale factor;

wherein the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz;

wherein the dBSPL to dBPhon Conversion equation 608 is:

$$P_{dBPhon}(F) = \frac{P_{dBSPL}(F) - ATH(F)}{1 + kATH(F)}$$

wherein the Gain equation 613 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH(F)>0
 =+1/240 when ATH(F)<0

In some embodiments, the absolute threshold of hearing may be computed in one example by the formula:

$$ATH(F) = \frac{3.64}{F_{kHz}^{0.8}} - 6.5e^{-0.6(F_{kHz}-3.3)^2} + 0.001F_{kHz}^4 - 3.37$$

In some embodiments, as shown in FIGS. 9, 10, 12, and 14, a computational model can be used in place of explicit computation of the Earspring and Conductor equations, where the computational model is $$\Delta P \cong \frac{AP^2 + BP + C}{DP^2 + EP + 1}$$

where A, B, C, D and E are parameters which have been fit against solutions to the combined Earspring and Conductor Equations, for each value of $P_0$ in 5 dB increments, and stored in a lookup table, such that for a given $P_0$, parameters for A, B, C, D, and E are extracted from the table, and then the computational model is used to compute $\Delta P$ given P.

In some embodiments it is also possible to use separate computational models for S(P) and for $S^{-1}(S)$, with separate sets of parameters fit against the solutions for various boundary parameters and values of $P_0$.

In some embodiments as in FIGS. 9 and 10, the processing chain, from output of channels at the digital filter bank to adding gains to channels via the gain component, is a process that occurs in parallel for all channels of the audio signal, through the use of threaded processes, or through the use of a parallel computing device, such as a multi-core processing unit.

As shown in FIG. 15, in some embodiments the present invention may be implemented on a computer-readable medium 1070 storing a set of instructions executable by one or more processors, where the computer-readable medium 1070 is effective in producing proper hearing corrections across a spectrum of frequencies by applying corrective gains of amplitude to a plurality of channels which constitute a first audio signal, wherein the gains are applied using a modified form of parallel compression, where the compression parameters are dynamically varied in accordance with the noise, and parameters are selected to approximate the compression curves demanded by a psychoacoustic model, wherein said source signal is a channel of the audio signal corresponding to a particular frequency, the computer-readable medium comprising:
a) code for solving for the power P(f) in Phons of the source signal of the source signal, at a frequency:
   i. code for extracting a power value of the source signal at a frequency, in dBFS with a first power estimator block 1008, comprising:
      1. extracting the first audio signal x(t) 1002, said first audio signal comprising a plurality of channels corresponding to varying frequencies f, where said first audio signal is then transmitted to an Analog to Digital Converter 1004 thereby converting the signal into digital format;
      2. feeding the first audio signal through a First Frequency Analysis Module 1006 where the first audio signal is broken down into separate frequency components;
      3. identifying a particular source frequency component of the first audio signal corresponding to a frequency 1050;
      4. generating a power value for the frequency component, whereby said power value is then fed into a dB Converter to generate a power value $P_{dBFS}(f)$ for the source in dBFS 1052;
   ii. code for calculating a calibration offset to convert the power value $P_{dBFS}(f)$ of the source signal in dBFS to a power value $P_{dBSPL}(f)$ in dBSPL 1010 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
   iii. code for converting the power value of the source signal to dB Phons by applying a dBSPL to dBPhon Conversion equation 1012, producing P(f);
b) code for solving for $P_0(f)$ in Phons of the background signal, at a frequency:
   i. code for extracting a power value of the background signal at the frequency, in dBFS with a second Power Estimator Block 1009, comprising:
      1. extracting a second audio signal $x_0(t)$ 1003, said second audio signal comprising a plurality of channels corresponding to varying frequencies, where said second audio signal is then transmitted to a second Analog to Digital Converter 1005 thereby converting the signal into digital format;
      2. feeding the second audio signal through a Second Frequency Analysis Module 1007 where the second audio signal is broken down into separate components;
      3. identifying a particular background signal component, corresponding to a particular frequency 1050;
      4. obtaining a power value for the background signal component, whereby said power value is then fed into a dB Converter to generate a power value $P_{0\_dBFS}(f)$ for the background signal in dBFS 1052;
   ii. code for calculating a calibration offset to convert the power value of the background signal $P_{0\_dBFS}(f)$ in dBFS to a power value $P_{0\_dbSPL}(f)$ in dBSPL using the calibration equation 1011 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
   iii. code for converting the power value of the background signal to dB Phons by applying the dBSPL to dBPhon Conversion equation 1013, producing $P_0(f)$;
c) code for determining parameters for the parallel compression module, including compression ratio, makeup gain, and threshold, based on the power value of the background signal,
d) code for applying parallel compression to the source signal, using the parameters previously determined,
e) code for reconstituting the first audio signal with the corrective gain to the source signal at the frequency, comprising combining, using a Frequency Synthesis Module 1018, the channels of the corrected signal, reconstituting the corrected signal, producing $x_{out}(t)$;
f) code for feeding the corrected audio signal through a Digital to Analog Converter 1019;

In some embodiments, discrete sets of parameters for the parallel compression are found by dividing the range of possible noise volumes into discrete levels, where sets of parameters are found for each discrete noise loudness level, where the parameter estimation module 422 is a lookup table, where during real-time processing the ambient noise intensity is measured and used to select the corresponding set of parameters.

In some embodiments, the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In some embodiments, one or more parameters (e.g. T) is defined as a function of the ambient noise intensity (e.g. T=$P_N$−T', where $P_N$ is noise loudness), such that the parameters stored (e.g. T') are the parameters of the function defining the relationship between sound intensity (e.g. $P_N$) and the parameter (e.g. T) of the parallel compression.

In another possible embodiment, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In some embodiments, a fixed set of parameters is used. The fixed parameters may fall in the range of 2 to 6 for compression ratio, 15 dB to 25 dB for makeup gain, and −15 to −25 dB for threshold offset.

In some embodiments, the First and Second Frequency Analysis Modules 406, 407 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 418 is a summer operation that combines the various channels into output xout(t).

In some embodiments, the First and second Frequency Analysis Modules 406,407 are digital filter banks composed of wavelet filters.

In some embodiments, the various sub-band channels correspond to critical bands of hearing.

In some embodiments, the First and Second Frequency Analysis Modules 406,407 are composed of FFT coprocessors that perform Fourier transforms on the input signals producing $X(t)$ and $X_0(t)$, where the power of each component is found by squaring the Fourier component, and the Frequency Synthesis Module 418 is an FFT coprocessor that performs an inverse Fourier transform, resulting in output signal $x_{out}(t)$.

In some embodiments, the frequency components may be grouped together to approximate sub-bands correspond to critical bands of hearing.

In some embodiments, the present invention features systems for audio correction. The systems may include but are not limited to mobile phones (and the like) and music players (and the like).

In some embodiments, the present invention may be multichannel, such as in a stereo or surround sound system. In this case, gains are computed independently for each channel independently. These gains may be based on one central background noise estimate, or multiple noise estimates at each speaker. Each channel is then amplified by its corresponding gains so that the overall surround effect compensates for the presence of background noise.

In some embodiments, the present invention features an apparatus for correcting an audio signal. The apparatus, or audio source as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal (e.g., an incoming conversation on a mobile phone) at given frequency (or within a frequency range) and the microphone can function to detect an amplitude of a background signal at a corresponding frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In some embodiments, some elements of the above process flow might be performed using analog circuitry before being input to the microprocessor.

In some embodiments, Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, referring to the means of extracting amplitudes of source signals or background signals: at the output of each filter which selects a band of adjacent frequencies, an electrical circuit to effect extraction of amplitudes could be the use of a diode, or rectifier bridge, fed by each signal which, in turn, feeds a simple series resistor and a capacitor in shunt to create an integrator of the absolute value of the signal. The integrator would accumulate rectified current for some period of time before being applied to the loudness response curve selection circuit, after which the capacitor would be shorted to discharge the accumulated current, in anticipation of the next cycle of integration. Alternatively, the capacitor could be allowed to discharge continuously through a higher valued resistor in shunt, so that charge can be bled off more slowly than it is accumulated, thereby forming a running exponential average integrator.

In some embodiments, a more sophisticated version of amplitude estimation could send the signals through a squarer circuit ahead of the RC integrator in order to accumulate an estimate of the power in the signal. The resulting integrated current would be an estimate of the RMS power at the end of the integration period. This power estimate could then feed the gain correction curve selection circuit.

In some embodiments, the output of each integrator can be fed to an analog differencing amplifier (operational amplifier, or OpAmp) to subtract the estimated amplitude of the noise signal from the estimated amplitude of the signal of interest. The output of this difference amplifier can be used to establish a dynamic compressor threshold. The output of the compressor circuit (a voltage controlled amplifier, or VCA) can be added to the dry signal to effect a nonlinear correction. A simple linear compressor (VCA) adjusted with suitable make-up gain and compression ratio can produce, in sum with the dry signal, an approximation of the required nonlinear correction gain.

The present invention is not limited to the aforementioned examples of means of extracting amplitudes.

Without wishing to limit the present invention to any theory or mechanism, it is believed that the present invention is advantageous because the present invention features a maximum output volume, for example the source signal will be amplified to only a certain degree. This can help protect against damage to the user's hearing. Furthermore, the systems frequently detect the background noise (e.g., 10-40 times per second, 1,000 times per second, etc.), allowing for the systems to react quickly to changes in the background noise. Furthermore, the systems utilize non-linear corrections, thus, loud signals are not amplified much if at all.

In some embodiments, the systems of the present invention can allow for microphone sensitivity to be altered. For example, a particular user may wish to have more correction or less correction. For example, the microphone may be in someone's pocket, or else exposed directly to the ambient noise sounds. If the microphone becomes shielded, it will produce a weaker response to the noise than if it were directly exposed. Hence the microphone gain can be increased to compensate for the shielding. Also, each of us has a slightly different response to noise levels, some people being more sensitive to it than others. A variable gain on the microphone can help to compensate for individual differences of loudness perception. Finally microphones exhibit varying characteristics depending on their specific construction. A variable microphone gain in the software can help to normalize the response from different microphones.

In some embodiments, the systems of the present invention can allow for signals to be corrected prior to transmission or recording, such that ambient noise in the recorded or received signal is retained, but the spectral composition of the primary source signal is modified to compensate, as an alternative to standard noise reduction techniques.

In some embodiments, steps for converting analog audio input signals to digital input signals can be bypassed where the invention utilizes digital input audio sources capable of receiving digital audio signals and transmitting the same to the processor.

As used herein, the term "hearing impaired" refers to physical hearing impairment, as in the traditional sense of hearing loss, and/or, can also refer to temporary hearing loss caused by a background noise or other temporary hearing loss factors. One of the novel discoveries addressed by the present invention is that a individual with normal hearing can in fact experience hearing impairment due to background noise, or background signals interfering with source noise or source signals.

Additional Disclosures of Preferred Embodiments

In some embodiments, the present invention comprises an apparatus 100, effective in enhancing a first audio signal in the face of ambient background noise, by applying corrective gains to a plurality of frequency components which constitute the first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the ambient background noise $P_0$, wherein corrective gains are generated for each frequency component by solving for a correction gain $\Delta P$ for the first audio signal which will suffice to raise the volume of each frequency component of the first audio signal so that the user will perceive it above background noise, by the loudness amount equivalent to how the first audio signal would be perceived in a noiseless environment.

In some embodiments, the apparatus comprises a first audio source 02, configured to extract a first audio signal where the first audio signal is a broadband audio signal of interest, the first audio source operatively connected to a microprocessor 01.

In some embodiments, the apparatus comprises a second audio source 03, configured for extracting a second audio signal comprising ambient broadband audio in the environment, the second audio source operatively connected to the microprocessor 01.

In some embodiments, the apparatus comprises the microprocessor 01, configured to execute applications for:
  i. a first Analog to Digital converter 04;
  ii. a second Analog to Digital converter 05;
  iii. a first Frequency Analysis Module 06;
  iv. a second Frequency Analysis Module 07;
  v. a first Power Estimator Block 08;
  vi. a second Power Estimator Block 09;
  vii. a first dBFS to dBSPL Converter 10;
  viii. a second dBFS to dBSPL Converter 11;
  ix. a first dBSPL to dB Phon Converter 12;
  x. a second dBSPL to dB Phon Converter 13;
  xi. a Psychoacoustic model 22;
  xii. a Gain Block component 17;
  xiii. a Frequency Synthesis Module 18; and
  xiv. a Digital to Analog Converter 19.

In some embodiments, the apparatus operates according to the following steps:

(i) the first audio source 02 extracts the first audio signal x(t), where the first audio signal is then transmitted to the first Analog to Digital Converter 04 thereby converting the first audio signal into digital format; and, (ii) the second audio source 03 extracts a second audio signal $x_0(t)$, where said second audio signal is then transmitted to the second Analog to Digital Converter 05 thereby converting the second audio signal into digital format, whereupon the first audio signal and the second audio signal are fed, respectively, through the First Frequency Analysis Module 06 and Second Frequency Analysis Module 07 breaking down each respective audio signal into separate pluralities of frequency components, whereupon, for each frequency component of the first audio signal, the apparatus 100 identifies a source signal and a background signal, where said source signal is a frequency component of the first audio signal and the background signal is the frequency component of the second audio signal 50, whereupon both the source signal and the background signal are fed, respectively, through the first Power Estimator 08 and the Second Power Estimator 09, which compute power values for the source signal $P_{dBFS}(f)$ and the background signal $P_{0\_dBFS}(f)$ in dBFS 52, whereupon (i) the microprocessor 01 completes a calibration offset such that a first dBFS to dBSPL Converter 10 converts the power value of the source signal from dBFS to dBSPL, and (ii) the microprocessor 01 completes a calibration offset such that a second dBFS to dBSPL Converter 11 converts the power value of the background signal from dBFS to dBSPL, producing $P_{dBSPL}(f)$ for the source signal and $P_{0\_dBSPL}(f)$ for the background signal, whereupon (i) a first dBSPL-dB Phon Converter 12 converts the power value of the source signal to dB Phons by applying a dBSPL to dBPhon Conversion equation, giving P(f) and (ii) a second dBSPL-dB Phon Converter 13 converts the power value of the background signal to dB Phons by applying the dBSPL to dBPhon Conversion equation, giving $P_0(f)$, whereupon the microprocessor 01 applies the power value of the source signal and the power value of the background signal, now in dB Phons, to the psychoacoustic model 22 whereupon the microprocessor 01 calculates $\Delta P(f)$ in dBPhons, whereupon the microprocessor 01 calculates a correction gain of power to the source signal G(f), at the frequency, in dBSPL, based on the value of $\Delta P(f)$ in dB Phons, using the Gain Block component 17 which utilizes the Gain equation, whereupon the apparatus 100 reconstitutes the first audio signal with the corrective gains to the source signals corresponding to each of the frequency components, comprising:

(i) multiplying the source signal corresponding to each of the frequency components according to the corresponding corrective gain $\Delta P(f)$, producing a corrected source signal,
  (ii) combining the corrected source signals using the Frequency Synthesis Module 18, to producing a corrected first audio signal whereupon the corrected first audio signal is fed through the Digital to Analog Converter 19, resulting in analog signal $x_{out}(t)$.

In some embodiments, the apparatus comprises an apparatus 200, effective in enhancing an audio signal, by applying corrective gains to a plurality of frequency components which constitute a first audio signal, wherein parallel compression is used to approximate gain curves derived from a psychoacoustic model, wherein the parallel compression is implemented by applying a gain G to a signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behaviour, where a different set of parameters is retrieved at each instant depending on the ambient noise volume in each frequency, where the dynamically changing noise loudness results in a dynamically changing selection of parameters for the parallel compression module.

In some embodiments, the apparatus comprises a first audio source 202, configured to extract a first audio signal, where the first audio signal is a broadband audio signal of interest, the first audio source operatively connected to a microprocessor 201.

In some embodiments, the apparatus comprises a second audio source 203, configured for extracting a second audio signal from the environment where the second audio signal is ambient noise, the second audio source operatively connected to the microprocessor 201.

In some embodiments, the apparatus comprises the microprocessor 201, operatively connected to a Speaker 220, and an Amplifier 219; the microprocessor 201 configured to execute applications for:
  i. a first Analog to Digital converter 204,
  ii. a second Analog to Digital converter 205,
  iii. a first frequency analysis module 206, configured to extract a plurality of frequency components from the first audio signal,
  iv. a second frequency analysis module 207, configured to extract a plurality of frequency components from the second audio signal,
  v. a first power estimation block 208, configured to calculate the sound intensity in decibels of each frequency component of the first audio signal 002,
  vi. a second power estimation block 209, configured to calculate the sound intensity of decibels of each frequency component of the second audio signal 003,
  vii. a first dBFS to dBSPL Converter 210,
  viii. a second dBFS to dBSPL Converter 211,
  ix. a parameter estimation module, which determines parameter settings for a parallel compression module, according to information stored in memory,
  x. the parallel compression module 215, parameterized by threshold T, compression ratio R, and makeup gain g0, where the parameters may by dynamically varied, where the parallel compression module is comprised of:
    a. a linear compression module 214, which applies gains to the first audio signal according to the equation $$G=g0+(P-T)*(1/R+1),$$

where G is the gain in dB to be applied to a frequency component of the first audio signal, P is the sound intensity of the frequency component in dB, g0 is the makeup gain in dB, T is the threshold in dB, and R is the compression ratio of the linear compression,
    b. a summer, which combines the resulting amplified first audio signal component with the original first audio signal component,
  xi. a Frequency Synthesis Module 216; and
  xii. a Digital to Analog Converter 219;

In some embodiments, the apparatus operates according to the following steps:
(i) the first audio source 202 extracts the first audio signal x(t), where the first audio signal is then transmitted to the first Analog to Digital Converter 204 thereby converting the first audio signal into digital format; and, (ii) the second audio source 203 extracts the second audio signal $x_0(t)$, where said second audio signal is then transmitted to the second Analog to Digital Converter 205 thereby converting the second audio signal into digital format, whereupon the first audio signal and the second audio signal are fed, respectively, through the First Frequency Analysis Module 206 and Second Frequency Analysis Module 207 breaking down each respective audio signal into separate components, whereupon, for each frequency component, the apparatus 200 identifies a source signal and a background signal corresponding to a frequency component 250, and said signals are thereafter transmitted to the microprocessor 201, whereupon, for each frequency component, both the source signal and the background signal are fed, respectively, through the first Power Estimator 208 and the Second Power Estimator 209, which compute power values for the signals, whereby said power values are then fed into the dB Converter to generate power values for the source signal $P_{dBFS}(f)$ and the background signal $P_{0\_dBFS}(f)$ in dBFS 252, whereupon, for each frequency component, and at each instant, the microprocessor, using the power estimates of the source signal and background signal, obtains parameters for the parallel compression, depending on the sound intensity of the background signal at each instant, whereupon the microprocessor, applies the parameters to a parallel compression module, whereupon the parallel compression module applies a linear compression, according to the selected parameters, to each of the frequency components of the first audio signal, whereupon the parallel compression module sums each frequency component of the first audio signal with the corresponding compressed audio signal, whereupon the apparatus 200 reconstitutes the plurality of frequency components of the corrected first audio signal using the Frequency Synthesis Module 218, to produce a corrected first audio signal, whereupon the corrected first audio signal is fed through the Digital to Analog Converter 219, resulting in analog signal $x_{out}(t)$.

In some embodiments, the First and Second Frequency Analysis Modules are composed of digital filter banks which are IIR filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output $x_{out}(t)$.

In some embodiments, the various sub-band channels correspond to critical bands of hearing.

In some embodiments, the First and second Frequency Analysis Modules are digital filter banks composed of wavelet filters.

In some embodiments, the First and Second Frequency Analysis Modules are composed of FFT coprocessors that perform Fourier transforms on the input signals producing $X(t)$ and $X_0(t)$, where the power of each component is found by squaring the Fourier component, and the Frequency Synthesis Module is an FFT coprocessor that performs an inverse Fourier transform, resulting in output signal $x_{out}(t)$.

In some embodiments, the frequency components are grouped together to approximate sub-bands correspond to critical bands of hearing.

In some embodiments, the psychoacoustic model 22 consists of a forward model which computes subjectively perceived Sones in terms of Phons, and an inverse model which computes Phons in terms of Sones, allowing the Psychoacoustic model to be combined into the Conductor Equation, the Conductor Equation 16 being, $$S(P) = S(P + \Delta P) - S(P_0) + S(0) \text{ or,}$$

$$\Delta P = S^{-1}(S(P) + S(P_0) - S(0)) - P,$$

where this equation may be stated as the desired gain in Phons being the Phons amplification necessary to amplify the sound over background noise so that it's subjectively perceived loudness over background noise is the same as the subjectively perceived loudness without the noise, where the function $S(P)$ is found by solving the Earspring equation under experimental boundary conditions, where the Earspring equation 14,15 is written $[d^2/dt^2 + 2\beta(d/dt) + k(1 + \gamma\gamma < y^2 >)]y(t) = \eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P, a solution y(t) to this equation can be found, which can then be converted to $<y^2>$, which represents the perceived loudness S in Sones, resulting in a function $S(P)$, $$S(P) = \frac{(4\tilde{\beta}^2 + \Gamma_{40}^2)}{(4\tilde{\beta}^2 + (\Gamma_{40} S(P))^2)} 10^{(P-40)/10},$$

where $S(P)$ is the perceived loudness in Sones which the listener experiences for a particular sub-band, and P is the sound intensity impinging on the ear in dBPhons for a particular subband, where $\tilde{\beta} = \beta/\sqrt{k}$ and where $\Gamma_{40}$ represents the mean power of vibration at the resonant frequency of the earspring, where the constants $\tilde{\beta}$ and $\Gamma_{40}$ are found by solving the Earspring equation according to experimental boundary conditions.

In some embodiments, the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz. In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

In some embodiments, a computational model is used to estimate Earspring equation solutions $S(P)$ and $S^{-1}(S)$ consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory.

In some embodiments, the psychoacoustic model is replaced by a computational model 124 which is used to approximate the output of the combined psychoacoustic model and conductor equation, where the computation model comprises a quadratic function $$\Delta P \cong \frac{AP^2 + BP + C}{DP^2 + EP + 1},$$

where A, B, C, D, and E are parameters which fit the quadratic function against the solution to the Conductor equation 116, for various values of the threshold elevation $P_0$ and are stored in a lookup table 123.

In some embodiments, the psychoacoustic model 122 is replaced by any numerical function approximator 124 that is fit against the Earspring 114, 115 and Conductor equations 116, and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, discrete sets of parameters are found by dividing the range of possible noise volumes into discrete levels, and where sets of parameters are found for each discrete noise loudness level, where the parameter estimation module 111 is a lookup table, where during real-time processing the ambient noise intensity is measured and used to select the corresponding set of parameters.

In some embodiments, the parameter estimation module 111 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In some embodiments, one or more parameters (e.g. T) is defined as a function of the ambient noise intensity (e.g. $T = P_N - T'$, where $P_N$ is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G=g0+(dP-T)/R-dP$$

where dP is the difference between the signal loudness and noise loudness in decibels, and T' is the threshold offset from the ambient noise intensity to the threshold T.

In some embodiments, a fixed set of parameters is used.

In some embodiments, the fixed parameters fall in the range of 2 to 6 for compression ratio, 15 dB to 25 dB for makeup gain, and −15 to −25 dB for threshold offset. In some embodiments, the fixed parameters fall in the range of 0 to 10 for compression ratio, 0 dB to 30 dB for makeup gain, and −25 to −40 dB for threshold offset. In some embodiments, the fixed parameters fall in the range of 6 to 50 for compression ratio, 10 dB to 50 dB for makeup gain, and −40 to 10 dB for threshold offset.

In some embodiments, the apparatus is a mobile phone.

In some embodiments, the present invention comprises a method of obtaining the solution to the Earspring equation 114,115 and it's inverse function in a computationally efficient manner, using a computational model in which various parameters of the model are fit against a variety of solutions of the Earspring equation, and it's inverse, for various input amplitudes and/or frequencies, where the parameters are stored within a long term memory component. In one exemplary embodiment, the computational model that estimates S(P) may consist of a quadratic function $$S(P) \cong \frac{AP^2+BP+C}{DP^2+EP+1},$$

where A, B, C, D, and E are parameters which fit the quadratic function against the solution to the Earspring equation and are stored in long term memory.

In some embodiments, the present invention comprises a method of obtaining corrective gains ΔP corresponding to a previously determined spectrum of threshold elevations, using the Conductor Equation 116 and perceived loudness models S(P) and $S^{-1}(S)$ based on solutions to the Earspring equation, the Conductor Equation 116 being, $$S(P)=S(P+\Delta P)-S(P_0)+S(0) \text{ or,}$$

$$\Delta P=S^{-1}(S(P)+S(P_0)-S(0))-P,$$

where S(P)=a Sones equation from an EarSpring equation 114,115 solution for the given frequency, as a function of Phons Pressure, and $S^{-1}(S)$ is an inverse function of this solution that gives the sound intensity P in Phons needed for a normal listener to perceive the sound at loudness S in Sones, where P(f)=a Phons amplitude of the frequency component at f of a source signal of interest, and $P_0(f)$=a Phons amplitude of the frequency component at f of a background signal of interest, where Sones is a measure of perceived loudness under subjective experience and Phons is a measure of objective sound intensity, where the Earspring equation 114,115 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)= amplitude of vibration, F(t)=driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P, a solution y(t) to this equation can be found, which can then be converted to $<y^2>$, which as the output of the equation represents the perceived loudness S in Sones, producing a function S(P), $$S(P) = \frac{(4\hat{\beta}^2+\Gamma_{40}^2)}{(4\hat{\beta}^2+(\Gamma_{40}S(P))^2)}10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary conditions.

In some embodiments, the set of boundary parameters comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

In some embodiments, the gains ΔP are obtained in a computationally efficient manner, using a single computational model 124 that combines S(P) and its inverse in the Conductor Equation 116 to obtain a single computational model $$\Delta P \cong \frac{AP^2+BP+C}{DP^2+EP+1},$$

where A, B, C, D, and E are parameters which fit the quadratic function against the Conductor equation and are stored in a lookup table 123.

In some embodiments, the psychoacoustic model is a computational model 124 which may be any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the present invention comprises a method of using parallel compression to approximate a desired non-linear dynamic range compression curve, wherein a compression curve defines the output loudness in decibels versus the input loudness in decibels of a signal of interest, wherein the compression is implemented by applying a gain G to the signal of interest according to the following equation:

$$G=g0+(P-T)*(1/R-1),$$

where G is the gain in dB to be applied to a frequency component of the first audio signal, P is the sound intensity of the frequency component in dB, g0 is the makeup gain in dB, T is the threshold in dB, and R is the compression ratio of the linear compression, whereupon the linearly compressed signal is added together with the original signal, producing a parallel compressed output signal, where the overall amplitude of the input versus the output signal defines a parallel compression curve, where g0, T, and R are thus parameters that vary the shape of the parallel compression curve, and P is the input loudness of the signal of interest,
where the method is comprised of the following steps:
 a) obtaining parameters that shape the parallel compression curve, by fitting compression curves using these parameters against a plurality of desired compression curves and selecting the parameters that minimize the difference between the compression curve of the parallel compression module and each of the desired compression curves,
 b) storing the optimal sets of parameters in a memory device,
 c) during real-time processing, at each time step:
  i. retrieving a set of parameters, depending on the desired compression curve to be used,
  ii. applying the set of parameters, to the parallel compression module; and processing a first audio signal using the time-varying compression parameters, in the parallel compression module, where the parallel compression module is performed by:
   1. applying linear compression to the first audio signal according to the equation $G=g0+(P-T)*(1/R+1)$, producing a linearly compressed
   2. summing the linearly compressed audio signal with the first audio signal In some embodiments, the plurality of desired dynamic range compression curves approximate the ideal compression curves needed to compensate for a plurality of ambient noise signal intensities, so that the derived parallel compression parameters correspond to a plurality of ambient noise loudness levels.

In some embodiments, discrete sets of parameters are found by dividing the range of possible noise volumes into discrete levels, and where sets of parameters are found for each discrete noise loudness level, where the sets of parallel compression parameters are stored in a lookup table, and where during real-time processing the ambient noise intensity is measured and used to select the corresponding set of parameters.

In some embodiments, polynomial regression is used to fit a continuous curve between the ambient noise loudness and each of the parameters, where the parameters of this curve are stored, and where during real time processing the ambient noise loudness is measured and applied to the polynomial function to obtain each parameter T, R, and g0.

In some embodiments, one or more parameters (e.g. T) is defined as a function of the ambient noise intensity (e.g. $T=P_N-T'$, where $P_N$ is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In some embodiments, a fixed set of parameters is used.

In some embodiments, the fixed parameters fall in the range of 2 to 6 for compression ratio, 15 dB to 25 dB for makeup gain, and −15 to −25 dB for threshold offset.

In some embodiments, the signal is divided into a plurality of sub-bands and parallel compression is applied independently to each channel.

In some embodiments, a threshold setting for the parallel compression is set according to a current threshold elevation value, wherein the threshold elevation is a function of a second audio signal.

In some embodiments, the present invention comprises a computer-readable medium 670 storing a set of instructions executable by one or more processors, where the computer-readable medium 670 is effective in producing proper hearing corrections across a spectrum of frequencies by applying corrective gains of amplitude to a plurality of frequency components which constitute a first audio signal, wherein corrective gains are generated for each frequency component by solving for a correction value of ΔP for a source signal, wherein said source signal is a frequency component of the first audio signal corresponding to a particular frequency component, where ΔP is derived from solving for the output of a psychoacoustic model 622.

In some embodiments, the computer-readable medium comprises:
 a) code for solving for the power P(f) in Phons of the source signal of the first audio signal, at each of the frequency components of the first audio signal:
  i. code for extracting a power value of the source signal at a frequency component, in dBFS with a first power estimator block 608, comprising:
   (A) extracting the first audio signal x(t) 602, said first audio signal comprising a plurality of frequency components, where said first audio signal is then transmitted to an Analog to Digital Converter 604 thereby converting the signal into digital format,
   (B) feeding the first audio signal through a First Frequency Analysis Module 606 where the first audio signal is broken down into separate frequency components,
   (C) identifying a the source signal of the first audio signal corresponding to a frequency component 650,
   (D) generating a power value for the source signal, whereby said power value is then fed into a dB Converter to generate a power value $P_{dBFS}(f)$ for the source signal in dBFS 652,
  ii. code for calculating a calibration offset to convert the power value $P_{dBFS}(f)$ of the source signal in dBFS to a power value $P_{dBSPL}(f)$ in dBSPL 610 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between −20 and −12,
  iii. code for converting the power value of the source signal to dB Phons by applying a dBSPL to dBPhon Conversion equation 612, producing P(f),
 b) code for solving for $P_0(f)$ in Phons of the background signal, at the frequency component:
  i. code for extracting a power value of the background signal at the frequency component, in dBFS with a second Power Estimator Block 609, comprising:

(A) extracting a second audio signal $x_0(t)$ 603, said second audio signal comprising a plurality of frequency components, where said second audio signal is then transmitted to a second Analog to Digital Converter 605 thereby converting the signal into digital format, (B) feeding the second audio signal through a Second Frequency Analysis Module 607 where the second audio signal is broken down into separate frequency components, (C) identifying a particular background signal, corresponding to the frequency component 650, (D) obtaining a power value for the background signal, whereby said power value is then fed into a dB Converter to generate a power value $P_{0\_dBFS}(f)$ for the background signal in dBFS 652, ii. code for calculating a calibration offset to convert the power value of the background signal $P_{0\_dBFS}(f)$ in dBFS to a power value $P_{0\_dbSPL}(f)$ in dBSPL using the calibration equation 611 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between $-20$ and $-12$, iii. code for converting the power value of the background signal to dB Phons by applying the dBSPL to dBPhon Conversion equation 613, producing $P_0(f)$, c) code for using the psychoacoustic model 622 to solve for $\Delta P(f)$ using $P(f)$ and $P_0(f)$;

d) code for calculating a correction gain of power $G(f)$, for a frequency f, in dBSPL based on the value of $\Delta P(f)$ in dB Phons, using a Gain equation 617;

e) code for reconstituting the first audio signal with corrective gains to the source signals at each of the frequency components of the first audio signal, comprising
   i. feeding the correction gain to an amplifier wherein the amplifier amplifies the source signal at the frequency component by the corrective gain $G(f)$ 653,
   ii. combining, using a Frequency Synthesis Module 618, the source signals of the corrected signal, producing a corrected first audio signal, $x_{out}(t)$, f) code for feeding the corrected first audio signal through a Digital to Analog Converter 619.

In some embodiments, the computer-readable medium comprises a computer-readable medium 70 storing a set of instructions executable by one or more processors, where the computer-readable medium 1070 is effective in producing proper hearing corrections across a spectrum of frequencies by applying corrective gains of amplitude to a plurality of frequency components which constitute a first audio signal, wherein parallel compression is used to approximate gain curves derived from a psychoacoustic model, wherein the compression is implemented by applying a gain G to the signal of interest according to the following equation:

$$G=g0+(P-T)*(1/R-1)$$

where G is the gain in dB to be applied to a frequency component of the first audio signal, P is the sound intensity of the frequency component in dB, g0 is the makeup gain in dB, T is the threshold in dB, and R is the compression ratio of the linear compression, whereupon the linearly compressed signal is added to the first audio signal, where the overall amplitude of the input versus the output signal defines a parallel compression curve, where g0, T, and R are thus parameters that vary the shape of the resulting compression curve, where the psychoacoustic model takes as inputs a source signal loudness and a noise signal loudness, where the model computes the gain in sound loudness at a given frequency component required to correct for the effect of an ambient noise signal, where the parameters g0, T, and R, for a plurality of noise loudness level, are determined beforehand and stored in memory, where a different set of parameters is retrieved at each instant depending on the ambient noise signal intensity at each frequency component, where the dynamically changing noise signal intensity results in a dynamically changing selection of parameters for the parallel compression module.

In some embodiments, the computer-readable medium comprises:

a) code for, at each frequency component, extracting a power value of the source signal at a frequency component, in dBFS with a first power estimator block 1008; comprising:
   i. extracting the first audio signal x(t) 1002, said first audio signal comprising a plurality of frequency components, where said first audio signal is then transmitted to an Analog to Digital Converter 1004 thereby converting the signal into digital format,
   ii. feeding the first audio signal through a First Frequency Analysis Module 1006 where the first audio signal is broken down into separate frequency components,
   iii. identifying a particular source signal of the first audio signal corresponding to a frequency component 1050,
   iv. generating a power value for the source signal 1051, whereby said power value is then fed into a dB Converter to generate a power value $P_{dBFS}(f)$ for the source signal in dBFS 1052,
   v. code for calculating a calibration offset to convert the power value $P_{dBFS}(f)$ of the source signal in dBFS to a power value $P_{dBSPL}(f)$ in dBSPL 1010 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between $-20$ and $-12$, b) code for extracting a power value of the background signal at the frequency component, in dBFS with a second Power Estimator Block 1009; comprising:
   i. extracting a second audio signal $x_0(t)$ 1002, said second audio signal comprising a plurality of frequency components, where said second audio signal is then transmitted to a second Analog to Digital Converter 1004 thereby converting the signal into digital format,
   ii. feeding the second audio signal through a Second Frequency Analysis Module 1006 where the second audio signal is broken down into separate frequency components,
   iii. identifying a particular background signal, corresponding to the frequency component 1050, iv. obtaining a power value for the background signal 1051, whereby said power value is then fed into a dB Converter to generate a power value $P_{0\_dBFS}(f)$ for the background signal in dBFS 1052, v. code for calculating a calibration offset to convert the power value of the background signal $P_{0\_dBFS}(f)$ in dBFS to a power value $P_{0\_dbSPL}(f)$ in dBSPL using the calibration equation 1010 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12, c) code for determining parameters for the parallel compression module 1022, including compression ratio, makeup gain, and threshold, based on the power value of the background signal, where the parameters have previously been fit against solutions to the Earspring and conductor equations, for a variety of background signal power values, and where the parameters may be retrieved at runtime, given a background signal power;

d) code for applying parallel compression to the source signal 1023, using the stored parameters now retrieved, thereby amplifying the source signal according to the desired compression;

e) code for reconstituting the audio signal with the corrective gain to the source signal at the frequency component, comprising combining, using a Frequency Synthesis Module 1018, the parallel compressed frequency components of the audio signal, producing a corrected audio signal, xout(t);

In some embodiments, the First and Second Frequency Analysis Modules are composed of Digital Filter Banks which are filters that break the signal down into varios channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output $x_{out}(t)$.

In some embodiments, the First and second Frequency Analysis Modules are digital filter banks composed of wavelet filters.

In some embodiments, the various channels correspond to critical bands of hearing.

In some embodiments, the First and Second Frequency Analysis Modules perform a Fourier transform on the input signals producing X(t) and X$_0$(t), where the power of each component is found by squaring the Fourier component, and the Frequency Synthesis Module performs an inverse Fourier transform, resulting in output signal $x_{out}(t)$.

In some embodiments, the psychoacoustic model 122 consists of a forward model which computes subjectively perceived Sones in terms of Phons, and an inverse model which computes Phons in terms of Sones, allowing the Psychoacoustic model to be combined into the Conductor Equation, the Conductor Equation 116 being, $$S(P)=S(P+\Delta P)-S(P_0)+S(0) \text{ or,}$$

$$\Delta P=S^{-1}(S(P)+S(P_0)-S(0))-P,$$

where this equation may be stated as the desired gain in Phons being the Phons amplification necessary to amplify the sound over background noise so that it's subjectively perceived loudness over background noise is the same as the subjectively perceived loudness without the noise, minus some correcting factor, where the function S(P) is found by solving the Earspring equation under experimental boundary conditions, where the Earspring equation 114,115 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)= driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P, a solution y(t) to this equation can be found, which can then be converted to $<y^2>$, which as the output of the equation represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary conditions.

In some embodiments, the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

In some embodiments, the computational model 122 is used to estimate S(P) and S$^{-1}$(S) consisting of a quadratic function $$S(P) \cong \frac{AP^2 + BP + C}{DP^2 + EP + 1},$$

where A, B, C, D, and E are parameters which fit the quadratic function against the solution to the Earspring and Conductor equations and are stored in long term memory.

In some embodiments, the computational model 122 is used to estimate ΔP consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in a lookup table 123.

In some embodiments, the computational model 122 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the first audio signal comprises a plurality of frequency components and wherein a corrective gain corresponding to each respective component is processed and applied to each component in parallel, before summation.

In some embodiments, the first audio signal contains more than one frequency component and steps (a) through (d) are repeated in series for all frequencies in the spectrum, before proceeding to step (e).

In some embodiments, the first audio signal contains more than one frequency component and steps (a) through (d) are in part computed in parallel and in part computed in series, before proceeding to step (e).

In some embodiments, either the Earspring equation or its inverse are estimated using separate computational models as in claim 5, replacing either step (a)(vi) or (a)(vii), respectively.

In some embodiments, the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=$-1/120$ when ATH(F)>0
 =$+1/240$ when ATH(F)<0

In some embodiments the Gain equation 17 is:

$$\Delta P_{dBSPL}(F) = \Delta P_{dBPhon}(F)(1+kATH(F))$$

where
F=frequency
ATH(F)=Absolute Threshold of Hearing
K=$-1/120$ when ATH(F)>0
 =$+1/240$ when ATH(F)<0

In some embodiments, the absolute threshold of hearing is computed by the formula:

$$ATH(F) = \frac{3.64}{F_{KHz}^{0.8}} - 6.5e^{-0.6(F_{kHz}-3.3)^2} + 0.001F_{kHz}^4 - 3.37$$

In some embodiments, discrete sets of parameters are found by dividing the range of possible noise signal intensities into discrete levels, and where sets of parameters are found for each discrete noise intensity level, where the parameter estimation module 111 is a lookup table, where during real-time processing the ambient noise intensity is measured and used to select the corresponding set of parameters.

In some embodiments, the parameter estimation module 111 is a polynomial continuous curve defining the relationship between the ambient noise loudness and each of the parameters, where polynomial regression is used to find parameters which define this curve, where these parameters are then stored in memory.

In some embodiments, one or more parameters (e.g. T) is defined as a function of the ambient noise intensity (e.g. T=$P_N$–T', where $P_N$ is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G = g0 + (dP-T')/R - dP$$

where dP is the difference between the signal intensity and noise intensity in decibels, and T' is the threshold offset from the ambient noise intensity to the threshold T.

In some embodiments, a fixed set of parameters is used.

In some embodiments, the fixed parameters fall in the range of 2 to 6 for compression ratio, 15 dB to 25 dB for makeup gain, and –15 to –25 dB for threshold offset.

In some embodiments, there are a plurality of source audio signals corresponding to the various signals of a stereo or surround sound audio system, and where gains for each channel are independently computed and applied to each channel.

In some embodiments, there are a plurality of source audio signals corresponding to the various signals of a stereo or surround sound audio system, and a plurality of background noise signals, one for each channel, and where gains for each channel are independently computed, according to the source and noise signal for each channel, and applied to each channel.

In some embodiments, the microprocessor is a DSP chip.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:

1. An apparatus 100, effective in enhancing a first audio signal in the face of ambient background noise, by applying corrective gains to a plurality of frequency components which constitute the first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the ambient background noise $P_0$, wherein corrective gains are generated for each frequency component by solving for a correction gain ΔP for the first audio signal which will suffice to raise the volume of each frequency component of the first audio signal so that the user will perceive it above background noise, by the loudness amount equivalent to how the first audio signal would be perceived in a noiseless environment, the apparatus 100 comprising:

a. a first audio source 02, configured to extract a first audio signal where the first audio signal is a broadband audio signal of interest, the first audio source operatively connected to a microprocessor 01;

b. a second audio source 03, configured for extracting a second audio signal comprising ambient broadband audio in the environment, the second audio source operatively connected to the microprocessor 01; the microprocessor 01, configured to execute applications for:

i. a first Analog to Digital converter 04;
    ii. a second Analog to Digital converter 05;
    iii. a first Frequency Analysis Module 06;
    iv. a second Frequency Analysis Module 07;
    v. a first Power Estimator Block 08;
    vi. a second Power Estimator Block 09;
    vii. a first dBFS to dBSPL Converter 10;
    viii. a second dBFS to dBSPL Converter 11;
    ix. a first dBSPL to dB Phon Converter 12;
    x. a second dBSPL to dB Phon Converter 13;
    xi. a Psychoacoustic model 22;
    xii. a Gain Block component 17;
    xiii. a Frequency Synthesis Module 18; and
    xiv. a Digital to Analog Converter 19;

wherein (i) the first audio source 02 extracts the first audio signal x(t), where the first audio signal is then transmitted to the first Analog to Digital Converter 04 thereby converting the first audio signal into digital format; and, (ii) the second audio source 03 extracts a second audio signal $x_0(t)$, where said second audio signal is then transmitted to the second Analog to Digital Converter 05 thereby converting the second audio signal into digital format, whereupon the first audio signal and the second audio signal are fed, respectively, through the First Frequency Analysis Module 06 and Second Frequency Analysis Module 07 breaking down each respective audio signal into separate pluralities of frequency components, whereupon, for each frequency component of the first audio signal, the apparatus 100 identifies a source signal and a background signal, where said source signal is a frequency component of the first audio signal and the background signal is the frequency component of the second audio signal 50, whereupon both the source signal and the background signal are fed, respectively, through the first Power Estimator 08 and the Second Power Estimator 09, which compute power values for the source signal $P_{dBFS}(f)$ and the background signal $P_{0\_dBFS}(f)$ in dBFS 52, whereupon (i) the microprocessor 01 completes a calibration offset such that a first dBFS to dBSPL Converter 10 converts the power value of the source signal from dBFS to dBSPL, and (ii) the microprocessor 01 completes a calibration offset such that a second dBFS to dBSPL Converter 11 converts the power value of the background signal from dBFS to dBSPL, producing $P_{dBSPL}(f)$ for the source signal and $P_{0\_dBSPL}(f)$ for the background signal, whereupon (i) a first dBSPL-dB Phon Converter 12 converts the power value of the source signal to dB Phons by applying a dBSPL to dBPhon Conversion equation, giving P(f) and (ii) a second dBSPL-dB Phon Converter 13 converts the power value of the background signal to dB Phons by applying the dBSPL to dBPhon Conversion equation, giving $P_0(f)$, whereupon the microprocessor 01 applies the power value of the source signal and the power value of the background signal, now in dB Phons, to the psychoacoustic model 22 whereupon the microprocessor 01 calculates ΔP(f) in dBPhons, whereupon the microprocessor 01 calculates a correction gain of power to the source signal G(f), at the frequency, in dBSPL, based on the value of ΔP(f) in dB Phons, using the Gain Block component 17 which utilizes the Gain equation, whereupon the apparatus 100 reconstitutes the first audio signal with the corrective gains to the source signals corresponding to each of the frequency components, comprising:

(i) multiplying the source signal corresponding to each of the frequency components according to the corresponding corrective gain ΔP(f), producing a corrected source signal,
    (ii) combining the corrected source signals using the Frequency Synthesis Module 18, to producing a corrected first audio signal whereupon the corrected first audio signal is fed through the Digital to Analog Converter 19, resulting in analog signal $x_{out}(t)$.

2. An apparatus 200, effective in enhancing an audio signal, by applying corrective gains to a plurality of frequency components which constitute a first audio signal, wherein parallel compression is used to approximate gain curves derived from a psychoacoustic model, wherein the parallel compression is implemented by applying a gain G to a signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the apparatus 200 comprising:

a) a first audio source 202, configured to extract a first audio signal, where the first audio signal is a broadband audio signal of interest, the first audio source operatively connected to a microprocessor 201;

b) a second audio source 203, configured for extracting a second audio signal from the environment where the second audio signal is ambient noise, the second audio source operatively connected to the microprocessor 201;

c) the microprocessor 201, operatively connected to a Speaker 220, and an Amplifier 219; the microprocessor 201 configured to execute applications for:
        i. a first Analog to Digital converter 204,
        ii. a second Analog to Digital converter 205,
        iii. a first frequency analysis module 206, configured to extract a plurality of frequency components from the first audio signal,
        iv. a second frequency analysis module 207, configured to extract a plurality of frequency components from the second audio signal,
        v. a first power estimation block 208, configured to calculate the sound intensity in decibels of each frequency component of the first audio signal 002,
        vi. a second power estimation block 209, configured to calculate the sound intensity of decibels of each frequency component of the second audio signal 003,
        vii. a first dBFS to dBSPL Converter 210, viii. a second dBFS to dBSPL Converter 211,
ix. a parameter estimation module, which determines parameter settings for a parallel compression module, according to information stored in memory,
x. the parallel compression module 215, parameterized by threshold T, compression ratio R, and makeup gain g0, where the parameters may by dynamically varied, where the parallel compression module is comprised of:
   a. a linear compression module 214, which applies gains to the first audio signal according to the equation $$G = g0 + (P-T)*(1/R-1),$$

where G is the gain in dB to be applied to a frequency component of the first audio signal, P is the sound intensity of the frequency component in dB, g0 is the makeup gain in dB, T is the threshold in dB, and R is the compression ratio of the linear compression,
   b. a summer, which combines the resulting amplified first audio signal component with the original first audio signal component,
xi. a Frequency Synthesis Module 216; and
xii. a Digital to Analog Converter 219;
wherein (i) the first audio source 202 extracts the first audio signal x(t), where the first audio signal is then transmitted to the first Analog to Digital Converter 204 thereby converting the first audio signal into digital format; and, (ii) the second audio source 203 extracts the second audio signal $x_0(t)$, where said second audio signal is then transmitted to the second Analog to Digital Converter 205 thereby converting the second audio signal into digital format,
whereupon the first audio signal and the second audio signal are fed, respectively, through the First Frequency Analysis Module 206 and Second Frequency Analysis Module 207 breaking down each respective audio signal into separate components,
whereupon, for each frequency component, the apparatus 200 identifies a source signal and a background signal corresponding to a frequency component 250, and said signals are thereafter transmitted to the microprocessor 201,
whereupon, for each frequency component, both the source signal and the background signal are fed, respectively, through the first Power Estimator 208 and the Second Power Estimator 209, which compute power values for the signals, whereby said power values are then fed into the dB Converter to generate power values for the source signal $P_{dBFS}(f)$ and the background signal $P_{0\_dBFS}(f)$ in dBFS 252,
whereupon, for each frequency component, and at each instant, the microprocessor, using the power estimates of the source signal and background signal, obtains parameters for the parallel compression, depending on the sound intensity of the background signal at each instant,
whereupon the microprocessor, applies the parameters to a parallel compression module,
whereupon the parallel compression module applies a linear compression, according to the selected parameters, to each of the frequency components of the first audio signal,
whereupon the parallel compression module sums each frequency component of the first audio signal with the corresponding compressed audio signal,
whereupon the apparatus 200 reconstitutes the plurality of frequency components of the corrected first audio signal using the Frequency Synthesis Module 218, to produce a corrected first audio signal,
whereupon the corrected first audio signal is fed through the Digital to Analog Converter 219, resulting in analog signal $x_{out}(t)$.

3. The apparatus of claim 1-2, where the First and Second Frequency Analysis Modules are composed of digital filter banks which are IIR filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output $x_{out}(t)$.

4. The apparatus of claim 3, where the various sub-band channels correspond to critical bands of hearing.

5. The apparatus of claim 1-2, where the First and second Frequency Analysis Modules are digital filter banks composed of wavelet filters.

6. The apparatus of claim 1-2, where the First and Second Frequency Analysis Modules are composed of FFT coprocessors that perform Fourier transforms on the input signals producing X(t) and $X_0(t)$, where the power of each component is found by squaring the Fourier component, and the Frequency Synthesis Module is an FFT coprocessor that performs an inverse Fourier transform, resulting in output signal $x_{out}(t)$.

7. The apparatus of claim 6, where the frequency components are grouped together to approximate sub-bands correspond to critical bands of hearing.

8. The apparatus of claim 1-2, where the psychoacoustic model 22 consists of a forward model which computes subjectively perceived Sones in terms of Phons, and an inverse model which computes Phons in terms of Sones, allowing the Psychoacoustic model to be combined into the Conductor Equation, the Conductor Equation 16 being, $$S(P) = S(P+\Delta P) - S(P_0) + S(0) \text{ or,}$$

$$\Delta P = S^{-1}(S(P) + S(P_0) - S(0)) - P,$$

where this equation may be stated as the desired gain in Phons being the Phons amplification necessary to amplify the sound over background noise so that it's subjectively perceived loudness over background noise is the same as the subjectively perceived loudness without the noise, where the function S(P) is found by solving the Earspring equation under experimental boundary conditions, where the Earspring equation 14,15 is written $[d^2/dt^2 + 2\beta(d/dt) + k(1+\gamma\gamma<y^2>)]y(t) = \eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and r=the scale factor, where for a particular frequency of the driving force F(t), which represents a pure sinusoid of intensity P, a solution y(t) to this equation can be found, which can then be converted to $<y^2>$, which represents the perceived loudness S in Sones, resulting in a function S(P), $$S(P) = \frac{(4\beta^2 + \Gamma_{40}^2)}{(4\beta^2 + (\Gamma_{40}S(P))^2)} 10^{(P-40)/10},$$

where S(P) is the perceived loudness in Sones which the listener experiences for a particular sub-band, and P is the sound intensity impinging on the ear in dBPhons for a particular subband, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary conditions, 9. The apparatus of claim 8, where the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

10. The apparatus of claim 9, where a computational model is used to estimate Earspring equation solutions S(P) and $S^{-1}$(S) consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory.

11. The apparatus of claim 9, where the psychoacoustic model is replaced by a computational model 124 which is used to approximate the output of the combined psychoacoustic model and conductor equation, where the computation model comprises a quadratic function $$\Delta P \cong \frac{AP^2 + BP + C}{DP^2 + EP + 1},$$

where A, B, C, D, and E are parameters which fit the quadratic function against the solution to the Conductor equation 116, for various values of the threshold elevation $P_0$ and are stored in a lookup table 123.

12. The apparatus of claim 9, where the psychoacoustic model 122 is replaced by any numerical function approximator 124 that is fit against the Earspring 114, 115 and Conductor equations 116, and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

13. The apparatus of claim 2, where discrete sets of parameters are found by dividing the range of possible noise volumes into discrete levels, and where sets of parameters are found for each discrete noise loudness level, where the parameter estimation module 111 is a lookup table, where during real-time processing the ambient noise intensity is measured and used to select the corresponding set of parameters.

14. The apparatus of claim 2, where the parameter estimation module 111 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

15. The apparatus of claim 2, where one or more parameters (e.g. T) is defined as a function of the ambient noise intensity (e.g. $T=P_N-T'$, where $P_N$ is noise loudness), such that the parameters stored (e.g. T') are the parameters of the function defining the relationship between sound intensity (e.g. $P_N$) and the parameter (e.g. T) of the parallel compression.

16. The apparatus of claim 2, where the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

17. The apparatus of claim 16, where a fixed set of parameters is used.

18. The apparatus of claim 17, where the fixed parameters fall in the range of 2 to 6 for compression ratio, 15 dB to 25 dB for makeup gain, and −15 to −25 dB for threshold offset.

19. The apparatus 100 of claim 1-2, wherein the apparatus is a mobile phone.

20. A method of obtaining the solution to the Earspring equation 114,115 and it's inverse function in a computationally efficient manner, using a computational model in which various parameters of the model are fit against a variety of solutions of the Earspring equation, and it's inverse, for various input amplitudes and/or frequencies, where the parameters are stored within a long term memory component. In one exemplary embodiment, the computational model that estimates S(P) may consist of a quadratic function $$S(P) \cong \frac{AP^2 + BP + C}{DP^2 + EP + 1},$$

where A, B, C, D, and E are parameters which fit the quadratic function against the solution to the Earspring equation and are stored in long term memory.

21. A method of obtaining corrective gains $\Delta P$ corresponding to a previously determined spectrum of threshold elevations, using the Conductor Equation 116 and perceived loudness models S(P) and $S^{-1}$(S) based on solutions to the Earspring equation, the Conductor Equation 116 being, $$S(P)=S(P+\Delta P)-S(P_0)+S(0) \text{ or,}$$

$$\Delta P=S^{-1}(S(P)+S(P_0)-S(0))-P,$$

where S(P)=a Sones equation from an EarSpring equation 114,115 solution for the given frequency, as a function of Phons Pressure, and $S^{-1}$(S) is an inverse function of this solution that gives the sound intensity P in Phons needed for a normal listener to perceive the sound at loudness S in Sones, where P(f)=a Phons amplitude of the frequency component at f of a source signal of interest, and $P_0$(f)=a Phons amplitude of the frequency component at f of a background signal of interest, where Sones is a measure of perceived loudness under subjective experience and Phons is a measure of objective sound intensity, where the Earspring equation 114,115 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P, a solution y(t) to this equation can be found, which can then be converted to <y²>, which as the output of the equation represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary conditions, 22. The method of claim 21, where the set of boundary parameters comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

23. The method of claim 21, where the gains ΔP are obtained in a computationally efficient manner, using a single computational model 124 that combines S(P) and its inverse in the Conductor Equation 116 to obtain a single computational model $$\Delta P \cong \frac{AP^2 + BP + C}{DP^2 + EP + 1},$$

where A, B, C, D, and E are parameters which fit the quadratic function against the Conductor equation and are stored in a lookup table 123.

24. The method of claim 21, where the psychoacoustic model is a computational model 124 which may be any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

25. A method of using parallel compression to approximate a desired non-linear dynamic range compression curve, wherein a compression curve defines the output loudness in decibels versus the input loudness in decibels of a signal of interest, wherein the compression is implemented by applying a gain G to the signal of interest according to the following equation:

$G=g0+(P-T)*(1/R-1),$ where G is the gain in dB to be applied to a frequency component of the first audio signal, P is the sound intensity of the frequency component in dB, g0 is the makeup gain in dB, T is the threshold in dB, and R is the compression ratio of the linear compression, whereupon the linearly compressed signal is added together with the original signal, producing a parallel compressed output signal, where the overall amplitude of the input versus the output signal defines a parallel compression curve, where g0, T, and R are thus parameters that vary the shape of the parallel compression curve, and P is the input loudness of the signal of interest, where the method is comprised of the following steps:

a) obtaining parameters that shape the parallel compression curve, by fitting compression curves using these parameters against a plurality of desired compression curves and selecting the parameters that minimize the difference between the compression curve of the parallel compression module and each of the desired compression curves, b) storing the optimal sets of parameters in a memory device, c) during real-time processing, at each time step:
  i. retrieving a set of parameters, depending on the desired compression curve to be used,
  ii. applying the set of parameters, to the parallel compression module; and processing a first audio signal using the time-varying compression parameters. in the parallel compression module, where the parallel compression module is performed by:
    1. applying linear compression to the first audio signal according to the equation G=g0+(P-T)*(1/R-1), producing a linearly compressed
    2. summing the linearly compressed audio signal with the first audio signal 26. The method of claim 25, where the plurality of desired dynamic range compression curves approximate the ideal compression curves needed to compensate for a plurality of ambient noise signal intensities, so that the derived parallel compression parameters correspond to a plurality of ambient noise loudness levels.

27. The method of claim 26, where discrete sets of parameters are found by dividing the range of possible noise volumes into discrete levels, and where sets of parameters are found for each discrete noise loudness level, where the sets of parallel compression parameters are stored in a lookup table, and where during real-time processing the ambient noise intensity is measured and used to select the corresponding set of parameters.

28. The method of claim 26, where polynomial regression is used to fit a continuous curve between the ambient noise loudness and each of the parameters, where the parameters of this curve are stored, and where during real time processing the ambient noise loudness is measured and applied to the polynomial function to obtain each parameter T, R, and g0.

29. The method of claim 26, where one or more parameters (e.g. T) is defined as a function of the ambient noise intensity (e.g. T=$P_N$–T', where $P_N$ is noise loudness), such that the parameters stored (e.g. T') are the parameters of the function defining the relationship between sound intensity (e.g. $P_N$) and the parameter (e.g. T) of the parallel compression.

30. The method of claim 26, where the gain equation is expressed as a function of the difference between signal intensity and noise intensity:

$G=g0+(dP-T')/R-dP$ where dP is the difference between the signal loudness and noise loudness in decibels, and T' is the threshold offset from the ambient noise intensity to the threshold T.

31. The method of claim 30, where a fixed set of parameters is used.

32. The method of claim 31, where the fixed parameters fall in the range of 2 to 6 for compression ratio, 15 dB to 25 dB for makeup gain, and –15 to –25 dB for threshold offset.

33. The method of claim 26, wherein the signal is divided into a plurality of sub-bands and parallel compression is applied independently to each channel.

34. The method of claim 25, wherein a threshold setting for the parallel compression is set according to a current threshold elevation value, wherein the threshold elevation is a function of a second audio signal.

35. A computer-readable medium 670 storing a set of instructions executable by one or more processors, where the computer-readable medium 670 is effective in producing proper hearing corrections across a spectrum of frequencies by applying corrective gains of amplitude to a plurality of frequency components which constitute a first audio signal, wherein corrective gains are generated for each frequency component by solving for a correction value of ΔP for a source signal, wherein said source signal is a frequency component of the first audio signal corresponding to a particular frequency component, where ΔP is derived from solving for the output of a psychoacoustic model 615,
the computer-readable medium comprising:

a) code for solving for the power P(f) in Phons of the source signal of the first audio signal, at each of the frequency components of the first audio signal:
   i. code for extracting a power value of the source signal at a frequency component, in dBFS with a first power estimator block, comprising:
      1. extracting the first audio signal x(t) 602, said first audio signal comprising a plurality of frequency components, where said first audio signal is then transmitted to an Analog to Digital Converter 604 thereby converting the signal into digital format,
      2. feeding the first audio signal through a First Frequency Analysis Module 606 where the first audio signal is broken down into separate frequency components,
      3. identifying a the source signal of the first audio signal corresponding to a frequency component 650,
      4. generating a power value for the source signal 651, whereby said power value is then fed into a dB Converter to generate a power value $P_{dBFS}(f)$ for the source signal in dBFS 652,
   ii. code for calculating a calibration offset to convert the power value $P_{dBFS}(f)$ of the source signal in dBFS to a power value $P_{dBSPL}(f)$ in dBSPL 610 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$–dBFS$_0$) wherein dBSPL$_0$ is nominally a value between 65 and 83, and wherein dBFS$_0$ is nominally a value between –20 and –12,
   iii. code for converting the power value of the source signal to dB Phons by applying a dBSPL to dBPhon Conversion equation 612, producing P(f),
b) code for solving for $P_0(f)$ in Phons of the background signal, at the frequency component:
   i. code for extracting a power value of the background signal at the frequency component, in dBFS with a second Power Estimator Block, comprising:
      1. extracting a second audio signal $x_0(t)$ 603, said second audio signal comprising a plurality of frequency components, where said second audio signal is then transmitted to a second Analog to Digital Converter 605 thereby converting the signal into digital format,
      2. feeding the second audio signal through a Second Frequency Analysis Module 607 where the second audio signal is broken down into separate frequency components,
      3. identifying a particular background signal, corresponding to the frequency component 650,
      4. obtaining a power value for the background signal, 651 whereby said power value is then fed into a dB Converter to generate a power value $P_{0\_dBFS}(f)$ for the background signal in dBFS 652,
   ii. code for calculating a calibration offset to convert the power value of the background signal $P_{0\_dBFS}(f)$ in dBFS to a power value $P_{0\_dbSPL}(f)$ in dBSPL using the calibration equation 611 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$–dBFS$_0$) wherein dBSPL$_0$ is nominally a value between 65 and 83, and wherein dBFS$_0$ is nominally a value between –20 and –12,
   iii. code for converting the power value of the background signal to dB Phons by applying the dBSPL to dBPhon Conversion equation 613, producing $P_0(f)$,
c) code for using the psychoacoustic model 616 to solve for ΔP(f) using P(f) and $P_0(f)$;
d) code for calculating a correction gain of power G(f), for a frequency f, in dBSPL based on the value of ΔP(f) in dB Phons, using a Gain equation 617;
e) code for reconstituting the first audio signal with corrective gains to the source signals at each of the frequency components of the first audio signal, comprising
   i. feeding the correction gain to an amplifier wherein the amplifier amplifies the source signal at the frequency component by the corrective gain G(f) 653,
   ii. combining, using a Frequency Synthesis Module 618, the source signals of the corrected signal, producing a corrected first audio signal, $x_{out}(t)$,
f) code for feeding the corrected first audio signal through a Digital to Analog Converter 619.

36. A computer-readable medium 1070 storing a set of instructions executable by one or more processors, where the computer-readable medium 1070 is effective in producing proper hearing corrections across a spectrum of frequencies by applying corrective gains of amplitude to a plurality of frequency components which constitute a first audio signal, wherein parallel compression is used to approximate gain curves derived from a psychoacoustic model, wherein the compression is implemented by applying a gain G to the signal of interest according to the following equation:

$$G = g0 + (P-T)*(1/R-1),$$

where G is the gain in dB to be applied to a frequency component of the first audio signal, P is the sound intensity of the frequency component in dB, g0 is the makeup gain in dB, T is the threshold in dB, and R is the compression ratio of the linear compression,
whereupon the linearly compressed signal is added to the first audio signal, where the overall amplitude of the input versus the output signal defines a parallel compression curve, where g0, T, and R are thus parameters that vary the shape of the resulting compression curve, where the psychoacoustic model takes as inputs a source signal loudness and a noise signal loudness, where the model computes the gain in sound loudness at a given frequency component required to correct for the effect of an ambient noise signal, where the parameters g0, T, and R, for a plurality of noise loudness level, are determined beforehand and stored in memory, where a different set of parameters is retrieved at each instant depending on the ambient noise signal intensity at each frequency component, where the dynamically changing noise signal intensity results in a dynamically changing selection of parameters for the parallel compression module,
the computer-readable medium comprising:
  a) code for, at each frequency component, extracting a power value of the source signal at a frequency component, in dBFS with a first power estimator block 1008; comprising:
    i. extracting the first audio signal x(t) 1002, said first audio signal comprising a plurality of frequency components, where said first audio signal is then transmitted to an Analog to Digital Converter 1004 thereby converting the signal into digital format,
    ii. feeding the first audio signal through a First Frequency Analysis Module 1006 where the first audio signal is broken down into separate frequency components,
    iii. identifying a particular source signal of the first audio signal corresponding to a frequency component 1050,
    iv. generating a power value for the source signal 1051, whereby said power value is then fed into a dB Converter to generate a power value $P_{dBFS}(f)$ for the source signal in dBFS 1052,
    v. code for calculating a calibration offset to convert the power value $P_{dBFS}(f)$ of the source signal in dBFS to a power value $P_{dBSPL}(f)$ in dBSPL 1010 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between $-20$ and $-12$,
  b) code for extracting a power value of the background signal at the frequency component, in dBFS with a second Power Estimator Block 1009; comprising:
    i. extracting a second audio signal $x_0(t)$ 1002, said second audio signal comprising a plurality of frequency components, where said second audio signal is then transmitted to a second Analog to Digital Converter 1004 thereby converting the signal into digital format,
    ii. feeding the second audio signal through a Second Frequency Analysis Module 1006 where the second audio signal is broken down into separate frequency components,
    iii. identifying a particular background signal, corresponding to the frequency component 1050,
    iv. obtaining a power value for the background signal, whereby said power value is then fed into a dB Converter to generate a power value $P_{0\_dBFS}(f)$ for the background signal in dBFS 1051,
    v. code for calculating a calibration offset to convert the power value of the background signal $P_{0\_dBFS}(f)$ in dBFS to a power value $P_{0\_dbSPL}(f)$ in dBSPL using the calibration equation 1010 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between $-20$ and $-12$,
  c) code for determining parameters for the parallel compression module 1022, including compression ratio, makeup gain, and threshold, based on the power value of the background signal, where the parameters have previously been fit against solutions to the Earspring and conductor equations, for a variety of background signal power values, and where the parameters may be retrieved at runtime, given a background signal power;
  d) code for applying parallel compression to the source signal 1023, using the stored parameters now retrieved, thereby amplifying the source signal according to the desired compression
  e) code for reconstituting the audio signal with the corrective gain to the source signal at the frequency component, comprising combining, using a Frequency Synthesis Module 1018, the parallel compressed frequency components of the audio signal, producing a corrected audio signal, xout(t).

37. The computer readable media storing a set of instruction of claim 35-36, where the First and Second Frequency Analysis Modules are composed of Digital Filter Banks which are filters that break the signal down into various channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output $x_{out}(t)$.

38. The computer readable media storing a set of instruction of claim 35-36, where the First and second Frequency Analysis Modules are digital filter banks composed of wavelet filters.

39. The computer readable media storing a set of instruction of claim 37, where the various channels correspond to critical bands of hearing.

40. The computer readable media storing a set of instruction of claim 35-36, where the First and Second Frequency Analysis Modules perform a Fourier transform on the input signals producing X(t) and $X_0(t)$, where the power of each component is found by squaring the Fourier component, and the Frequency Synthesis Module performs an inverse Fourier transform, resulting in output signal $x_{out}(t)$.

41. The computer readable media storing a set of instruction of claim 40, where the frequency components are grouped together to approximate sub-bands correspond to critical bands of hearing.

42. The computer readable media storing a set of instruction of claim 35-36, where the psychoacoustic model 122 consists of a forward model which computes subjectively perceived Sones in terms of Phons, and an inverse model which computes Phons in terms of Sones, allowing the Psychoacoustic model to be combined into the Conductor Equation, the Conductor Equation 116 being, $$S(P)=S(P+\Delta P)-S(P_0)+S(0) \text{ or,}$$

$$\Delta P=S^{-1}(S(P)+S(P_0)-S(0))-P,$$

where this equation may be stated as the desired gain in Phons being the Phons amplification necessary to amplify the sound over background noise so that it's subjectively perceived loudness over background noise is the same as the subjectively perceived loudness without the noise, minus some correcting factor, where the function S(P) is found by solving the Earspring equation under experimental boundary conditions, where the Earspring equation 114,115 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $\langle y^2 \rangle$=mean power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P, a solution y(t) to this equation can be found, which can then be converted to $\langle y^2 \rangle$, which as the output of the equation represents the perceived loudness S in Sones, producing a function S(P), $$S(P) = \frac{(4\hat{\beta}^2 + \Gamma_{40}^2)}{(4\hat{\beta}^2 + (\Gamma_{40} S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary conditions.

43. The computer readable media storing a set of instruction of claim 42, where the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

44. The computer readable media storing a set of instruction of claim 35, where the computational model 122 is used to estimate S(P) and $S^{-1}(S)$ consisting of a quadratic function $$S(P) \cong \frac{AP^2 + BP + C}{DP^2 + EP + 1},$$

where A, B, C, D, and E are parameters which fit the quadratic function against the solution to the Earspring and Conductor equations and are stored in long term memory.

45. The computer readable media storing a set of instruction of claim 35, where the computational model 122 is used to estimate $\Delta P$ consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in a lookup table 123.

46. The computer readable media storing a set of instruction of claim 35, where the computational model 122 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

47. The computer-readable media storing a set of instructions of claims 35-36, wherein the first audio signal comprises a plurality of frequency components and wherein a corrective gain corresponding to each respective component is processed and applied to each component in parallel, before summation.

48. The computer-readable medium storing a set of instructions of claims 35-36, wherein the first audio signal contains more than one frequency component and steps (a) through (d) are repeated in series for all frequencies in the spectrum, before proceeding to step (e).

49. The computer-readable medium storing a set of instructions of claims 35-36, wherein the first audio signal contains more than one frequency component and steps (a) through (d) are in part computed in parallel and in part computed in series, before proceeding to step (e).

50. The computer readable medium storing a set of instructions of claims 35-36, in which either the Earspring equation or its inverse are estimated using separate computational models as in claim 5, replacing either step (a) (vi) or (a)(vii), respectively.

51. The apparatus of claim 1, and the computer readable medium storing a set of instructions of claim 35, wherein the dBSPL to dBPhon Conversion equation 12,13 is:

$$P_{dBPhon}(F) = \frac{P_{dBSPL}(F) - ATH(F)}{1 + k ATH(F)}$$

where
F=frequency
ATH(F)=Absolute Threshold of Hearing
K=$-1/120$ when ATH(F)>0
 =$+1/240$ when ATH(F)<0

52. The apparatus of claim 1, and the computer readable medium storing a set of instructions of claim 35, wherein the Gain equation 17 is:

$$\Delta P_{dBSPL}(F) = \Delta P_{dBPhon}(F)(1 + k ATH(F))$$

where
F=frequency
ATH(F)=Absolute Threshold of Hearing
K=$-1/120$ when ATH(F)>0
 =$+1/240$ when ATH(F)<0

53. The apparatus of claim 1, and the computer readable medium storing a set of instructions of claim 35, where the absolute threshold of hearing is computed by the formula:

$$ATH(F) = \frac{3.64}{F_{KHz}^{0.8}} - 6.5 e^{-0.6(F_{kHz}-3.3)^2} + 0.001 F_{kHz}^4 - 3.37$$

54. The computer readable media storing a set of instruction of claim 36, where discrete sets of parameters are found by dividing the range of possible noise signal intensities into discrete levels, and where sets of parameters are found for each discrete noise intensity level, where the parameter estimation module 111 is a lookup table, where during real-time processing the ambient noise intensity is measured and used to select the corresponding set of parameters.

55. The computer readable media storing a set of instruction of claim 54, where the parameter estimation module 111 is a polynomial continuous curve defining the relationship between the ambient noise loudness and each of the parameters, where polynomial regression is used to find parameters which define this curve, where these parameters are then stored in memory.

56. The computer readable media storing a set of instruction of claim 54, where one or more parameters (e.g. T) is defined as a function of the ambient noise intensity (e.g. T=$P_N$-T', where $P_N$ is noise loudness), such that the parameters stored (e.g. T') are the parameters of the function defining the relationship between sound intensity (e.g. $P_N$) and the parameter (e.g. T) of the parallel compression.

57. The computer readable media storing a set of instruction of claim 54, where the gain equation is expressed as a function of the difference between signal intensity and noise intensity:

$$G=g0+(dP-T')/R-dP$$

where dP is the difference between the signal intensity and noise intensity in decibels, and T' is the threshold offset from the ambient noise intensity to the threshold T.

58. The computer readable media storing a set of instruction of claim 57, where a fixed set of parameters is used.

59. The computer readable media storing a set of instruction of claim 58, where the fixed parameters fall in the range of 2 to 6 for compression ratio, 15 dB to 25 dB for makeup gain, and −15 to −25 dB for threshold offset.

60. The apparatus of claim 1-2, and the computer readable medium storing a set of instructions of claim 35-36, where there are a plurality of source audio signals corresponding to the various signals of a stereo or surround sound audio system, and where gains for each channel are independently computed and applied to each channel.

61. The apparatus of claim 1-2, and the computer readable medium storing a set of instructions of claim 35-36, where there are a plurality of source audio signals corresponding to the various signals of a stereo or surround sound audio system, and a plurality of background noise signals, one for each channel, and where gains for each channel are independently computed, according to the source and noise signal for each channel, and applied to each channel.

62. The apparatus of claim 1-2, where the microprocessor is a DSP chip.

HEADSET FEATURING DYNAMIC SPECTRAL CORRECTION OF AUDIO SIGNALS

Background of the Invention

The present invention relates to the field of audio processing and more specifically to compensation for noise in the listener's environment.

A headset may be a set of headphones for allowing the user to listen to audio signals, or may be a two-way communication device worn on the head with a microphone for the user to speak through.

Headsets are often worn by personnel in environments of varying noise. Noise cancellation is a common technique used to compensate for noise, to allow the user to hear what is sent through the headset without the need to constantly adjust the volume. However, noise cancellation, by definition, reduces the user's awareness of external noises, which depending on the user's environment, he may need to be aware of. For example, military personnel working in noisy combat environments need to hear commands sent over headphones, but also need to be aware of sounds such as gunfire in their vicinity to maintain situational awareness. A person listening to music while crossing a busy street similar may need to be aware of approaching vehicles.

For these reasons, noise cancellation often has the undesirable effect of making people unaware of approaching danger. Hence there is a need to compensate for noise in other ways. Some headsets may use automatic level control to adjust the volume of signals automatically depending on the total volume of noise. However, because of the non-linearities and dynamic properties of the human ear, this technique often amplifies some sounds too much and other sounds too little.

There are many systems for the application of filtering to noise suppression in an audio signal. In most cases, these inventions relate to the removal of noise that is present in the source signal from the origin or introduced into the signal through processing and transmission. Various forms of filtering may be applied which suppresses the noise signal in whole or in part. Generally, these systems have adverse impacts upon the quality of the original signal. However, these systems do not address noise in the environment of the listener, which cannot be filtered.

Conversely, systems for the suppression of noise in the listener's environment also exist. These systems generally use noise cancellation to remove the disrupting external signal by adding sound projected through headphones which has the effect of countering the sound waves produced by the noise. In this case, the noise is completely canceled and listener is generally unaware of the existence of the external noise, a result which can reduce the awareness of the listener to potential dangers in the environment.

In some prior art systems, dynamic volume compensation may be used to raise the volume of a source signal of interest over ambient background noise. However, these systems increase the gain in a spectrally uniform manner, raising the volume of all frequency components equally. This effect can distort the perception of music and speech due to the non-linear behavior of the human ear with respect to frequency and volume.

Microphones and mechanical systems (e.g., computer software) can measure dBSPL; a sound (e.g., 40 dBSPL) at particular frequency (e.g., 1 kHz) sounds just as loud as the sound (e.g., 40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Since the human ear dynamically adjusts to sound intensity levels, the presence of background noise alters the threshold at which sounds begin to be perceived. As a result, ambient noise at a given frequency may make sounds at those frequencies that would otherwise be perceptible imperceptible in the presence of ambient noise. In order for the sound to be heard it must be amplified over the background noise. The volume of the ambient noise therefore represents a degree of hearing impairment or baseline threshold elevation over which the sound must be amplified to be perceived.

This effect varies according to the spectral composition of the noise, that is, spectral components that are sufficiently far from the spectral composition of the noise will remain perceptible. Consequently, using the total intensity of the background noise to raise the intensity of the source uniformly will overly amplify bands which are not affected, possibly raising the volume to damaging levels. In order to amplify only those components which need compensation, the gains to the source signal must vary by spectral band, according to the spectral composition of the noise.

Moreover, due to the nonlinear response of the human ear, using the spectral intensity of the background noise at a particular band as the gain for the source at that band will produce excessive amplification. In order to compute the correct gain a nonlinear corrective model must be used to compute an appropriate gain for each frequency. The intensity of the background noise as well as the source signal at a given frequency are inputs to this model, and the output is a desired gain for the source signal at that frequency.

The perceived loudness of sound can be modeled by a harmonic oscillator with spring constant that varies according to the mean power of vibration. This model is called the Earspring model. The Earspring equation 10,11 is written $[d^2/dt^2+2\beta(d/dt)+k(1+\gamma\gamma<y^2>)]y(t)=\eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude, for which the amplitude is P in dBPhons, a solution to the earspring equation y(t) can be found, for a particular set of boundary conditions, which is the steady state response to the forcing function. Transforming into the frequency domain we can obtain the mean power of vibration $<y^2>=\frac{1}{2}|Y|^2$, which can be rewritten as S(P).

A possible set of boundary parameters comprises (i) a Sones ratio between the hearing threshold level and the reference level of 40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

We can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

The present invention features systems for dynamically adjusting audio signals by applying a gain to the signal in a spectrally varying manner to compensate for a noise source in the environment of the listener, such that the sound is perceived by the listener to be unchanged in loudness and spectral composition. The system obtains a threshold elevation for each frequency component by analyzing the spectral composition of the ambient noise. This threshold elevation is then used by a perceptual model of hearing to determine an appropriate gain adjustment for the corresponding frequency component of the source signal which will make that component perceived by the human ear to be just as loud as if the noise were not present. After applying the gains to the source signal, the resulting signal is output to the speaker. The system allows a listener to hear without distortion, over ambient noise, by applying a gain to the source that varies according to the spectral composition of the noise, rather than cancelling the noise, or applying a uniform volume adjustment to the source. The perceived spectral composition of the source is thus adjusted without the removal of the noise signal. Systems may be incorporated into apparatuses including but not limited to headsets and music players.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL).

An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.

6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by:
$P_{dbSPL}(F) = P_{dBFS}(F) + (P_{dBSPL\_0}(F) - P_{dBFS\_0}(F))$
wherein PdBSPL0 is nominally a value between 65 and 83, and wherein $P_{dBFS0}$ is nominally a value between −20 and −12;
where
P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component can may comprises a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.
20. Gain Block component—This component applies the gains to each corresponding frequency component or band. In some embodiments, the term gain block component is used interchangeably with a "means for applying gains to a audio signal." Said means may be, for example, an amplifier, or gain block component.
21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.
22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.

23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F\_kHz)=26.811(1+1.960/F\_kHz)-0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G=g0+(P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical parameter value that when input to the Personalized Sound adjustment, generates may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference. In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

where G is the gain ratio, PSIG is the signal intensity at a frequency in units of power, PNOISE is the signal intensity of the background noise, PTHRQ is the absolute threshold of hearing, and α=0.2 is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

34. RF Transceiver: Radio Frequency Transmitter/Receiver—this device interfaces directly with the antenna and can modulate an audio signal with its radio carrier frequency for transmission as well as demodulate a received radio frequency signal 35. Source signal: The Source signal, as used herein refers to a portion of the first audio signal or the audio signal of interest at a given frequency component.

36. Speaker: The speaker can be any speaker or the like capable of receiving and projecting a sound signal adjusted or corrected by the present invention.

37. Storage media: A computer readable media used for storing data, such as a hard disk, RAM, or flash memory 38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

39. Threshold elevation: Threshold elevations correlate to the minimum sound pressures required to perceive sounds at various frequencies.

Additional Terms:

12. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.

13. dBSPL: Decibels sound power level—a unit of measure of sound intensity at the ear 14. dBSPL to dBPhon Conversion equation: This equation converts sound pressure level to Phons in decibels:

$$P_{dBPhon}(F) = \frac{P_{dBSPL}(F) - ATH(F)}{1 + kATH(F)}$$

where
F=Frequency
ATH=Absolute Threshold of Hearing
P=Phons amplitude of a source signal of interest
dBSPL=decibels according to sound pressure 15. dBFS to dBSPL Converter: This equation converts the audio signal power from audio power in decibels to audio sound pressure level in decibels 16. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.

17. Gain Equation: This equation converts the gain in Phons to a gain in sound pressure level $$\Delta P_{dBSPL}(F) = \Delta P_{dBPhon}(F)(1 + kATH(F))$$

where:
F=Frequency
ATH=Absolute Threshold of Hearing
P=Phons amplitude of a source signal of interest
dBSPL=decibels according to sound pressure 18. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.

19. Phons: Phons are objective units of sound intensity impinging upon the ear. Sound power may be converted from decibels (dBFS) to Phons using a conversion first to dBSPL then to Phons 20. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.

21. Sones: Sones are subjective units of perceived sound loudness

22. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1. Is a drawing of a possible systems architecture for a wired headset utilizing a DSP chip to implement an ambient noise correction compression algorithm.

FIG. 2. Is a drawing of a possible systems architecture for a wireless headset utilizing a DSP chip to implement an ambient noise correction compression algorithm.

FIG. 3. is a drawing of a possible architecture of the present invention implemented on a DSP microprocessor.

FIG. 4. Diagrams an implementation of the Perceptual Model of the present invention using analytical solutions to the Earspring model.

FIG. 5. Diagrams an implementation of the Perceptual Model in which a Numerical approximation to the solutions is made using a function approximator for which parameters have been stored in memory.

FIG. 6. Is a drawing illustrating an application of parallel compression to approximate a psychoacoustic non-linear compressor, where the parameters of the parallel compression are dynamically adjusted.

FIG. 7 is a drawing of an exemplary embodiment of the present invention, using a dynamically adjusted parallel compression to approximate the desired non-linear compression of the psychoacoustic model.

FIG. 8 is a plot of the compression ratio needed to make the parallel compression module approximate the psychoacoustic model, as found by fitting the parallel compression curves against the desired model curves.

FIG. 9 is a plot of the makeup gain needed to make the parallel compression module approximate the psychoacoustic model, as found by fitting the parallel compression curves against the desired model curves.

Description of Preferred Embodiments

Headset

As shown in FIG. 1-3, in some broad embodiments, the present invention may comprise a headset 01, capable of applying corrections to incoming audio signals of interest, to compensate for ambient noise in the listener's environment, the headset 01 comprising:

a) an RF transmitter/receiver or an audio jack 113, coupled to the microprocessor, capable of receiving a first audio signal, which is the signal of interest b) a speaker 110, coupled to the DSP chip 103, disposed upon the phone in a location ergonomically suitable for listening through the user's ear when using the phone, c) a microphone 111, capable of receiving a second audio signal, which is noise, disposed upon the phone in a location removed from the locations of the first microphone 109, and speaker 110 suitable to minimizing the effect of the speaker's voice on the ambient noise measurement, d) a second digital signal processing (DSP) chip, coupled to the audio codec, the microphone and the speaker, configured to implement a noise correction algorithm 103, the noise correction algorithm comprising:
  i. a first Analog to Digital converter 204;
  ii. a second Analog to Digital converter 205;
  iii. a first Frequency Analysis Module 206;
  iv. a second Frequency Analysis Module 207;
  v. a first Power Estimator Block 208;
  vi. a second Power Estimator Block 209;
  vii. a first dBFS to dBSPL Converter 210;
  viii. a second dBFS to dBSPL Converter 211;
  ix. a first dBSPL to dB Phon Converter 212;
  x. a second dBSPL to dB Phon Converter 213;
  xi. a Perceptual model 222;
  xii. a Gain Block component 217;
  xiii. a Frequency Synthesis Module 218; and
  xiv. a Digital to Analog Converter 219;

wherein the DSP 103 receives a first audio signal which is the signal of interest via the RF transmitter 104, whereupon the DSP Chip 103, obtains a second audio signal from the background noise microphone 111;

whereupon the first audio signal x(t) and the second audio signal $x_0(t)$ are fed, respectively, through the First D/A Converter 204 and Second D/A 205 thereby converting the signals into digital format;

whereupon the first audio signal x(t) and the second audio signal $x_0(t)$ are fed, respectively, through the First Frequency Analysis Module 206 and Second Frequency Analysis Module 207 breaking down each respective audio signal into arrays of frequency components;

whereupon the first audio signal x(t) and the second audio signal $x_0(t)$ are fed, respectively, through the first Power Estimator 208 and the Second Power Estimator 209, which compute power values for the various channels, whereby said power values are then fed into the dB Converter to generate power values for the source signal $P_{dBFS}(f)$ and the background signal $P_{0\_dBFS}(f)$ in dBFS;

whereupon (i) the DSP chip 103 completes a calibration offset such that a first dBFS to dBSPL Converter 210 converts the power value of the source signal from dBFS to dBSPL, and (ii) the DSP chip 103 completes a calibration offset such that a second dBFS to dBSPL Converter 211 converts the power value of the background signal from dBFS to dBSPL, producing $P_{dBSPL}(f)$ and $P_{0\_dBSPL}(f)$;

whereupon (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0(f)$;

whereupon the DSP chip 103 applies the power value of the source signal and the power value of the background signal, now in dB Phons, to the perceptual model 222 whereupon the DSP chip 103 calculates ΔP(f) in dBPhons
whereupon the DSP chip 103 calculates a correction gain of power to the source signal G(f), at the frequency, in dBSPL, based on the value of ΔP(f) in dB Phons, using the Gain Block component 217 which utilizes the Gain equation;
whereupon the DSP chip 103 reconstitutes the first audio signal with the corrective gain to the source signal corresponding to the frequency, comprising:
  a) multiplying the source signal at the frequency according to the corresponding corrective gain ΔP(f);
  b) using the Frequency Synthesis Module 18, to reconstitute the resulting audio signal
whereupon the corrected audio signal is fed through the Digital to Analog Converter 219, resulting in analog signal $x_{out}(t)$;
whereupon the DSP chip 103 outputs the corrected signal to the speaker 110.

As shown in FIG. 4, in some embodiments the perceptual model involves analytically computing the value in Sones of the input signal at a given frequency S(P), along with the estimated hearing loss due to background noise in Sones at that frequency $S(P_0)$, and applying these values to the conductor equation to derive a gain in Phons for the signal that will correct for the perceived hearing loss, the Conductor Equation 13 being, $$S(P) = S(P+\Delta P) - S(P_0) + S(0) \text{ or,}$$

$$\Delta P = S^{-1}(S(P) + S(P_0) - S(0)) - P$$

As shown in FIG. 5, in some embodiments the perceptual model uses a numerical estimate of these equations, combining the conductor equation and the Earspring equation solutions into one equation. In this embodiment, a function approximator, such as a quadratic estimator, linear regression with quadratic features, neural network, or other computational model, can be fit against the solutions to the Earspring equation, and the parameters of the model then stored in memory. During operation, these parameters can be retrieved by the microprocessor from a lookup table, and used to compute an approximate value for ΔP for any given P and $P_0$.

In some embodiments, all or part of the present invention could be implemented using a parallel processing architecture such that some or all of the set of computations from step 5 to 10 above may be computed simultaneously using multiple processing units.

In some embodiments, the absolute threshold of hearing may be computed in one example by the formula:

$$ATH(F) = \frac{3.64}{F_{KHz}^{0.8}} - 6.5 e^{-0.6(F_{kHz}-3.3)^2} + 0.001 F_{kHz}^4 - 3.37$$

In some embodiments, a Fourier transform of the signal is used so that the gain computation is performed for each element in the frequency spectrum instead of by channel.

In some embodiments, a computational model can be used in place of explicit computation of the Earspring and Conductor equations, where the computational model is $$\Delta P \cong \frac{AP^2 + BP + C}{DP^2 + EP + 1}$$

where A, B, C, D and E are parameters which have been fit against solutions to the combined Earspring and Conductor Equations, for each value of $P_0$ in 5 dB increments, and stored in a lookup table, such that for a given $P_0$, parameters for A, B, C, D, and E are extracted from the table, and then the computational model is used to compute ΔP given P.

In some embodiments it is also possible to use separate computational models for S(P) and for $S^{-1}(S)$, with separate sets of parameters fit against the solutions for various boundary parameters and values of $P_0$.

As shown in FIG. 6, in some embodiments, an alternative means of effectuating the gains demanded by the psychoacoustic model is to harness an existing sound processing technique known as parallel compression. Parallel compression involves compressing a copy of an original signal using linear compression 312, and subsequently adding this compressed signal back into the original signal. This results in a non-linear compression curve that amplifies low sounds below a certain threshold. The shape of the compression curve is controlled by a number of parameters including the threshold (T), compression ratio (R), and makeup gain (M). By varying these parameters, the parallel compression curves can be made to approximate the compression curve that would otherwise be produced by applying the psychoacoustic model. This is done by fitting the parameters against the desired characteristics of the psychoacoustic model using a least-squares error fit. These parameters are then stored in memory in a lookup table 311, or computed using a formula and may be retrieved in real time to dynamically update the parallel compression block 312. Since the psychoacoustic model depends upon both the signal and noise power, both signal and noise power 306, 307 will factor into determining the gains. Thus, these parameters must be updated at each time step account for the changing noise. Typically the T parameter is chosen to be the threshold elevation (or noise power) minus 20 dB. From that point makeup gain and compression ratio are found using standard curves that have been derived by fitting against the psychoacoustic model. Plots of the parameters used for varying threshold elevations are shown in FIG. 8 and FIG. 9. Here we can see that the desired compression ratio has an "upside down U" shape for varying threshold elevations.

One embodiment (Shown in FIG. 7) of the present invention comprises a headset 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G = g0 + (P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the headset 01 comprising:
- a) an audio receiver 13, coupled to the microprocessor, capable of receiving a first audio signal;
- b) a speaker 10, coupled to the DSP chip 03;
- c) a microphone 11, capable of receiving a second audio signal, which is noise, the microphone disposed upon the headset in a location removed from the locations of the audio receiver 13 and speaker 10, said microphone suitable for minimizing the effect of the speaker's voice on the ambient noise measurement;
- d) a digital signal processing (DSP) chip, coupled to the microphone and the speaker, configured to implement a noise correction algorithm 03, the noise correction algorithm comprising:
  - i. a first Analog to Digital converter 404,
  - ii. a second Analog to Digital converter 405,
  - iii. a first Frequency Analysis Module 406,
  - iv. a second Frequency Analysis Module 407,
  - v. a first Power Estimator Block 408,
  - vi. a second Power Estimator Block 409,
  - vii. a first dBFS to dBSPL Converter 410,
  - viii. a second dBFS to dBSPL Converter 411,
  - ix. a parameter estimation module 422, which determines parameter settings for a parallel compression module, according to information stored in memory,
  - x. a parallel compression module 417, parameterized by threshold T, compression ratio R, and makeup gain g0, where the parameters may by dynamically varied, where the parallel compression module is comprised of:
    - a. a linear compression module, which applies gains to the first audio signal according to the equation $G=g0+(P-T)*(1/R-1)$, where G is the gain in dB to be applied to a frequency component of the first audio signal, P is the sound intensity of the frequency component in dB, g0 is the makeup gain in dB, T is the threshold in dB, and R is the compression ratio of the linear compression,
    - b. a summer, which combines the resulting amplified first audio signal component with the original first audio signal component,
  - xi. a Frequency Synthesis Module 418, and
  - xii. a Digital to Analog Converter 419, wherein the DSP chip 03 receives a first audio signal which is the signal of interest via the audio receiver,
whereupon the DSP Chip 03, obtains a second audio signal from the background noise microphone 11,
whereupon the first audio signal x(t) and the second audio signal $x_0(t)$ are fed, respectively, through the First D/A Converter 404 and Second D/A 405 thereby converting the signals into digital format,
whereupon the first audio signal x(t) and the second audio signal $x_0(t)$ are fed, respectively, through the First Frequency Analysis Module 406 and Second Frequency Analysis Module 407 breaking down each respective audio signal into separate arrays of frequency components,
whereupon, for each frequency component, the first audio signal x(t) and the second audio signal $x_0(t)$ are fed, respectively, through the first Power Estimator 408 and the Second Power Estimator 409, which compute power values for the various channels, whereby said power values are then fed into the dB Converter to generate power values for a source signal $P_{dBFS}(f)$ and a background signal $P_{0\_dBFS}(f)$ in dBFS,
whereupon (i) the DSP chip 03 completes a calibration offset such that a first dBFS to dBSPL Converter 410 converts the power value of the source signal from dBFS to dBSPL, and (ii) the DSP chip 03 completes a calibration offset such that a second dBFS to dBSPL Converter 411 converts the power value of the background signal from dBFS to dBSPL, producing $P_{dBSPL}(f)$ and $P_{0\_dBSPL}(f)$,
whereupon, for each frequency component, and at each instant, the DSP chip 03, using the power estimates of the frequency components of the first 002 and second 003 audio signals, obtains parameters for the parallel compression 422, depending on the sound intensity of the second audio signal at each instant,
whereupon the DSP chip 03, applies the parameters to a parallel compression module 417,
whereupon the parallel compression module 417 applies a linear compression, according to the selected parameters, to each of the frequency components of the first audio signal 002,
whereupon the parallel compression module 417 sums each frequency component of the first audio signal 002 with the corresponding compressed audio signal,
whereupon the DSP chip 03 repeats the process of estimating the power of both the signal of interest and the noise, selecting compression settings, and applying parallel compression for each frequency component of the first audio signal 002,
whereupon the DSP chip 03 reconstitutes the first audio signal using the Frequency Synthesis Module 418 producing a corrected audio signal,
whereupon the corrected audio signal is fed through the Digital to Analog Converter 419, resulting in analog corrected audio signal $x_{out}(t)$;
whereupon the DSP chip 03 outputs the corrected audio signal to the speaker 10.

In one possible embodiment, the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In one possible embodiment, one or more parameters (e.g. T) is defined as a function of the ambient noise intensity (e.g. T=P¬T', where P¬ N is noise loudness), such that the parameters stored (e.g. T') are the parameters of the function defining the relationship between sound intensity (e.g. $P_N$) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In the aforementioned embodiment, a fixed set of parameters ca be used. The fixed parameters may fall in the range of 2 to 6 for compression ratio, 15 dB to 25 dB for makeup gain, and −15 to −25 dB for threshold offset.

In some embodiments, the First and Second Frequency Analysis Modules are composed of digital filter banks which are filters that break the signal down into various sub-band channels $\bar{x}(t)$ and $\bar{x}\_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output xout(t).

In some embodiments, the First and second Frequency Analysis Modules are digital filter banks composed of wavelet filters.

In some embodiments, the various sub-band channels correspond to critical bands of hearing.

In some embodiments, the First and Second Frequency Analysis Modules, are composed of FFT coprocessors that perform Fourier transforms on the input signals producing X(t) and X0(t), where the power of each component is found by squaring the Fourier component, and the Frequency Synthesis Module 418 is an FFT coprocessor that performs an inverse Fourier transform, resulting in output signal xout(t).

In some embodiments, the frequency components may be grouped together to approximate sub-bands correspond to critical bands of hearing.

In some embodiments, the processing chain, from output of channels at the digital filter bank to adding gains to channels via the gain component, is a process that occurs in parallel for all channels of the audio signal, through the use of threaded processes, or through the use of a parallel computing device, such as a multi-core processing unit.

The present invention features systems for audio correction. The systems may include but are not limited to headsets (and the like) and music players (and the like).

In some embodiments, the present invention may be multi-channel, such as in a stereo or surround sound system. In this case, gains are computed independently for each channel independently. These gains may be based on one central background noise estimate, or multiple noise estimates at each speaker. Each channel is then amplified by its corresponding gains so that the overall surround effect compensates for the presence of background noise.

In some embodiments, the present invention features an headset for correcting an audio signal. The apparatus, or audio source as claimed, (e.g., a headset) may, for example, comprise a standard headset receiver, a standard headset microphone, and a standard headset speaker, all of which are well known to one of ordinary skill in the art. The receiver can function to extract an amplitude of a source signal (e.g., an incoming conversation on a headset) at given frequency (or within a frequency range) and the microphone can function to detect an amplitude of a background signal at a corresponding frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In some embodiments, some elements of the above process flow might be performed using analog circuitry before being input to the microprocessor.

In some embodiments, Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, referring to the means of extracting amplitudes of source signals or background signals: at the output of each filter which selects a band of adjacent frequencies, an electrical circuit to effect extraction of amplitudes could be the use of a diode, or rectifier bridge, fed by each signal which, in turn, feeds a simple series resistor and a capacitor in shunt to create an integrator of the absolute value of the signal. The integrator would accumulate rectified current for some period of time before being applied to the loudness response curve selection circuit, after which the capacitor would be shorted to discharge the accumulated current, in anticipation of the next cycle of integration. Alternatively, the capacitor could be allowed to discharge continuously through a higher valued resistor in shunt, so that charge can be bled off more slowly than it is accumulated, thereby forming a running exponential average integrator.

In some embodiments, more sophisticated version of amplitude estimation could send the signals through a squarer circuit ahead of the RC integrator in order to accumulate an estimate of the power in the signal. The resulting integrated current would be an estimate of the RMS power at the end of the integration period. This power estimate could then feed the gain correction curve selection circuit.

In some embodiments, the output of each integrator can be fed to an analog differencing amplifier (operational amplifier, or OpAmp) to subtract the estimated amplitude of the noise signal from the estimated amplitude of the signal of interest. The output of this difference amplifier can be used to establish a dynamic compressor threshold. The output of the compressor circuit (a voltage controlled amplifier, or VCA) can be added to the dry signal to effect a nonlinear correction. A simple linear compressor (VCA) adjusted with suitable make-up gain and compression ratio can produce, in sum with the dry signal, an approximation of the required nonlinear correction gain.

The present invention is not limited to the aforementioned examples of means of extracting amplitudes.

Without wishing to limit the present invention to any theory or mechanism, it is believed that the present invention is advantageous because the present invention features a maximum output volume, for example the source signal will be amplified to only a certain degree. This can help protect against damage to the user's hearing. Furthermore, the systems frequently detect the background noise (e.g., 10-40 times per second, 1,000 times per second, etc.), allowing for the systems to react quickly to changes in the background noise. Furthermore, the systems utilize non-linear corrections, thus, loud signals are not amplified much if at all.

In some embodiments, the systems of the present invention can allow for microphone sensitivity to be altered. For example, a particular user may wish to have more correction or less correction. For example, the microphone may be in someone's pocket, or else exposed directly to the ambient noise sounds. If the microphone becomes shielded, it will produce a weaker response to the noise than if it were directly exposed. Hence the microphone gain can be increased to compensate for the shielding. Also, each of us has a slightly different response to noise levels, some people being more sensitive to it than others. A variable gain on the microphone can help to compensate for individual differences of loudness perception. Finally microphones exhibit varying characteristics depending on their specific construction. A variable microphone gain in the software can help to normalize the response from different microphones.

In some embodiments, the systems of the present invention can allow for signals to be corrected prior to transmission or recording, such that ambient noise in the recorded or received signal is retained, but the spectral composition of the primary source signal is modified to compensate, as an alternative to standard noise reduction techniques.

In some embodiments, the headset of the present invention may be a form fitting insulated helmet, such as may be worn by military personnel.

In some embodiments the microphone of the present invention may be a directional microphone or an omnidirectional microphone, in varying embodiments.

In some embodiments, the present invention may incorporate sound sensors and means for identifying classes of sounds in the ambient noise environment (i.e. aircraft noise).

In some embodiments the present invention may be capable of accepting voice activated commands.

In some embodiments the present invention may be equipped with interconnection ports for allowing the headset to communicate with external devices.

In some embodiments the present invention may be equipped with a microphone boom, either for allowing the wearer to place the speaking microphone close to his mouth, or to place the noise sensing microphone away from his mouth.

In some embodiments, the present invention may include an Intra-concha ear piece, which is configured to be positioned inside the concha—the cavity surrounding the opening to the ear canal, or a supranatual headset in which the ear piece is configured to rest against the pinna, or a circumatural headset in which the ear piece is configured to surround the pinna.

In some embodiments, steps for converting analog audio input signals to digital input signals can be bypassed where the invention utilizes digital input audio sources capable of receiving digital audio signals and transmitting the same to the processor.

As used herein, the term "hearing impaired" refers to physical hearing impairment, as in the traditional sense of hearing loss, and/or, can also refer to temporary hearing loss caused by a background noise or other temporary hearing loss factors. One of the novel discoveries addressed by the present invention is that a individual with normal hearing can in fact experience hearing impairment due to background noise, or background signals interfering with source noise or source signals.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.
These are not Claims, they are Additional Disclosure:
1. A headset 01, effective for applying corrections to incoming audio signals of interest, to compensate for ambient noise in the listener's environment, the headset 01 comprising:

a) an audio input 13, coupled to the microprocessor, capable of receiving a first audio signal;
b) a speaker 10, coupled to a DSP chip 03;
c) a microphone 11, capable of receiving a second audio signal;
d) a digital signal processing ("DSP") chip coupled to the microphone and the speaker, configured to implement a noise correction algorithm, the noise correction algorithm comprising:
  i. a first Analog to Digital converter 204,
  ii. a second Analog to Digital converter 205,
  iii. a first Frequency Analysis Module 206,
  iv. a second Frequency Analysis Module 207,
  v. a first Power Estimator Block 208,
  vi. a second Power Estimator Block 209,
  vii. a first dBFS to dBSPL Converter 210,
  viii. a second dBFS to dBSPL Converter 211,
  ix. a first dBSPL to dB Phon Converter 212,
  x. a second dBSPL to dB Phon Converter 213,
  xi. a Perceptual model 222,
  xii. a Gain Block component 217,
  xiii. a Frequency Synthesis Module 218, and
  xiv. a Digital to Analog Converter 219,
wherein the DSP chip 03 receives a first audio signal which is the signal of interest via the audio input 13,
whereupon the DSP Chip 03, obtains a second audio signal from the background noise microphone 11,
whereupon the first audio signal $x(t)$ and the second audio signal $x_0(t)$ are fed, respectively, through the First D/A Converter 204 and the Second D/A 205 thereby converting the signals into digital format,
whereupon the first audio signal $x(t)$ and the second audio signal $x_0(t)$ are fed, respectively, through the First Frequency Analysis Module 206 and Second Frequency Analysis Module 207 breaking down each respective audio signal into separate arrays of frequency components,
whereupon, for each frequency component, the first audio signal $x(t)$ and the second audio signal $x_0(t)$ are fed, respectively, through the first Power Estimator 208 and the Second Power Estimator 209, which compute power values for the various frequency components, whereby said power values are then fed into the dB Converter to generate power values for a source signal $P_{dBFS}(f)$ and the background signal $P_{0\_dBFS}(f)$ in dBFS,
whereupon (i) the DSP chip 03 completes a calibration offset such that a first dBFS to dBSPL Converter 210 converts the power value of the source signal from dBFS to dBSPL, and (ii) the DSP chip 03 completes a calibration offset such that a second dBFS to dBSPL Converter 211 converts the power value of the background signal from dBFS to dBSPL, producing $P_{dBSPL}(f)$ and $P_{0\_dBSPL}(f)$,
whereupon (i) a first dBSPL-dB Phon Converter 212 converts the power value of the source signal to dB Phons by applying a dBSPL to dBPhon Conversion equation, giving $P(f)$ and (ii) a second dBSPL-dB Phon Converter 213 converts the power value of the background signal to dB Phons by applying the dBSPL to dBPhon Conversion equation, giving $P_0(f)$,
whereupon the DSP chip 03 applies the power value of the source signal and the power value of the background signal, now in dB Phons, to the perceptual model 222 whereupon the DSP chip 03 calculates $\Delta P(f)$ in dBPhons,
whereupon the DSP chip 03 calculates a correction gain of power to the source signal $G(f)$, at the frequency component, in dBSPL, based on the value of $\Delta P(f)$ in dB Phons, using the Gain Block component 217 which utilizes the Gain equation, whereupon the DSP chip 03 reconstitutes the first audio signal with the corrective gain to each of the source signals corresponding to the frequency components, comprising:

a) multiplying each of the source signals at the corresponding frequency component according to the corresponding corrective gain $\Delta P(f)$, b) using the Frequency Synthesis Module 18 to reconstitute the resulting audio signal whereupon the resulting audio signal is fed through the Digital to Analog Converter 219, resulting in analog signal $x_{out}(t)$, whereupon the DSP chip 03 outputs the resulting audio signal to the speaker 10.

2. The headset of claim 1, where the First and Second Frequency Analysis Modules 206, 207 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 218 is a summer operation that combines the various channels into output $x_{out}(t)$.

3. The headset of claim 1, where the First and second Frequency Analysis Modules 206, 207 are digital filter banks composed of wavelet filters.

4. The headset of claim 2, where the various sub-band channels correspond to critical bands of hearing.

5. The headset of claim 1, where the First and Second Frequency Analysis Modules 206,207 are composed of FFT coprocessors that perform Fourier transforms on the input signals producing $X(t)$ and $X_0(t)$, where the power of each component is found by squaring the Fourier component, and the Frequency Synthesis Module 218 is an FFT coprocessor that performs an inverse Fourier transform, resulting in output signal $x_{out}(t)$.

6. The headset of claim 5, where the frequency components are grouped together to approximate sub-bands correspond to critical bands of hearing.

7. The headset of claim 1, where the perceptual model 222 consists of a forward model which computes subjectively perceived Sones in terms of Phons, and an inverse model which computes Phons in terms of Sones, allowing the Perceptual model to be combined into the Conductor Equation, the Conductor Equation 316 being, $$S(P)=S(P+\Delta P)-S(P_0)+S(0) \text{ or,}$$

$$\Delta P=S^{-1}(S(P)+S(P_0)-S(0))-P,$$

where this equation may be stated as the desired gain in Phons being the Phons amplification necessary to amplify the sound over background noise so that it's subjectively perceived loudness over background noise is the same as the subjectively perceived loudness without the noise, minus some correcting factor, where the function $S(P)$ is found by solving the Earspring equation under experimental boundary conditions, where the Earspring equation 314,315 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P, a solution y(t) to this equation can be found, which can then be converted to $<y^2>$, which represents the perceived loudness S in Sones, resulting in a function S(P), $$S(P) = \frac{4(\hat{\beta}^2 + \Gamma_{40}^2)}{(4\hat{\beta}^2 + (\Gamma_{40}S(P))^2)} 10^{(P-40)/10},$$

where $S(P)$ is the perceived loudness in Sones which the listener experiences for a particular sub-band, and P is the sound intensity impinging on the ear in dBPhons for a particular subband, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary parameters.

8. The headset of claim 7, where the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

9. The headset of claim 8, where a computational model is used to estimate the Earspring equation solutions $S(P)$ and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory.

10. The headset of claim 8, where a computational model is used to estimate $\Delta P$, which consists of a quadratic function $$\Delta P \cong \frac{AP^2 + BP + C}{DP^2 + EP + 1},$$

where A, B, C, D, and E are parameters which fit the quadratic function against the solution to the Conductor equation 316, for various values of $P_0$ and are stored and retrieved using a parameter estimation module 323.

11. The headset of claim 10, where the parameter estimation module is a lookup table.

12. The headset of claim 10, where the parameter estimation module is a quadratic function that approximates the optimal parameters across a spectrum of values for the threshold elevation $P_0$.

13. The headset of claim 8, where a computational model is used to estimate the solutions to the Earspring and/or conductor equations, where the computational model is any numerical function approximator 324 that is fit against the Earspring 314, 315 and Conductor equations 316, as described in claim 6, and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

14. The headset of claim 1, wherein the dBSPL to dBPhon Conversion equation 312,313 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
 =+1/240 when ATH(F)<0

15. The headset of claim 1, wherein the Gain equation 317 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH(F)>0
 =+1/240 when ATH(F)<0

16. The headset of claim 1, where the absolute threshold of hearing is computed by the formula:

$$ATH(F) = \frac{3.64}{F_{KHz}^{0.8}} - 6.5e^{-0.6(F_{kHz}-3.3)^2} + 0.001F_{kHz}^4 - 3.37$$

17. The headset of claim 1, where there are a plurality of source audio signals corresponding to the various signals of a stereo or surround sound audio system, and where gains for each channel are independently computed and applied to each channel.

18. The headset of claim 1, where there are a plurality of source audio signals corresponding to the various signals of a stereo or surround sound audio system, and a plurality of background noise signals, one for each channel, and where gains for each channel are independently computed, according to the source and noise signal for each channel, and applied to each channel.

19. The headset of claim 1, where the audio input is a physical audio jack.

20. The headset of claim 1, where the audio input is a RF receiver, such as a Bluetooth receiver.

21. A headset 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G = g0 + (P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the headset 01 comprising:
 a) an audio receiver 13, coupled to the microprocessor, capable of receiving a first audio signal;
 b) a speaker 10, coupled to the DSP chip 03;
 c) a microphone 11, capable of receiving a second audio signal, which is noise, the microphone disposed upon the headset in a location removed from the locations of the audio receiver 13 and speaker 10, said microphone suitable for minimizing the effect of the speaker's voice on the ambient noise measurement;
 d) a digital signal processing (DSP) chip, coupled to the microphone and the speaker, configured to implement a noise correction algorithm 03, the noise correction algorithm comprising:
  xiii. a first Analog to Digital converter 404,
  xiv. a second Analog to Digital converter 405,
  xv. a first Frequency Analysis Module 406,
  xvi. a second Frequency Analysis Module 407,
  xvii. a first Power Estimator Block 408,
  xviii. a second Power Estimator Block 409,
  xix. a first dBFS to dBSPL Converter 410,
  xx. a second dBFS to dBSPL Converter 411,
  xxi. a parameter estimation module 422, which determines parameter settings for a parallel compression module, according to information stored in memory,
  xxii. a parallel compression module 417, parameterized by threshold T, compression ratio R, and makeup gain g0, where the parameters may by dynamically varied, where the parallel compression module is comprised of:
   a. a linear compression module, which applies gains to the first audio signal according to the equation G=g0+(P−T)*(1/R−1), where G is the gain in dB to be applied to a frequency component of the first audio signal, P is the sound intensity of the frequency component in dB, g0 is the makeup gain in dB, T is the threshold in dB, and R is the compression ratio of the linear compression,
   b. a summer, which combines the resulting amplified first audio signal component with the original first audio signal component,
  xxiii. a Frequency Synthesis Module 418, and
  xxiv. a Digital to Analog Converter 419,
wherein the DSP chip 03 receives a first audio signal which is the signal of interest via the audio receiver,
whereupon the DSP Chip 03, obtains a second audio signal from the background noise microphone 11,
whereupon the first audio signal x(t) and the second audio signal $x_0(t)$ are fed, respectively, through the First D/A Converter 404 and Second D/A 405 thereby converting the signals into digital format,
whereupon the first audio signal x(t) and the second audio signal $x_0(t)$ are fed, respectively, through the First Frequency Analysis Module 406 and Second Frequency Analysis Module 407 breaking down each respective audio signal into separate arrays of frequency components,
whereupon, for each frequency component, the first audio signal x(t) and the second audio signal $x_0(t)$ are fed, respectively, through the first Power Estimator 408 and the Second Power Estimator 409, which compute power values for the various channels, whereby said power values are then fed into the dB Converter to generate power values for a source signal $P_{dBFS}(f)$ and a background signal $P_{0\_dBFS}(f)$ in dBFS, whereupon (i) the DSP chip 03 completes a calibration offset such that a first dBFS to dBSPL Converter 410 converts the power value of the source signal from dBFS to dBSPL, and (ii) the DSP chip 03 completes a calibration offset such that a second dBFS to dBSPL Converter 411 converts the power value of the background signal from dBFS to dBSPL, producing $P_{dBSPL}(f)$ and $P_{0\_dBSPL}(f)$, whereupon, for each frequency component, and at each instant, the DSP chip 03, using the power estimates of the frequency components of the first 002 and second 003 audio signals, obtains parameters for the parallel compression 422, depending on the sound intensity of the second audio signal at each instant, whereupon the DSP chip 03, applies the parameters to a parallel compression module 417, whereupon the parallel compression module 417 applies a linear compression, according to the selected parameters, to each of the frequency components of the first audio signal 002, whereupon the parallel compression module 417 sums each frequency component of the first audio signal 002 with the corresponding compressed audio signal, whereupon the DSP chip 03 repeats the process of estimating the power of both the signal of interest and the noise, selecting compression settings, and applying parallel compression for each frequency component of the first audio signal 002, whereupon the DSP chip 03 reconstitutes the first audio signal using the Frequency Synthesis Module 418 producing a corrected audio signal, whereupon the corrected audio signal is fed through the Digital to Analog Converter 419, resulting in analog corrected audio signal $x_{out}(t)$;

whereupon the DSP chip 03 outputs the corrected audio signal to the speaker 10.

22. The headset of claim 21, where the audio receiver is a physical audio jack.

23. The headset of claim 21, where the audio receiver is a RF receiver, such as a Bluetooth receiver.

24. The headset of claim 21, where the First and Second Frequency Analysis Modules 406, 407 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 418 is a summer operation that combines the various channels into output $x_{out}(t)$.

25. The headset of claim 21, where the First and second Frequency Analysis Modules 406,407 are digital filter banks composed of wavelet filters.

26. The headset of claim 22, where the various sub-band channels correspond to critical bands of hearing.

27. The headset of claim 21, where the First and Second Frequency Analysis Modules 406,407 are composed of FFT coprocessors that perform Fourier transforms on the input signals producing $X(t)$ and $X_0(t)$, where the power of each component is found by squaring the Fourier component, and the Frequency Synthesis Module 418 is an FFT coprocessor that performs an inverse Fourier transform, resulting in output signal $x_{out}(t)$.

28. The headset of claim 21, where the frequency components are grouped together to approximate sub-bands correspond to critical bands of hearing.

29. The headset of claim 21, where discrete sets of parameters are found by dividing the range of possible noise volumes into discrete levels, and where sets of parameters are found for each discrete noise loudness level, where the parameter estimation module 422 is a lookup table, where during real-time processing the ambient noise intensity is measured and used to select the corresponding set of parameters.

30. The headset of claim 21, where the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

31. The headset of claim 21, where one or more parameters (e.g. T) is defined as a function of the ambient noise intensity (e.g. $T=P_N-T'$, where $P_N$ is noise loudness), such that the parameters stored (e.g. T') are the parameters of the function defining the relationship between sound intensity (e.g. $P_N$) and the parameter (e.g. T) of the parallel compression.

32. The headset of claim 21, where the gain equation is expressed as a function of the difference between signal intensity and noise intensity:

$$G=g0+(dP-T)/R-dP$$

where dP is the difference between the signal loudness and noise loudness in decibels, and T' is the threshold offset from the ambient noise intensity to the threshold T.

33. The headset of claim 32, where a fixed set of parameters is used.

34. The headset of claim 33, where the fixed parameters fall in the range of 2 to 6 for compression ratio, 15 dB to 25 dB for makeup gain, and −15 to −25 dB for threshold offset.

35. The headset of claims 1 and 21, where the headset has two speakers, one for each ear.

36. The headset of claims 1 and 21, where the headset has a second microphone for the reception of speech of the user.

PERSONAL COMMUNICATIONS DEVICE FEATURING DYNAMIC SPECTRAL CORRECTION OF AUDIO SIGNALS TO COMPENSATE FOR AMBIENT NOISE

Background of the Invention

The present invention relates to the design of personal communications devices and systems designed to enhance personal communications device signals in the presence of noise.

The term "personal communication device" is used throughout this document to refer to a device which has the capacity to send and receive was wide variety of audio signals between a remote system and a network infrastructure.

Mobile phones are becoming more sophisticated, including features such as streaming audio, streaming video and radio reception. These devices are used in a wide variety of environments with rapidly changing noise conditions. It is therefore desirable for the phone to have both ability to dynamically adjust sound output in response to local ambient noise. However, uniformly increasing the volume of a signal often results in some part of a signal being amplified too much or too little, since the human ear is not a simple linear mechanism and ambient noise frequency content is not uniform.

There are many systems for the application of filtering to noise suppression in an audio signal. In most cases, these inventions relate to the removal of noise that is present in the source signal from the origin or introduced into the signal through processing and transmission. Various forms of filtering may be applied which suppresses the noise signal in whole or in part. Generally, these systems have adverse impacts upon the quality of the original signal. However, these systems do not address noise in the environment of the listener, which cannot be filtered.

Conversely, systems for the suppression of noise in the listener's environment also exist. These systems generally use noise cancellation to remove the disrupting external signal by adding sound projected through headphones which has the effect of countering the sound waves produced by the noise. In this case, the noise is completely canceled and listener is generally unaware of the existence of the external noise, a result which can reduce the awareness of the listener to potential dangers in the environment.

In some prior art systems, dynamic volume compensation may be used to raise the volume of a source signal of interest over ambient background noise. However, these systems increase the gain in a spectrally uniform manner, raising the volume of all frequency components equally. This effect can distort the perception of music and speech due to the nonlinear behavior of the human ear with respect to frequency and volume.

Microphones and mechanical systems (e.g., computer software) can measure dBSPL; a sound (e.g., 40 dBSPL) at particular frequency (e.g., 1 kHz) sounds just as loud as the sound (e.g., 40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Since the human ear dynamically adjusts to sound intensity levels, the presence of background noise alters the threshold at which sounds begin to be perceived. As a result, ambient noise at a given frequency may make sounds at those frequencies that would otherwise be perceptible imperceptible in the presence of ambient noise. In order for the sound to be heard it must be amplified over the background noise. The volume of the ambient noise therefore represents a degree of hearing impairment or baseline threshold elevation over which the sound must be amplified to be perceived.

This effect varies according to the spectral composition of the noise, that is, spectral components that are sufficiently far from the spectral composition of the noise will remain perceptible. Consequently, using the total intensity of the background noise to raise the intensity of the source uniformly will overly amplify bands which are not affected, possibly raising the volume to damaging levels. In order to amplify only those components which need compensation, the gains to the source signal must vary by spectral band, according to the spectral composition of the noise.

Moreover, due to the nonlinear response of the human ear, using the spectral intensity of the background noise at a particular band as the gain for the source at that band will produce excessive amplification. In order to compute the correct gain a nonlinear corrective model must be used to compute an appropriate gain for each frequency. The intensity of the background noise as well as the source signal at a given frequency are inputs to this model, and the output is a desired gain for the source signal at that frequency.

The perceived loudness of sound can be modeled by a harmonic oscillator with spring constant that varies according to the mean power of vibration. This model is called the Earspring model. The Earspring equation 10,11 is written $[d^2/dt^2+2\beta(d/dt)+k(1+\gamma\gamma<y^2>)]y(t)=\eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude, for which the amplitude is P in dBPhons, a solution to the earspring equation y(t) can be found, for a particular set of boundary conditions, which is the steady state response to the forcing function. Transforming into the frequency domain we can obtain the mean power of vibration $<y^2>=\frac{1}{2}|Y|^2$, which can be rewritten as S(P).

A possible set of boundary parameters comprises (i) a Sones ratio between the hearing threshold level and the reference level of 40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

We can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

The present invention features systems for dynamically adjusting audio signals by applying a gain to the signal in a spectrally varying manner to compensate for a noise source in the environment of the listener, such that the sound is perceived by the listener to be unchanged in loudness and spectral composition. The system obtains a threshold elevation for each frequency component by analyzing the spectral composition of the ambient noise. This threshold elevation is then used by a perceptual model of hearing to determine an appropriate gain adjustment for the corresponding frequency component of the source signal which will make that component perceived by the human ear to be just as loud as if the noise were not present. After applying the gains to the source signal, the resulting signal is output to the speaker. The system allows a listener to hear without distortion, over ambient noise, by applying a gain to the source that varies according to the spectral composition of the noise, rather than cancelling the noise, or applying a uniform volume adjustment to the source. The perceived spectral composition of the source is thus adjusted without the removal of the noise signal. Systems may be incorporated into apparatuses including but not limited to personal communications devices and music players.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12;
where P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.

18. Frequency component and Frequency Component Spectrum: A frequency component, as used herein, identifies a portion of the frequency range of an audio signal. A frequency component can may comprises a particular, individual frequency, frequency channels, or frequency bands. A frequency component spectrum is a plurality of frequency components.

19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.

20. Gain Block component—This component applies the gains to each corresponding frequency component or band. In some embodiments, the term gain block component is used interchangeably with a "means for applying gains to a audio signal." Said means may be, for example, an amplifier, or gain block component.

21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.

22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.

23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F\_kHz)=26.811(1+1.960/F\_kHz)-0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G=g0+(P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical parameter value that when input to the Personalized Sound adjustment, generates may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference. In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^2 + P_{NOISE}^2 - P_{THRQ}^2}}{P_{SIG}}$$

34. where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

35. RF Transceiver: Radio Frequency Transmitter/Receiver—this device interfaces directly with the antenna and can modulate an audio signal with its radio carrier frequency for transmission as well as demodulate a received radio frequency signal 36. Source signal: The Source signal, as used herein refers to a portion of the first audio signal or the audio signal of interest at a given frequency component.

37. Speaker: The speaker can be any speaker or the like capable of receiving and projecting a sound signal adjusted or corrected by the present invention.

38. Storage media: A computer readable media used for storing data, such as a hard disk, RAM, or flash memory 39. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

40. Threshold elevation: Threshold elevations correlate to the minimum sound pressures required to perceive sounds at various frequencies.

Additional Terms:

23. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.
24. dBSPL: Decibels sound power level—a unit of measure of sound intensity at the ear
25. dBSPL to dBPhon Conversion equation: This equation converts sound pressure level to Phons in decibels:

$$P_{dBPhon}(F) = \frac{P_{dBSPL}(F) - ATH(F)}{1 + kATH(F)}$$

where
F=Frequency
ATH=Absolute Threshold of Hearing
P=Phons amplitude of a source signal of interest
dBSPL=decibels according to sound pressure
26. dBFS to dBSPL Converter: This equation converts the audio signal power from audio power in decibels to audio sound pressure level in decibels
27. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
28. Gain Equation: This equation converts the gain in Phons to a gain in sound pressure level $\Delta P_{dBSPL}(F) = \Delta P_{dBPhon}(F)(1+kATH(F))$ where:
F=Frequency
ATH=Absolute Threshold of Hearing
P=Phons amplitude of a source signal of interest
dBSPL=decibels according to sound pressure
K=$-1/120$ when ATH(F)>0
 =$+1/240$ when ATH(F)<0
29. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
30. Phons: Phons are objective units of sound intensity impinging upon the ear. Sound power may be converted from decibels (dBFS) to Phons using a conversion first to dBSPL then to Phons
31. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
32. Sones: Sones are subjective units of perceived sound loudness.
33. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1. Is a drawing of a possible systems architecture for a personal communications device utilizing a DSP chip to implement an ambient noise correction compression algorithm.

FIG. 2. Is a drawing of a possible systems architecture for a personal communications device utilizing a software application to implement an ambient noise correction compression algorithm.

FIG. 3. is a drawing of a possible embodiment for the systems architecture of the present invention.

FIG. 4. Diagrams an implementation of the Perceptual Model of the present invention using analytical solutions to the Earspring model.

FIG. 5. Diagrams an implementation of the Perceptual Model in which a Numerical approximation to the solutions is made using a function approximator for which parameters have been stored in memory.

FIG. 6 is a drawing illustrating an application of parallel compression to approximate a psychoacoustic non-linear compressor, where the parameters of the parallel compression are dynamically adjusted.

FIG. 7 is a drawing of an exemplary embodiment of the present invention, using a dynamically adjusted parallel compression to approximate the desired non-linear compression of the psychoacoustic model.

FIG. 8 is a plot of the compression ratio needed to make the parallel compression module approximate the psychoacoustic model, as found by fitting the parallel compression curves against the desired model curves.

FIG. 9 is a plot of the makeup gain needed to make the parallel compression module approximate the psychoacoustic model, as found by fitting the parallel compression curves against the desired model curves.

FIG. 10 is a drawing of a possible process flow for the present invention, using a computational model that approximated Earspring and conductor equations.

FIG. 11 is a drawing of a possible process flow for the present invention, using analytical earpsring and conductor equations.

FIG. 12 is a drawing of a possible process flow for the present invention using parallel compression to approximate the earspring and conductor equation gains to the signal.

Description of Preferred Embodiments

Personal Communications Device

FIG. 1 diagrams a systems architecture for a personal communications device, in some embodiments, with the noise correction system implemented on a DSP processor in an integrated microprocessor core. The noise correction module may take several forms as shown in FIG. 3 and FIG. 7. The personal communications device comprises the following modules:
- a) a microprocessor 02, the microprocessor configured to execute a noise correction application 03,
- b) an RF transmitter/receiver 04, coupled to the microprocessor, capable of receiving a first audio signal, which is the signal of interest
- c) a digital signal processing chip configured to implement an audio codec 05, coupled to the microprocessor, which effectuates the decoding of audio signals for output by a speaker, and the encoding of voice and noise audio received by the first and second microphones,
- d) a display screen 06, coupled to the microprocessor, upon which the microprocessor may display information for the user to view,
- e) a keypad 07, couple to the microprocessor, which the user actuates to enter data into the microprocessor,
- f) a data storage/program memory unit 08, coupled to the microprocessor, which the microprocessor uses to store program code and variables,
- g) a speaker 10, coupled to the audio codec 05, disposed upon the device in a location ergonomically suitable for listening through the user's ear when using the device,
- h) a microphone 11, capable of receiving a second audio signal, which is noise, disposed upon the device in a location removed from the locations of the first microphone 08, and speaker 09 suitable to minimizing the effect of the speaker's voice on the ambient noise measurement, FIG. 2. diagrams a systems architecture for a personal communications device, in some embodiments, with the noise correction system implemented on a external DSP processor on the output signal line. The personal communications device 101 comprising:
- a) a microprocessor 102,
- b) an RF transmitter/receiver 104, coupled to the microprocessor, capable of receiving a first audio signal, which is the signal of interest
- c) a digital signal processing chip configured to implement an audio codec 105, coupled to the microprocessor, which effectuates the decoding of audio signals for output by a speaker, and the encoding of voice and noise audio received by the first and second microphones,
- d) a display screen 106, coupled to the microprocessor, upon which the microprocessor may display information for the user to view,
- e) a keypad 107, couple to the microprocessor, which the user actuates to enter data into the microprocessor,
- f) a data storage/program memory unit 108, coupled to the microprocessor, which the microprocessor uses to store program code and variables,
- g) a speaker 110, coupled to the audio codec 104, disposed upon the device in a location ergonomically suitable for listening through the user's ear when using the device,
- h) a microphone 111, capable of receiving a second audio signal, which is noise, disposed upon the phone in a location removed from the locations of the first microphone 108, and speaker 109 suitable to minimizing the effect of the speaker's voice on the ambient noise measurement,
- i) a second digital signal processing (DSP) chip, coupled to the audio codec, the microphone and the speaker, configured to implement a noise correction algorithm 103

Using the architecture of FIG. 1 and the noise correction module shown in FIG. 3, in some embodiments, the present invention comprises a personal communications device capable of applying corrections to incoming audio signals of interest, to compensate for ambient noise in the listener's environment, the personal communications device 01 comprising:
- a) a microprocessor 02, the microprocessor configured to execute a noise correction application 03,
- b) an RF transmitter/receiver 04, coupled to the microprocessor, capable of receiving a first audio signal, which is the signal of interest
- c) a digital signal processing chip configured to implement an audio codec 05, coupled to the microprocessor, which effectuates the decoding of audio signals for output by a speaker, and the encoding of voice and noise audio received by the first and second microphones,
- d) a display screen 06, coupled to the microprocessor, upon which the microprocessor may display information for the user to view,
- e) a keypad 07, couple to the microprocessor, which the user actuates to enter data into the microprocessor,
- f) a data storage/program memory unit 08, coupled to the microprocessor, which the microprocessor uses to store program code and variables,
- g) a speaker 10, coupled to the audio codec 05, disposed upon the device in a location ergonomically suitable for listening through the user's ear when using the device,
- h) a microphone 11, capable of receiving a second audio signal, which is noise, disposed upon the device in a location removed from the locations of the first microphone 08, and speaker 09 suitable to minimizing the effect of the speaker's voice on the ambient noise measurement,
- i) the noise correction algorithm 03, the noise correction algorithm comprising:
    - i. a first Frequency Analysis Module 206;
    - ii. a second Frequency Analysis Module 207;
    - iii. a first Power Estimator Block 208;
    - iv. a second Power Estimator Block 209;
    - v. a first dBFS to dBSPL Converter 210;
    - vi. a second dBFS to dBSPL Converter 211;
    - vii. a first dBSPL to dB Phon Converter 212;
    - viii. a second dBSPL to dB Phon Converter 213;
    - ix. a Perceptual model 222;
    - x. a Gain Block component 217;
    - xi. a Frequency Synthesis Module 218;

whereupon the microprocessor 02 receives a first audio signal which is the signal of interest via the RF transmitter 03, whereupon the microprocessor 01 receives a second audio signal, which is the noise signal via the microphone, whereupon the first audio signal 202 and second audio signal 203 are input to the noise correction algorithm, whereupon the first audio signal x(t) and the second audio signal $x_0(t)$ are fed, respectively, through the First Frequency Analysis Module 204 and Second Frequency Analysis Module 205 breaking down each respective audio signal into arrays of frequency components;

whereupon the first audio signal x(t) and the second audio signal $x_0(t)$ are fed, respectively, through the first Power Estimator 208 and the Second Power Estimator 209, which compute power values for the various channels, whereby said power values are then fed into the dB Converter to generate power values for the source signal $P_{dBFS}(f)$ and the background signal $P_{0\_dBFS}(f)$ in dBFS 252;

whereupon (i) the microprocessor 201 completes a calibration offset such that a first dBFS to dBSPL Converter 210 converts the power value of the source signal from dBFS to dBSPL, and (ii) the microprocessor 201 completes a calibration offset such that a second dBFS to dBSPL Converter 211 converts the power value of the background signal from dBFS to dBSPL, producing $P_{dBSPL}(f)$ and $P_{0\_dBSPL}(f)$;

whereupon (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0(f)$;

whereupon the microprocessor 201 applies the power value of the source signal and the power value of the background signal, now in dB Phons, to the perceptual model 22 whereupon the microprocessor 201 calculates ΔP(f) in dBPhons whereupon the microprocessor 201 calculates a correction gain of power to the source signal G(f), at the frequency, in dBSPL, based on the value of ΔP(f) in dB Phons, using the Gain Block component 217 which utilizes the Gain equation; whereupon the microprocessor 201 reconstitutes the first audio signal with the corrective gain to the source signal corresponding to the frequency, comprising:
  a) multiplying the source signal at the frequency according to the corresponding corrective gain ΔP(f);
  b) using the Frequency Synthesis Module 218, to reconstitute the resulting audio signal whereupon the noise correction algorithm 203 outputs a corrected audio signal to the microprocessor, whereupon the microprocessor sends the encoded audio signal to the audio codec 205, whereupon the audio codec decodes the signal into analog form, whereupon the audio codec outputs the signal to the speaker 210.

Using the architecture of FIG. 2 and the noise correction module shown in FIG. 3, in some embodiments, the present comprises a personal communications device 101, capable of applying corrections to incoming audio signals of interest, to compensate for ambient noise in the listener's environment, the personal communications device 101 comprising:
  a) a microprocessor 102,
  b) an RF transmitter/receiver 104, coupled to the microprocessor, capable of receiving a first audio signal, which is the signal of interest
  c) a digital signal processing chip configured to implement an audio codec 105, coupled to the microprocessor, which effectuates the decoding of audio signals for output by a speaker, and the encoding of voice and noise audio received by the first and second microphones,
  d) a display screen 106, coupled to the microprocessor, upon which the microprocessor may display information for the user to view,
  e) a keypad 107, couple to the microprocessor, which the user actuates to enter data into the microprocessor,
  f) a data storage/program memory unit 108, coupled to the microprocessor, which the microprocessor uses to store program code and variables,
  g) a speaker 110, coupled to the audio codec 104, disposed upon the device in a location ergonomically suitable for listening through the user's ear when using the device,
  h) a microphone 111, capable of receiving a second audio signal, which is noise, disposed upon the device in a location removed from the locations of the first microphone 108, and speaker 109 suitable to minimizing the effect of the speaker's voice on the ambient noise measurement,
  i) a second digital signal processing (DSP) chip, coupled to the audio codec, the microphone and the speaker, configured to implement a noise correction algorithm 103, the noise correction algorithm comprising:
    i. a first Analog to Digital converter 204;
    ii. a second Analog to Digital converter 205;
    iii. a first Frequency Analysis Module 206;
    iv. a second Frequency Analysis Module 207;
    v. a first Power Estimator Block 208;
    vi. a second Power Estimator Block 209;
    vii. a first dBFS to dBSPL Converter 210;
    viii. a second dBFS to dBSPL Converter 211;
    ix. a first dBSPL to dB Phon Converter 212;
    x. a second dBSPL to dB Phon Converter 213;
    xi. a Perceptual model 222;
    xii. a Gain Block component 217;
    xiii. a Frequency Synthesis Module 218; and
    xiv. a Digital to Analog Converter 219;

whereupon the microprocessor 102 receives a first audio signal which is the signal of interest via the RF transmitter 104, whereupon the microprocessor sends the encoded audio signal to the audio codec 105, whereupon the audio codec decodes the signal into analog form, whereupon the audio codec outputs the signal to a DSP Chip 103, whereupon the DSP Chip 103, obtains a second audio signal from the background noise microphone 111;

whereupon the first audio signal x(t) and the second audio signal $x_0(t)$ are fed, respectively, through the First D/A Converter 204 and Second D/A 205 thereby converting the signals into digital format;

whereupon the first audio signal x(t) and the second audio signal $x_0(t)$ are fed, respectively, through the First Frequency Analysis Module 206 and Second Frequency Analysis Module 207 breaking down each respective audio signal into arrays of frequency components;

whereupon the first audio signal x(t) and the second audio signal $x_0(t)$ are fed, respectively, through the first Power Estimator 208 and the Second Power Estimator 209, which compute power values for the various channels, whereby said power values are then fed into the dB Converter to generate power values for the source signal $P_{dBFS}(f)$ and the background signal $P_{0\_dBFS}(f)$ in dBFS;

whereupon (i) the DSP chip 103 completes a calibration offset such that a first dBFS to dBSPL Converter 210 converts the power value of the source signal from dBFS to dBSPL, and (ii) the DSP chip 103 completes a calibration offset such that a second dBFS to dBSPL Converter 211 converts the power value of the background signal from dBFS to dBSPL, producing $P_{dBSPL}(f)$ and $P_{0\_dBSPL}(f)$;

whereupon (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0(f)$;

whereupon the DSP chip 103 applies the power value of the source signal and the power value of the background signal, now in dB Phons, to the perceptual model 222 whereupon the DSP chip 103 calculates ΔP(f) in dBPhons whereupon the DSP chip 103 calculates a correction gain of power to the source signal G(f), at the frequency, in dBSPL, based on the value of ΔP(f) in dB Phons, using the Gain Block component 217 which utilizes the Gain equation;
whereupon the DSP chip 103 reconstitutes the first audio signal with the corrective gain to the source signal corresponding to the frequency, comprising:
    a) multiplying the source signal at the frequency according to the corresponding corrective gain ΔP(f);
    b) using the Frequency Synthesis Module 18, to reconstitute the resulting audio signal
whereupon the corrected audio signal is fed through the Digital to Analog Converter 219, resulting in analog signal $x_{out}(t)$;
whereupon the DSP chip 203 outputs the corrected signal to the speaker 210.

As shown in FIG. 4, in some embodiments, the perceptual model involves analytically computing the value in Sones of the input signal at a given frequency S(P), along with the estimated hearing loss due to background noise in Sones at that frequency $S(P_0)$, and applying these values to the conductor equation to derive a gain in Phons for the signal that will correct for the perceived hearing loss, the Conductor Equation 13 being, $$S(P)=S(P+\Delta P)-S(P_0)+S(0) \text{ or,}$$

$$\Delta P=S^{-1}(S(P)+S(P_0)-S(0))-P$$

As shown in FIG. 5, in some embodiments, the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for ΔP for any given P and $P_0$.

Computer Readable Media

In some embodiments, as explained by FIG. 10, the present invention can exist in major part on a computer-readable medium 570 storing a set of instructions executable by one or more processors, where the computer-readable medium 570 is effective in producing proper hearing corrections across a spectrum of frequencies by applying corrective gains of amplitude to a plurality of channels which constitute a first audio signal, wherein corrective gains are generated for each channel by solving for a correction value of ΔP for a source signal, wherein said source signal is a channel of the audio signal corresponding to a particular frequency, where ΔP is derived from solving for the output of a perceptual model 522, the computer-readable medium comprising:
  a. code for reading the first audio signal x(t) 502 from the RF transceiver, said first audio signal comprising a plurality of channels corresponding to varying frequencies,
  b. code for obtaining a second audio signal $x_0(t)$ 503 from a microphone, said second audio signal comprising a plurality of channels corresponding to varying frequencies,
  c. code for solving for the power P(f) in Phons of the source signal of the source signal, at a frequency:
    i. code for extracting a power value of the source signal at a frequency, in dBFS with a first power estimator block 508, comprising:
      (A) extracting the first audio signal x(t) 502, said first audio signal comprising a plurality of channels corresponding to varying frequencies f, where said first audio signal is then transmitted to an Analog to Digital Converter 504 thereby converting the signal into digital format;
      (B) feeding the first audio signal through a First Frequency Analysis Module 506 where the first audio signal is broken down into separate frequency components;
      (C) identifying a particular source frequency component of the first audio signal corresponding to a frequency 550;
      (D) generating a power value for the frequency component, whereby said power value is then fed into a dB Converter to generate a power value $P_{dBFS}(f)$ for the source in dBFS 552;
    ii. code for calculating a calibration offset to convert the power value $P_{dBFS}(f)$ of the source signal in dBFS to a power value $P_{dBSPL}(f)$ in dBSPL 510 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
    iii. code for converting the power value of the source signal to dB Phons by applying a dBSPL to dBPhon Conversion equation 512, producing P(f);
  d. code for solving for $P_0(f)$ in Phons of the background signal, at a frequency:
    i. code for extracting a power value of the background signal at the frequency, in dBFS with a second Power Estimator Block 509, comprising:
      (A) extracting a second audio signal $x_0(t)$ 503, said second audio signal comprising a plurality of channels corresponding to varying frequencies, where said second audio signal is then transmitted to a second Analog to Digital Converter 505 thereby converting the signal into digital format;
      (B) feeding the second audio signal through a Second Frequency Analysis Module 507 where the second audio signal is broken down into separate components;
      (C) identifying a particular background signal component, corresponding to a particular frequency 550;
      (D) obtaining a power value for the background signal component, whereby said power value is then fed into a dB Converter to generate a power value $P_{0\_dBFS}(f)$ for the background signal in dBFS 552;
    ii. code for calculating a calibration offset to convert the power value of the background signal $P_{0\_dBFS}(f)$ in dBFS to a power value $P_{0\_dbSPL}(f)$ in dBSPL using the calibration equation 5 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
    iii. code for converting the power value of the background signal to dB Phons by applying the dBSPL to dBPhon Conversion equation 513, producing $P_0(f)$;

e. code for using the computational model 522 to solve for ΔP(f)
f. code for calculating a correction gain of power G(f), for a frequency f, in dBSPL based on the value of ΔP(f) in dB Phons, using a Gain equation 517;
g. code for reconstituting the first audio signal with the corrective gain to the source signal at the frequency, comprising
   i. feeding the correction gain to an amplifier wherein the amplifier amplifies the source signal at the frequency by the corrective gain G(f) 553;
   ii. combining, using a Frequency Synthesis Module 518, the channels of the corrected signal, reconstituting the corrected signal, producing $x_{out}(t)$;
h. code for feeding the corrected audio signal through a Digital to Analog Converter 519;
i. code for transmitting the corrected audio signal to an amplifier, to be output through a speaker.

In some embodiments, as explained by FIG. 11, the present invention can exist in major part on a computer medium, 670 storing a set of instructions executable by one or more processors, where the computer-readable medium 670 is effective in producing proper hearing corrections across a spectrum of frequencies by applying corrective gains of amplitude to a plurality of channels which constitute a first audio signal, wherein corrective gains are generated for each channel by solving for a correction value of ΔP for a source signal, wherein said source signal is a channel of the audio signal corresponding to a particular frequency, where ΔP is derived from a novel Conductor Equation 616, $$S(P)=S(P+\Delta P)-S(P_0)+S(0) \text{ or,}$$

$$\Delta P=S^{-1}(S(P)+S(P_0)-S(0))-P,$$

where S(P)=a Sones equation from an EarSpring equation solution 614, as a function of Phons Pressure, P=a Phons amplitude of a source signal of interest, ΔP=the gain needed to make a source signal appear at proper loudness for impaired hearing, and $P_0$=an elevated threshold in Phons of impaired hearing, the computer-readable medium comprising:

a) code for reading the first audio signal x(t) 502 from the RF transceiver, said first audio signal comprising a plurality of channels corresponding to varying frequencies,
b) code for obtaining a second audio signal $x_0(t)$ 503 from a microphone, said second audio signal comprising a plurality of channels corresponding to varying frequencies,
c) code for solving for S(P) of the Conductor Equation which comprises:
   i. code for extracting a power value of the source signal at a frequency, in dBFS with a first power estimator block 608, comprising:
      A. extracting the first audio signal x(t), said first audio signal comprising a plurality of channels corresponding to varying frequencies, where said first audio signal is then transmitted to an Analog to Digital Converter thereby converting the signal into digital format;
      B. feeding the first audio signal through a first digital filterbank 606 where the first audio signal is broken down into separate channels corresponding to varying Frequencies f;
      C. identifying the source signal, wherein the source signal is a particular channel of the first audio signal corresponding to the frequency 650;
      D. feeding the source signal through a squared summer equation 651 whereby the source signal is squared and added up N times, whereby the sum of the signal at the end block divided by N generates a mean power value for the source signal, whereby said power value is then fed into a dB Converter to generate a power value for the source in dBFS 652, $P_{dBFS}(f)$;
   ii. code for calculating a calibration offset to convert the power value of the source signal $P_{dBFS}(f)$ in dBFS to a power value $P_{dBSPL}(f)$ in dBSPL 610 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
   iii. code for converting the power value of the source signal to dB Phons by applying a dBSPL to dBPhon Conversion equation 612, producing P(f);
   iv. code for applying the power value of the source signal P(f), now in dB Phons, to the EarSpring equation 614 in order to obtain the power value of the source signal in Sones, or S(P(f));
d) code for solving for S($P_0$) of the Conductor Equation which comprises:
   i. code for extracting a power value $P_0(f)$ of the background signal at the frequency, in dBFS with a second Power Estimator Block 609, comprising
      A. extracting a second audio signal $x_0(t)$, said second audio signal comprising a plurality of channels corresponding to varying frequencies, where said second audio signal is then transmitted to a second analog to digital Converter 605 thereby converting the signal into digital format;
      B. feeding the second audio signal through a second Digital Filter Bank 607 where the second audio signal is broken down into separate channels $X_0(f)$ corresponding to varying frequencies;
      C. identifying the background signal, wherein the background signal is a particular channel $X_0(f)$ of the audio signal corresponding to the frequency;
      D. feeding the background signal through a squared summer equation 651 whereby the background signal is squared and added up N times, whereby the sum of the signal at the end block divided by N generates a mean power value for the signal, whereby said power value is then fed into a dB Converter to generate a power value for the background signal in dBFS 652, producing $P_{0\_dBFS}(f)$;
   ii. code for calculating a calibration offset to convert the power value of the background signal $P_{0\_dBFS}(f)$ in dBFS to a power value $P_{0\_dBSPL}(f)$ in dBSPL using the calibration equation 611 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;

iii. code for converting the power value of the background signal to dB Phons by applying the dBSPL to dBPhon Conversion equation 613, producing $P_0(f)$;

iv. code for applying the power value of the background signal, now in dB Phons, to the EarSpring equation 615 in order to obtain the power value of the background signal in Sones, or $S(P_0)$;

e) code for using $S(P(f))$ and $S(P_0(f))$ to solve for $\Delta P(f)$ using the Conductor equation 616 which results in the Conductor equation 616 generating a $\Delta P(f)$ in dBPhons;

f) code for calculating a correction gain of power $G(f)$, for a frequency f, in dBSPL based on the value of $\Delta P(f)$ in dB Phons, using a Gain equation 617;

g) code for reconstituting the first audio signal with the corrective gain to the source signal at the frequency, comprising:

i. feeding the correction gain to an amplifier wherein the amplifier multiplies the source signal at the frequency by the corrective gain $\Delta P(f)$ 653;

ii. combining, using a Summer Block 618, the channels of the corrected audio signal to reconstitute the corrected output $x_{out}(t)$;

h) code for feeding the first audio signal through a Digital to Analog Converter 619;

i) code for transmitting the first audio signal, now in analog format, to the Amplifier 620; and j) code for causing the Amplifier 620 to output the audio signal, now containing the corrective gain at the frequency, to a Speaker 620 where the Speaker 620 outputs the audio signal with the corrective gain at the frequency;

wherein the EarSpring equation 614 is $[d^2/dt^2+2\beta(d/dt)+k(1+\gamma\gamma<y^2>)]y(t)=\eta F(t)$, where t=time, y(t)=amplitude of vibration, F(t)=driving force, identified as the Phons amplitude in the following equations, $<y^2>$=mean power of vibration or S(P), identified as the Sones power in the following equations, $\beta$=damping constant, k=spring constant, and $\gamma$=coefficient of power dependence of spring constant, and $\eta$=the scale factor;

wherein the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz;

wherein the dBSPL to dBPhon Conversion equation 608 is:

$$P_{dBPhon}(F) = \frac{P_{dBSPL}(F) - ATH(F)}{1 + kATH(F)}$$

wherein the Gain equation 613 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH (F)>0
 =+1/240 when ATH(F)<0

In some embodiments, all or part of the present invention could be implemented using a parallel processing architecture such that some or all of the set of computations from step 5 to 10 above may be computed simultaneously using multiple processing units.

In some embodiments, the absolute threshold of hearing may be computed in one example by the formula:

$$ATH(F) = \frac{3.64}{F_{kHz}^{0.8}} - 6.5e^{-0.6(F_{kHz}-3.3)^2} + 0.001F_{kHz}^4 - 3.37$$

In some embodiments, as shown in FIG. 6. a Fourier transform of the signal is used so that the gain computation is performed for each element in the frequency spectrum instead of by channel.

In some embodiments, as shown in FIGS. 5, 8, and 10, a computational model can be used in place of explicit computation of the Earspring and Conductor equations, where the computational model is $$\Delta P \cong \frac{AP^2 + BP + C}{DP^2 + EP + 1},$$

where A, B, C, D and E are parameters which have been fit against solutions to the combined Earspring and Conductor Equations, for each value of $P_0$ in 5 dB increments, and stored in a lookup table, such that for a given $P_0$, parameters for A, B, C, D, and E are extracted from the table, and then the computational model is used to compute $\Delta P$ given P.

In some embodiments it is also possible to use separate computational models for S(P) and for $S^{-1}(S)$, with separate sets of parameters fit against the solutions for various boundary parameters and values of $P_0$.

In some embodiments the processing chain, from output of channels at the digital filter bank to adding gains to channels via the gain component, is a process that occurs in parallel for all channels of the audio signal, through the use of threaded processes, or through the use of a parallel computing device, such as a multi-core processing unit.

Description of Additional Preferred Embodiments

FIG. 6 shows another alternative embodiment in place of the perceptual model. In this case, a parallel compression module is fit against the Earspring and Conductor equations and used to estimate their responses. In this embodiment, the optimal threshold (T), makeup gain (M) and compression ratio (R) for a plurality of noise signal powers are pre-computed. These parameters are then stored in memory, or approximated using a function approximator across a range of possible noise powers. At run time, these parameters are then computed and retrieved using a parameter estimation module 311 and applied to a linear compression module 312, which then compresses the source audio signal according to the source signal power, and adds the compressed signal back into the source signal. The resulting parallel compression is a non-linear compression of the source that approximates the effect of the Earspring and Conductor equations.

FIG. 7 demonstrates the way the parallel compression model is implemented in the noise correction module, using the various sub-components of the frequency, where each component has its power estimated and is compressed according to a parameters selected depending on the noise power. The frequency components are then combined to produce an output signal.

Using the architecture of FIG. 1, in some embodiments, with the noise correction module of FIG. 7 the present invention may comprises a personal communications device 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the personal communications device 01 comprising:
a) a microprocessor 02, the microprocessor being a multi-core processor containing a digital signal processor 03,
b) an RF transmitter/receiver 04, coupled to the microprocessor, capable of receiving a first audio signal, which is the signal of interest
c) a digital signal processing chip configured to implement an audio codec 05, coupled to the microprocessor, which effectuates the decoding of audio signals for output by a speaker, and the encoding of voice and noise audio received by the first and second microphones,
d) a display screen 06, coupled to the microprocessor, upon which the microprocessor may display information for the user to view,
e) a keypad 07, couple to the microprocessor, which the user actuates to enter data into the microprocessor,
f) a data storage/program memory unit 08, coupled to the microprocessor, which the microprocessor uses to store program code and variables,
g) a speaker 10, coupled to the audio codec 05, disposed upon the device in a location ergonomically suitable for listening through the user's ear when using the device,
h) a microphone 11, capable of receiving a second audio signal, which is noise, disposed upon the device in a location removed from the locations of the first microphone 08, and speaker 09 suitable to minimizing the effect of the speaker's voice on the ambient noise measurement,
i) the digital signal processor 03, configured to implement a noise correction algorithm, the noise correction algorithm comprising:
i. a first frequency analysis module 406, configured to extract a plurality of frequency components from the first audio signal;
ii. a second frequency analysis module 407, configured to extract a plurality of frequency components from the second audio signal;
iii. a first power estimation block 408, configured to calculate the sound intensity in decibels of each frequency component of the first audio signal 002;
iv. a second power estimation block 409, configured to calculate the sound intensity of decibels of each frequency component of the second audio signal 003;
v. a first dBFS to dBSPL Converter 410;
vi. a second dBFS to dBSPL Converter 411; a parameter estimation module 422, which determines parameter settings for a parallel compression module, according to information stored in memory,
vii. the parallel compression module 417, parameterized by threshold T, compression ratio R, and makeup gain g0, where the parameters may by dynamically varied, where the parallel compression module is comprised of:
(a) a linear compression module, which applies gains to the first audio signal according to the equation G=g0+(P−T)*(1/R+1), where G is the gain in dB to be applied to a frequency component of the first audio signal, P is the sound intensity of the frequency component in dB, g0 is the makeup gain in dB, T is the threshold in dB, and R is the compression ratio of the linear compression,
(b) a summer, which combines the resulting amplified first audio signal component with the original first audio signal component
viii. a Frequency Synthesis Module 418;
whereupon the microprocessor 02 receives a first audio signal which is the signal of interest via the RF transmitter 04, whereupon the microprocessor 01 receives a second audio signal, which is the noise signal via the microphone,
whereupon the first audio signal 402 and second audio signal 403 are input to the noise correction algorithm,
whereupon the first audio signal x(t) and the second audio signal $x_0(t)$ are fed, respectively, through the First Frequency Analysis Module 404 and Second Frequency Analysis Module 405 breaking down each respective audio signal into arrays of frequency components;
whereupon the first audio signal x(t) and the second audio signal $x_0(t)$ are fed, respectively, through the first Power Estimator 408 and the Second Power Estimator 409, which compute power values for the various channels, whereby said power values are then fed into the dB Converter to generate power values for the source signal $P_{dBFS}(f)$ and the background signal $P_{0\_dBFS}(f)$ in dBFS;
whereupon (i) the microprocessor 401 completes a calibration offset such that a first dBFS to dBSPL Converter 410 converts the power value of the source signal from dBFS to dBSPL, and (ii) the microprocessor 401 completes a calibration offset such that a second dBFS to dBSPL Converter 411 converts the power value of the background signal from dBFS to dBSPL, producing $P_{dBSPL}(f)$ and $P_{0\_dBSPL}(f)$;
whereupon, for each frequency component, and at each instant, the microprocessor 401, using the power estimates of the frequency components of the first and second audio signals, obtains parameters for the parallel compression 422, depending on the sound intensity of the second audio signal at each instant,
whereupon the microprocessor 401, applies the parameters to a parallel compression module 417,
whereupon the parallel compression module 417 applies a linear compression, according to the selected parameters, to each of the frequency components of the first audio signal 002,
whereupon the parallel compression module 417 sums each frequency component of the first audio signal 002 with the corresponding compressed audio signal,
whereupon the microprocessor 401 repeats the process of estimating the power of both the signal of interest and the noise, selecting compression settings, and applying parallel compression for each frequency component of the first audio signal 002,
whereupon the DSP 401 reconstitutes the first audio signal using the Frequency Synthesis Module 418;
whereupon the DSP 401 outputs a corrected audio signal to the microprocessor,
whereupon the microprocessor sends the encoded audio signal to the audio codec 05,
whereupon the audio codec decodes the signal into analog form, whereupon the audio codec outputs the signal to the speaker 10.

Using the system architecture for the personal communication device shown in FIG. 2, in some the present invention comprises a personal communications device 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the personal communications device 101 comprising:
a) a microprocessor 102,
b) an RF transmitter/receiver 104, coupled to the microprocessor, capable of receiving a first audio signal, which is the signal of interest
c) a digital signal processing chip configured to implement an audio codec 105, coupled to the microprocessor, which effectuates the decoding of audio signals for output by a speaker, and the encoding of voice and noise audio received by the first and second microphones,
d) a display screen 106, coupled to the microprocessor, upon which the microprocessor may display information for the user to view,
e) a keypad 107, couple to the microprocessor, which the user actuates to enter data into the microprocessor,
f) a data storage/program memory unit 108, coupled to the microprocessor, which the microprocessor uses to store program code and variables,
g) a speaker 110, coupled to the audio codec 104, disposed upon the device in a location ergonomically suitable for listening through the user's ear when using the device,
h) a microphone 111, capable of receiving a second audio signal, which is noise, disposed upon the device in a location removed from the locations of the first microphone 108, and speaker 109 suitable to minimizing the effect of the speaker's voice on the ambient noise measurement,
i) a second digital signal processing (DSP) chip, coupled to the audio codec, the microphone and the speaker, configured to implement a noise correction algorithm 103, the noise correction algorithm comprising:
  i. a first Analog to Digital converter 404;
  ii. a second Analog to Digital converter 405;
  iii. a first frequency analysis module 406, configured to extract a plurality of frequency components from the first audio signal;
  iv. a second frequency analysis module 407, configured to extract a plurality of frequency components from the second audio signal;
  v. a first power estimation block 408, configured to calculate the sound intensity in decibels of each frequency component of the first audio signal 002;
  vi. a second power estimation block 409, configured to calculate the sound intensity of decibels of each frequency component of the second audio signal 003;
  vii. a first dBFS to dBSPL Converter 10;
  viii. a second dBFS to dBSPL Converter 11; a parameter estimation module 422, which determines parameter settings for a parallel compression module, according to information stored in memory,
  ix. the parallel compression module 417, parameterized by threshold T, compression ratio R, and makeup gain g0, where the parameters may by dynamically varied, where the parallel compression module is comprised of:
    a. a linear compression module, which applies gains to the first audio signal according to the equation G=g0+(P−T)*(1/R+1), where G is the gain in dB to be applied to a frequency component of the first audio signal, P is the sound intensity of the frequency component in dB, g0 is the makeup gain in dB, T is the threshold in dB, and R is the compression ratio of the linear compression,
    b. a summer, which combines the resulting amplified first audio signal component with the original first audio signal component
  x. a Frequency Synthesis Module 418; and
  xi. a Digital to Analog Converter 419;
whereupon the microprocessor 102 receives a first audio signal which is the signal of interest via the RF transmitter 104,
whereupon the microprocessor sends the encoded audio signal to the audio codec 105, whereupon the audio codec decodes the signal into analog form,
whereupon the audio codec outputs the signal to a DSP Chip 103,
whereupon the DSP Chip 103, obtains a second audio signal from the background noise microphone 111;
whereupon the first audio signal x(t) and the second audio signal $x_0(t)$ are fed, respectively, through the First D/A Converter 404 and Second D/A 405 thereby converting the signals into digital format;
whereupon the first audio signal x(t) and the second audio signal $x_0(t)$ are fed, respectively, through the First Frequency Analysis Module 406 and Second Frequency Analysis Module 407 breaking down each respective audio signal into arrays of frequency components;
whereupon the first audio signal x(t) and the second audio signal $x_0(t)$ are fed, respectively, through the first Power Estimator 408 and the Second Power Estimator 409, which compute power values for the various channels, whereby said power values are then fed into the dB Converter to generate power values for the source signal $P_{dBFS}(f)$ and the background signal $P_{0\_dBFS}(f)$ in dBFS;

whereupon (i) the DSP 103 completes a calibration offset such that a first dBFS to dBSPL Converter 410 converts the power value of the source signal from dBFS to dBSPL, and (ii) the DSP 103 completes a calibration offset such that a second dBFS to dBSPL Converter 411 converts the power value of the background signal from dBFS to dBSPL, producing $P_{dBSPL}(f)$ and $P_{0\_dBSPL}(f)$;

whereupon, for each frequency component, and at each instant, the DSP 103, using the power estimates of the frequency components of the first and second audio signals, obtains parameters for the parallel compression 422, depending on the sound intensity of the second audio signal at each instant, whereupon the DSP 103, applies the parameters to a parallel compression module 417, whereupon the parallel compression module 417 applies a linear compression, according to the selected parameters, to each of the frequency components of the first audio signal 002, whereupon the parallel compression module 417 sums each frequency component of the first audio signal 002 with the corresponding compressed audio signal, whereupon the DSP 103 repeats the process of estimating the power of both the signal of interest and the noise, selecting compression settings, and applying parallel compression for each frequency component of the first audio signal 002, whereupon the DSP 103 reconstitutes the first audio signal using the Frequency Synthesis Module 418;

whereupon the corrected audio signal is fed through the Digital to Analog Converter 419, resulting in analog signal $x_{out}(t)$;

whereupon the DSP chip 203 outputs the corrected signal to the speaker 10.

As shown in FIG. 12, the present invention in some embodiments, comprises the alternative parallel compression method on a computer-readable medium 70 storing a set of instructions executable by one or more processors, where the computer-readable medium 1070 is effective in producing proper hearing corrections across a spectrum of frequencies by applying corrective gains of amplitude to a plurality of frequency components which constitute a first audio signal, wherein parallel compression is used to approximate gain curves derived from a psychoacoustic model, wherein the compression is implemented by applying a gain G to the signal of interest according to the following equation:

$$G = g0 + (P-T)*(1/R-1)$$

where G is the gain in dB to be applied to a frequency component of the first audio signal, P is the sound intensity of the frequency component in dB, g0 is the makeup gain in dB, T is the threshold in dB, and R is the compression ratio of the linear compression, whereupon the linearly compressed signal is added to the first audio signal, where the overall amplitude of the input versus the output signal defines a parallel compression curve, where g0, T, and R are thus parameters that vary the shape of the resulting compression curve, where the psychoacoustic model takes as inputs a source signal loudness and a noise signal loudness, where the model computes the gain in sound loudness at a given frequency component required to correct for the effect of an ambient noise signal, where the parameters g0, T, and R, for a plurality of noise loudness level, are determined beforehand and stored in memory, where a different set of parameters is retrieved at each instant depending on the ambient noise signal intensity at each frequency component, where the dynamically changing noise signal intensity results in a dynamically changing selection of parameters for the parallel compression module, the computer-readable medium comprising:
a) code for, at each frequency component, extracting a power value of the source signal at a frequency component, in dBFS with a first power estimator block 1008; comprising:
  i. extracting the first audio signal x(t) 1002, said first audio signal comprising a plurality of frequency components, where said first audio signal is then transmitted to an Analog to Digital Converter 1004 thereby converting the signal into digital format,
  ii. feeding the first audio signal through a First Frequency Analysis Module 1006 where the first audio signal is broken down into separate frequency components,
  iii. identifying a particular source signal of the first audio signal corresponding to a frequency component 1050,
  iv. generating a power value for the source signal, whereby said power value is then fed into a dB Converter to generate a power value $P_{dBFS}(f)$ for the source signal in dBFS 1052,
  v. code for calculating a calibration offset to convert the power value $P_{dBFS}(f)$ of the source signal in dBFS to a power value $P_{dBSPL}(f)$ in dBSPL 1010 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12,
b) code for extracting a power value of the background signal at the frequency component, in dBFS with a second Power Estimator Block 1009; comprising:
  i. extracting a second audio signal $x_0(t)$ 1003, said second audio signal comprising a plurality of frequency components, where said second audio signal is then transmitted to a second Analog to Digital Converter 1005 thereby converting the signal into digital format,
  ii. feeding the second audio signal through a Second Frequency Analysis Module 1007 where the second audio signal is broken down into separate frequency components,
  iii. identifying a particular background signal, corresponding to the frequency component 1050,
  iv. obtaining a power value for the background signal, whereby said power value is then fed into a dB Converter to generate a power value $P_{0\_dBFS}(f)$ for the background signal in dBFS 1052,
  v. code for calculating a calibration offset to convert the power value of the background signal $P_{0\_dBFS}(f)$ in dBFS to a power value $P_{0\_dbSPL}(f)$ in dBSPL using the calibration equation 1011 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_O$−dBFS$_O$) wherein dBSPL$_O$ is nominally a value between 65 and 83, and wherein dBFS$_O$ is nominally a value between −20 and −12, c) code for determining parameters for the parallel compression module 1022, including compression ratio, makeup gain, and threshold, based on the power value of the background signal, where the parameters have previously been fit against solutions to the Earspring and conductor equations, for a variety of background signal power values, and where the parameters may be retrieved at runtime, given a background signal power;

d) code for applying parallel compression to the source signal 1023, using the stored parameters now retrieved, thereby amplifying the source signal according to the desired compression;

e) code for reconstituting the audio signal with the corrective gain to the source signal at the frequency component, comprising combining, using a Frequency Synthesis Module 1018, the parallel compressed frequency components of the audio signal, producing a corrected audio signal, xout(t)

In a some embodiments, discrete sets of parameters for the parallel compression are found by dividing the range of possible noise volumes into discrete levels, where sets of parameters are found for each discrete noise loudness level, where the parameter estimation module 422 is a lookup table, where during real-time processing the ambient noise intensity is measured and used to select the corresponding set of parameters.

In some embodiments, the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In some embodiments, one or more parameters (e.g. T) is defined as a function of the ambient noise intensity (e.g. T=P$_N$-T', where P$_N$ is noise loudness), such that the parameters stored (e.g. T') are the parameters of the function defining the relationship between sound intensity (e.g. P$_N$) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In this embodiment, a fixed set of parameters is used. The fixed parameters may fall in the range of 2 to 6 for compression ratio, 15 dB to 25 dB for makeup gain, and −15 to −25 dB for threshold offset.

In some embodiments the First and Second Frequency Analysis Modules 406, 407 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 418 is a summer operation that combines the various channels into output xout(t).

In some embodiments, the First and second Frequency Analysis Modules 406,407 are digital filter banks composed of wavelet filters.

In some embodiments, the various sub-band channels correspond to critical bands of hearing.

In some embodiments, the First and Second Frequency Analysis Modules 406,407 are composed of FFT coprocessors that perform Fourier transforms on the input signals producing X(t) and X$_0$(t), where the power of each component is found by squaring the Fourier component, and the Frequency Synthesis Module 418 is an FFT coprocessor that performs an inverse Fourier transform, resulting in output signal x$_{out}$(t).

In some embodiments, the frequency components may be grouped together to approximate sub-bands correspond to critical bands of hearing.

In some embodiments, the present invention may be multi-channel, such as in a stereo or surround sound system. In this case, gains are computed independently for each channel independently. These gains may be based on one central background noise estimate, or multiple noise estimates at each speaker. Each channel is then amplified by its corresponding gains so that the overall surround effect compensates for the presence of background noise.

In some embodiments, the present invention features a personal communications device for correcting an audio signal. The apparatus, or audio source as claimed, (e.g., a personal communications device) may, for example, comprise a standard personal communications device receiver, a standard personal communications device microphone, and a standard personal communications device speaker, all of which are well known to one of ordinary skill in the art. The receiver can function to extract an amplitude of a source signal (e.g., an incoming conversation on a personal communications device) at given frequency (or within a frequency range) and the microphone can function to detect an amplitude of a background signal at a corresponding frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In some embodiments, some elements of the above process flow might be performed using analog circuitry before being input to the microprocessor.

In some embodiments, Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, referring to the means of extracting amplitudes of source signals or background signals: at the output of each filter which selects a band of adjacent frequencies, an electrical circuit to effect extraction of amplitudes could be the use of a diode, or rectifier bridge, fed by each signal which, in turn, feeds a simple series resistor and a capacitor in shunt to create an integrator of the absolute value of the signal. The integrator would accumulate rectified current for some period of time before being applied to the loudness response curve selection circuit, after which the capacitor would be shorted to discharge the accumulated current, in anticipation of the next cycle of integration. Alternatively, the capacitor could be allowed to discharge continuously through a higher valued resistor in shunt, so that charge can be bled off more slowly than it is accumulated, thereby forming a running exponential average integrator.

In some embodiments, a more sophisticated version of amplitude estimation could send the signals through a squarer circuit ahead of the RC integrator in order to accumulate an estimate of the power in the signal. The resulting integrated current would be an estimate of the RMS power at the end of the integration period. This power estimate could then feed the gain correction curve selection circuit.

In some embodiments, the output of each integrator can be fed to an analog differencing amplifier (operational amplifier, or OpAmp) to subtract the estimated amplitude of the noise signal from the estimated amplitude of the signal of interest. The output of this difference amplifier can be used to establish a dynamic compressor threshold. The output of the compressor circuit (a voltage controlled amplifier, or VCA) can be added to the dry signal to effect a nonlinear correction. A simple linear compressor (VCA) adjusted with suitable make-up gain and compression ratio can produce, in sum with the dry signal, an approximation of the required nonlinear correction gain.

The present invention is not limited to the aforementioned examples of means of extracting amplitudes.

Without wishing to limit the present invention to any theory or mechanism, it is believed that the present invention is advantageous because the present invention features a maximum output volume, for example the source signal will be amplified to only a certain degree. This can help protect against damage to the user's hearing. Furthermore, the systems frequently detect the background noise (e.g., 10-40 times per second, 1,000 times per second, etc.), allowing for the systems to react quickly to changes in the background noise. Furthermore, the systems utilize non-linear corrections, thus, loud signals are not amplified much if at all.

The systems of the present invention can allow for microphone sensitivity to be altered. For example, a particular user may wish to have more correction or less correction. For example, the microphone may be in someone's pocket, or else exposed directly to the ambient noise sounds. If the microphone becomes shielded, it will produce a weaker response to the noise than if it were directly exposed. Hence the microphone gain can be increased to compensate for the shielding. Also, each of us has a slightly different response to noise levels, some people being more sensitive to it than others. A variable gain on the microphone can help to compensate for individual differences of loudness perception. Finally microphones exhibit varying characteristics depending on their specific construction. A variable microphone gain in the software can help to normalize the response from different microphones.

In some embodiments, the systems of the present invention can allow for signals to be corrected prior to transmission or recording, such that ambient noise in the recorded or received signal is retained, but the spectral composition of the primary source signal is modified to compensate, as an alternative to standard noise reduction techniques.

In some embodiments, the present invention further comprises an output transducer. Said transducer may be a substance or device, such as a piezoelectric crystal, microphone, or photoelectric cell. Said transducers are effective to convert input energy of one form into output energy of another. An output transducer may be in electronic communication with the microprocessor or DSP.

In some embodiments, the present invention further comprises one or more sensors for sensing audio signals. Said sensors may be advantageous because they can be placed at one or more locations on the device, thereby increasing the ability of the device to detect audio signals. Said sensors may be in electronic communication with the microprocessor or DSP.

In some embodiments, the present invention further comprises a remote server for storing user information such as parameters. In some embodiments, the remote server can process audio information. Said feature may be in communication with the microprocessor or DSP.

In some embodiments, the present invention further comprises a server provider network. For example, the present invention may communicate with a cell phone service network and may make audio adjustments at various locations throughout the network. Said feature greatly enhances the flexibility of the present invention. Said feature may be in communication with the microprocessor or DSP.

In some embodiments, the present invention further comprises a combination of vTuning and vDBM. For example, the present invention may dynamically adjust audio signals to account for interfering ambient noise while also making a spectral sound adjustment to the signal of interest to personalize sound according to a user's preference. Said feature may be enabled, for example, where the microprocessor or DSP contains both instructions for vTuning and vDBM.

In some embodiments, the present invention further comprises removable memory devices for storing hearing preferences and profiles. Said memory devices may be, for example, zip drives, memory sticks, memory cards, or the like. Said feature may be in communication with the microprocessor or DSP.

In some embodiments, the present invention further comprises a composite profile. Said feature may, for example, be electronically stored on the microprocessor or DSP.

In some embodiments, the present invention further comprises accessory ports. Said ports are effective for allowing the present invention to communicate with additional devices. Said feature may be in communication with the microprocessor or DSP and may be in predetermined locations on the device in places convenient for contact with external devices and connecting peripherals.

In some embodiments, the present invention further comprises streaming audio, or audio that is constantly received by and presented to an end-user while being delivered by a streaming provider. Said audio may be received be received by the present invention at the audio device.

In some embodiments, the present invention further comprises streaming video, or video that is constantly received by and presented to an end-user while being delivered by a streaming provider. Said video may be received be received by the present invention at the audio device.

In some embodiments, the present invention further comprises radio reception. Radio reception may be via the of, for example, an antennae where said antennae is in electronic communication with the microprocessor or DSP.

In some embodiments, the present invention further comprises resources configured to prompt the user to provide information such as sound alerts, or messages displayed on a screen. Said feature may be instructions encoded to or programmed on the microprocessor or DSP.

In some embodiments, the present invention further comprises a communication network, effective for sharing information with external devices and systems. Said network may be wired, or wireless.

In some embodiments, the present invention further comprises an input/output controller. Said device may be a device that interfaces between an input or output device and a computer or hardware device, such as, for example, the microprocessor or DSP.

In some embodiments, the present invention further comprises one or more of the following peripherals: a USB port, an infrared port, or a storage device. Said peripherals enable the present invention communicate with one or more external devices. Said peripherals may be located at predetermined locations on the personal communications device and be in electronic communication with the microprocessor or DSP.

In some embodiments, the present invention further comprises common network protocols, which may be stored on the microprocessor or DSP, for sending and receiving information to and from a mobile phone include AMPS (analog signal), TDMA (Time division multiple access), including GSM (General system for mobile), CDMA (code division multiple access), and GPRS (general packet radio service). There are other standards that comprise a sub or super set of these general classifications. The aforementioned are mentioned to include signal means between network and mobile phone that span analog, circuit switched, analog digital and packet based wireless services. Mobile phones adapted to communication with the protocols are provided with signal processing capability that is increasing in power and flexibility.

In some embodiments, the present invention further comprises a side tone and side tone adder. Side tone may be the effect of sound that is picked up by the telephone's mouthpiece and in real-time introduced at a low level into the earpiece of the same handset, acting as controlled feedback. Adding the side tone may be via an electric adder. Side tone may also be sound diverted from a telephone microphone to the earpiece so that a speaker hears his own voice at the same level and position as that of the respondent.

In some embodiments, the present invention can be utilized with a standard television set. As such the television may be in electronic communication with the personal communications device through a wired or wireless connection. Said embodiment may allow a standard television to utilize vTuning or VDBM via the personal communications device.

In some embodiments, the present invention further comprises a maximum gain filter in electronic communication with the microprocessor or DSP and the amplifier or gain block. Said feature may prevent the gains applied to the audio signal of interest to exceed a certain level of gain.

In some embodiments, the present invention further comprises a peak detector, which may be time varying. Said peak detector may be a series connection of a diode and a capacitor outputting a DC voltage equal to the peak value of an applied AC signal, Said peak detector may be in electronic communication with the microprocessor or DSP, gain block, amplifier, or audio device or any combination thereof.

In some embodiments, the present invention further comprises a touch screen controller in electronic communication with the microprocessor or DSP.

In some embodiments, the present invention further comprises an LCD (Liquid Crystal Display). In some embodiments, the present invention further comprises an LCD controller. Said features are effective for display of information pertaining to the present invention to the user and may be in electronic communication with the microprocessor or DSP.

In some embodiments, the present invention further comprises a baseboard processor. Said feature may be in electronic communication with the microprocessor or DSP, or be utilized in place of the microprocessor or DSP.

In some embodiments, the present invention further comprises a GPS antenna effective for receiving GPS signals.

In some embodiments, the present invention further comprises an application processor which may be an integrated Circuit chip similar to the microprocessor or DSP and may control the applications and flow of data on the present invention. Said applications processor may be in communication with and in addition to the microprocessor or DSP, or may exist in place of the microprocessor or DSP.

In some embodiments, the present invention further comprise a Class D Amp which may be an electronic amplifier where all power devices are operated as binary switches. Said amplifier may be in electronic communication with the microprocessor or DSP.

In some embodiments, the present invention further comprises a low power audio codec, which may contain vDBM. Said feature may be a computer program implementing an algorithm and said codec may reside or be in electronic communication with the microprocessor or DSP.

In some embodiments, the present invention further comprises echo cancellation which describes the process by which echo is removed from a voice communication in order to improve sound quality during, for example, a phone call. Said process may be conducted via the DSP or in a software implementation and may use echo suppressors, echo cancelers, or any combination thereof.

In some embodiments, the present invention further comprises a packet switching network which optimizes data transmission to and from the present invention by grouping data into blocks, called packets, irrespective as to the type of data being transmitted. Said feature may be implemented via a network adapter, transceiver, or the like.

In some embodiments, steps for converting analog audio input signals to digital input signals can be bypassed where the invention utilizes digital input audio sources capable of receiving digital audio signals and transmitting the same to the processor.

As used herein, the term "hearing impaired" refers to physical hearing impairment, as in the traditional sense of hearing loss, and/or, can also refer to temporary hearing loss caused by a background noise or other temporary hearing loss factors. One of the novel discoveries addressed by the present invention is that a individual with normal hearing can in fact experience hearing impairment due to background noise, or background signals interfering with source noise or source signals.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention. THESE ARE NOT CLAIMS, THEY ARE ADDITIONAL DISCLOSURE:

1. A personal communications device 01, capable of applying corrections to a first audio signal of interest, to compensate for ambient noise in the listener's environment, by applying corrective gains to a plurality of frequency components which constitute the first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the ambient background noise $P_0$, wherein corrective gains are generated for each frequency component by solving for a correction gain $\Delta P$ for the first audio signal which will suffice to raise the volume of each frequency component of the first audio signal so that the user will perceive it above background noise, by the loudness amount equivalent to how the first audio signal would be perceived in a noiseless environment, the personal communications device 01 comprising:
   a) a microprocessor 02, the microprocessor being a multi-core processor containing a digital signal processor (DSP);
   b) an RF transmitter/receiver 04, coupled to the microprocessor, capable of receiving a first audio signal, which is the signal of interest;
   c) a digital signal processing chip configured to implement an audio codec 05, coupled to the microprocessor, which effectuates the decoding of audio signals for output by a speaker, and the encoding of voice and noise audio received from the RF transmitter/receiver and a microphone;
   d) a display screen 06, coupled to the microprocessor, upon which the microprocessor may display information for the user to view;
   e) an input device 07, couple to the microprocessor, which the user actuates to enter data to the microprocessor
   f) a data storage/program memory unit 08, coupled to the microprocessor, which the microprocessor uses to store program code and variables;
   g) a speaker 10, coupled to the audio codec 05, disposed upon the device in a location ergonomically suitable for listening through the user's ear when using the device;
   h) the microphone 11, capable of receiving a second audio signal; and
   i) the DSP 03, configured to execute applications for:
   i. a first Frequency Analysis Module 206,
   ii. a second Frequency Analysis Module 207,
   iii. a first Power Estimator Block 208,
   iv. a second Power Estimator Block 209,
   v. a first dBFS to dBSPL Converter 210,
   vi. a second dBFS to dBSPL Converter 211,
   vii. a first dBSPL to dB Phon Converter 212,
   viii. a second dBSPL to dB Phon Converter 213,
   ix. a Perceptual model 222,
   x. a Gain Block component 217, and a
   xi. a Frequency Synthesis Module 218,
wherein the microprocessor 02 receives a first audio signal which is the signal of interest via the RF transmitter 03, whereupon the microprocessor 02 receives a second audio signal, which is the noise signal via the microphone, whereupon the first audio signal 202 and second audio signal 203 are input to the noise correction algorithm, whereupon the first audio signal x(t) and the second audio signal $x_0(t)$ are fed, respectively, through the First Frequency Analysis Module 204 and Second Frequency Analysis Module 205 breaking down each respective audio signal into separate arrays of frequency components;

whereupon the first audio signal x(t) and the second audio signal $x_0(t)$ are fed, respectively, through the first Power Estimator 208 and the Second Power Estimator 209, which compute power values for the various frequency components, whereby said power values are then fed into the dB Converter to generate power values for a source signal $P_{dBFS}(f)$ and a background signal $P_{0\_dBFS}(f)$ in dBFS, for each frequency component, whereupon, for each frequency component, (i) the microprocessor 201 completes a calibration offset such that a first dBFS to dBSPL Converter 210 converts the power value of the source signal of a frequency component from dBFS to dBSPL, and (ii) the microprocessor 201 completes a calibration offset such that a second dBFS to dBSPL Converter 211 converts the power value of the background signal from the frequency component from dBFS to dBSPL, producing $P_{dBSPL}(f)$ and $P_{0\_dBSPL}(f)$, whereupon (i) the first dBSPL-dB Phon Converter 212 converts the power value of the source signal to dB Phons by applying a dBSPL to dBPhon Conversion equation, giving P(f) and (ii) the second dBSPL-dB Phon Converter 213 converts the power value of the background signal to dB Phons by applying the dBSPL to dBPhon Conversion equation, giving $P_0(f)$, whereupon the microprocessor 201 applies the power value of the source signal and the power value of the background signal, now in dB Phons, to the perceptual model 22 whereupon the microprocessor 201 calculates $\Delta P(f)$ in dBPhons, whereupon the microprocessor 201 calculates a correction gain of power to the source signal G(f), at the frequency component, in dBSPL, based on the value of $\Delta P(f)$ in dB Phons, using the Gain Block component 217 which utilizes the Gain equation, whereupon the microprocessor 201 reconstitutes the first audio signal with the corrective gains to the source signals corresponding to each of the frequency components, comprising:
   a) multiplying the source signal at the frequency component according to the corresponding corrective gain $\Delta P(f)$, and
   b) using the Frequency Synthesis Module 218, to reconstitute the resulting corrected audio signal whereupon the noise correction algorithm 203 outputs the corrected audio signal to the microprocessor, whereupon the microprocessor sends the encoded corrected audio signal to the audio codec 205, whereupon the audio codec decodes the corrected audio signal into analog form, whereupon the audio codec outputs the corrected audio signal to the speaker 210.

2. A personal communications device 01, capable of applying corrections to a first audio signal of interest, to compensate for ambient noise in the listener's environment, by applying corrective gains to a plurality of frequency components which constitute the first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the ambient background noise $P_0$, wherein corrective gains are generated for each frequency component by solving for a correction gain ΔP for the first audio signal which will suffice to raise the volume of each frequency component of the first audio signal so that the user will perceive it above background noise, by the loudness amount equivalent to how the first audio signal would be perceived in a noiseless environment, the personal communications device 101 comprising:

a) a microprocessor 102;

b) an RF transmitter/receiver 104, coupled to the microprocessor, capable of receiving a first audio signal, which is the signal of interest;

c) a digital signal processing chip configured to implement an audio codec 105, coupled to the microprocessor, which effectuates the decoding of audio signals for output by a speaker, and the encoding of voice and noise audio received by first and second microphones;

d) a display screen 106, coupled to the microprocessor, upon which the microprocessor may display information for the user to view;

e) an input device 107, coupled to the microprocessor, which the user actuates to enter data into the microprocessor;

f) a data storage/program memory unit 108, coupled to the microprocessor, which the microprocessor uses to store program code and variables;

g) a speaker 110, coupled to the audio codec 104, disposed upon the device in a location ergonomically suitable for listening through the user's ear when using the device;

h) a microphone 111, capable of receiving a second audio signal;

i) a second digital signal processing (DSP) chip, coupled to the audio codec, the microphone and the speaker, configured to implement a noise correction algorithm 103, the noise correction algorithm comprising:

i. a first Analog to Digital converter 204, ii. a second Analog to Digital converter 205, iii. a first Frequency Analysis Module 206, iv. a second Frequency Analysis Module 207, v. a first Power Estimator Block 208, vi. a second Power Estimator Block 209, vii. a first dBFS to dBSPL Converter 210, viii. a second dBFS to dBSPL Converter 211, ix. a first dBSPL to dB Phon Converter 212, x. a second dBSPL to dB Phon Converter 213, xi. a Perceptual model 222, xii. a Gain Block component 217, xiii. a Frequency Synthesis Module 218, and xiv. a Digital to Analog Converter 219 wherein the microprocessor 102 receives a first audio signal which is the signal of interest via the RF transmitter 104, whereupon the microprocessor sends the encoded audio signal to the audio codec 105, whereupon the audio codec decodes the signal into analog form, whereupon the audio codec outputs the signal to the DSP Chip 103, whereupon the DSP Chip 103, obtains a second audio signal from the background noise microphone 111, whereupon the first audio signal x(t) and the second audio signal $x_0$(t) are fed, respectively, through the First D/A Converter 204 and Second D/A 205 thereby converting the signals into digital format, whereupon the first audio signal x(t) and the second audio signal $x_0$(t) are fed, respectively, through the First Frequency Analysis Module 206 and Second Frequency Analysis Module 207 breaking down each respective audio signal into separate arrays of frequency components, whereupon the first audio signal x(t) and the second audio signal $x_0$(t) are fed, respectively, through the first Power Estimator 208 and the Second Power Estimator 209, which compute power values for the various frequency components, whereby said power values are then fed into the dB Converter to generate power values for a source signal $P_{dBFS}$(f) and a background signal $P_{0\_dBFS}$(f) in dBFS, for each frequency component, whereupon (i) the DSP chip 103 completes a calibration offset such that the first dBFS to dBSPL Converter 210 converts the power value of the source signal from dBFS to dBSPL, and (ii) the DSP chip 103 completes a calibration offset such that the second dBFS to dBSPL Converter 211 converts the power value of the background signal from dBFS to dBSPL, producing $P_{dBSPL}$(f) and $P_{0\_dBSPL}$(f), whereupon (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0$(f), whereupon the DSP chip 103 applies the power value of the source signal and the power value of the background signal, now in dB Phons, to the perceptual model 222 whereupon the DSP chip 103 calculates ΔP(f) in dBPhons, whereupon the DSP chip 103 calculates a correction gain of power to the source signal G(f), at the frequency component, in dBSPL, based on the value of ΔP(f) in dB Phons, using the Gain Block component 217 which utilizes the Gain equation, whereupon the DSP chip 103 reconstitutes the first audio signal with the corrective gains to each of the source signals corresponding to the frequency components, comprising:

a) multiplying the source signal at the frequency component according to the corresponding corrective gain ΔP(f), b) using the Frequency Synthesis Module 18, to reconstitute the resulting audio signal whereupon the resulting audio signal is fed through the Digital to Analog Converter 219, generating in analog, signal $x_{out}$(t), whereupon the DSP chip 203 outputs the $x_{out}$(t) to the speaker 210.

3. A personal communications device 01, capable of applying corrections to a first audio signal of interest, to compensate for ambient noise in the listener's environment, by applying corrective gains to a plurality of frequency components which constitute the first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the ambient background noise $P_0$, wherein corrective gains are generated for each frequency component by solving for a correction gain ΔP for the first audio signal which will suffice to raise the volume of each frequency component of the first audio signal so that the user will perceive it above background noise, by the loudness amount equivalent to how the first audio signal would be perceived in a noiseless environment, the personal communications device 101 comprising:

a) a microprocessor 102;

b) an RF transmitter/receiver 104, coupled to the microprocessor, capable of receiving a first audio signal, which is the signal of interest;

c) a digital signal processing chip configured to implement an audio codec 105, coupled to the microprocessor, which effectuates the decoding of audio signals for output by a speaker, and the encoding of voice and noise audio received by first and second microphones;

d) a display screen 106, coupled to the microprocessor, upon which the microprocessor may display information for the user to view;

e) an input device 107, coupled to the microprocessor, which the user actuates to enter data into the microprocessor;

f) a data storage/program memory unit 108, coupled to the microprocessor, which the microprocessor uses to store program code and variables;

g) a speaker 110, coupled to the audio codec 104, disposed upon the device in a location ergonomically suitable for listening through the user's ear when using the device;

h) a microphone 111, capable of receiving a second audio signal;

i) a computer readable media, the computer-readable medium comprising:

i. code for reading the first audio signal x(t) 502 from an the RF transceiver, said first audio signal comprising a plurality of channels corresponding to varying frequencies, ii. code for obtaining a second audio signal x0(t) 503 from a microphone 111, said second audio signal comprising a plurality of channels corresponding to varying frequencies, iii. code for solving for the power P(f) in Phons of the source signal of the source signal, at a frequency:

(1) code for extracting a power value of the source signal at a frequency, in dBFS with a first power estimator block 508, comprising:

(a) extracting the first audio signal x(t) 502, said first audio signal comprising a plurality of channels corresponding to varying frequencies f, where said first audio signal is then transmitted to an Analog to Digital Converter 504 thereby converting the signal into digital format;

(b) feeding the first audio signal through a First Frequency Analysis Module 506 where the first audio signal is broken down into separate frequency components;

(c) identifying a particular source frequency component of the first audio signal corresponding to a frequency 550;

(d) generating a power value for the frequency component, whereby said power value is then fed into a dB Converter to generate a power value PdBFS(f) for the source in dBFS 552;

(2) code for calculating a calibration offset to convert the power value PdBFS(f) of the source signal in dBFS to a power value PdBSPL(f) in dBSPL 510 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL0−dBFS0) wherein dBSPL0 is nominally a value between 65 and 83, and wherein dBFS0 is nominally a value between −20 and −12;

(3) code for converting the power value of the source signal to dB Phons by applying a dBSPL to dBPhon Conversion equation 512, producing P(f);

iv. code for solving for P0(f) in Phons of the background signal, at a frequency:

(1) code for extracting a power value of the background signal at the frequency, in dBFS with a second Power Estimator Block 509, comprising:

(a) extracting a second audio signal x0(t) 503, said second audio signal comprising a plurality of channels corresponding to varying frequencies, where said second audio signal is then transmitted to a second Analog to Digital Converter 505 thereby converting the signal into digital format;

(b) feeding the second audio signal through a Second Frequency Analysis Module 507 where the second audio signal is broken down into separate components;

(c) identifying a particular background signal component, corresponding to a particular frequency 550;

(d) obtaining a power value for the background signal component, whereby said power value is then fed into a dB Converter to generate a power value P0_dBFS(f) for the background signal in dBFS 552;

(2) code for calculating a calibration offset to convert the power value of the background signal P0_dBFS(f) in dBFS to a power value P0_dbSPL(f) in dBSPL using the calibration equation 511 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL0−dBFS0) wherein dBSPL0 is nominally a value between 65 and 83, and wherein dBFS0 is nominally a value between −20 and −12;

(3) code for converting the power value of the background signal to dB Phons by applying the dBSPL to dBPhon Conversion equation 513, producing P0(f);

v. code for using the perceptual model 522 to solve for $\Delta P(f)$ vi. code for calculating a correction gain of power G(f), for a frequency f, in dBSPL based on the value of $\Delta P(f)$ in dB Phons, using a Gain equation 517;

vii. code for reconstituting the first audio signal with the corrective gain to the source signal at the frequency, comprising (1) feeding the correction gain to an amplifier wherein the amplifier amplifies the source signal at the frequency by the corrective gain G(f) 553;

(2) combining, using a Frequency Synthesis Module 518, the channels of the corrected signal, reconstituting the corrected signal, producing xout(t);

viii. code for feeding the corrected audio signal through a Digital to Analog Converter 519;

ix. code for transmitting the corrected audio signal to an amplifier 520, to be output through a speaker 521.

4. The personal communications device of claims 1-3 where the First and Second Frequency Analysis Modules 206, 207 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 218 is a summer operation that combines the various channels into output xout(t).

5. The personal communications device of claim 1-3, where the First and second Frequency Analysis Modules 206,207 are digital filter banks composed of wavelet filters.

6. The personal communications device of claim 5 where the various sub-band channels correspond to critical bands of hearing.

7. The personal communications device of claim 1-3, where the First and Second Frequency Analysis Modules 206,207 are composed of FFT coprocessors that perform Fourier transforms on the input signals producing $X(t)$ and $X_0(t)$, where the power of each component is found by squaring the Fourier component, and the Frequency Synthesis Module 218 is an FFT coprocessor that performs an inverse Fourier transform, resulting in output signal $x_{out}(t)$.

8. The personal communications device of claim 7, where the frequency components are grouped together to approximate sub-bands corresponding to critical bands of hearing.

9. The personal communications device of claim 1-3, where the perceptual model 222 consists of a forward model which computes subjectively perceived Sones in terms of Phons, and an inverse model which computes Phons in terms of Sones, allowing the Perceptual model to be combined into the Conductor Equation, the Conductor Equation 316 being, $$S(P)=S(P+\Delta P)-S(P_0)+S(0) \text{ or,}$$

$$\Delta P=S^{-1}(S(P)+S(P_0)-S(0))-P,$$

where this equation may be stated as the desired gain in Phons being the Phons amplification necessary to amplify the sound over background noise so that it's subjectively perceived loudness over background noise is the same as the subjectively perceived loudness without the noise, minus some correcting factor, where the function $S(P)$ is found by solving the Earspring equation under experimental boundary conditions, where the Earspring equation 314,315 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, $y(t)$=amplitude of vibration, $F(t)$=driving force in terms of Phons amplitude or sound intensity, $<y^2>$=mean power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force $F(t)$, which represents a pure sinusoid of intensity P, a solution $y(t)$ to this equation can be found, which can then be converted to $<y^2>$, which represents the perceived loudness S in Sones, resulting in a function $S(P)$, $$S(P) = \frac{(4\hat{\beta}^2 + \Gamma_{40}^2)}{(4\hat{\beta}^2 + (\Gamma_{40}S(P))^2)} 10^{(P-40)/10},$$

where $S(P)$ is the perceived loudness in Sones which the listener experiences for a particular sub-band, and P is the sound intensity impinging on the ear in dBPhons for a particular subband, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary parameters.

10. The personal communications device of claim 9, where the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

11. The personal communications device of claim 1-3, where a computational model is used to estimate Earspring equation solutions $S(P)$ and $S^{-1}(S)$ consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory.

12. The personal communications device of claim 1-3, where the perceptual model 222 is a computational model 324 used to estimate $\Delta P$, which consists of a quadratic function $$\Delta P \cong \frac{AP^2 + BP + C}{DP^2 + EP + 1},$$

where A, B, C, D, and E are parameters which fit the quadratic function against the solution to the Conductor equation 316, as described in claim 6, for various values of $P_0$ and are stored in a lookup table 323.

13. The personal communications device of claim 1-3, where the perceptual model 222 is any numerical function approximator 224 that is fit against the Earspring 314, 315 and Conductor equations 316, as described in claim 6, and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

14. A personal communications device 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the personal communications device 01 comprising:

a) a microprocessor 02, the microprocessor being a multi-core processor containing a digital signal processor 03;

b) an RF transmitter/receiver 04, coupled to the microprocessor, capable of receiving a first audio signal, which is the signal of interest;

c) a digital signal processing chip configured to implement an audio codec 05, coupled to the microprocessor, which effectuates the decoding of audio signals for output by a speaker, and the encoding of voice and noise audio received by first and second microphones;

d) a display screen 06, coupled to the microprocessor, upon which the microprocessor may display information for the user to view;

e) an input device 07, coupled to the microprocessor, which the user actuates to enter data into the microprocessor;

f) a data storage/program memory unit 08, coupled to the microprocessor, which the microprocessor uses to store program code and variables;

g) a speaker 10, coupled to the audio codec 05, disposed upon the device in a location ergonomically suitable for listening through the user's ear when using the device;

h) a microphone 11, capable of receiving a second audio signal;

i) the digital signal processor 03, configured to implement a noise correction algorithm; the noise correction algorithm comprising:

i. a first frequency analysis module 406, configured to extract a plurality of frequency components from the first audio signal, ii. a second frequency analysis module 407, configured to extract a plurality of frequency components from the second audio signal, iii. a first power estimation block 408, configured to calculate the sound intensity in decibels of each frequency component of the first audio signal 002, iv. a second power estimation block 409, configured to calculate the sound intensity of decibels of each frequency component of the second audio signal 003, v. a first dBFS to dBSPL Converter 410, vi. a second dBFS to dBSPL Converter 411, vii. a parameter estimation module 422, which determines parameter settings for a parallel compression module, according to information stored in memory, viii. the parallel compression module 417, parameterized by threshold T, compression ratio R, and makeup gain g0, where the parameters may by dynamically varied, where the parallel compression module is comprised of:

(a) a linear compression module, which applies gains to the first audio signal according to the equation $G=g0+(P-T)*(1/R-1)$, where G is the gain in dB to be applied to a frequency component of the first audio signal, P is the sound intensity of the frequency component in dB, g0 is the makeup gain in dB, T is the threshold in dB, and R is the compression ratio of the linear compression, (b) a summer, which combines the resulting amplified first audio signal component with the original first audio signal component, and ix. a Frequency Synthesis Module 418 wherein the microprocessor 02 receives a first audio signal which is the signal of interest via the RF transmitter 04, whereupon the microprocessor 01 receives a second audio signal, which is the noise signal via the microphone, whereupon the first audio signal 402 and second audio signal 403 are input to the noise correction algorithm, whereupon the first audio signal $x(t)$ and the second audio signal $x_0(t)$ are fed, respectively, through the First Frequency Analysis Module 404 and Second Frequency Analysis Module 405 breaking down each respective audio signal into separate arrays of frequency components, whereupon the first audio signal $x(t)$ and the second audio signal $x_0(t)$ are fed, respectively, through the first Power Estimator 408 and the Second Power Estimator 409, which compute power values for the various frequency components, whereby said power values are then fed into the dB Converter to generate power values for a source signal $P_{dBFS}(f)$ and a background signal $P_{0\_dBFS}(f)$ in dBFS, for each frequency component, whereupon (i) the microprocessor 401 completes a calibration offset such that the first dBFS to dBSPL Converter 410 converts the power value of the source signal from dBFS to dBSPL, and (ii) the microprocessor 401 completes a calibration offset such that the second dBFS to dBSPL Converter 411 converts the power value of the background signal from dBFS to dBSPL, producing $P_{dBSPL}(f)$ and $P_{0\_dBSPL}(f)$, whereupon, for each frequency component, and at each instant, the microprocessor 401, using the power estimates of the frequency components of the first and second audio signals, obtains parameters for the parallel compression 422, depending on the sound intensity of the second audio signal at each instant, whereupon the microprocessor 401, applies the parameters to a parallel compression module 417, whereupon the parallel compression module 417 applies a linear compression, according to the selected parameters, to each of the frequency components of the first audio signal 002, whereupon the parallel compression module 417 sums each frequency component of the first audio signal 002 with the corresponding compressed audio signal, whereupon the microprocessor 401 repeats the process of estimating the power of both the signal of interest and the noise, selecting compression settings, and applying parallel compression for each frequency component of the first audio signal 002, whereupon the DSP 401 reconstitutes the first audio signal using the Frequency Synthesis Module 418 resulting in a corrected audio signal, whereupon the DSP 401 outputs the corrected audio signal to the microprocessor, whereupon the microprocessor sends the encoded corrected audio signal to the audio codec 05, whereupon the audio codec decodes the corrected audio signal into analog form, whereupon the audio codec outputs the corrected audio signal to the speaker 15. A personal communications device 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the personal communications device 101 comprising:
- a) a microprocessor 102;
- b) an RF transmitter/receiver 104, coupled to the microprocessor, capable of receiving a first audio signal, which is the signal of interest;
- c) a digital signal processing chip configured to implement an audio codec 105, coupled to the microprocessor, which effectuates the decoding of audio signals for output by a speaker, and the encoding of voice and noise audio received by first and second microphones;
- d) a display screen 106, coupled to the microprocessor, upon which the microprocessor may display information for the user to view;
- e) an input device 107, coupled to the microprocessor, which the user actuates to enter data into the microprocessor;
- f) a data storage/program memory unit 108, coupled to the microprocessor, which the microprocessor uses to store program code and variables;
- g) a speaker 110, coupled to the audio codec 104, disposed upon the device in a location ergonomically suitable for listening through the user's ear when using the device;
- h) a microphone 111, capable of receiving a second audio signal;
- i) a second digital signal processing (DSP) chip, coupled to the audio codec, the RF transmitter/receiver and the speaker, configured to implement a noise correction algorithm 103; the noise correction algorithm comprising:
  - i. a first Analog to Digital converter 404,
  - ii. a second Analog to Digital converter 405,
  - iii. a first frequency analysis module 406, configured to extract a plurality of frequency components from the first audio signal,
  - iv. a second frequency analysis module 407, configured to extract a plurality of frequency components from the second audio signal,
  - v. a first power estimation block 408, configured to calculate the sound intensity in decibels of each frequency component of the first audio signal 002,
  - vi. a second power estimation block 409, configured to calculate the sound intensity of decibels of each frequency component of the second audio signal 003,
  - vii. a first dBFS to dBSPL Converter 10,
  - viii. a second dBFS to dBSPL Converter 11,
  - ix. a parameter estimation module 422, which determines parameter settings for a parallel compression module, according to information stored in memory,
  - x. the parallel compression module 417, parameterized by threshold T, compression ratio R, and makeup gain g0, where the parameters may by dynamically varied, where the parallel compression module is comprised of:
    - a. a linear compression module, which applies gains to the first audio signal according to the equation G=g0+ (P−T)*(1/R−1), where G is the gain in dB to be applied to a frequency component of the first audio signal, P is the sound intensity of the frequency component in dB, g0 is the makeup gain in dB, T is the threshold in dB, and R is the compression ratio of the linear compression, and
    - b. a summer, which combines the resulting amplified first audio signal component with the original first audio signal component,
  - xi. a Frequency Synthesis Module 418, and
  - xii. a Digital to Analog Converter 419 wherein the microprocessor 102 receives a first audio signal which is the signal of interest via the RF transmitter 104, whereupon the microprocessor sends the encoded audio signal to the audio codec 105, whereupon the audio codec decodes the signal into analog form, whereupon the audio codec outputs the signal to a DSP Chip 103, whereupon the DSP Chip 103, obtains a second audio signal from the background noise microphone 111, whereupon the first audio signal x(t) and the second audio signal $x_0(t)$ are fed, respectively, through the First D/A Converter 404 and Second D/A converter 405 thereby converting the signals into digital format, whereupon the first audio signal x(t) and the second audio signal $x_0(t)$ are fed, respectively, through the First Frequency Analysis Module 406 and Second Frequency Analysis Module 407 breaking down each respective audio signal into separate arrays of frequency components, whereupon the first audio signal x(t) and the second audio signal $x_0(t)$ are fed, respectively, through the first Power Estimator 408 and the Second Power Estimator 409, which compute power values for the various frequency components, whereby said power values are then fed into the dB Converter to generate power values for a source signal $P_{dBFS}(f)$ and a background signal $P_{0\_dBFS}(f)$ in dBFS, at each frequency component, whereupon (i) the DSP 103 completes a calibration offset such that the first dBFS to dBSPL Converter 410 converts the power value of the source signal from dBFS to dBSPL, and (ii) the DSP 103 completes a calibration offset such that a second dBFS to dBSPL Converter 411 converts the power value of the background signal from dBFS to dBSPL, producing $P_{dBSPL}(f)$ and $P_{0\_dBSPL}(f)$, whereupon, for each frequency component, and at each instant, the DSP 103, using the power estimates of the frequency components of the first and second audio signals, obtains parameters for the parallel compression 422, depending on the sound intensity of the second audio signal at each instant, whereupon the DSP 103, applies the parameters to the parallel compression module 417, whereupon the parallel compression module 417 applies a linear compression, according to the selected parameters, to each of the frequency components of the first audio signal 002, whereupon the parallel compression module 417 sums each frequency component of the first audio signal 002 with the corresponding compressed audio signal, whereupon the DSP 103 repeats the process of estimating the power of both the signal of interest and the noise, selecting compression settings, and applying parallel compression for each frequency component of the first audio signal 002, whereupon the DSP 103 reconstitutes the first audio signal using the Frequency Synthesis Module 418, whereupon the first audio signal is fed through the Digital to Analog Converter 419, resulting in analog signal $x_{out}(t)$, whereupon the DSP chip 203 outputs the first audio signal to the speaker 10.

16. A personal communications device 01, capable of applying corrections to incoming audio signals of interest, to compensate for ambient noise in the listener's environment, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G = g0 + (P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module,
the personal communications device 101 comprising:
 a) a microprocessor 102;
 b) an RF transmitter/receiver 104, coupled to the microprocessor, capable of receiving a first audio signal, which is the signal of interest;
 c) a digital signal processing chip configured to implement an audio codec 105, coupled to the microprocessor, which effectuates the decoding of audio signals for output by a speaker, and the encoding of voice and noise audio received by first and second microphones;
 d) a display screen 106, coupled to the microprocessor, upon which the microprocessor may display information for the user to view;
 e) an input device 107, coupled to the microprocessor, which the user actuates to enter data into the microprocessor;
 f) a data storage/program memory unit 108, coupled to the microprocessor, which the microprocessor uses to store program code and variables;
 g) a speaker 110, coupled to the audio codec 104, disposed upon the device in a location ergonomically suitable for listening through the user's ear when using the device;
 h) a microphone 111, capable of receiving a second audio signal;
 i) a computer readable media,
 the computer-readable medium comprising:
  a. code for reading the first audio signal x(t) 702 from the RF transceiver, said first audio signal comprising a plurality of channels corresponding to varying frequencies,
  b. code for obtaining a second audio signal $x_0(t)$ 703 from a microphone 111, said second audio signal comprising a plurality of channels corresponding to varying frequencies,
  c. code for solving for the power P(f) in Phons of the source signal of the source signal, at a frequency:
   i. code for extracting a power value of the source signal at a frequency, in dBFS with a first power estimator block 708, comprising:
    (A) extracting the first audio signal x(t) 702, said first audio signal comprising a plurality of channels corresponding to varying frequencies f, where said first audio signal is then transmitted to an Analog to Digital Converter 704 thereby converting the signal into digital format;
    (B) feeding the first audio signal through a First Frequency Analysis Module 706 where the first audio signal is broken down into separate frequency components;
    (C) identifying a particular source frequency component of the first audio signal corresponding to a frequency 750;
    (D) generating a power value for the frequency component, whereby said power value is then fed into a dB Converter to generate a power value $P_{dBFS}(f)$ for the source in dBFS 752;
   ii. code for calculating a calibration offset to convert the power value $P_{dBFS}(f)$ of the source signal in dBFS to a power value $P_{dBSPL}(f)$ in dBSPL 710 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL = dBFS + (dBSPL_0 - dBFS_0)$ wherein $dBSPL_0$ is nominally a value between 65 and 83, and wherein $dBFS_0$ is nominally a value between −20 and −12;
   iii. code for converting the power value of the source signal to dB Phons by applying a dBSPL to dBPhon Conversion equation 712, producing P(f);
  d. code for solving for $P_0(f)$ in Phons of the background signal, at a frequency:
   i. code for extracting a power value of the background signal at the frequency, in dBFS with a second Power Estimator Block 709, comprising:
    (A) extracting a second audio signal $x_0(t)$ 703, said second audio signal comprising a plurality of channels corresponding to varying frequencies, where said second audio signal is then transmitted to a second Analog to Digital Converter 705 thereby converting the signal into digital format;
    (B) feeding the second audio signal through a Second Frequency Analysis Module 707 where the second audio signal is broken down into separate components;
    (C) identifying a particular background signal component, corresponding to a particular frequency 750;
    (D) obtaining a power value for the background signal component, whereby said power value is then fed into a dB Converter to generate a power value $P_{0\_dBFS}(f)$ for the background signal in dBFS 752;
   ii. code for calculating a calibration offset to convert the power value of the background signal $P_{0\_dBFS}(f)$ in dBFS to a power value $P_{0\_dbSPL}(f)$ in dBSPL using the calibration equation 711 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL = dBFS + (dBSPL_0 - dBFS_0)$ wherein $dBSPL_0$ is nominally a value between 65 and 83, and wherein $dBFS_0$ is nominally a value between −20 and −12;

iii. code for converting the power value of the background signal to dB Phons by applying the dBSPL to dBPhon Conversion equation 713, producing $P_0(f)$;

e. code for determining parameters for the parallel compression using the power value of the background signal, and a lookup table parameter estimation module 722, f. code for applying parallel compression 717 to the source signal, according to the parameters selected, g. code for reconstituting the first audio signal with the corrective gain to the source signal at the frequency, comprising combining, using a Frequency Synthesis Module 718, the channels of the corrected signal, reconstituting the corrected signal, producing $x_{out}(t)$;

h. code for feeding the corrected audio signal through a Digital to Analog Converter 719;

i. code for transmitting the corrected audio signal to an amplifier 720, to be output through a speaker 721.

17. The personal communications device of claim 14-16, where the First and Second Frequency Analysis Modules 406, 407 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 418 is a summer operation that combines the various channels into output xout(t).

18. The personal communications device of claim 14-16, where the First and second Frequency Analysis Modules 406,407 are digital filter banks composed of wavelet filters.

19. The personal communications devices of claim 17, where the various sub-band channels correspond to critical bands of hearing.

20. The personal communications device of claim 14-16, where the First and Second Frequency Analysis Modules 406,407 are composed of FFT coprocessors that perform Fourier transforms on the input signals producing X(t) and $X_0(t)$, where the power of each component is found by squaring the Fourier component, and the Frequency Synthesis Module 418 is an FFT coprocessor that performs an inverse Fourier transform, resulting in output signal $x_{out}(t)$.

21. The personal communications device of claim 20, where the frequency components are grouped together to approximate sub-bands correspond to critical bands of hearing.

22. The personal communications device of claim 14-16, where discrete sets of parameters are found by dividing the range of possible noise volumes into discrete levels, and where sets of parameters are found for each discrete noise loudness level, where the parameter estimation module 422 is a lookup table, where during real-time processing the ambient noise intensity is measured and used to select the corresponding set of parameters.

23. The personal communications device of claim 14-16, where the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

24. The personal communications device of claim 14-16, where one or more parameters (e.g. T) is defined as a function of the ambient noise intensity (e.g. $T=P_N-T'$, where $P_N$ is noise loudness), such that the parameters stored (e.g. T') are the parameters of the function defining the relationship between sound intensity (e.g. $P_N$) and the parameter (e.g. T) of the parallel compression.

25. The personal communications device of claim 14-16, where the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

26. The personal communications device of claim 25, where a fixed set of parameters is used.

27. The personal communications device of claim 26, where the fixed parameters fall in the range of 2 to 6 for compression ratio, 15 dB to 25 dB for makeup gain, and −15 to −25 dB for threshold offset.

28. The personal communications device of claim 1-3, wherein the dBSPL to dBPhon Conversion equation 312,313 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
 =+1/240 when ATH(F)<0

29. The personal communications device of claim 1-3 wherein the Gain equation 317 is:

$$\Delta P_{dBSPL}(F)=\Delta P_{dBPhon}(F)(1+kATH(F))$$

where
F=frequency
ATH(F)=Absolute Threshold of Hearing
K=−1/120 when ATH(F)>0
 =+1/240 when ATH(F)<0

30. The personal communications device of 1-3, and 14-16, where the absolute threshold of hearing is computed by the formula:

$$ATH(F) = \frac{3.64}{F_{kHz}^{0.8}} - 6.5e^{0.6(F_{kHz}-3.3)^2} + 0.001F_{kHz}^4 - 3.37$$

31. The personal communications device of claims 1-3, and 14-16, where there are a plurality of source audio signals corresponding to the various signals of a stereo or surround sound audio system, and where gains for each channel are independently computed and applied to each channel.

32. The personal communications device of claims 1, 2, 12 and 13, where there are a plurality of source audio signals corresponding to the various signals of a stereo or surround sound audio system, and a plurality of background noise signals, one for each channel, and where gains for each channel are independently computed, according to the source and noise signal for each channel, and applied to each channel.

MEDIA PLAYER WITH DYNAMIC
CORRECTION OF AUDIO SIGNALS TO
COMPENSATE FOR AMBIENT NOISE

Background of the Invention

The present invention relates to the design of music players and systems designed to enhance music player signals in the presence of noise.

When watching a video or listening to music, decoded audio data is replayed through a speaker associated with a media player (TV, MP3, Stereo, etc) to provide a sound experience for the user. A media player reproduces audio information via an internal speaker or external speakers in communication with audio output connections. In some instances, a media player reproduces decoded video information and/or provides decoded information to a video output. A media player may be an MP3 player, car stereo, radio home stereo, television, smart phone, or other device capable of playing back audio or video from a stored location, or an input source such as cable, broadcast, or internet streaming.

There are many systems for the application of filtering to noise suppression in an audio signal. In most cases, these inventions relate to the removal of noise that is present in the source signal from the origin or introduced into the signal through processing and transmission. Various forms of filtering may be applied which suppresses the noise signal in whole or in part. Generally, these systems have adverse impacts upon the quality of the original signal. However, these systems do not address noise in the environment of the listener, which cannot be filtered.

Conversely, systems for the suppression of noise in the listener's environment also exist. These systems generally use noise cancellation to remove the disrupting external signal by adding sound projected through headphones which has the effect of countering the sound waves produced by the noise. In this case, the noise is completely canceled and listener is generally unaware of the existence of the external noise, a result which can reduce the awareness of the listener to potential dangers in the environment.

In some prior art systems, dynamic volume compensation may be used to raise the volume of a source signal of interest over ambient background noise. However, these systems increase the gain in a spectrally uniform manner, raising the volume of all frequency components equally. This effect can distort the perception of music and speech due to the nonlinear behavior of the human ear with respect to frequency and volume.

Microphones and mechanical systems (e.g., computer software) can measure dBSPL; a sound (e.g., 40 dBSPL) at particular frequency (e.g., 1 kHz) sounds just as loud as the sound (e.g., 40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Since the human ear dynamically adjusts to sound intensity levels, the presence of background noise alters the threshold at which sounds begin to be perceived. As a result, ambient noise at a given frequency may make sounds at those frequencies that would otherwise be perceptible imperceptible in the presence of ambient noise. In order for the sound to be heard it must be amplified over the background noise. The volume of the ambient noise therefore represents a degree of hearing impairment or baseline threshold elevation over which the sound must be amplified to be perceived.

This effect varies according to the spectral composition of the noise, that is, spectral components that are sufficiently far from the spectral composition of the noise will remain perceptible. Consequently, using the total intensity of the background noise to raise the intensity of the source uniformly will overly amplify bands which are not affected, possibly raising the volume to damaging levels. In order to amplify only those components which need compensation, the gains to the source signal must vary by spectral band, according to the spectral composition of the noise.

Moreover, due to the nonlinear response of the human ear, using the spectral intensity of the background noise at a particular band as the gain for the source at that band will produce excessive amplification. In order to compute the correct gain a nonlinear corrective model must be used to compute an appropriate gain for each frequency. The intensity of the background noise as well as the source signal at a given frequency are inputs to this model, and the output is a desired gain for the source signal at that frequency.

The perceived loudness of sound can be modeled by a harmonic oscillator with spring constant that varies according to the mean power of vibration. This model is called the Earspring model. The Earspring equation 10,11 is written $[d^2/dt^2+2\beta(d/dt)+k(1+\gamma\gamma<y^2>)]y(t)=\eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude, for which the amplitude is P in dBPhons, a solution to the earspring equation y(t) can be found, for a particular set of boundary conditions, which is the steady state response to the forcing function. Transforming into the frequency domain we can obtain the mean power of vibration $<y^2>=\frac{1}{2}|Y|^2$, which can be rewritten as S(P).

A possible set of boundary parameters comprises (i) a Sones ratio between the hearing threshold level and the reference level of 40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

We can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

The present invention features systems for dynamically adjusting audio signals by applying a gain to the signal in a spectrally varying manner to compensate for a noise source in the environment of the listener, such that the sound is perceived by the listener to be unchanged in loudness and spectral composition. The system obtains a threshold elevation for each frequency component by analyzing the spectral composition of the ambient noise. This threshold elevation is then used by a perceptual model of hearing to determine an appropriate gain adjustment for the corresponding frequency component of the source signal which will make that component perceived by the human ear to be just as loud as if the noise were not present. After applying the gains to the source signal, the resulting signal is output to the speaker. The system allows a listener to hear without distortion, over ambient noise, by applying a gain to the source that varies according to the spectral composition of the noise, rather than cancelling the noise, or applying a uniform volume adjustment to the source. The perceived spectral composition of the source is thus adjusted without the removal of the noise signal. Systems may be incorporated into media players including but not limited to car stereos and music players.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention
  1. Amplifier: This component can be any amplifier or related device capable of applying gains to an audio signal.
  2. Audio Codec: Audio Encoder/Decoder converts an audio signal to and from its encoded format either for storing in a file or transmission over a network
  3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
  4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
  5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
  6. Audio Jack: An input by which an audio signal can be received. i.e. from a microphone.
  7. Background signal: The background signal, as used herein, refers to a portion of the second audio signal or the ambient noise signal at the same frequency component as that of the source signal. The source signal and the background signal are paired.
  8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12;
     where P=Phons amplitude of a source signal of interest
     F=Frequency
     dBSPL=decibels according to sound pressure
     dBFS=decibels relative to full scale
  9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
  10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
  11. Digital Signal Processor ("DSP") Chip: A specialized microprocessor with an architecture for the fast operational needs of digital signal processing.
  12. FFT Co-Processor: A specialized microprocessor designed for the purpose of rapidly computing Fourier transforms using a algorithm for computing Fourier transforms commonly known as the 'Fast Fourier Transform' (FFT).
  13. Field Programmable Gate Array ("FPGA"): a reprogrammable electronic chip.
  14. Filter banks: An array of band-pass filters that separate an input signal into multiple components, or as used herein, frequency components, each frequency component carrying a single frequency subband of the original signal.

15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component can may comprises a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.
20. Gain Block component—This component applies the gains to each corresponding frequency component or band. In some embodiments, the term gain block component is used interchangeably with a "means for applying gains to a audio signal." Said means may be, for example, an amplifier, or gain block component.
21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.
22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.
23. Inverse Fourier Transform: A mathematical operation which computes a time domain signal corresponding to a given frequency spectrum.
24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F\_kHz)=26.811(1+1.960/F\_kHz)-0.53$$

In some embodiments, the term kHz frequency to critical band center frequency converter is used interchangeably with a "means for converting a frequency component or series of frequency components to critical band frequency. Said mean may be, for example, a summer.
25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.
26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.
27. Microphone: The microphone can be any microphone or the like capable of receiving an audio signal.
28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G = g_0 + (P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical parameter value that when input to the Personalized Sound adjustment, generates may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference. In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

34. where G is the gain ratio, PSIG is the signal intensity at a frequency in units of power, PNOISE is the signal intensity of the background noise, PTHRQ is the absolute threshold of hearing, and α=0.2 is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

35. RF Transceiver: Radio Frequency Transmitter/Receiver—this device interfaces directly with the antenna and can modulate an audio signal with its radio carrier frequency for transmission as well as demodulate a received radio frequency signal 36. Source signal: The Source signal, as used herein refers to a portion of the first audio signal or the audio signal of interest at a given frequency component.
37. Speaker: The speaker can be any speaker or the like capable of receiving and projecting a sound signal adjusted or corrected by the present invention.
38. Storage media: A computer readable media used for storing data, such as a hard disk, RAM, or flash memory
39. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.
40. Threshold elevation: Threshold elevations correlate to the minimum sound pressures required to perceive sounds at various frequencies.

Additional Terms:
1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.
2. dBSPL: Decibels sound power level—a unit of measure of sound intensity at the ear
3. dBSPL to dBPhon Conversion equation: This equation converts sound pressure level to Phons in decibels:

$$P_{dBPhon}(F) = \frac{P_{dBSPL}(F) - ATH(F)}{1 + kATH(F)}$$

where
F=Frequency
ATH=Absolute Threshold of Hearing
P=Phons amplitude of a source signal of interest
dBSPL=decibels according to sound pressure
4. dBFS to dBSPL Converter: This equation converts the audio signal power from audio power in decibels to audio sound pressure level in decibels
5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
6. Gain Equation: This equation converts the gain in Phons to a gain in sound pressure level $$\Delta P_{dBSPL}(F) = \Delta P_{dBPhon}(F)(1+kATH(F))$$

where:
F=Frequency
ATH=Absolute Threshold of Hearing
P=Phons amplitude of a source signal of interest
dBSPL=decibels according to sound pressure
K=$-1/120$ when ATH(F)>0
 =$+1/240$ when ATH(F)<0
7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
8. Phons: Phons are objective units of sound intensity impinging upon the ear. Sound power may be converted from decibels (dBFS) to Phons using a conversion first to dBSPL then to Phons
9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
10. Sones: Sones are subjective units of perceived sound loudness.
11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1. Is a drawing of a possible systems architecture for a media player utilizing a DSP chip to implement an ambient noise correction compression algorithm.

FIG. 2. Is a drawing of a possible systems architecture for a media player utilizing a software application to implement an ambient noise correction compression algorithm.

FIG. 3. is a drawing of a possible embodiment for the systems architecture of the present invention.

FIG. 4. Diagrams an implementation of the Perceptual Model of the present invention using analytical solutions to the Earspring model.

FIG. 5. Diagrams an implementation of the Perceptual Model in which a Numerical approximation to the solutions is made using a function approximator for which parameters have been stored in memory.

FIG. 6 is a drawing illustrating an application of parallel compression to approximate a psychoacoustic non-linear compressor, where the parameters of the parallel compression are dynamically adjusted.

FIG. 7 is a drawing of an exemplary embodiment of the present invention, using a dynamically adjusted parallel compression to approximate the desired non-linear compression of the psychoacoustic model.

FIG. 8 is a plot of the compression ratio needed to make the parallel compression module approximate the psychoacoustic model, as found by fitting the parallel compression curves against the desired model curves.

FIG. 9 is a plot of the makeup gain needed to make the parallel compression module approximate the psychoacoustic model, as found by fitting the parallel compression curves against the desired model curves.

FIG. 10 is a drawing of a possible process flow for the present invention, using a computational model fit against the Earpsring and Conductor equations.

FIG. 11 is a drawing of a possible process flow for the present invention, using analytical solutions of the Earspring and Conductor equations FIG. 12 is a drawing of a possible process flow for the present invention using parallel compression to approximate the gains produced by the Earspring and Conductor equations.

Description of Preferred Embodiments

Media Player

As shown in FIG. 1, a possible embodiment of the present invention can comprise a media player capable of applying corrections to incoming audio signals of interest, to compensate for ambient noise in the listener's environment, the media player 101 comprising:
  a) a microprocessor 102,
  b) a storage media 104, containing at least one media file capable of being played back,
  c) a digital signal processing chip configured to implement an audio codec 05, coupled to the microprocessor, which effectuates the decoding of audio signals for output by a speaker, and the encoding of voice and noise audio received by the first and second microphones,
  d) a display screen 06, coupled to the microprocessor, upon which the microprocessor may display information for the user to view,
  e) a keypad 07, couple to the microprocessor, which the user actuates to enter data into the microprocessor,
  f) a data storage/program memory unit 08, coupled to the microprocessor, which the microprocessor uses to store program code and variables,
  g) a speaker 10, coupled to the audio codec 05, disposed upon the phone in a location ergonomically suitable for listening through the user's ear when using the phone,
  h) a microphone 11, capable of receiving a second audio signal, which is noise, disposed upon the phone in a location removed from the locations of the first microphone 08, and speaker 09 suitable to minimizing the effect of the speaker's voice on the ambient noise measurement,
  i) the noise correction algorithm 03, the noise correction algorithm comprising:
    i. a first Frequency Analysis Module 206;
    ii. a second Frequency Analysis Module 207;
    iii. a first Power Estimator Block 208;
    iv. a second Power Estimator Block 209;
    v. a first dBFS to dBSPL Converter 210;
    vi. a second dBFS to dBSPL Converter 211;
    vii. a first dBSPL to dB Phon Converter 212;
    viii. a second dBSPL to dB Phon Converter 213;
    ix. a Perceptual model 222;
    x. a Gain Block component 217;
    xi. a Frequency Synthesis Module 218;
whereupon the microprocessor 02 receives a first audio signal which is the signal of interest via the RF transmitter 03, whereupon the microprocessor 01 receives a second audio signal, which is the noise signal via the microphone, whereupon the first audio signal 202 and second audio signal 203 are input to the noise correction algorithm,
whereupon the first audio signal x(t) and the second audio signal $x_0(t)$ are fed, respectively, through the First Frequency Analysis Module 204 and Second Frequency Analysis Module 205 breaking down each respective audio signal into arrays of frequency components;
whereupon the first audio signal x(t) and the second audio signal $x_0(t)$ are fed, respectively, through the first Power Estimator 208 and the Second Power Estimator 209, which compute power values for the various channels, whereby said power values are then fed into the dB Converter to generate power values for the source signal $P_{dBFS}(f)$ and the background signal $P_{0\_dBFS}(f)$ in dBFS 252;
whereupon (i) the microprocessor 201 completes a calibration offset such that a first dBFS to dBSPL Converter 210 converts the power value of the source signal from dBFS to dBSPL, and (ii) the microprocessor 201 completes a calibration offset such that a second dBFS to dBSPL Converter 211 converts the power value of the background signal from dBFS to dBSPL, producing $P_{dBSPL}(f)$ and $P_{0\_dBSPL}(f)$;
whereupon (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0(f)$;
whereupon the microprocessor 201 applies the power value of the source signal and the power value of the background signal, now in dB Phons, to the perceptual model 22 whereupon the microprocessor 201 calculates ΔP(f) in dBPhons
whereupon the microprocessor 201 calculates a correction gain of power to the source signal G(f), at the frequency, in dBSPL, based on the value of ΔP(f) in dB Phons, using the Gain Block component 217 which utilizes the Gain equation;
whereupon the microprocessor 201 reconstitutes the first audio signal with the corrective gain to the source signal corresponding to the frequency, comprising:
  a) multiplying the source signal at the frequency according to the corresponding corrective gain ΔP(f);
  b) using the Frequency Synthesis Module 218, to reconstitute the resulting audio signal
whereupon the noise correction algorithm 203 outputs a corrected audio signal to the microprocessor, whereupon the microprocessor sends the encoded audio signal to the audio codec 205,
whereupon the audio codec decodes the signal into analog form, whereupon the audio codec outputs the signal to the speaker 210.

A media player 01, capable of applying corrections to incoming audio signals of interest, to compensate for ambient noise in the listener's environment, the media player 101 comprising:
  a) a microprocessor 102,
  b) a storage media 104, containing at least one media file capable of being played back,
  c) a digital signal processing chip configured to implement an audio codec 105, coupled to the microprocessor, which effectuates the decoding of audio signals for output by a speaker, and the encoding of voice and noise audio received by the first and second microphones,
  d) a display screen 106, coupled to the microprocessor, upon which the microprocessor may display information for the user to view,
  e) a keypad 107, couple to the microprocessor, which the user actuates to enter data into the microprocessor,
  f) a data storage/program memory unit 108, coupled to the microprocessor, which the microprocessor uses to store program code and variables, g) a speaker 110, coupled to the audio codec 104, disposed upon the phone in a location ergonomically suitable for listening through the user's ear when using the phone,
h) a microphone 111, capable of receiving a second audio signal, which is noise, disposed upon the phone in a location removed from the locations of the first microphone 108, and speaker 109 suitable to minimizing the effect of the speaker's voice on the ambient noise measurement,
i) a second digital signal processing (DSP) chip, coupled to the audio codec, the microphone and the speaker, configured to implement a noise correction algorithm 103, the noise correction algorithm comprising:
   i. a first Analog to Digital converter 204;
   ii. a second Analog to Digital converter 205;
   iii. a first Frequency Analysis Module 206;
   iv. a second Frequency Analysis Module 207;
   v. a first Power Estimator Block 208;
   vi. a second Power Estimator Block 209;
   vii. a first dBFS to dBSPL Converter 210;
   viii. a second dBFS to dBSPL Converter 211;
   ix. a first dBSPL to dB Phon Converter 212;
   x. a second dBSPL to dB Phon Converter 213;
   xi. a Perceptual model 222;
   xii. a Gain Block component 217;
   xiii. a Frequency Synthesis Module 218; and
   xiv. a Digital to Analog Converter 219;
whereupon the microprocessor 102 receives a first audio signal which is the signal of interest via the RF transmitter 104,
whereupon the microprocessor sends the encoded audio signal to the audio codec 105, whereupon the audio codec decodes the signal into analog form,
whereupon the audio codec outputs the signal to a DSP Chip 103,
whereupon the DSP Chip 103, obtains a second audio signal from the background noise microphone 111;
whereupon the first audio signal x(t) and the second audio signal $x_0(t)$ are fed, respectively, through the First D/A Converter 204 and Second D/A 205 thereby converting the signals into digital format;
whereupon the first audio signal x(t) and the second audio signal $x_0(t)$ are fed, respectively, through the First Frequency Analysis Module 206 and Second Frequency Analysis Module 207 breaking down each respective audio signal into arrays of frequency components;
whereupon the first audio signal x(t) and the second audio signal $x_0(t)$ are fed, respectively, through the first Power Estimator 208 and the Second Power Estimator 209, which compute power values for the various channels, whereby said power values are then fed into the dB Converter to generate power values for the source signal $P_{dBFS}(f)$ and the background signal $P_{0\_dBFS}(f)$ in dBFS;
whereupon (i) the DSP chip 103 completes a calibration offset such that a first dBFS to dBSPL Converter 210 converts the power value of the source signal from dBFS to dBSPL, and (ii) the DSP chip 103 completes a calibration offset such that a second dBFS to dBSPL Converter 211 converts the power value of the background signal from dBFS to dBSPL, producing $P_{dBSPL}(f)$ and $P_{0\_dBSPL}(f)$;
whereupon (i) a first dBSPL-dB Phon Converter 212 converts the power value of the source signal to dB Phons by applying a dBSPL to dBPhon Conversion equation, giving P(f) and (ii) a second dBSPL-dB Phon Converter 213 converts the power value of the background signal to dB Phons by applying the dBSPL to dBPhon Conversion equation, giving $P_0(f)$;
whereupon the DSP chip 103 applies the power value of the source signal and the power value of the background signal, now in dB Phons, to the perceptual model 222 whereupon the DSP chip 103 calculates ΔP(f) in dBPhons
whereupon the DSP chip 103 calculates a correction gain of power to the source signal G(f), at the frequency, in dBSPL, based on the value of ΔP(f) in dB Phons, using the Gain Block component 217 which utilizes the Gain equation;
whereupon the DSP chip 103 reconstitutes the first audio signal with the corrective gain to the source signal corresponding to the frequency, comprising:
   c) multiplying the source signal at the frequency according to the corresponding corrective gain ΔP(f);
   d) using the Frequency Synthesis Module 18, to reconstitute the resulting audio signal
whereupon the corrected audio signal is fed through the Digital to Analog Converter 219, resulting in analog signal $x_{out}(t)$;
whereupon the DSP chip 203 outputs the corrected signal to the speaker 210.

As shown in FIG. 4, one possible embodiment of the perceptual model involves analytically computing the value in Sones of the input signal at a given frequency S(P), along with the estimated hearing loss due to background noise in Sones at that frequency $S(P_0)$, and applying these values to the conductor equation to derive a gain in Phons for the signal that will correct for the perceived hearing loss, the Conductor Equation 13 being, $$S(P)=S(P+\Delta P)-S(P_0)+S(0) \text{ or,}$$

$$\Delta P=S^{-1}(S(P)+S(P_0)-S(0))-P$$

As shown in FIG. 5, an alternative embodiment for the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for ΔP for any given P and $P_0$.

In some embodiments, all or part of the present invention could be implemented using a parallel processing architecture such that some or all of the set of computations from step 5 to 10 above may be computed simultaneously using multiple processing units.

Computer Readable Media

In some embodiments, as explained by FIG. 10, the present invention can exist in major part on a computer-readable medium 570 storing a set of instructions executable by one or more processors, where the computer-readable medium 570 is effective in producing proper hearing corrections across a spectrum of frequencies by applying corrective gains of amplitude to a plurality of channels which constitute a first audio signal, wherein corrective gains are generated for each channel by solving for a correction value of ΔP for a source signal, wherein said source signal is a channel of the audio signal corresponding to a particular frequency, where ΔP is derived from solving for the output of a perceptual model 522, the computer-readable medium comprising:
   a. code for reading the first audio signal x(t) 502 from a storage media 04, said first audio signal comprising a plurality of channels corresponding to varying frequencies, b. code for obtaining a second audio signal $x_0(t)$ 503 from a microphone 11, said second audio signal comprising a plurality of channels corresponding to varying frequencies, c. code for solving for the power P(f) in Phons of the source signal of the source signal, at a frequency:

i. code for extracting a power value of the source signal at a frequency, in dBFS with a first power estimator block 408, comprising:

(A) extracting the first audio signal x(t) 502, said first audio signal comprising a plurality of channels corresponding to varying frequencies f, where said first audio signal is then transmitted to an Analog to Digital Converter 504 thereby converting the signal into digital format;

(B) feeding the first audio signal through a First Frequency Analysis Module 506 where the first audio signal is broken down into separate frequency components;

(C) identifying a particular source frequency component of the first audio signal corresponding to a frequency 550;

(D) generating a power value for the frequency component, whereby said power value is then fed into a dB Converter to generate a power value $P_{dBFS}(f)$ for the source in dBFS 552;

ii. code for calculating a calibration offset to convert the power value $P_{dBFS}(f)$ of the source signal in dBFS to a power value $P_{dBSPL}(f)$ in dBSPL 410 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between −20 and −12;

iii. code for converting the power value of the source signal to dB Phons by applying a dBSPL to dBPhon Conversion equation 412, producing P(f);

d. code for solving for $P_0(f)$ in Phons of the background signal, at a frequency:

i. code for extracting a power value of the background signal at the frequency, in dBFS with a second Power Estimator Block 409, comprising:

(A) extracting a second audio signal $x_0(t)$ 503, said second audio signal comprising a plurality of channels corresponding to varying frequencies, where said second audio signal is then transmitted to a second Analog to Digital Converter 505 thereby converting the signal into digital format;

(B) feeding the second audio signal through a Second Frequency Analysis Module 507 where the second audio signal is broken down into separate components;

(C) identifying a particular background signal component, corresponding to a particular frequency 550;

(D) obtaining a power value for the background signal component, whereby said power value is then fed into a dB Converter to generate a power value $P_{0\_dBFS}(f)$ for the background signal in dBFS 552;

ii. code for calculating a calibration offset to convert the power value of the background signal $P_{0\_dBFS}(f)$ in dBFS to a power value $P_{0\_dbSPL}(f)$ in dBSPL using the calibration equation 411 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between −20 and −12;

iii. code for converting the power value of the background signal to dB Phons by applying the dBSPL to dBPhon Conversion equation 413, producing $P_0(f)$;

e. code for using the computational model model 422 to solve for $\Delta P(f)$ f. code for calculating a correction gain of power G(f), for a frequency f, in dBSPL based on the value of $\Delta P(f)$ in dB Phons, using a Gain equation 417;

g. code for reconstituting the first audio signal with the corrective gain to the source signal at the frequency, comprising i. feeding the correction gain to an amplifier wherein the amplifier amplifies the source signal at the frequency by the corrective gain G(f) 453;

ii. combining, using a Frequency Synthesis Module 418, the channels of the corrected signal, reconstituting the corrected signal, producing $x_{out}(t)$;

h. code for feeding the corrected audio signal through a Digital to Analog Converter 419;

i. code for transmitting the corrected audio signal to an amplifier 220, to be output through a speaker 221.

In some embodiments, as explained by FIG. 11, the present invention can exist in major part on a computer medium, 670 storing a set of instructions executable by one or more processors, where the computer-readable medium 670 is effective in producing proper hearing corrections across a spectrum of frequencies by applying corrective gains of amplitude to a plurality of channels which constitute a first audio signal, wherein corrective gains are generated for each channel by solving for a correction value of $\Delta P$ for a source signal, wherein said source signal is a channel of the audio signal corresponding to a particular frequency, where $\Delta P$ is derived from a novel Conductor Equation 616, $$S(P)=S(P+\Delta P)-S(P_0)+S(0) \text{ or,}$$

$$\Delta P=S^{-1}(S(P)+S(P_0)-S(0))-P,$$

where S(P)=a Sones equation from an EarSpring equation solution 614, as a function of Phons Pressure, P=a Phons amplitude of a source signal of interest, $\Delta P$=the gain needed to make a source signal appear at proper loudness for impaired hearing, and $P_0$=an elevated threshold in Phons of impaired hearing, the computer-readable medium comprising:

a) code for reading the first audio signal x(t) 502 from a storage media 04, said first audio signal comprising a plurality of channels corresponding to varying frequencies, b) code for obtaining a second audio signal $x_0(t)$ 503 from a microphone 11, said second audio signal comprising a plurality of channels corresponding to varying frequencies, c) code for solving for S(P) of the Conductor Equation which comprises:

i. code for extracting a power value of the source signal at a frequency, in dBFS with a first power estimator block 608, comprising:

A. extracting the first audio signal x(t), said first audio signal comprising a plurality of channels corresponding to varying frequencies, where said first audio signal is then transmitted to an Analog to Digital Converter thereby converting the signal into digital format;

B. feeding the first audio signal through a first digital filterbank 606 where the first audio signal is broken down into separate channels corresponding to varying Frequencies f;

C. identifying the source signal, wherein the source signal is a particular channel of the first audio signal corresponding to the frequency 650;

D. feeding the source signal through a squared summer equation 651 whereby the source signal is squared and added up N times, whereby the sum of the signal at the end block divided by N generates a mean power value for the source signal, whereby said power value is then fed into a dB Converter to generate a power value for the source in dBFS 652, $P_{dBFS}(f)$;

ii. code for calculating a calibration offset to convert the power value of the source signal $P_{dBFS}(f)$ in dBFS to a power value $P_{dBSPL}(f)$ in dBSPL 610 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$–dBFS$_0$) wherein dBSPL$_0$ is nominally a value between 65 and 83, and wherein dBFS$_0$ is nominally a value between –20 and –12;

iii. code for converting the power value of the source signal to dB Phons by applying a dBSPL to dBPhon Conversion equation 612, producing P(f);

iv. code for applying the power value of the source signal P(f), now in dB Phons, to the EarSpring equation 614 in order to obtain the power value of the source signal in Sones, or S(P(f));

d) code for solving for S(P$_0$) of the Conductor Equation which comprises:

i. code for extracting a power value P$_0$(f) of the background signal at the frequency, in dBFS with a second Power Estimator Block 609, comprising A. extracting a second audio signal x$_0$(t), said second audio signal comprising a plurality of channels corresponding to varying frequencies, where said second audio signal is then transmitted to a second analog to digital Converter 605 thereby converting the signal into digital format;

B. feeding the second audio signal through a second Digital Filter Bank 607 where the second audio signal is broken down into separate channels X$_0$(f) corresponding to varying frequencies;

C. identifying the background signal, wherein the background signal is a particular channel X$_0$(f) of the audio signal corresponding to the frequency;

D. feeding the background signal through a squared summer equation 651 whereby the background signal is squared and added up N times, whereby the sum of the signal at the end block divided by N generates a mean power value for the signal, whereby said power value is then fed into a dB Converter to generate a power value for the background signal in dBFS 652, producing $P_{0\_dBFS}(f)$;

ii. code for calculating a calibration offset to convert the power value of the background signal $P_{0\_dBFS}(f)$ in dBFS to a power value $P_{0\_dBSPL}(f)$ in dBSPL using the calibration equation 611 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$–dBFS$_0$) wherein dBSPL$_0$ is nominally a value between 65 and 83, and wherein dBFS$_0$ is nominally a value between –20 and –12;

iii. code for converting the power value of the background signal to dB Phons by applying the dBSPL to dBPhon Conversion equation 613, producing P$_0$(f);

iv. code for applying the power value of the background signal, now in dB Phons, to the EarSpring equation 615 in order to obtain the power value of the background signal in Sones, or S(P$_0$);

e) code for using S(P(f)) and S(P$_0$(f)) to solve for ΔP(f) using the Conductor equation 616 which results in the Conductor equation 616 generating a ΔP(f) in dBPhons;

f) code for calculating a correction gain of power G(f), for a frequency f, in dBSPL based on the value of ΔP(f) in dB Phons, using a Gain equation 617;

g) code for reconstituting the first audio signal with the corrective gain to the source signal at the frequency, comprising:

i. feeding the correction gain to an amplifier wherein the amplifier multiplies the source signal at the frequency by the corrective gain ΔP(f) 653;

ii. combining, using a Summer Block 618, the channels of the corrected audio signal to reconstitute the corrected output x$_{out}$(t);

h) code for feeding the first audio signal through a Digital to Analog Converter 619;

i) code for transmitting the first audio signal, now in analog format, to the Amplifier 620; and j) code for causing the Amplifier 620 to output the audio signal, now containing the corrective gain at the frequency, to a Speaker 620 where the Speaker 620 outputs the audio signal with the corrective gain at the frequency;

wherein the EarSpring equation 614 is $[d^2/dt^2+2\beta(d/dt)+k(1+\gamma\gamma<y^2>)]y(t)=\eta F(t)$, where t=time, y(t)=amplitude of vibration, F(t)=driving force, identified as the Phons amplitude in the following equations, $<y^2>$=mean power of vibration or S(P), identified as the Sones power in the following equations, β=damping constant, k=spring constant, and γ=coefficient of power dependence of spring constant, and η=the scale factor;

wherein the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz;

wherein the dBSPL to dBPhon Conversion equation 608 is:

$$P_{dBPhon}(F) = \frac{P_{dBSPL}(F) - ATH(F)}{1 + kATH(F)}$$

wherein the Gain equation 613 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH (F)>0
 =+1/240 when ATH(F)<0

The absolute threshold of hearing may be computed in one example by the formula:

$$ATH(F) = \frac{3.64}{F_{KHz}^{0.8}} - 6.5e^{-0.6(F_{kHz}-3.3)^2} + 0.001F_{kHz}^4 - 3.37$$

In another embodiment, a Fourier transform of the signal is used so that the gain computation is performed for each element in the frequency spectrum instead of by channel.

In some embodiments, a computational model can be used in place of explicit computation of the Earspring and Conductor equations, where the computational model is $$\Delta P \cong \frac{AP^2 + BP + C}{DP^2 + EP + 1},$$

where A, B, C, D and E are parameters which have been fit against solutions to the combined Earspring and Conductor Equations, for each value of $P_0$ in 5 dB increments, and stored in a lookup table, such that for a given $P_0$, parameters for A, B, C, D, and E are extracted from the table, and then the computational model is used to compute ΔP given P.

In other embodiments it is also possible to use separate computational models for S(P) and for $S^{-1}(S)$, with separate sets of parameters fit against the solutions for various boundary parameters and values of $P_0$.

In some embodiments as in FIGS. 9 and 10, the processing chain, from output of channels at the digital filter bank to adding gains to channels via the gain component, is a process that occurs in parallel for all channels of the audio signal, through the use of threaded processes, or through the use of a parallel computing device, such as a multi-core processing unit.

Description of Alternative Embodiment

In an alternative embodiment the invention comprises a media player 200, effective in producing corrections to a source audio signal, across a spectrum of frequencies, by applying corrective gains of amplitude to a plurality of channels which constitute a source audio signal, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $G=g0+(P-T)*(1/R-1),$ where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the media player 200 comprising:
a. a first audio device 202, configured to extract a first audio signal 002 where the first audio signal is a broadband audio signal of interest, the first audio device operatively connected to a microprocessor 201;
b. a second audio device 203, configured for extracting a second audio signal 003 where the second audio signal 003 is ambient broadband audio in the environment, the second audio device 203 operatively connected to the microprocessor 201;
c. the microprocessor 201, operatively connected to the first audio device 202 and the second audio device 203, the microprocessor 201 configured to execute applications for:
   i. a first frequency analysis module 204, configured to extract a plurality of frequency components from the first audio signal 002;
   ii. a second frequency analysis module 205, configured to extract a plurality of frequency components from the second audio signal 003;
   iii. a first power estimation block 206, configured to calculate the sound intensity in decibels of each frequency component of the first audio signal 002;
   iv. a second power estimation block 207, configured to calculate the sound intensity of decibels of each frequency component of the second audio signal 003;
   v. a parameter estimation module 311, which determines parameter settings for a parallel compression module, according to information stored in memory,
   vi. the parallel compression module 312, parameterized by threshold T, compression ratio R, and makeup gain g0, where the parameters may by dynamically varied, where the parallel compression module is comprised of:
      1. a linear compression module, which applies gains to the first audio signal according to the equation $G=g0+(P-T)*(1/R-1),$ where G is the gain in dB to be applied to a frequency component of the first audio signal, P is the sound intensity of the frequency component in dB, g0 is the makeup gain in dB, T is the threshold in dB, and R is the compression ratio of the linear compression,
      2. a summer, which combines the resulting amplified first audio signal component with the original first audio signal component,
   vii. a Frequency Synthesis Module 210, which combines the frequency components of the resulting audio signal;
wherein (i) the first audio device 202 extracts the first audio signal 002, whereupon the first audio signal 002 is then transmitted through an analog to digital converter, thereby converting the first audio signal 002 into digital format;
and simultaneously, (ii) the second audio device 203 extracts a second audio signal 003, where said second audio signal 003 is then transmitted through a second analog to digital converter thereby converting the second audio signal 003 into digital format;

whereupon the first audio signal x(t) 002 and the second audio signal x0(t) 003 are fed, respectively, through the First Frequency Analysis Module 204 and Second Frequency Analysis Module 205 breaking down each respective audio signal into arrays of frequency components;

whereupon, for each frequency component, the first audio signal 002 and the second audio signal 003 are fed, respectively, through the first Power Estimation Block 206 and Second Power Estimation Block 207, resulting in estimates, for each frequency component, and at each instant, for the sound intensity of each signal in decibels;

whereupon, for each frequency component, and at each instant, the microprocessor 201, using the power estimates of the frequency components of the first 002 and second 003 audio signals, obtains parameters for the parallel compression 311, depending on the sound intensity of the second audio signal at each instant, whereupon the microprocessor 201, applies the parameters to a parallel compression module 209, whereupon the parallel compression module 312 applies a linear compression, according to the selected parameters, to each of the frequency components of the first audio signal 002, whereupon the parallel compression module 209 sums each frequency component of the first audio signal 002 with the corresponding compressed audio signal, whereupon the microprocessor 201 repeats the process of estimating the power of both the signal of interest and the noise, selecting compression settings, and applying parallel compression for each frequency component of the first audio signal 002, whereupon the microprocessor 201 reconstitutes the first audio signal 002 by feeding the now parallel compressed frequency components of the parallel compressed audio signal 002 through the Frequency Synthesis Module 210, thereby obtaining an output xout(t).

In an alternative embodiment, the invention comprises a computer-readable medium 770 storing a set of instructions executable by one or more processors, where the computer-readable medium 770 is effective in producing proper hearing corrections across a spectrum of frequencies by applying corrective gains of amplitude to a plurality of channels which constitute a first audio signal, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behaviour, where a different set of parameters is retrieved at each instant depending on the ambient noise volume in each frequency, where the dynamically changing noise loudness results in a dynamically changing selection of parameters for the parallel compression module, the computer-readable medium comprising:
a. code for reading the first audio signal x(t) 702 from a storage media, said first audio signal comprising a plurality of channels corresponding to varying frequencies,
b. code for obtaining a second audio signal $x_0(t)$ 703 from a microphone 11, said second audio signal comprising a plurality of channels corresponding to varying frequencies,
c. code for solving for the power P(f) in Phons of the source signal of the source signal, at a frequency:
 i. code for extracting a power value of the source signal at a frequency, in dBFS with a first power estimator block 708, comprising:
  (A) extracting the first audio signal x(t) 702, said first audio signal comprising a plurality of channels corresponding to varying frequencies f, where said first audio signal is then transmitted to an Analog to Digital Converter 704 thereby converting the signal into digital format;
  (B) feeding the first audio signal through a First Frequency Analysis Module 706 where the first audio signal is broken down into separate frequency components;
  (C) identifying a particular source frequency component of the first audio signal corresponding to a frequency 750;
  (D) generating a power value for the frequency component, whereby said power value is then fed into a dB Converter to generate a power value $P_{dBFS}(f)$ for the source in dBFS 752;
 ii. code for calculating a calibration offset to convert the power value $P_{dBFS}(f)$ of the source signal in dBFS to a power value $P_{dBSPL}(f)$ in dBSPL 710 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between −20 and −12;
 iii. code for converting the power value of the source signal to dB Phons by applying a dBSPL to dBPhon Conversion equation 712, producing P(f);
d. code for solving for $P_0(f)$ in Phons of the background signal, at a frequency:
 i. code for extracting a power value of the background signal at the frequency, in dBFS with a second Power Estimator Block 709, comprising:
  (A) extracting a second audio signal $x_0(t)$ 703, said second audio signal comprising a plurality of channels corresponding to varying frequencies, where said second audio signal is then transmitted to a second Analog to Digital Converter 705 thereby converting the signal into digital format;
  (B) feeding the second audio signal through a Second Frequency Analysis Module 707 where the second audio signal is broken down into separate components;

(C) identifying a particular background signal component, corresponding to a particular frequency 750;

(D) obtaining a power value for the background signal component, whereby said power value is then fed into a dB Converter to generate a power value $P_{0\_dBFS}(f)$ for the background signal in dBFS 752;

ii. code for calculating a calibration offset to convert the power value of the background signal $P_{0\_dBFS}(f)$ in dBFS to a power value $P_{0\_dbSPL}(f)$ in dBSPL using the calibration equation 711 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $dBSPL=dBFS+(dBSPL_0-dBFS_0)$ wherein $dBSPL_0$ is nominally a value between 65 and 83, and wherein $dBFS_0$ is nominally a value between −20 and −12;

e. code for determining parameters for the parallel compression using the power value of the background signal, and a parameter estimation module 722, f. code for applying parallel compression 717 to the source signal, according to the parameters selected, g. code for reconstituting the first audio signal with the corrective gain to the source signal at the frequency, comprising i. feeding the correction gain to an amplifier wherein the amplifier amplifies the source signal at the frequency by the corrective gain G(f) 753;

ii. combining, using a Frequency Synthesis Module 718, the channels of the corrected signal, reconstituting the corrected signal, producing $x_{out}(t)$;

h. code for feeding the corrected audio signal through a Digital to Analog Converter 719;

i. code for transmitting the corrected audio signal to an amplifier 720, to be output through a speaker 721.

In one possible embodiment, the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In one possible embodiment, one or more parameters (e.g. T) is defined as a function of the ambient noise intensity (e.g. T=P¬ N−T', where P¬ N is noise loudness), such that the parameters stored (e.g. T') are the parameters of the function defining the relationship between sound intensity (e.g. PN) and the parameter (e.g. T) of the parallel compression.

In another possible embodiment, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In this embodiment, a fixed set of parameters is used. The fixed parameters may fall in the range of 2 to 6 for compression ratio, 15 dB to 25 dB for makeup gain, and −15 to −25 dB for threshold offset.

In varying embodiments the First and Second Frequency Analysis Modules are composed of digital filter banks which are filters that break the signal down into various sub-band channels $\bar{x}(t)$ and $\bar{x}\_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output xout(t).

The First and second Frequency Analysis Modules are digital filter banks composed of wavelet filters.

In some embodiments, the various sub-band channels correspond to critical bands of hearing.

In some embodiments, the First and Second Frequency Analysis Modules, are composed of FFT coprocessors that perform Fourier transforms on the input signals producing X(t) and X0(t), where the power of each component is found by squaring the Fourier component, and the Frequency Synthesis Module 418 is an FFT coprocessor that performs an inverse Fourier transform, resulting in output signal xout(t).

In some embodiments, the frequency components may be grouped together to approximate sub-bands correspond to critical bands of hearing.

The present invention features systems for audio correction. The systems may include but are not limited to media players (and the like) and music players (and the like).

A possible embodiment for the present invention may be multi-channel, such as in a stereo or surround sound system. In this case, gains are computed independently for each channel independently. These gains may be based on one central background noise estimate, or multiple noise estimates at each speaker. Each channel is then amplified by its corresponding gains so that the overall surround effect compensates for the presence of background noise.

The present invention features an media player for correcting an audio signal. The media player, or audio source as claimed, (e.g., a music player) may, for example, comprise a standard media player receiver, a standard media player microphone, and a standard media player speaker, all of which are well known to one of ordinary skill in the art. The receiver can function to extract an amplitude of a source signal (e.g., an incoming conversation on a media player) at given frequency (or within a frequency range) and the microphone can function to detect an amplitude of a background signal at a corresponding frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, referring to the means of extracting amplitudes of source signals or background signals: at the output of each filter which selects a band of adjacent frequencies, an electrical circuit to effect extraction of amplitudes could be the use of a diode, or rectifier bridge, fed by each signal which, in turn, feeds a simple series resistor and a capacitor in shunt to create an integrator of the absolute value of the signal. The integrator would accumulate rectified current for some period of time before being applied to the loudness response curve selection circuit, after which the capacitor would be shorted to discharge the accumulated current, in anticipation of the next cycle of integration. Alternatively, the capacitor could be allowed to discharge continuously through a higher valued resistor in shunt, so that charge can be bled off more slowly than it is accumulated, thereby forming a running exponential average integrator.

A more sophisticated version of amplitude estimation could send the signals through a squarer circuit ahead of the RC integrator in order to accumulate an estimate of the power in the signal. The resulting integrated current would be an estimate of the RMS power at the end of the integration period. This power estimate could then feed the gain correction curve selection circuit.

The output of each integrator can be fed to an analog differencing amplifier (operational amplifier, or OpAmp) to subtract the estimated amplitude of the noise signal from the estimated amplitude of the signal of interest. The output of this difference amplifier can be used to establish a dynamic compressor threshold. The output of the compressor circuit (a voltage controlled amplifier, or VCA) can be added to the dry signal to effect a nonlinear correction. A simple linear compressor (VCA) adjusted with suitable make-up gain and compression ratio can produce, in sum with the dry signal, an approximation of the required nonlinear correction gain.

The present invention is not limited to the aforementioned examples of means of extracting amplitudes.

Without wishing to limit the present invention to any theory or mechanism, it is believed that the present invention is advantageous because the present invention features a maximum output volume, for example the source signal will be amplified to only a certain degree. This can help protect against damage to the user's hearing. Furthermore, the systems frequently detect the background noise (e.g., 10-40 times per second, 1,000 times per second, etc.), allowing for the systems to react quickly to changes in the background noise. Furthermore, the systems utilize non-linear corrections, thus, loud signals are not amplified much if at all.

The systems of the present invention can allow for microphone sensitivity to be altered. For example, a particular user may wish to have more correction or less correction. For example, the microphone may be in someone's pocket, or else exposed directly to the ambient noise sounds. If the microphone becomes shielded, it will produce a weaker response to the noise than if it were directly exposed. Hence the microphone gain can be increased to compensate for the shielding. Also, each of us has a slightly different response to noise levels, some people being more sensitive to it than others. A variable gain on the microphone can help to compensate for individual differences of loudness perception. Finally microphones exhibit varying characteristics depending on their specific construction. A variable microphone gain in the software can help to normalize the response from different microphones.

In varying embodiments, the music player of the present invention may optionally include an LCD screen, LCD controller, or a touch screen or keypad for controlling or configuring the music player settings.

In some embodiments, the present invention resides on an electronic device external to but in communication with separate media players. For example, the present invention resides on a receiver, and communicates with media players via a network, which may be wired or wireless.

In some embodiments, the present invention comprises at least one output terminal for providing the enhanced audio for playback.

In some embodiments, the present invention comprises a touch screen controller in electronic communication with the microprocessor or DSP.

In some embodiments, the present invention comprises an LCD, LCD Controller, or any combination thereof. Said features are effective for display of information pertaining to the present invention to the user and may be in electronic communication with the microprocessor or DSP.

In some embodiments, the present invention comprises a baseboard processor. Said feature may be in electronic communication with the microprocessor.

In some embodiments, the present invention comprises an application processor, which may be an integrated Circuit chip similar to the microprocessor and may control the applications and flow of data on the present invention. Said applications processor may be in communication with and in addition to the microprocessor, or may exist in place of the microprocessor.

In some embodiments, the present invention comprises a Class D amp which may be an electronic amplifier where all power devices are operated as binary switches. Said amplifier may be in electronic communication with the microprocessor or DSP.

In some embodiments, the present invention comprises a low power audio codec. Said codec may for example, contain vDBM. Said feature may be a computer program implementing an algorithm and said codec may reside or be in electronic communication with the microprocessor.

In some embodiments, the present invention comprises sensors for sensing audio signals. Said sensors may be advantageous because they can be disposed at one or more locations on the device, thereby increasing the ability of the device to detect audio signals. Said sensors may be in electronic communication with the microprocessor.

In some embodiments, the present invention comprises a combination of vTuning and vDBM. For example, the present invention may dynamically adjust audio signals to account for interfering ambient noise while also making a spectral sound adjustment to the signal of interest to personalize sound according to a user's preference. Said feature may be enabled, for example, where the microprocessor contains both instructions for vTuning and vDBM.

In some embodiments, the present invention comprises removable memory devices for storing hearing preferences and profiles. Said memory devices may be, for example, zip drives, memory sticks, memory cards, or the like. Said feature may be in communication with the microprocessor.

In some embodiments, the present invention comprises a composite profile which may be data stored on the microprocessor.

In some embodiments, the present invention further comprises accessory ports. Said ports are effective for allowing the present invention to communicate with additional devices. Said feature may be in communication with the microprocessor or DSP and may be in predetermined locations on the device in places convenient for contact with external devices and connecting peripherals.

In some embodiments, the present invention further comprises streaming audio, or audio that is constantly received by and presented to an end-user while being delivered by a streaming provider. Said audio may be received be received by the present invention at the audio device.

In some embodiments, the present invention further comprises streaming video, or video that is constantly received by and presented to an end-user while being delivered by a streaming provider. Said video may be received be received by the present invention at the audio device.

In some embodiments, the present invention further comprises radio reception. Radio reception may be via the of, for example, an antennae where said antennae is in electronic communication with the microprocessor or DSP.

In some embodiments, the present invention comprises resources to prompt the user to provide information, resources to project information to a user, and any combination thereof. Said feature may be, use of the microprocessor, executing a software application where the microprocessor is configured to display message to the user on a screen and/or present messages to a user via a speaker.

In some embodiments, the present invention comprises an input/output controller. Said device may be a device that interfaces between an input or output device and a computer or hardware device, such as, for example, the microprocessor or DSP.

In some embodiments, the present invention comprises a USB port, infrared port, storage device or any combination thereof. Said peripherals enable the present invention communicate with one or more external devices. Said peripherals may be located at predetermined locations on the personal communications device and be in electronic communication with the microprocessor or DSP.

In some embodiments, the present invention comprises a transceiver. Said transceiver may be configured to negotiate a communication channel with an external device and to convert the audio channel into the appropriate format before transmission. Said receiver may be a combination of hardware and software in electronic communication with the microprocessor.

In some embodiments, the present invention comprises a transmitter. Said transmitter may be a mini stereo plug, RCA cable, USB, HDMI, or wireless device. Said transmitter may be in electronic communication with the microprocessor.

In some embodiments, the present invention comprises a Hearing aid/Media Player combo where the Hearing aid may be in communication with Media player, where hearing aid adjusts sound from the media player according to the technology discussed herein.

In some embodiments, the present invention comprises a remote control device in wireless or wired electronic communication with the microprocessor, said remote control configured to enable a user to interact with the present invention.

The systems of the present invention can allow for signals to be corrected prior to transmission or recording, such that ambient noise in the recorded or received signal is retained, but the spectral composition of the primary source signal is modified to compensate, as an alternative to standard noise reduction techniques.

In some embodiments, steps for converting analog audio input signals to digital input signals can be bypassed where the invention utilizes digital input audio sources capable of receiving digital audio signals and transmitting the same to the processor.

As used herein, the term "hearing impaired" refers to physical hearing impairment, as in the traditional sense of hearing loss, and/or, can also refer to temporary hearing loss caused by a background noise or other temporary hearing loss factors. One of the novel discoveries addressed by the present invention is that a individual with normal hearing can in fact experience hearing impairment due to background noise, or background signals interfering with source noise or source signals.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:

1. A media player 01, capable of applying corrections to incoming audio signals of interest, to compensate for ambient noise in the listener's environment, the media player 01 comprising:
    a) a microprocessor 02, the microprocessor being a multi-core processor containing a DSP chip 03;
    b) a storage media 04, coupled to the microprocessor, containing at least one media recording;
    c) a digital signal processing chip configured to implement an audio codec 05, coupled to the microprocessor, which effectuates the decoding of audio signals for output by a speaker;
    d) a display screen 06, coupled to the microprocessor, upon which the microprocessor may display information;
    e) an input device 07, coupled to the microprocessor, which the user actuates to enter data into the microprocessor;
    f) a data storage/program memory unit 08, coupled to the microprocessor, which the microprocessor uses to store program code and variables;
    g) a speaker 10, coupled to the audio codec 05;
    h) a microphone 11, capable of receiving a second audio signal;
    i) the DSP chip implementing a noise correction algorithm 03; the noise correction algorithm comprising:
        i. a first Frequency Analysis Module 206,
        ii. a second Frequency Analysis Module 207,
        iii. a first Power Estimator Block 208,
        iv. a second Power Estimator Block 209,
        v. a first dBFS to dBSPL Converter 210,
        vi. a second dBFS to dBSPL Converter 211,
        vii. a first dBSPL to dB Phon Converter 212,
        viii. a second dBSPL to dB Phon Converter 213,
        ix. a Perceptual model 222,
        x. a Gain Block component 217,
        xi. a Frequency Synthesis Module 218,
wherein the microprocessor 02 receives a first audio signal which is the signal of interest via storage media,
whereupon the microprocessor 02 receives a second audio signal, which is the noise signal via the microphone,
whereupon the first audio signal 202 and second audio signal 203 are input to the noise correction algorithm,
whereupon the first audio signal $x(t)$ and the second audio signal $x_0(t)$ are fed, respectively, through the First Frequency Analysis Module 204 and the Second Frequency Analysis Module 205 breaking down each respective audio signal into separate arrays of frequency components,
whereupon the first audio signal $x(t)$ and the second audio signal $x_0(t)$ are fed, respectively, through the first Power Estimator 208 and the Second Power Estimator 209, which compute power values for the various frequency components, whereby said power values are then fed into the dB Converter to generate power values for a source signal $P_{dBFS}(f)$ and a background signal $P_{0\_dBFS}(f)$ in dBFS 252, at each frequency component, whereupon (i) the microprocessor 201 completes a calibration offset such that the first dBFS to dBSPL Converter 210 converts the power value of the source signal from dBFS to dBSPL, and (ii) the microprocessor 201 completes a calibration offset such that the second dBFS to dBSPL Converter 211 converts the power value of the background signal from dBFS to dBSPL, producing $P_{dBSPL}(f)$ and $P_{0\_dBSPL}(f)$, whereupon (i) the first dBSPL-dB Phon Converter 212 converts the power value of the source signal to dB Phons by applying a dBSPL to dBPhon Conversion equation, giving P(f) and (ii) the second dBSPL-dB Phon Converter 213 converts the power value of the background signal to dB Phons by applying the dBSPL to dBPhon Conversion equation, giving $P_0(f)$, whereupon the microprocessor 201 applies the power value of the source signal and the power value of the background signal, now in dB Phons, to the perceptual model 22, whereupon the microprocessor 201 calculates ΔP(f) in dBPhons, whereupon the microprocessor 201 calculates a correction gain of power to the source signal G(f), at each frequency component, in dBSPL, based on the value of ΔP(f) in dB Phons, using the Gain Block component 217 which utilizes the Gain equation, whereupon the microprocessor 201 reconstitutes the first audio signal with the corrective gains to the source signals corresponding to the frequency components, comprising:
a) multiplying the source signal at the frequency component according to the corresponding corrective gain ΔP(f), and
b) using the Frequency Synthesis Module 218, to reconstitute the first audio signal, thereby creating a resulting audio signal whereupon the noise correction algorithm 203 outputs the resulting audio signal to the microprocessor, whereupon the microprocessor sends the encoded resulting audio signal to the audio codec 205, whereupon the audio codec decodes the resulting audio signal into analog form, whereupon the audio codec outputs the resulting audio signal to the speaker 210.

2. A media player 01, capable of applying corrections to incoming audio signals of interest, to compensate for ambient noise in the listener's environment, the media player 01 comprising:
a) a microprocessor 02, the microprocessor configured to execute a noise correction application 03;
b) a storage media 04, coupled to the microprocessor, containing at least one media recording;
c) a digital signal processing chip configured to implement an audio codec 105, coupled to the microprocessor, which effectuates the decoding of audio signals for output by a speaker;
d) a display screen 106, coupled to the microprocessor, upon which the microprocessor may display information;
e) an input device, 107, coupled to the microprocessor, which the user actuates to enter data into the microprocessor;
f) a data storage/program memory unit 108, coupled to the microprocessor, which the microprocessor uses to store program code and variables;
g) a speaker 110, coupled to the audio codec 104;
h) a microphone 111, capable of receiving a second audio signal;
i) a second digital signal processing (DSP) chip, coupled to the audio codec, the microphone and the speaker, configured to implement a noise correction algorithm 103; the noise correction algorithm comprising:
  i. a first Analog to Digital converter 204,
  ii. a second Analog to Digital converter 205,
  iii. a first Frequency Analysis Module 206,
  iv. a second Frequency Analysis Module 207,
  v. a first Power Estimator Block 208,
  vi. a second Power Estimator Block 209,
  vii. a first dBFS to dBSPL Converter 210,
  viii. a second dBFS to dBSPL Converter 211,
  ix. a first dBSPL to dB Phon Converter 212,
  x. a second dBSPL to dB Phon Converter 213,
  xi. a Perceptual model 222,
  xii. a Gain Block component 217,
  xiii. a Frequency Synthesis Module 218, and
  xiv. a Digital to Analog Converter 219 whereupon the microprocessor 102 receives a first audio signal which is the signal of interest via the storage media, whereupon the microprocessor sends the encoded audio signal to the audio codec 105, whereupon the audio codec decodes the signal into analog form, whereupon the audio codec outputs the signal to a DSP Chip 103, whereupon the DSP Chip 103, obtains a second audio signal from the background noise microphone 111, whereupon the first audio signal x(t) and the second audio signal $x_0(t)$ are fed, respectively, through the First D/A Converter 204 and Second D/A converter 205 thereby converting the signals into digital format, whereupon the first audio signal x(t) and the second audio signal $x_0(t)$ are fed, respectively, through the First Frequency Analysis Module 206 and Second Frequency Analysis Module 207 breaking down each respective audio signal into separate arrays of frequency components, whereupon the first audio signal x(t) and the second audio signal $x_0(t)$ are fed, respectively, through the first Power Estimator 208 and the Second Power Estimator 209, which compute power values for the various frequency components, whereby said power values are then fed into the dB Converter to generate power values for a source signal $P_{dBFS}(f)$ and a background signal $P_{0\_dBFS}(f)$ in dBFS, for each frequency component, whereupon (i) the DSP chip 103 completes a calibration offset such that the first dBFS to dBSPL Converter 210 converts the power value of the source signal from dBFS to dBSPL, and (ii) the DSP chip 103 completes a calibration offset such that the second dBFS to dBSPL Converter 211 converts the power value of the background signal from dBFS to dBSPL, producing $P_{dBSPL}(f)$ P and $P_{0\_dBSPL}(f)$, whereupon (i) the first dBSPL-dB Phon Converter 212 converts the power value of the source signal to dB Phons by applying a dBSPL to dBphon Conversion equation, giving P(f) and (ii) the second dBSPL-dB Phon Converter 213 converts the power value of the background signal to dB Phons by applying the dBSPL to dBPhon Conversion equation, giving $P_0(f)$, whereupon the DSP chip 103 applies the power value of the source signal and the power value of the background signal, now in dB Phons, to the perceptual model 222 whereupon the DSP chip 103 calculates ΔP(f) in dBPhons, whereupon the DSP chip 103 calculates a correction gain of power to the source signal G(f), at each frequency component, in dBSPL, based on the value of ΔP(f) in dB Phons, using the Gain Block component 217 which utilizes the Gain equation, whereupon the DSP chip 103 reconstitutes the first audio signal with the corrective gains to the source signals corresponding to the frequency components, comprising:
  a) multiplying the source signal at the frequency component according to the corresponding corrective gain ΔP(f),
  b) using the Frequency Synthesis Module 18, to reconstitute the resulting audio signal whereupon the resulting audio signal is fed through the Digital to Analog Converter 219, generating an analog signal $x_{out}(t)$;

whereupon the DSP chip 203 outputs the analog signal to the speaker 210.

3. The media player of claims 1 and 2, where the First and Second Frequency Analysis Modules 206, 207 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 218 is a summer operation that combines the various channels into output $x_{out}(t)$ 4. The media player of claims 1 and 2, where the First and second Frequency Analysis Modules 206,207 are digital filter banks composed of wavelet filters.

5. The media player of claims 1 and 2, where the various sub-band channels correspond to critical bands of hearing.

6. The media player of claims 1 and 2, where the First and Second Frequency Analysis Modules 206,207 are composed of FFT coprocessors that perform Fourier transforms on the input signals producing X(t) and $X_0(t)$, where the power of each component is found by squaring the Fourier component, and the Frequency Synthesis Module 218 is an FFT coprocessor that performs an inverse Fourier transform, resulting in output signal $x_{out}(t)$.

7. The media player of claims 1 and 2, where the frequency components are grouped together to approximate sub-bands correspond to critical bands of hearing.

8. The media player of claims 1 and 2, where the perceptual model 222 consists of a forward model which computes subjectively perceived Sones in terms of Phons, and an inverse model which computes Phons in terms of Sones, allowing the Perceptual model to be combined into the Conductor Equation, the Conductor Equation 316 being, $$S(P) = S(P+\Delta P) - S(P_0) + S(0) \text{ or,}$$

$$\Delta P = S^{-1}(S(P) + S(P_0) - S(0)) - P,$$

where this equation may be stated as the desired gain in Phons being the Phons amplification necessary to amplify the sound over background noise so that it's subjectively perceived loudness over background noise is the same as the subjectively perceived loudness without the noise, minus some correcting factor, where the function S(P) is found by solving the Earspring equation under experimental boundary conditions, where the Earspring equation 314,315 is written $[d^2/dt^2 + 2\beta(d/dt) + k(1+\gamma\gamma<y^2>)]y(t) = \eta F(t)$, which is a harmonic oscillator model of the signal processing performed by the ear, the cochlea, and immediate signal processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and r=the scale factor, where for a particular frequency of the driving force F(t), which represents a pure sinusoid of intensity P, a solution y(t) to this equation can be found, which can then be converted to $<y^2>$, which represents the perceived loudness S in Sones, resulting in a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular sub-band, and P is the sound intensity impinging on the ear in dBPhons for a particular subband, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary parameters.

9. The media player of claims 1 and 2, where the set of boundary parameters used to obtain solutions to the Earspring Equation comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

10. The media player of claims 1 and 2, where a computational model is used to estimate Earspring equation solutions S(P) and $S^{-1}(S)$ consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory.

11. The media player of claims 1 and 2, where the perceptual model 222 is a computational model 324 used to estimate ΔP, which consists of a quadratic function $$\Delta P \cong \frac{AP^2 + BP + C}{DP^2 + EP + 1},$$

where A, B, C, D, and E are parameters which fit the quadratic function against the solution to the Conductor equation 316, as described in claim 6, for various values of $P_0$ and are stored in a lookup table 323.

12. The media player of claims 1 and 2, where the perceptual model 222 is any numerical function approximator 324 that is fit against the Earspring 314, 315 and Conductor equations 316, as described in claim 6, and approximates their solutions, where these approximators may include, but are not limited to linear regression, neural networks, and others.

13. A media player 200, effective in producing corrections to a source audio signal, across a spectrum of frequencies, by applying corrective gains of amplitude to a plurality of channels which constitute a source audio signal, wherein parallel compression is used to approximate gain curves derived from a psychoacoustic model, wherein the parallel compression is implemented by applying a gain G to the signal of interest according to a linear compression and then combining this compressed signal with the source audio signal, such that the combined parallel compression of the source signal forms a non-linear compression curve, where the linear compression is found by the equation, $$G=g0+(P-T)*(1/R-1),$$

where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the media player 200 comprising:
  a. a first audio device 202, configured to extract a first audio signal 002 where the first audio signal is a broadband audio signal of interest, the first audio device operatively connected to a microprocessor 201;
  b. a second audio device 203, configured for extracting a second audio signal 003 where the second audio signal 003 is ambient broadband audio in the environment, the second audio device 203 operatively connected to the microprocessor 201;
  c. the microprocessor 201, operatively connected to the first audio device 202 and the second audio device 203, the microprocessor 201 configured to execute applications for:
    i. a first frequency analysis module 204, configured to extract a plurality of frequency components from the first audio signal 002,
    ii. a second frequency analysis module 205, configured to extract a plurality of frequency components from the second audio signal 003,
    iii. a first power estimation block 206, configured to calculate the sound intensity in decibels of each frequency component of the first audio signal 002,
    iv. a second power estimation block 207, configured to calculate the sound intensity of decibels of each frequency component of the second audio signal 003,
    v. a parameter estimation module 311, which determines parameter settings for a parallel compression module, according to information stored in memory,
    vi. the parallel compression module 312, parameterized by threshold T, compression ratio R, and makeup gain g0, where the parameters may by dynamically varied, where the parallel compression module is comprised of:
      1. a linear compression module, which applies gains to the first audio signal according to the equation $$G=g0+(P-T)*(1/R-1),$$

where G is the gain in dB to be applied to a frequency component of the first audio signal, P is the sound intensity of the frequency component in dB, g0 is the makeup gain in dB, T is the threshold in dB, and R is the compression ratio of the linear compression,
      2. a summer, which combines the resulting amplified first audio signal component with the original first audio signal component,
    vii. a Frequency Synthesis Module 210, which combines the frequency components of the resulting audio signal, wherein (i) the first audio device 202 extracts the first audio signal 002,
whereupon the first audio signal 002 is then transmitted through an analog to digital converter, thereby converting the first audio signal 002 into digital format,
and, (ii) the second audio device 203 extracts a second audio signal 003, where said second audio signal 003 is then transmitted through a second analog to digital converter thereby converting the second audio signal 003 into digital format,
whereupon the first audio signal x(t) 002 and the second audio signal x0(t) 003 are fed, respectively, through the First Frequency Analysis Module 204 and Second Frequency Analysis Module 205 breaking down each respective audio signal into separate arrays of frequency components,
whereupon, for each frequency component, the first audio signal 002 and the second audio signal 003 are fed, respectively, through the first Power Estimation Block 206 and Second Power Estimation Block 207, resulting in power estimates, for each frequency component, and at each instant, for the sound intensity of each signal in decibels,
whereupon, for each frequency component, and at each instant, the microprocessor 201, using the power estimates of the frequency components of the first 002 and second 003 audio signals, obtains parameters for the parallel compression 311, depending on the sound intensity of the second audio signal at each instant,
whereupon the microprocessor 201, applies the parameters to a parallel compression module 209,
whereupon the parallel compression module 312 applies a linear compression, according to the selected parameters, to each of the frequency components of the first audio signal 002,
whereupon the parallel compression module 312 sums each frequency component of the first audio signal 002 with the corresponding compressed audio signal,
whereupon the microprocessor 201 repeats the process of estimating the power of both the signal of interest and the noise, selecting compression settings, and applying parallel compression for each frequency component of the first audio signal 002,
whereupon the microprocessor 201 reconstitutes the first audio signal 002 by feeding the now parallel compressed frequency components of the parallel compressed audio signal 002 through the Frequency Synthesis Module 210, thereby obtaining an output xout(t).

14. The media player of claim 13, where the First 204 and Second 205 Frequency Analysis Modules are composed of a digital filter banks of filters and output and the frequency components comprise time-domain arrays of band-limited frequency channels for the first 002 and second 003 audio signals, and where the Frequency Synthesis Module is a summer block that summers together the channels of the audio signals after gains have been applied.

15. The media player of claim 14, where the frequency sub-bands correspond to critical bands of hearing.

16. The media player of claim 13, where the First and second Frequency Analysis Modules are digital filter banks composed of wavelet filters.
17. The media player of claim 13, where the First 204 and Second 205 Frequency Analysis modules are composed of FFT co-processors 411 and the frequency components comprise output Fourier transform components for the first 002 and second 003 audio signals, and where the Frequency Synthesis Module 210 is an IFFT co-processor 410.
18. The media player of claim 17, where the frequency components are grouped together to approximate sub-bands correspond to critical bands of hearing.
19. The media player of claim 13, where discrete sets of parameters are found by dividing the range of possible noise volumes into discrete levels, and where sets of parameters are found for each discrete noise loudness level, where the parameter estimation module 311 is a lookup table, where during real-time processing the ambient noise intensity is measured and used to select the corresponding set of parameters.
20. The media player of claim 13, where the parameter estimation module 311 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.
21. The media player of claim 13, where one or more parameters (e.g. T) is defined as a function of the ambient noise intensity (e.g. T=$P_n$-T', where $P_n$ is noise loudness), such that the parameters stored (e.g. T') are the parameters of the function defining the relationship between sound intensity (e.g. $P_n$) and the parameter (e.g. T) of the parallel compression.
22. The media player of claim 13, where the gain equation is expressed as a function of the difference between signal intensity and noise intensity:

$G = g0 + (dP - T')/R - dP$ where dP is the difference between the signal loudness and noise loudness in decibels, and T' is the threshold offset from the ambient noise intensity to the threshold T.
23. The media player of claim 22, where a fixed set of parameters is used.
24. The media player of claim 23, where the fixed parameters fall in the range of 2 to 6 for compression ratio, 15 dB to 25 dB for makeup gain, and −15 to −25 dB for threshold offset.
25. The media player of claims 1, 2, and 13 wherein the dBSPL to dBPhon Conversion equation 312,313 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
 =+1/240 when ATH(F)<0
26. The media player of claims 1, 2, and 13 wherein the Gain equation 317 is:

$\Delta P_{dBSPL}(F) = \Delta P_{dBPhon}(F)(1 + kATH(F))$ where
F=frequency
ATH(F)=Absolute Threshold of Hearing
K=−1/120 when ATH(F)>0
 =+1/240 when ATH(F)<0
27. The media player of claims 1, 2, and 13 where the absolute threshold of hearing is computed by the formula:

$$ATH(F) = \frac{3.64}{F_{KHz}^{0.8}} - 6.5e^{-0.6(F_{kHz} - 3.3)^2} + 0.001 F_{kHz}^4 - 3.37$$

28. The media player of claims 1, 2, and 13 where there are a plurality of source audio signals corresponding to the various signals of a stereo or surround sound audio system, and a plurality of background noise signals, one for each channel, and where gains for each channel are independently computed, according to the source and noise signal for each channel, and applied to each channel.

VIRTUAL AUDIO PORT WITH DYNAMIC SPECTRAL CORRECTION OF AUDIO SIGNALS TO COMPENSATE FOR AMBIENT NOISE

Background of the Invention

The present invention relates to the field of audio processing and more specifically to compensation for ambient noise in the listener's environment, using a software application on a personal computer or smart phone.

The term virtual audio port as used herein refers to a software application that can be run as a background process on a personal computer, which mimics the interfaces of a hardware audio output port. The virtual audio port can be selected as an output device for the audio of a person computer or other software application. The software can then process the sound before outputting to an actual hardware audio port, or other audio output (i.e. a file, streaming audio connection, etc.)

Ambient noise in the listeners environment can interfere with the ability of a user to hear audio output from a personal computer, smart phone, or other computing device. Implementing corrective adjustments can be done in software applications on the personal computer, but having separate correction for each application would be inefficient and troublesome to implement. Hence there is a need for a single software solution for personal computers that would allow the sound output to be adapted to ambient noise. A virtual audio port, by mimicking the interfaces of an audio output can be interposed between the application software and the audio output of the hardware in a way that allows it to be universally applied to all output sounds from the computing device.

There are many systems for the application of filtering to noise suppression in an audio signal. In most cases, these inventions relate to the removal of noise that is present in the source signal from the origin or introduced into the signal through processing and transmission. Various forms of filtering may be applied which suppresses the noise signal in whole or in part. Generally, these systems have adverse impacts upon the quality of the original signal. However, these systems do not address noise in the environment of the listener, which cannot be filtered.

Conversely, systems for the suppression of noise in the listener's environment also exist. These systems generally use noise cancellation to remove the disrupting external signal by adding sound projected through headphones which has the effect of countering the sound waves produced by the noise. In this case, the noise is completely canceled and listener is generally unaware of the existence of the external noise, a result which can reduce the awareness of the listener to potential dangers in the environment.

In some prior art systems, dynamic volume compensation may be used to raise the volume of a source signal of interest over ambient background noise. However, these systems increase the gain in a spectrally uniform manner, raising the volume of all frequency components equally. This effect can distort the perception of music and speech due to the nonlinear behavior of the human ear with respect to frequency and volume.

Microphones and mechanical systems (e.g., computer software) can measure dBSPL; a sound (e.g., 40 dBSPL) at particular frequency (e.g., 1 kHz) sounds just as loud as the sound (e.g., 40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Since the human ear dynamically adjusts to sound intensity levels, the presence of background noise alters the threshold at which sounds begin to be perceived. As a result, ambient noise at a given frequency may make sounds at those frequencies that would otherwise be perceptible imperceptible in the presence of ambient noise. In order for the sound to be heard it must be amplified over the background noise. The volume of the ambient noise therefore represents a degree of hearing impairment or baseline threshold elevation over which the sound must be amplified to be perceived.

This effect varies according to the spectral composition of the noise, that is, spectral components that are sufficiently far from the spectral composition of the noise will remain perceptible. Consequently, using the total intensity of the background noise to raise the intensity of the source uniformly will overly amplify bands which are not affected, possibly raising the volume to damaging levels. In order to amplify only those components which need compensation, the gains to the source signal must vary by spectral band, according to the spectral composition of the noise.

Moreover, due to the nonlinear response of the human ear, using the spectral intensity of the background noise at a particular band as the gain for the source at that band will produce excessive amplification. In order to compute the correct gain a nonlinear corrective model must be used to compute an appropriate gain for each frequency. The intensity of the background noise as well as the source signal at a given frequency are inputs to this model, and the output is a desired gain for the source signal at that frequency.

The perceived loudness of sound can be modeled by a harmonic oscillator with spring constant that varies according to the mean power of vibration. This model is called the Earspring model. The Earspring equation 10,11 is written $[d^2/dt^2+2\beta(d/dt)+k(1+\gamma\gamma<y^2>)]y(t)=\eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude, for which the amplitude is P in dBPhons, a solution to the earspring equation y(t) can be found, for a particular set of boundary conditions, which is the steady state response to the forcing function. Transforming into the frequency domain we can obtain the mean power of vibration $<y^2>=\frac{1}{2}|Y|^2$, which can be rewritten as S(P).

A possible set of boundary parameters comprises (i) a Sones ratio between the hearing threshold level and the reference level of 40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

We can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

The present invention features systems for dynamically adjusting audio signals by applying a gain to the signal in a spectrally varying manner to compensate for a noise source in the environment of the listener, such that the sound is perceived by the listener to be unchanged in loudness and spectral composition. The system obtains a threshold elevation for each frequency component by analyzing the spectral composition of the ambient noise. This threshold elevation is then used by a psychoacoustic model of hearing to determine an appropriate gain adjustment for the corresponding frequency component of the source signal which will make that component perceived by the human ear to be just as loud as if the noise were not present. After applying the gains to the source signal, the resulting signal is output to the speaker. The system allows a listener to hear without distortion, over ambient noise, by applying a gain to the source that varies according to the spectral composition of the noise, rather than cancelling the noise, or applying a uniform volume adjustment to the source. The perceived spectral composition of the source is thus adjusted without the removal of the noise signal. Systems may be incorporated into apparatuses including but not limited to mobile phones and music players.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dBSPL}(F)=P_{dBFS}(F)+(P_{dBSPL_0}(F)=P_{dBFS_0}(F))$ wherein $P_{dBSPL0}$ is nominally a value between 65 and 83, and wherein $P_{dBFS0}$ is nominally a value between −20 and −12;

where P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component can may comprises a particular, individual frequency, frequency channels, or frequency bands. A frequency component spectrum is a plurality of frequency components.

19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.

20. Gain Block component—This component applies the gains to each corresponding frequency component or band. In some embodiments, the term gain block component is used interchangeably with a "means for applying gains to a audio signal." Said means may be, for example, an amplifier, or gain block component.

21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.

22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.

23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F\_kHz)=26.811(1+1.960/F\_kHz)-0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G=g0+(P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical parameter value that when input to the Personalized Sound adjustment, generates may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference. In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

34. where G is the gain ratio, PSIG is the signal intensity at a frequency in units of power, PNOISE is the signal intensity of the background noise, PTHRQ is the absolute threshold of hearing, and α=0.2 is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

35. RF Transceiver: Radio Frequency Transmitter/Receiver—this device interfaces directly with the antenna and can modulate an audio signal with its radio carrier frequency for transmission as well as demodulate a received radio frequency signal 36. Source signal: The Source signal, as used herein refers to a portion of the first audio signal or the audio signal of interest at a given frequency component.

37. Speaker: The speaker can be any speaker or the like capable of receiving and projecting a sound signal adjusted or corrected by the present invention.

38. Storage media: A computer readable media used for storing data, such as a hard disk, RAM, or flash memory 39. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

40. Threshold elevation: Threshold elevations correlate to the minimum sound pressures required to perceive sounds at various frequencies.

Additional Terms:
1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.
2. dBSPL: Decibels sound power level—a unit of measure of sound intensity at the ear
3. dBSPL to dBPhon Conversion equation: This equation converts sound pressure level to Phons in decibels:

$$P_{dBPhon}(F) = \frac{P_{dBSPL}(F) - ATH(F)}{1 + kATH(F)}$$

where
F=Frequency
ATH=Absolute Threshold of Hearing
P=Phons amplitude of a source signal of interest
dBSPL=decibels according to sound pressure
4. dBFS to dBSPL Converter: This equation converts the audio signal power from audio power in decibels to audio sound pressure level in decibels
5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
6. Gain Equation: This equation converts the gain in Phons to a gain in sound pressure level $$\Delta P_{dBSPL}(F) = \Delta P_{dBPhon}(F)(1+kATH(F))$$

where:
F=Frequency
ATH=Absolute Threshold of Hearing
P=Phons amplitude of a source signal of interest
dBSPL=decibels according to sound pressure
K=−1/120 when ATH(F)>0
 =+1/240 when ATH(F)<0
7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
8. Phons: Phons are objective units of sound intensity impinging upon the ear. Sound power may be converted from decibels (dBFS) to Phons using a conversion first to dBSPL then to Phons
9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
10. Sones: Sones are subjective units of perceived sound loudness.
11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1. Is a drawing of a possible systems architecture for a VAP application implementing an ambient noise correction compression algorithm.
FIG. 2. is a drawing of a possible block diagram of the software architecture of the present invention.
FIG. 3. Diagrams an implementation of the Psychoacoustic Model of the present invention using analytical solution to the Earspring model.
FIG. 4. Diagrams an implementation of the Psychoacoustic Model in which a Numerical approximation to the solutions is made using a function approximator for which parameters have been stored in memory.
FIG. 5 is a drawing illustrating an application of parallel compression to approximate a psychoacoustic non-linear compressor, where the parameters of the parallel compression are dynamically adjusted.
FIG. 6 is a drawing of an exemplary embodiment of the present invention, using a dynamically adjusted parallel compression to approximate the desired non-linear compression of the psychoacoustic model.
FIG. 7 is a plot of the compression ratio needed to make the parallel compression module approximate the psychoacoustic model, as found by fitting the parallel compression curves against the desired model curves.
FIG. 8 is a plot of the makeup gain needed to make the parallel compression module approximate the psychoacoustic model, as found by fitting the parallel compression curves against the desired model curves.
FIG. 9 is a drawing of a possible process flow for the present invention, using a computational model to approximate the Earpsring and consuctor equations.
FIG. 10 is a drawing of a possible process flow for the present invention, using analytical solutions to the earspring and conductor equations.
FIG. 11 is a drawing of a possible process flow for the present invention using parallel compression to approximate the gains produced by the Earspring and Conductor equations.

Description of Preferred Embodiments

As described by FIG. 1, in some embodiments, the invention may be implemented on a personal computer, where the personal computer has a microphone for measuring sound in the environment 03, an internet connection and modem 12, a software application capable of processing incoming audio signals 17, and a speaker output 11. The present invention is implemented as a virtual audio channel, which interfaces between an actual audio output of the personal computer and the software application. The virtual audio port 16 appears as a normal audio output on the personal computer's operating system, and accepts inputs from the software application and a microphone available on the computer. The virtual audio channel processes the audio and outputs a corrected signal to the actual audio output.
As shown in FIG. 2, in some embodiments, the virtual audio port comprises a system effective in producing corrections to a source audio signal across a spectrum of frequencies by applying corrective gains of amplitude to a plurality of channels which constitute a source audio signal, wherein corrective gains are generated for each channel through a psychoacoustic model, where the psychoacoustic model takes as inputs the source signal X and the noise signal X0, where the model computes the gain in sound intensity at a given frequency required to correct for the effect of an ambient noise signal, the apparatus 100 comprising:

(a) a first audio signal 02 where the first audio signal 002 is a digital audio signal of interest, received from a software application;

(b) a second audio signal 03, where the second audio signal 03 is broadband ambient noise in the environment, received from a microphone;

(c) the virtual audio pipe application 01, configured to execute a plurality of applications for:
  a. a first frequency analysis module 104, configured to extract a plurality of frequency components from the first audio signal 02;
  b. a second frequency analysis module 105, configured to extract a plurality of frequency components from the second audio signal 03;
  c. a first power estimation block 106, configured to calculate the sound intensity in decibels of each of the frequency components of the first audio signal 002;
  d. a second power estimation block 107, configured to calculate the sound intensity in decibels of each of the frequency components of the second audio signal 003;
  e. a psychoacoustic model 108, which takes as input the sound intensity of the first audio signal 002 as the signal of interest, and the sound intensity of the second audio signal 003 as a threshold elevation, and computes a correction gain for the first audio signal 002 for each frequency component of the first audio signal 002;
  f. a Gain Block component 109, configured to apply the computed correction gains corresponding to each of the frequency components of the first audio signal 002;
  g. a Frequency Synthesis Module 110, which combines the frequency components of the resulting audio signal to form an output signal where the output signal is the corrected version of the original first audio signal 02;

where the first audio signal x(t) 02 and the second audio signal x0(t) 03 are fed, respectively, through the First Frequency Analysis Module 104 and Second Frequency Analysis Module 105 breaking down each respective audio signal into arrays of frequency components;

whereupon the first audio signal 002 and the second audio signal 03 are fed, respectively, through the first Power Estimation Block 106 and the Second Power Estimation Block 107, resulting in power estimates for the sound intensities of each of the frequency components corresponding to both the first audio signal 02 and the second audio signal 03, in decibels;

whereupon the source signal power estimates and the noise signal power estimates, are applied to the psychoacoustic model 108 in order to obtain gains represented by $\Delta X$ in dB, for each frequency component;

whereupon the virtual audio port 16 amplifies each frequency component of the source signal by the corresponding gain computed, by feeding the frequency component through the gain block 109;

whereupon the virtual audio port 16 reconstitutes the first audio signal 02 into a corresponding output audio signal by feeding the various frequency components of the source signal 02 through the Frequency Synthesis Module 110, obtaining output xout(t).

Computer Readable Media

In some embodiments, as explained by FIG. 9, the present invention can exist in major part on a computer-readable medium 570 storing a set of instructions executable by one or more processors, where the computer-readable medium 570 is effective in producing proper hearing corrections across a spectrum of frequencies by applying corrective gains of amplitude to a plurality of channels which constitute a first audio signal, wherein corrective gains are generated for each channel by solving for a correction value of $\Delta P$ for a source signal, wherein said source signal is a channel of the audio signal corresponding to a particular frequency, where $\Delta P$ is derived from solving for the output of a psychoacoustic model 522, the computer-readable medium comprising:
  a. code for reading the first audio signal x(t) 502 from the software application 16, said first audio signal comprising a plurality of channels corresponding to varying frequencies,
  b. code for obtaining a second audio signal $x_0(t)$ 503 from a microphone, said second audio signal comprising a plurality of channels corresponding to varying frequencies,
  c. code for solving for the power P(f) in Phons of the source signal of the source signal, at a frequency:
    i. code for extracting a power value of the source signal at a frequency, in dBFS with a first power estimator block 508, comprising:
      (A) extracting the first audio signal x(t) 502, said first audio signal comprising a plurality of channels corresponding to varying frequencies f, feeding the first audio signal through a First Frequency Analysis Module 506 where the first audio signal is broken down into separate frequency components;
      (B) identifying a particular source frequency component of the first audio signal corresponding to a frequency 550;
      (C) generating a power value for the frequency component, whereby said power value is then fed into a dB Converter to generate a power value $P_{dBFS}(f)$ for the source in dBFS 552;
    ii. code for calculating a calibration offset to convert the power value $P_{dBFS}(f)$ of the source signal in dBFS to a power value $P_{dBSPL}(f)$ in dBSPL 510 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;
    iii. code for converting the power value of the source signal to dB Phons by applying a dBSPL to dBPhon Conversion equation 512, producing P(f);
  d. code for solving for $P_0(f)$ in Phons of the background signal, at a frequency:
    i. code for extracting a power value of the background signal at the frequency, in dBFS with a second Power Estimator Block 509, comprising:
      (A) extracting a second audio signal $x_0(t)$ 503, said second audio signal comprising a plurality of channels corresponding to varying frequencies;

(B) feeding the second audio signal through a Second Frequency Analysis Module 507 where the second audio signal is broken down into separate components;

(C) identifying a particular background signal component, corresponding to a particular frequency 550;

(D) obtaining a power value for the background signal component, whereby said power value is then fed into a dB Converter to generate a power value $P_{0\_dBFS}(f)$ for the background signal in dBFS 552;

ii. code for calculating a calibration offset to convert the power value of the background signal $P_{0\_dBFS}(f)$ in dBFS to a power value $P_{0\_dbSPL}(f)$ in dBSPL using the calibration equation 511 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$–dBFS$_0$) wherein dBSPL$_0$ is nominally a value between 65 and 83, and wherein dBFS$_0$ is nominally a value between –20 and –12;

iii. code for converting the power value of the background signal to dB Phons by applying the dBSPL to dBPhon Conversion equation 513, producing $P_0(f)$;

e. code for using the computational model 522 to solve for $\Delta P(f)$ f. code for calculating a correction gain of power G(f), for a frequency f, in dBSPL based on the value of $\Delta P(f)$ in dB Phons, using a Gain equation 517;

g. code for reconstituting the first audio signal with the corrective gain to the source signal at the frequency, comprising i. feeding the correction gain to an amplifier wherein the amplifier amplifies the source signal at the frequency by the corrective gain G(f) 553;

ii. combining, using a Summer 518, the channels of the corrected signal, reconstituting the corrected signal, producing $x_{out}(t)$;

h. code for transmitting the corrected audio signal to an amplifier 10, to be output through a speaker 11.

In some embodiments, as explained by FIG. 10, the present invention can exist in major part on a computer medium, 670 storing a set of instructions executable by one or more processors, where the computer-readable medium 670 is effective in producing proper hearing corrections across a spectrum of frequencies by applying corrective gains of amplitude to a plurality of channels which constitute a first audio signal, wherein corrective gains are generated for each channel by solving for a correction value of $\Delta P$ for a source signal, wherein said source signal is a channel of the audio signal corresponding to a particular frequency, where $\Delta P$ is derived from a novel Conductor Equation 616, $$S(P)=S(P+\Delta P)-S(P_0)+S(0) \text{ or,}$$

$$\Delta P = S^{-1}(S(P)+S(P_0)-S(0))-P,$$

where S(P)=a Sones equation from an EarSpring equation solution 614, as a function of Phons Pressure, P=a Phons amplitude of a source signal of interest, $\Delta P$=the gain needed to make a source signal appear at proper loudness for impaired hearing, and $P_0$=an elevated threshold in Phons of impaired hearing, the computer-readable medium comprising:

a) code for reading the first audio signal x(t) 502 from a storage media 04, said first audio signal comprising a plurality of channels corresponding to varying frequencies, b) code for obtaining a second audio signal $x_0(t)$ 503 from a microphone 11, said second audio signal comprising a plurality of channels corresponding to varying frequencies, c) code for solving for S(P) of the Conductor Equation which comprises:

i. code for extracting a power value of the source signal at a frequency, in dBFS with a first power estimator block 608, comprising:

A. extracting the first audio signal x(t), said first audio signal comprising a plurality of channels corresponding to varying frequencies, where said first audio signal is then transmitted to an Analog to Digital Converter thereby converting the signal into digital format;

B. feeding the first audio signal through a first digital filter bank 606 where the first audio signal is broken down into separate channels corresponding to varying Frequencies f;

C. identifying the source signal, wherein the source signal is a particular channel of the first audio signal corresponding to the frequency 650;

D. feeding the source signal through a squared summer equation 651 whereby the source signal is squared and added up N times, whereby the sum of the signal at the end block divided by N generates a mean power value for the source signal, whereby said power value is then fed into a dB Converter to generate a power value for the source in dBFS 652, $P_{dBFS}(f)$;

ii. code for calculating a calibration offset to convert the power value of the source signal $P_{dBFS}(f)$ in dBFS to a power value $P_{dBSPL}(f)$ in dBSPL 610 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$–dBFS$_0$) wherein dBSPL$_0$ is nominally a value between 65 and 83, and wherein dBFS$_0$ is nominally a value between –20 and –12;

iii. code for converting the power value of the source signal to dB Phons by applying a dBSPL to dBPhon Conversion equation 612, producing P(f);

iv. code for applying the power value of the source signal P(f), now in dB Phons, to the EarSpring equation 614 in order to obtain the power value of the source signal in Sones, or S(P(f));

d) code for solving for $S(P_0)$ of the Conductor Equation which comprises:

i. code for extracting a power value $P_0(f)$ of the background signal at the frequency, in dBFS with a second Power Estimator Block 609, comprising A. extracting a second audio signal $x_0(t)$, said second audio signal comprising a plurality of channels corresponding to varying frequencies, where said second audio signal is then transmitted to a second analog to digital Converter 605 thereby converting the signal into digital format;

B. feeding the second audio signal through a second Digital Filter Bank 607 where the second audio signal is broken down into separate channels $X_0(f)$ corresponding to varying frequencies;

C. identifying the background signal, wherein the background signal is a particular channel $X_0(f)$ of the audio signal corresponding to the frequency;

D. feeding the background signal through a squared summer equation 651 whereby the background signal is squared and added up N times, whereby the sum of the signal at the end block divided by N generates a mean power value for the signal, whereby said power value is then fed into a dB Converter to generate a power value for the background signal in dBFS 652, producing $P_{0\_dBFS}(f)$;

ii. code for calculating a calibration offset to convert the power value of the background signal $P_{0\_dBFS}(f)$ in dBFS to a power value $P_{0\_dBSPL}(f)$ in dBSPL using the calibration equation 611 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12;

iii. code for converting the power value of the background signal to dB Phons by applying the dBSPL to dBPhon Conversion equation 613, producing $P_0(f)$;

iv. code for applying the power value of the background signal, now in dB Phons, to the EarSpring equation 615 in order to obtain the power value of the background signal in Sones, or $S(P_0)$;

e) code for using $S(P(f))$ and $S(P_0(f))$ to solve for $\Delta P(f)$ using the Conductor equation 616 which results in the Conductor equation 616 generating a $\Delta P(f)$ in dBPhons;

f) code for calculating a correction gain of power $G(f)$, for a frequency f, in dBSPL based on the value of $\Delta P(f)$ in dB Phons, using a Gain equation 617;

g) code for reconstituting the first audio signal with the corrective gain to the source signal at the frequency, comprising:

i. feeding the correction gain to an amplifier wherein the amplifier multiplies the source signal at the frequency by the corrective gain $\Delta P(f)$ 653;

ii. combining, using a Summer Block 618, the channels of the corrected audio signal to reconstitute the corrected output $x_{out}(t)$;

h) code for feeding the first audio signal through a Digital to Analog Converter 619;

i) code for transmitting the first audio signal, now in analog format, to the Amplifier 620; and j) code for causing the Amplifier 620 to output the audio signal, now containing the corrective gain at the frequency, to a Speaker 620 where the Speaker 620 outputs the audio signal with the corrective gain at the frequency;

As shown in FIG. 3, in some embodiments, the psychoacoustic model involves analytically computing the value in Sones of the input signal at a given frequency $S(P)$, using the earspring equation, along with the estimated hearing loss due to background noise in Sones at that frequency $S(P_0)$ using the earpsring equation, and applying these values to the conductor equation to derive a gain in Phons for the signal that will correct for the perceived hearing loss, the Conductor Equation 13 being, $$S(P) = S(P+\Delta P) - S(P_0) + S(0) \text{ or,}$$

$$\Delta P = S^{-1}(S(P) + S(P_0) - S(0)) - P$$

wherein the EarSpring equation 614 is $[d^2/dt^2 + 2\beta(d/dt) + k(1 + \gamma\gamma<y^2>)]y(t) = \eta F(t)$, where t=time, y(t)=amplitude of vibration, F(t)=driving force, identified as the Phons amplitude in the following equations, $<y^2>$=mean power of vibration or S(P), identified as the Sones power in the following equations, $\beta$=damping constant, k=spring constant, and $\gamma$=coefficient of power dependence of spring constant, and $\eta$=the scale factor; The earpsing equation is used to derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. This equation is found by solving the earspring equation for a set of experimentally derived boundary conditions, wherein the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz;

As shown in FIG. 4, in some embodiments, the psychoacoustic model uses a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for $\Delta P$ for any given P and $P_0$.

In some embodiments, all or part of the present invention could be implemented using a parallel processing architecture such that some or all of the set of computations from step 5 to 10 above may be computed simultaneously using multiple processing units.

The dBSPL to dBPhon Conversion equation 608 is:

$$P_{dBPhon}(F) = \frac{P_{dBSPL}(F) - ATH(F)}{1 + kATH(F)}$$

The Gain equation 613 is:

$$\Delta P_{dBSPL}(F) = \Delta P_{dBPhon}(F)(1 + kATH(F))$$

where

F=frequency

ATH(F)=Absolute Threshold of Hearing

K=−1/120 when ATH(F)>0

=+1/240 when ATH(F)<0

The absolute threshold of hearing, in some embodiments, may be computed in one example by the formula:

$$ATH(F) = \frac{3.64}{F_{KHz}^{0.8}} - 6.5e^{-0.6(F_{kHz}-3.3)^2} + 0.001F_{kHz}^4 - 3.37$$

In some embodiments, a Fourier transform of the signal is used so that the gain computation is performed for each element in the frequency spectrum instead of by channel.

In some embodiments, as shown in FIGS. 4 and 9, a computational model can be used in place of explicit computation of the Earspring and Conductor equations for the psychoacoustic model, where the computational model is $$\Delta P \cong \frac{AP^2 + BP + C}{DP^2 + EP + 1}$$

where A, B, C, D and E are parameters which have been fit against solutions to the combined Earspring and Conductor Equations, for each value of $P_0$ in 5 dB increments, and stored in a lookup table, such that for a given $P_0$, parameters for A, B, C, D, and E are extracted from the table, and then the computational model is used to compute $\Delta P$ given P.

In some embodiments it is also possible to use separate computational models for S(P) and for $S^{-1}(S)$, with separate sets of parameters fit against the solutions for various boundary parameters and values of $P_0$.

Description of Alternative Embodiments

As shown in FIG. 5, an alternative means of effectuating the gains produced by the psychoacoustic model is to harness an existing sound processing technique known as parallel compression. Parallel compression involves compressing a copy of an original signal using linear compression 312, and subsequently adding this compressed signal back into the original signal. This results in a non-linear compression curve that amplifies low sounds below a certain threshold. The shape of the compression curve is controlled by a number of parameters including the threshold (T), compression ratio (R), and makeup gain (M). By varying these parameters, the parallel compression curves can be made to approximate the compression curve that would otherwise be produced by applying the psychoacoustic model. This is done by fitting the parameters against the desired characteristics of the psychoacoustic model using a least-squares error fit. These parameters are then stored in memory in a lookup table 311, or computed using a formula and may be retrieved in real time to dynamically update the parallel compression block 312. Since the psychoacoustic model depends upon both the signal and noise power, both signal and noise power 306, 307 will factor into determining the gains. Thus, these parameters must be updated at each time step account for the changing noise. Typically the T parameter is chosen to be the threshold elevation (or noise power) minus 20 dB. From that point makeup gain and compression ratio are found using standard curves that have been derived by fitting against the psychoacoustic model. Plots of the parameters used for varying threshold elevations are shown in FIG. 7 and FIG. 8. Here we can see that the desired compression ratio has an "upside down U" shape for varying threshold elevations.

As shown in FIG. 6, in some embodiments, the virtual audio port is shown where parallel compression is used to approximate gain curves derived from a psychoacoustic model, where the psychoacoustic model takes as inputs the source signal X and the noise signal X0, where the model computes the gain in sound intensity at a given frequency required to correct for the effect of an ambient noise signal, the virtual audio port 400 comprising code for:

(a) a first audio source 402, the first audio source operatively connected to the virtual audio port 16;

(b) a second audio source 403, configured for extracting ambient broadband audio in the environment, the second audio source operatively connected to the virtual audio port;

(c) a virtual audio port 16, operatively connected to the first audio source 402, the second audio source 4, for the noise correction process comprising:

i. a first frequency analysis module 404, configured to extract a plurality of frequency components from the first audio signal;

ii. a second frequency analysis module 405, configured to extract and plurality of frequency components from the second audio signal;

iii. a first power estimation block 406, configured to calculate the sound intensity in decibels of each frequency component of the first audio signal;

iv. a second power estimation block 407, configured to calculate the sound intensity of decibels of each frequency component of the second audio signal;

v. a parallel compression block, the parallel compression block comprising:

vi. a parameter estimation module 411, containing parameter settings for the parallel compression module, including threshold, compression ratio and makeup gain, vii. a parallel compression module 409, capable of adjusting threshold, compression ratio, and makeup gain parameters in real time, viii. a Frequency Synthesis Module 410, which combines the frequency components of the resulting audio signal;

whereupon (i) the first audio source 402 extracts the first audio signal, where the first audio signal is then transmitted through an analog to digital converter, thereby converting the first audio signal into digital format;

and simultaneously, (ii) the second audio source 403 extracts a second audio signal, where said second audio signal is then transmitted through a second analog to digital converter thereby converting the second audio signal into digital format;

whereupon the first audio signal x(t) and the second audio signal x0(t) are fed, respectively, through the First Frequency Analysis Module 404 and Second Frequency Analysis Module 405 breaking down each respective audio signal into arrays of frequency components;

whereupon, for each frequency component, the first audio signal and the second audio signal are fed, respectively, through the first Power Estimation Block 406 and Second Power Estimation Block 407, resulting in estimates for the sound intensity of each signal in decibels;

whereupon, for each frequency component, the microprocessor 401, using the power estimate of the frequency component of the first and second audio signals, obtains parameters from the parallel compression lookup table 411, whereupon the microprocessor 401, applies these gains to a parallel compression module, whereupon the parallel compression module 409 applies a linear compression, according to the given parameters, to the frequency component of the first audio signal, whereupon the parallel compression module 409 sums the frequency component of the first audio signal with the resulting compressed audio signal, whereupon the microprocessor 401 repeats the process of estimating the power, selecting compression settings, and applying parallel compression for each frequency component of the first audio signal, whereupon the microprocessor 401 reconstitutes the output audio signal by feeding the various components of the first audio signal through the Frequency Synthesis Module 410, obtaining output xout(t);

In some embodiments, as shown in FIG. 11, the present invention may comprise a computer-readable medium 770 storing a set of instructions executable by one or more processors, where the computer-readable medium 770 is effective in producing corrections to a source audio signal, to compensate for the presence of an ambient noise signal, across a plurality of channels by applying corrective gains of amplitude to the channels which constitute the source audio signal, wherein parallel compression is used to approximate gain curves derived from a psychoacoustic model, wherein the compression is implemented by applying a gain G to the signal of interest according to the following equation:

$$G=g0+(P-T)*(1/R-1),$$

where G is the gain in dB to be applied to a frequency component of the source signal, P is the sound intensity of the frequency component in dB, g0 is the makeup gain in dB, T is the threshold in dB, and R is the compression ratio of the linear compression, whereupon the linearly compressed signal is added to the original signal, where the overall amplitude of the input versus the output signal defines a parallel compression curve, where g0, T, and R are thus parameters that vary the shape of the resulting compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness level, are determined beforehand and stored in memory, where a different set of parameters is retrieved at each instant depending on the ambient noise signal intensity in each frequency, where the dynamically changing noise signal intensity results in a dynamically changing selection of parameters for the parallel compression module, the computer-readable medium comprising code for:
a) extracting a first audio signal x(t) 702, said first audio signal comprising a plurality of channels corresponding to varying frequencies, where the first audio signal is the source signal,
b) extracting a second audio signal x0(t) 702, said second audio signal comprising a plurality of channels corresponding to varying frequencies, where the second audio signal is the noise signal
c) feeding the first audio signal through a first Frequency Analysis Module 706 where the first audio signal is broken down into separate frequency components corresponding to varying frequencies;
d) feeding the second audio signal through a second Frequency Analysis Module 706 where the second audio signal is broken down into separate components corresponding to varying frequencies;
e) identifying a source component, wherein the source band is a particular component of the first audio signal 750;
f) identifying a corresponding noise component 751, wherein the noise component is a particular component of the second audio signal at the same frequency as the source component;
g) computing the power value of the source component 708;
h) computing the power value of the noise component 708;
i) using the power value of the source component and the power value of the noise component to select parameters for a parallel compression module 722;
j) compressing the source component of the first audio signal using parallel compression according to the parameter settings selected 717, where the parallel compression code consists of code for:
   a. a linear compression, which applies gains to the first audio signal according to the equation $$G=g0+(P-T)*(1/R-1),$$

where G is the gain in dB to be applied to a frequency component of the first audio signal, P is the sound intensity of the frequency component in dB, g0 is the makeup gain in dB, T is the threshold in dB, and R is the compression ratio of the linear compression,
   b. a summation, which combines the resulting amplified first audio signal component with the original first audio signal component,
k) feeding the resulting compressed components of the first audio signal through a Frequency Synthesis Module 718 producing a corrected audio signal xout(t).
l)

In some embodiments, discrete sets of parameters for the parallel compression are found by dividing the range of possible noise volumes into discrete levels, where sets of parameters are found for each discrete noise loudness level, where the parameter estimation module 422 is a lookup table, where during real-time processing the ambient noise intensity is measured and used to select the corresponding set of parameters.

In some embodiments, the parameter estimation module 422 is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

In some embodiments, one or more parameters (e.g. T) is defined as a function of the ambient noise intensity (e.g. T=P ¬ N−T', where P¬ N is noise loudness), such that the parameters stored (e.g. T') are the parameters of the function defining the relationship between sound intensity (e.g. PN) and the parameter (e.g. T) of the parallel compression.

In some embodiments, the gain equation is expressed as a function of the difference between signal intensity and noise intensity:

$$G=g0+(dP-T')/R-dP$$

where dP is the difference between the signal loudness and noise loudness in decibels, and T' is the threshold offset from the ambient noise intensity to the threshold T.

In this embodiment, a fixed set of parameters is used. The fixed parameters may fall in the range of 2 to 6 for compression ratio, 15 dB to 25 dB for makeup gain, and −15 to −25 dB for threshold offset.

In some embodiments the First and Second Frequency Analysis Modules 406, 407 are composed of digital filter banks which are filters that break the signal down into various sub-band channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal, and where the Frequency Synthesis Module 418 is a summer operation that combines the various channels into output xout(t).

In some embodiments, the First and second Frequency Analysis Modules 406,407 are digital filter banks composed of wavelet filters.

In some embodiments, the various sub-band channels correspond to critical bands of hearing.

In some embodiments, the First and Second Frequency Analysis Modules 406,407 are composed of FFT coprocessors that perform Fourier transforms on the input signals producing X(t) and $X_0$(t), where the power of each component is found by squaring the Fourier component, and the Frequency Synthesis Module 418 is an FFT coprocessor that performs an inverse Fourier transform, resulting in output signal $x_{out}$(t).

In some embodiments, the frequency components may be grouped together to approximate sub-bands correspond to critical bands of hearing.

In some embodiments, the processing chain, from output of channels at the digital filter bank to adding gains to channels via the gain component, is a process that occurs in parallel for all channels of the audio signal, through the use of threaded processes, or through the use of a parallel computing device, such as a multi-core processing unit.

The present invention features systems for audio correction. The systems may include but are not limited to mobile phones (and the like) and music players (and the like).

In some embodiments, the present invention may be multi-channel, such as in a stereo or surround sound system. In this case, gains are computed independently for each channel independently. These gains may be based on one central background noise estimate, or multiple noise estimates at each speaker. Each channel is then amplified by its corresponding gains so that the overall surround effect compensates for the presence of background noise.

The present invention features an apparatus for correcting an audio signal. The apparatus, or audio source as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal (e.g., an incoming conversation on a mobile phone) at given frequency (or within a frequency range) and the microphone can function to detect an amplitude of a background signal at a corresponding frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, referring to the means of extracting amplitudes of source signals or background signals: at the output of each filter which selects a band of adjacent frequencies, an electrical circuit to effect extraction of amplitudes could be the use of a diode, or rectifier bridge, fed by each signal which, in turn, feeds a simple series resistor and a capacitor in shunt to create an integrator of the absolute value of the signal. The integrator would accumulate rectified current for some period of time before being applied to the loudness response curve selection circuit, after which the capacitor would be shorted to discharge the accumulated current, in anticipation of the next cycle of integration. Alternatively, the capacitor could be allowed to discharge continuously through a higher valued resistor in shunt, so that charge can be bled off more slowly than it is accumulated, thereby forming a running exponential average integrator.

A more sophisticated version of amplitude estimation could send the signals through a squarer circuit ahead of the RC integrator in order to accumulate an estimate of the power in the signal. The resulting integrated current would be an estimate of the RMS power at the end of the integration period. This power estimate could then feed the gain correction curve selection circuit.

The output of each integrator can be fed to an analog differencing amplifier (operational amplifier, or OpAmp) to subtract the estimated amplitude of the noise signal from the estimated amplitude of the signal of interest. The output of this difference amplifier can be used to establish a dynamic compressor threshold. The output of the compressor circuit (a voltage controlled amplifier, or VCA) can be added to the dry signal to effect a nonlinear correction. A simple linear compressor (VCA) adjusted with suitable make-up gain and compression ratio can produce, in sum with the dry signal, an approximation of the required nonlinear correction gain.

The present invention is not limited to the aforementioned examples of means of extracting amplitudes.

Without wishing to limit the present invention to any theory or mechanism, it is believed that the present invention is advantageous because the present invention features a maximum output volume, for example the source signal will be amplified to only a certain degree. This can help protect against damage to the user's hearing. Furthermore, the systems frequently detect the background noise (e.g., 10-40 times per second, 1,000 times per second, etc.), allowing for the systems to react quickly to changes in the background noise. Furthermore, the systems utilize non-linear corrections, thus, loud signals are not amplified much if at all.

The systems of the present invention can allow for microphone sensitivity to be altered. For example, a particular user may wish to have more correction or less correction. For example, the microphone may be in someone's pocket, or else exposed directly to the ambient noise sounds. If the microphone becomes shielded, it will produce a weaker response to the noise than if it were directly exposed. Hence the microphone gain can be increased to compensate for the shielding. Also, each of us has a slightly different response to noise levels, some people being more sensitive to it than others. A variable gain on the microphone can help to compensate for individual differences of loudness perception. Finally microphones exhibit varying characteristics depending on their specific construction. A variable microphone gain in the software can help to normalize the response from different microphones.

The systems of the present invention can allow for signals to be corrected prior to transmission or recording, such that ambient noise in the recorded or received signal is retained, but the spectral composition of the primary source signal is modified to compensate, as an alternative to standard noise reduction techniques.

In some embodiments, the present invention comprises pulse code modulation and may be a method to digitally represent analog signals and may be implemented on a single integrated circuit generally referred to as an analog-to-digital converter (ADC).

In some embodiments, the present invention comprises accessory ports disposed at predetermined locations on the external portion of the present invention. Said ports can allow the present invention to communicate with peripherals such as, for example, removable memory sticks.

In some embodiments, the present invention comprises streaming audio, streaming video, or any combination thereof. Streaming video or audio is constantly received by and presented to an end-user while being delivered by a streaming provider. Said audio/video may be received be received by the present invention at the audio device.

In some embodiments, the present invention comprises radio reception via for example, an RF transmitter which allows the present invention to extract radio signals.

In some embodiments, the present invention comprises a graphical user interface which enables the user to interact, graphically, with the present invention and can be the product of a software program hosted and executed by the microprocessor.

In varying embodiments, when applied to audio signals in compressed format, including streaming audio or video signals, the present invention may be combined with techniques such as discontinuous transmission, comfort noise generation and noise substitution, lost packet substitution/reconstruction and buffer and jitter control.

In some embodiments, steps for converting analog audio input signals to digital input signals can be bypassed where the invention utilizes digital input audio sources capable of receiving digital audio signals and transmitting the same to the processor.

As used herein, the term "hearing impaired" refers to physical hearing impairment, as in the traditional sense of hearing loss, and/or, can also refer to temporary hearing loss caused by a background noise or other temporary hearing loss factors. One of the novel discoveries addressed by the present invention is that a individual with normal hearing can in fact experience hearing impairment due to background noise, or background signals interfering with source noise or source signals.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:

1. A computer-readable medium 570 storing a set of instructions executable by one or more processors, where the computer-readable medium 570 is effective in producing proper hearing corrections across a spectrum of frequencies by applying corrective gains of amplitude to a plurality of channels which constitute a first audio signal, wherein corrective gains are generated for each channel by solving for a correction value of $\Delta P$ for a source signal, wherein said source signal is a channel of the audio signal corresponding to a particular frequency, where $\Delta P$ is derived from solving for the output of a psychoacoustic model 522, the computer-readable medium comprising:
   a. code for receiving telephony packets from an internet connection via a modem 12, and decoding these packets into an audio stream 14;
   b. code for opening and reading a first audio signal x(t) 502 from an audio stream 14, said first audio signal comprising a plurality of frequency components;
   c. code for obtaining a second audio signal $x_0(t)$ 503 from a microphone and sound card 13, said second audio signal comprising a plurality of frequency components;
   d. code for solving for the power P(f) in Phons of a source signal of the first audio signal, at a frequency component:
      i. code for extracting a power value of the source signal at a frequency component, in dBFS with a first power estimator block 508, comprising:
         (A) extracting the first audio signal x(t) 502 from a software application 17,
         (B) feeding the first audio signal through a First Frequency Analysis Module 506 where the first audio signal is broken down into separate frequency components,
         (C) identifying the particular source frequency component of the first audio signal corresponding to a frequency component 550,
         (D) generating a power value for the source signal, whereby said power value is then fed into a dB Converter to generate a power value $P_{dBFS}(f)$ for the source signal in dBFS 552,
      ii. code for calculating a calibration offset to convert the power value $P_{dBFS}(f)$ of the source signal in dBFS to a power value $P_{dBSPL}(f)$ in dBSPL 510 using a calibration equation wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12,
      iii. code for converting the power value of the source signal to dB Phons by applying a dBSPL to dBPhon Conversion equation 512, producing P(f),
   e. code for solving for $P_0(f)$ in Phons of the background signal, at the frequency component:
      i. code for extracting a power value of the background signal at the frequency component, in dBFS with the second Power Estimator Block 509, comprising:
         (A) extracting the second audio signal $x_0(t)$ 503 from the microphone,
         (B) feeding the second audio signal through a Second Frequency Analysis Module 507 where the second audio signal is broken down into separate frequency components, (C) identifying the particular background signal, corresponding to a particular frequency component 550, (D) obtaining a power value for the background signal component, whereby said power value is then fed into a dB Converter to generate a power value $P_{0\_dBFS}(f)$ for the background signal in dBFS 552;

ii. code for calculating a calibration offset to convert the power value of the background signal $P_{0\_dBFS}(f)$ in dBFS to a power value $P_{0\_dbSPL}(f)$ in dBSPL using the calibration equation 511 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is dBSPL=dBFS+(dBSPL$_0$−dBFS$_0$) wherein dBSPL$_0$ is nominally a value between 65 and 83, and wherein dBFS$_0$ is nominally a value between −20 and −12, iii. code for converting the power value of the background signal to dB Phons by applying the dBSPL to dBPhon Conversion equation 513, producing $P_0(f)$, f. code for using the psychoacoustic model 522 to solve for $\Delta P(f)$ g. code for calculating a correction gain of power G(f), for a frequency f, in dBSPL based on the value of $\Delta P(f)$ in dB Phons, using a Gain equation 517, h. code for solving for corrective gains for any additional frequency components of the first audio signal by repeating steps (d) through (g) where additional frequency components are remaining, i. code for reconstituting the first audio signal with the corrective gains to the source signals at the frequency components, comprising i. feeding the correction gains to an amplifier wherein the amplifier amplifies the source signal at the frequency component by the corrective gain G(f) 553, ii. combining, using a Frequency Synthesis Module 518, the frequency components of the first audio signal, reconstituting a corrected signal, producing $x_{out}(t)$, 2. A computer-readable medium 770 storing a set of instructions executable by one or more processors, where the computer-readable medium 770 is effective in producing corrections to a source audio signal, to compensate for the presence of an ambient noise signal, across a plurality of channels by applying corrective gains of amplitude to the channels which constitute the source audio signal, wherein parallel compression is used to approximate gain curves derived from a psychoacoustic model, wherein the compression is implemented by applying a gain G to the signal of interest according to the following equation:

$$G=g0+(P-T)*(1/R-1),$$

where G is the gain in dB to be applied to a frequency component of the source signal, P is the sound intensity of the frequency component in dB, g0 is the makeup gain in dB, T is the threshold in dB, and R is the compression ratio of the linear compression, whereupon the linearly compressed signal is added to the original signal, where the overall amplitude of the input versus the output signal defines a parallel compression curve, where g0, T, and R are thus parameters that vary the shape of the resulting compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness level, are determined beforehand and stored in memory, where a different set of parameters is retrieved at each instant depending on the ambient noise signal intensity in each frequency, where the dynamically changing noise signal intensity results in a dynamically changing selection of parameters for the parallel compression module, the computer-readable medium comprising code for:

a) extracting a first audio signal x(t) 702, said first audio signal comprising a plurality of frequency components;

b) extracting a second audio signal x0(t) 702, said second audio signal comprising a plurality of frequency components;

c) feeding the first audio signal through a first Frequency Analysis Module 706 where the first audio signal is broken down into separate frequency components corresponding to varying frequencies;

d) feeding the second audio signal through a second Frequency Analysis Module 706 where the second audio signal is broken down into separate frequency components corresponding to varying frequencies;

e) identifying a source signal, wherein the source signal is a particular component of the first audio signal 750;

f) identifying a corresponding background signal 751, wherein the background signal is a particular component of the second audio signal at the same frequency as the source signal;

g) computing the power value of the source signal 708;

h) computing the power value of the background signal 708;

i) using the power value of the source signal and the power value of the background signal to select parameters for a parallel compression module 722;

j) compressing the source signal of the first audio signal using parallel compression according to the parameter settings selected 717, where the parallel compression code consists of code for:

a. a linear compression, which applies gains to the first audio signal according to the equation $$G=g0+(P-T)*(1/R-1),$$

where G is the gain in dB to be applied to a frequency component of the first audio signal, P is the sound intensity of the frequency component in dB, g0 is the makeup gain in dB, T is the threshold in dB, and R is the compression ratio of the linear compression, b. a summation, which combines the resulting amplified first audio signal component with the original first audio signal component, k) feeding the resulting compressed components of the first audio signal through a Frequency Synthesis Module 718 producing a corrected audio signal xout(t).

3. The computer readable media storing a set of instruction of claim 1-2, where the First and Second Frequency Analysis Modules 506, 507 are composed of Digital Filter Banks which are filters that break the signal down into various channels $\bar{x}(t)$ and $\bar{x}_0(t)$, where the power of each channel is found by passing the channel through a Square Summer equation, whereby said signals are squared and added up N times, whereby the sum of the signals at the end block divided by N generates mean power values for the source signal and background signal 551, and where the Frequency Synthesis Module 518 is a summer operation that combines the various channels into output $x_{out}(t)$.

4. The computer readable media storing a set of instruction of claim 1-2, where the First and second Frequency Analysis Modules are digital filter banks composed of wavelet filters.
5. The computer readable media storing a set of instruction of claim 3, where the various channels correspond to critical bands of hearing.
6. The computer readable media storing a set of instruction of claim 1-2, where the First and Second Frequency Analysis Modules perform a Fourier transform on the input signals producing X(t) and $X_0$(t), where the power of each component is found by squaring the Fourier component, and the Frequency Synthesis Module performs an inverse Fourier transform, resulting in output signal $x_{out}$(t).
7. The computer readable media storing a set of instruction of claim 6, where the frequency components are grouped together to approximate sub-bands correspond to critical bands of hearing.
8. The computer readable media storing a set of instruction of claim 1-2, where the psychoacoustic model 122 consists of a forward model which computes subjectively perceived Sones in terms of Phons, and an inverse model which computes Phons in terms of Sones, allowing the Psychoacoustic model to be combined into the Conductor Equation, the Conductor Equation 216 being, $S(P)=S(P+\Delta P)-S(P_0)+S(0)$ or, $\Delta P=S^{-1}(S(P)+S(P_0)-S(0))-P$, where this equation may be stated as the desired gain in Phons being the Phons amplification necessary to amplify the sound over background noise so that it's subjectively perceived loudness over background noise is the same as the subjectively perceived loudness without the noise, minus some correcting factor, where the function S(P) is found by solving the Earspring equation under experimental boundary conditions, where the Earspring equation 214,215 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and r=the scale factor, where for a particular frequency of the driving force F(t), which represents a pure sinusoid of intensity P, a solution y(t) to this equation can be found, which can then be converted to $<y^2>$, which as the output of the equation represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the earspring, where the constants $\hat{\beta}$ and $\Gamma_{40}$ are found by solving the Earspring equation according to experimental boundary conditions.
9. The computer readable media storing a set of instruction of claim 8, where the set of boundary parameters used to obtain solutions to the Earspring Equation comprises: (i) a Sones ratio between the hearing threshold level and the reference level at 1 kHz, and (ii) the detuning (flattening) of tones as tones range in intensity from ~40 dBSPL to ~90 dBSPL near 1 kHz;
10. The computer readable media storing a set of instruction of claim 9, where the computational model 224 is used to estimate S(P) and $S^{-1}$(S) consisting of quadratic functions such as $$S(P) \cong \frac{AP^2 + BP + C}{DP^2 + EP + 1},$$

where A, B, C, D, and E are parameters which fit the quadratic function against the solution to the Earspring and Conductor equations and are stored in long term memory.
11. The computer readable media storing a set of instruction of claim 9, where the computational model 224 is used to estimate ΔP consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in a lookup table 223.
12. The computer readable media storing a set of instruction of claim 9, where the computational model 224 is any numerical function approximator that is fit against the Earspring and Conductor equation and approximates their solutions, where these approximators may include, but are not limited to linear regression, neural networks, and others.
13. The computer-readable media storing a set of instructions of claim 1-2, wherein the audio signal comprises a plurality of channels corresponding to various frequencies and wherein a corrective gain corresponding to each respective frequency component is computed in parallel.
14. The computer-readable medium storing a set of instructions of claim 1-2, wherein the audio signal contains more than one frequency component and where gains are computed in serial for each frequency component.
15. The computer-readable medium storing a set of instructions of claim 1-2, wherein the audio signal contains more than one frequency component and where corrective gains are computed for each frequency component, in part in parallel and in part in serial.
16. The computer readable medium storing a set of instructions of claim 1-2, in which either the Earspring equation or its inverse are estimated using separate computational models as in claim 5, replacing either step (a)(vi) or (a)(vii), respectively.
17. The computer readable medium storing a set of instructions of claim 1, wherein the dBSPL to dBPhon Conversion equation 412,413 is:

$$P_{dBPhon}(F) = \frac{P_{dBSPL}(F) - ATH(F)}{1 + kATH(F)}$$

where
F=frequency
ATH(F)=Absolute Threshold of Hearing

K=−1/120 when ATH(F)>0
= +1/240 when ATH(F)<0

18. The computer readable medium storing a set of instructions of claim 1, wherein the Gain equation 417 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH(F)>0
= +1/240 when ATH(F)<0

19. The computer readable medium storing a set of instructions of claim 1, where the absolute threshold of hearing is computed by the formula:

$$ATH(F) = \frac{3.64}{F_{KHz}^{0.8}} - 6.5e^{-0.6(F_{kHz}-3.3)^2} + 0.001F_{kHz}^4 - 3.37$$

20. The computer readable medium storing a set of instructions of claim 2, where there are a plurality of source audio signals corresponding to the various signals of a stereo or surround sound audio system, and a plurality of background noise signals, one for each channel, and where gains for each channel are independently computed, according to the source and noise signal for each channel, and applied to each channel.

21. The computer readable media storing a set of instruction of claim 20, where discrete sets of parameters are found by dividing the range of possible noise signal intensities into discrete levels, and where sets of parameters are found for each discrete noise intensity level, where the parameter estimation module 223 is a lookup table, where during real-time processing the ambient noise intensity is measured and used to select the corresponding set of parameters.

22. The computer readable media storing a set of instruction of claim 20, where the parameter estimation module 223 is a polynomial continuous curve defining the relationship between the ambient noise loudness and each of the parameters, where polynomial regression is used to find parameters which define this curve, where these parameters are then stored in memory.

23. The computer readable media storing a set of instruction of claim 20, where one or more parameters (e.g. T) is defined as a function of the ambient noise intensity (e.g. T=$P_N$−T', where $P_N$ is noise loudness), such that the parameters stored (e.g. T') are the parameters of the function defining the relationship between sound intensity (e.g. $P_N$) and the parameter (e.g. T) of the parallel compression.

24. The computer readable media storing a set of instruction of claim 20, where the gain equation is expressed as a function of the difference between signal intensity and noise intensity:

$$G = g0 + (dP-T')/R - dP$$

where dP is the difference between the signal intensity and noise intensity in decibels, and T' is the threshold offset from the ambient noise intensity to the threshold T.

25. The computer readable media storing a set of instruction of claim 24, where a fixed set of parameters is used.

26. The computer readable media storing a set of instruction of claim 25, where the fixed parameters fall in the range of 2 to 6 for compression ratio, 15 dB to 25 dB for makeup gain, and −15 to −25 dB for threshold offset.

SYSTEMS AND METHODS FOR AUTOMATIC
SPECTRAL ENHANCEMENT OF AUDIO
SIGNALS

Background of the Invention

The present invention relates to the field of audio processing for the correction of hearing loss and also personalization of sound.

Hearing loss is a normal part of the aging process for most humans, which can also be accelerated or produced through repetitive exposure to loud noises from, for example, rock concerts or construction equipment. Most humans begin to lose awareness of high frequency noises in their twenties. Hearing loss starts in the higher frequency register and gradually progresses to lower registers. As a result, a constant volume increase in loudness will fail to correct for the change in the frequency composition of the sound perceived by the listener, thereby distorting the perception of the sound by the listener. The aging of a large segment of the population which has been repetitively exposed to loud rock music is likely to result in a significant portion of the elderly in the near future having more progressive hearing loss in their old age than in the past.

Most hearing aids focus on the enhancement of signals specifically for speech perception. However, hearing loss affects sound across the spectrum in a consistent manner. These losses affect the enjoyment of music by causing the listener to lose his perception of sounds in a higher register. The application of standard hearing aid corrections to a musical performance can produce a displeasing effect by amplifying sound in a spectrally inconsistent manner and failing to correct for the higher register losses. In order to hear the higher frequency registers a user may increase the volume of music to potentially damaging levels.

There are many systems for sound level equalization from an audio processing standpoint. However, most of these systems use measures of sound intensity prior to impingement on the ear as a target for correction. Few systems use perceptual loudness—that is, sound as it is apparent to the listener. The human ear introduces many non-linear effects on apparent loudness, consequently, sound intensity as measured by the sound pressure level (SPL) does not correlate linearly with the sound level perceived by a human. Moreover, after hearing loss, the perceived sound level is degraded by an increasing function of frequency (higher frequencies are more degraded than lower ones).

Microphones and mechanical systems (e.g., computer software) can measure dBSPL; a sound (e.g., ~40 dBSPL) at particular frequency (e.g., 1 kHz) sounds just as loud as the sound (e.g., ~40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Iso-loudness contours are most often displayed in terms of dB intensity versus log frequency. The log frequency axis provides excessive emphasis on the lower frequencies and less emphasis on high frequencies where audiological damage most often occurs in sensioneural hearing loss.

It can be observed that everyone is "impaired" at higher frequencies unless the volume of sounds at those frequencies are very loud. Most of the spice of music is found in the high frequency region—sibilant speech, breathiness, cymbals, etc. Further, nearly everyone enjoys music more when it is played loudly. That gives that the opportunity to hear this musical spice. By using the present invention, users can gain a sense of enjoyment without needing to raise the volume of music and sounds to potentially damaging levels.

Using the equations described herein for correction of signal source amplitudes, it is found that most people with normal hearing prefer a parameter setting (of the sound adjustment equations described herein) of around 2.5 dB per Bark, when listening at 77 dB SPL through headphones. That corresponds to a working threshold elevation of 50 dB at the highest frequencies. But since we don't live in a world of threshold level sounds, the actual gain needed for a 50 dB threshold elevation, when the sound is at 60 dBSPL and 10 kHz, is only on the order of approximately 5 dB. The present invention applies nonlinear compression to overcome the "recruitment" gain expansion produced by ear physics.

When offered the opportunity to listen through the corrective systems of the present invention, based on the hearing equations discussed herein, people with very normal hearing uniformly prefer some degree of modulation at varying frequencies.

In some prior art systems, an individualized audiogram is used to measure hearing loss for a particular individual. The sound can then be spectrally corrected using this stored audiogram pattern to reproduce a spectral correct sound in the individual's perception. This method is disadvantageous since it requires a significant number of parameters to be stored and these parameters are cumbersome and difficult to adjust accurately, even when performed by a medical professional.

The perceived loudness of sound can be modeled by a harmonic oscillator with spring constant that varies according to the mean power of vibration. This model is called the Earspring model. The Earspring equation 10,11 is written $[d^2/dt^2 + 2\beta(d/dt) + k(1+\gamma\gamma<y^2>)]y(t) = \eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude P in dBPhons, a solution to the Earspring equation y(t) can be found, for a particular set of boundary conditions, which is the steady state response to the forcing function. Transforming into the frequency domain we can obtain the mean power of vibration $<y^2>=\frac{1}{2}|Y|^2$, which is the Sones power of the perceived sound.

A possible set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Using the boundary parameters, we can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary parameters. Note that this formula is independent of frequency although the sound intensity P of any given signal may vary as a function of frequency.

Summary of the Invention

The present invention features systems for enhancing audio signals to correct across a spectrum of frequencies according to a model of the spectral characteristics of hearing loss, and a model of the perceptual loudness of sound as a function of sound intensity. A method of the present invention estimates hearing loss from a function of the critical band center frequency and a single user input. A model of perceptual loudness is applied across frequencies, taking the estimated hearing loss per frequency as an input. The model allows the system to compute corrections which will cause the sound to be perceived as loudly as it should be from the perspective of the user, and in a way in which the perceived spectral composition of the sound is unaltered. The systems of the present invention compute a user-determined degree of correction to sounds at varying frequencies, allowing a listener to hear sounds, across varying frequencies, as the listener wishes to hear them without needing to raise the volume of the sounds to potentially damaging levels. Systems may be incorporated into apparatuses including but not limited to mobile phones, music players and virtual audio ports.

Allowing the user to control the slope with respect to frequency of the correction pattern through a user adjustable setting allows the user to tune the corrections, across the frequency spectrum, to his or her taste through a single adjustment.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention
1. Amplifier: This component can be any amplifier or related device capable of applying gains to an audio signal.

2. Audio Codec: Audio Encoder/Decoder converts an audio signal to and from its encoded format either for storing in a file or transmission over a network.
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage.
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12;
where P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component may comprise a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.
20. Gain Block component—This component applies the gains to each corresponding frequency component or band. In some embodiments, the term gain block component is used interchangeably with a "means for applying gains to a audio signal." Said means may be, for example, an amplifier, or gain block component.
21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.
22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, a keypad, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.
23. Inverse Fourier Transform: A mathematical operation which computes a time domain signal corresponding to a given frequency spectrum.
24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale-a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F_{kHz}) = \frac{26.81}{1+\frac{1.960}{F_{kHz}}} - 0.53$$

In some embodiments, the term kHz frequency to critical band center frequency converter is used interchangeably with a "means for converting a frequency component or series of frequency components to critical band frequency. Said mean may be, for example, a summer.
25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.
27. Microphone: The microphone can be any microphone or the like capable of receiving an audio signal.
28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G=g0+(P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical value that when input to the Personalized Sound adjustment, may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference.

In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^{\alpha} + P_{NOISE}^{\alpha} - P_{THRQ}^{\alpha}}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

34. RF Transceiver: Radio Frequency Transmitter/Receiver—this device interfaces directly with the antenna and can modulate an audio signal with its radio carrier frequency for transmission as well as demodulate a received radio frequency signal.

35. Source signal: The Source signal, as used herein refers to a portion of the first audio signal or the audio signal of interest at a given frequency component.

36. Speaker: The speaker can be any speaker or the like capable of receiving and projecting a sound signal adjusted or corrected by the present invention.

37. Storage media: A computer readable media used for storing data, such as a hard disk, RAM, or flash memory. In some embodiments, the term "storage media" is used interchangeably with a means for storing a media file or audio signal.

38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

39. Threshold elevation: Threshold elevations correlate to the minimum sound pressures required to perceive sounds at various frequencies.

Additional Terms:

1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.

2. dBSPL: Decibels sound power level—a unit of measure of sound intensity at the ear 3. dBFS to dBSPL Converter: This equation converts the audio signal power from audio power in decibels to audio sound pressure level in decibels.

4. dBSPL to dBPhon Conversion equation: This equation converts sound pressure level to Phons in decibels:

$$P\_dBPhon(F) = (P\_dBSPL(F) - ATH(F))/(1 + k ATH(F))$$

where
F=Frequency
ATH=Absolute Threshold of Hearing

P=Phons amplitude of a source signal of interest
dBSPL=decibels according to sound pressure
5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
6. Gain Equation: This equation converts the gain in Phons to a gain in sound pressure level $$\Delta P\_dBSPL(F) = [\Delta P]\_dBPhon(F)(1 + kATH(F))$$

where:
F=Frequency
ATH=Absolute Threshold of Hearing
P=Phons amplitude of a source signal of interest
dBSPL=decibels according to sound pressure
7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
8. Phons: Phons are objective units of sound intensity impinging upon the ear. Sound power may be converted from decibels (dBFS) to Phons using a conversion first to dBSPL then to Phons.
9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
10. Sones: Sones are subjective units of perceived sound loudness.
11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1 is a general systems architecture drawing for the present invention.

FIG. 2 diagrams an implementation of the Perceptual Model of the present invention using analytical solutions to the Earspring model.

FIG. 3 diagrams an implementation of the Perceptual Model in which a numerical approximation to the solution is made using a function approximator for which parameters have been stored in a lookup table for various values of $P_0$.

FIG. 4 diagrams a number of possible realizations of the personalized sound adjustment model, including a linear slope function, a pattern library or lookup table, or estimation of hearing loss from ambient noise.

FIG. 5 is a drawing of a possible embodiment for the systems architecture of the present invention in which the Earspring model and Conductor equation are explicitly used to compute the gains.

FIG. 6 is a drawing of a possible embodiment for the systems architecture of the present invention in which a computational model that is fit against the Earspring equation solutions is used in place of the Earspring model.

FIG. 7 is a drawing of a possible embodiment for the systems architecture of the present invention in which frequency analysis is used instead of a filter bank.

FIG. 8 is a drawing of a possible process flow for the present invention, in which the Earspring is used explicitly, and all computations are performed in series.

FIG. 9 is a drawing of a possible process flow for the present invention in which a computational model is used in place of the Earspring and all computations are performed in series.

FIG. 10 is a drawing of a possible process flow for the present invention, in which the Earspring is used explicitly, and all computations are performed in parallel.

FIG. 11 is a drawing of a possible process flow for the present invention in which a computational model is used in place of the Earspring and all computations are performed in series.

FIG. 12 is a drawing of a possible process flow for the present invention in which fourier analysis is used to compute the gains.

FIG. 13 is a graphical representation of the invention's adjustment to sound intensities at varying frequencies.

FIG. 14 show an alternate embodiment of the present invention.

Description of Preferred Embodiments

Apparatus

As shown in FIG. 1, in some embodiments, the present invention comprises an audio source, an amplifier, a speaker and a microprocessor where a number of software applications are executed by a microprocessor. As shown, said software applications can comprise a series of converters and computational applications for calculating and generating the mathematical values that help to enable the invention along with the physical components which can be configured to communicate and operate with the same. These may include operations for performing a frequency analysis on the input signal, a power computation for the input signal, a hearing loss estimation module, a perceptual model which computes gains by frequency for the signal, according to the hearing loss estimate, and a Summer Block Component which applies the gains and reconstitutes the audio signal.

As shown in FIG. 2, in some embodiments, the perceptual model involves analytically computing the value in Sones of the input signal at a given frequency $S(P)$, along with the estimated hearing loss in Sones at that frequency $S(P_0)$, and applying these values the conductor equation to derive a gain in Phons for the signal that will correct for the perceived hearing loss, the Conductor Equation 13 being, $$S(P) = S(P + \Delta P) - S(P_0) + S(0) \text{ or,}$$

$$\Delta P = S^{-1}(S(P) + S(P_0) - S(0)) - P$$

As shown in FIG. 3, in some embodiments the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for $\Delta P$ for any given P and $P_0$.

As shown in FIG. 4, a possible process flow for the present invention can comprise the following steps:
1. The audio source 02 extracts the audio signal x(t), where said audio signal is then transmitted to the Analog to Digital Converter 03 thereby converting the audio signal into digital format;
2. whereupon the audio signal x(t) is fed through the Digital Filter Bank 04, breaking down the audio signal into a plurality of frequency components $\bar{x}(t)$, corresponding to the critical bands of human hearing;
3. whereupon the apparatus 100 identifies the source signal corresponding to a particular frequency 50;
4. whereupon the source signal is fed to the Power Estimator 06 and whereby the Power Estimator processes the source signal, via the microprocessor 01, through a Square Summer equation 51, whereby the source signal is squared and added up N times, whereby the sum of the signal at the end block divided by N generates a mean power value for the source signal, whereby said power value is then fed into a dB Converter to generate a power value for the source signal in dBFS $P_{dBFS}(f)$ 52;
5. whereupon the microprocessor 01 completes a calibration offset such that the dBFS to dBSPL Converter 07 converts the power value of the source signal $P_{dBFS}(f)$, from dBFS to dBSPL or $P_{dBSPL}(f)$;
6. whereupon the dBSPL-dB Phon Converter 08 converts the power value of the source signal to dB Phons by applying a dBSPL to dBPhon Conversion equation, producing P(f);
7. whereupon the critical band center frequency converter 09 converts the frequency value f of a given input from kHz to Bark;
8. whereupon the Personalized sound adjustment model 10 generates a value for $P_0(f)$ in dB Phons using the Hearing loss estimate for the current frequency and the user adjustable input 03,
9. whereupon the microprocessor 01 applies the power value of the source signal for the current frequency band P(f) now in dB Phons, and the power value of the threshold elevation $P_0(f)$ to the Earspring model components 11,12 in order to obtain S(P(f)) and S($P_0(f)$) in Sones where S(P) is given as, $$S(P) = \frac{(4\hat{\beta}^2 + \Gamma_{40}^2)}{(4\hat{\beta}^2 + (\Gamma_{40}S(P))^2)} 10^{(P-40)/10}$$

10. whereupon the microprocessor 01 applies the Sones values S(P(f)) and S($P_0(f)$), to the Conductor equation 13 in order to obtain gains $\Delta P(f)$, the Conductor Equation 13 being, $$S(P)=S(P+\Delta P)-S(P_0)+S(0) \text{ or,}$$

$$\Delta P=S^{-1}(S(P)+S(P_0)-S(0))-P,$$

where S(P)=a Sones equation from an EarSpring equation solution, as a function of Phons Pressure, P=a Phons amplitude of a source signal of interest, where $P_0$=an output of the Hearing loss estimate at a frequency F, where Sones is a measure of perceived loudness and Phons is a measure of objective sound intensity.
11. whereupon the microprocessor 01 calculates a correction gain of power G(f), for the source signal, in dBSPL, based on the value of $\Delta P(f)$ in dB Phons, using the Gain Block component 14 which utilizes the Gain equation; and
12. whereupon the apparatus 100 reconstitutes the audio signal with the corrective gain to the source signal at the frequency, comprising:
   a. feeding the correction gain to the amplifier, wherein the amplifier multiplies the source signal X(f) at the frequency by the corresponding corrective gain G 53, resulting in $X_{out}(f)$;
   b. combining, using the Summer Block 16, the channels of the source signal $X_{out}(f)$ to reconstitute the audio signal;
13. whereupon the audio signal $x_{out}(t)$ is fed through the Digital to Analog Converter 17;
14. whereupon the audio signal, now in analog format, is transmitted to the Amplifier 18;
15. whereupon the Amplifier 18 outputs the audio signal, now containing the corrective gain at the frequency, to the Speaker 19 where the Speaker 19 outputs the audio signal; wherein the dBSPL to dBPhon Conversion equation 07 is:

$$P_{dBPhon}(F) = \frac{P_{dBSPL}(F) - ATH(F)}{1 + kATH(F)}$$

wherein the Gain equation 14 is:

$$\Delta P_{dBSPL}(F) = \Delta P_{dBPhon}(F)(1+kATH(F))$$

where
F=frequency
ATH(F)=Absolute Threshold of Hearing
K=$-\frac{1}{120}$ when ATH(F)>0
 =$+\frac{1}{240}$ when ATH(F)<0

As shown in FIG. 5, a different possible process flow for the present invention, in which a computational model is used instead of explicit computation of the Earpsring and Conductor equations, can comprise the following steps:
1. the audio source 02 extracts the audio signal x(t), where said audio signal is then transmitted to the Analog to Digital Converter 03 thereby converting the audio signal into digital format;
2. whereupon the audio signal x(t) is fed through the Digital Filter Bank 04, breaking down the audio signal into separate channels X(f) corresponding to varying frequencies f;
3. whereupon the apparatus 100 identifies the source signal corresponding to a particular frequency X(f) 50 and transmits the source signal to the microprocessor 01;
4. whereupon the source signal is fed to the Power Estimator 06 and whereby the Power Estimator processes the source signal, via the microprocessor 01, through a Square Summer equation 51, whereby the source signal is squared and added up N times, whereby the sum of the signal at the end block divided by N generates a mean power value for the source signal, whereby said power value is then fed into a dB Converter to generate a power value for the source signal in dBFS 52, $P_{dBFS}(f)$;
5. whereupon the microprocessor 01 completes a calibration offset such that the dBFS to dBSPL Converter 07 converts the power value of the source signal $P_{dBFS}(f)$, from dBFS to dBSPL, or $P_{dBSPL}(f)$;
6. whereupon the dBSPL-dB Phon Converter 08 converts the power value of the source signal to dB Phons (P(f)) by applying a dBSPL to dBPhon Conversion equation, 7. whereupon the critical band center frequency converter 09 converts the frequency value f of a given input from kHz to Bark;
8. whereupon the Personalized sound adjustment model 10 generates a value for $P_0(f)$ in dB Phons using the Hearing loss estimate for the current frequency and the user adjustable input 03,
9. whereupon the microprocessor 01 applies the power value of the source signal for the current frequency band P(f) now in dB Phons, and the power value of the threshold elevation $P_0(f)$ to a computational model for the gains ΔP $$\Delta P \cong \frac{AP^2 + BP + C}{DP^2 + EP + 1}$$

where the parameters A, B, C, D, and E are selected from a lookup table corresponding to the threshold elevation $P_0(f)$, where these values have been fit against solutions to the Earspring and Conductor equations for each $P_0$ in 5 dB increments;
10. whereupon the microprocessor 01 calculates a correction gain of power G(f), for the source signal, in dBSPL, based on the value of ΔP(f) in dB Phons, using the Gain Block component 14 which utilizes the Gain equation; and
11. whereupon the apparatus 100 reconstitutes the audio signal with the corrective gain to the source signal at the frequency, comprising:
    a. feeding the correction gain to the amplifier, wherein the amplifier multiplies the source signal X(f) at the frequency by the corresponding corrective gains G(f) 53, producing $X_{out}(f)$;
    b. combining, using the Summer Block 16, the channels of the corrected audio signal to reconstitute the audio signal $x_{out}(t)$;
12. whereupon the audio signal is fed through the Digital to Analog Converter 17;
13. whereupon the audio signal, now in analog format, is transmitted to the Amplifier 18;
14. whereupon the Amplifier 18 outputs the audio signal, now containing the corrective gain at the frequency, to the Speaker 19 where the Speaker 19 outputs the audio signal;
wherein the dBSPL to dBPhon Conversion equation 07 is:

$$P_{dBPhon}(F) = \frac{P_{dBSPL}(F) - ATH(F)}{1 + kATH(F)}$$

wherein the Gain equation 14 is:

$$\Delta P_{dBSPL}(F) = \Delta P_{dBPhon}(F)(1 + kATH(F))$$

where
F=frequency
ATH(F)=Absolute Threshold of Hearing
K=−1/120 when ATH(F)>0
=+1/240 when ATH(F)<0

As shown in FIG. 6, a third possible process flow for the present invention, in which Fourier transforms are used to convert the whole signal to the frequency domain, instead of digital filter banks, can comprise the following steps:
1. the audio source 02 extracts the audio signal x(t), where said audio signal is then transmitted to the Analog to Digital Converter 03 thereby converting the audio signal into digital format;
2. whereupon the audio signal x(t) is fed through the Frequency Analysis Module 20, breaking down the audio signal into separate channels X(f) corresponding to varying frequencies f;
3. whereupon the apparatus 100 identifies the source signal corresponding to a particular frequency P(f) 50 and transmits the source signal to the microprocessor 01;
4. whereupon the source signal is fed to the Power Estimator 06 and whereby the Power Estimator squares the value of the Fourier transform X(f), which is then fed into a dB Converter to generate a power value for the source signal in dBFS 52, $P_{dBFS}(f)$;
5. whereupon the microprocessor 01 completes a calibration offset such that the dBFS to dBSPL Converter 07 converts the power value of the source signal $P_{dBFS}(f)$ from dBFS to dBSPL, producing $P_{dBSPL}(f)$;
6. whereupon the dBSPL-dB Phon Converter 08 converts the power value of the source signal to dB Phons by applying a dBSPL to dBPhon Conversion equation, producing P(f) for the source signal;
7. whereupon the microprocessor 01 refers to a library of stored patterns to determine the estimated threshold elevation $P_0(f)$ for a given f and user input 03, where said user input causes a monotonic increase in $P_0(f)$ for every f,
8. whereupon the microprocessor 01 selects a set of parameters A, B, C, D, and E from a lookup table corresponding to the value of $P_0(f)$, and applies these parameters and the power value of the source signal for the current frequency band P(f) now in dB Phons, to a computational model for the gains ΔP $$\Delta P \cong \frac{AP^2 + BP + C}{DP^2 + EP + 1}$$

where various parameters A, B, C, D, and E are selected from a lookup table corresponding to the threshold elevation $P_0(f)$, and these values have been fit against solutions to the Earspring and Conductor equations for each $P_0$ in 5 dB increments,
9. whereupon the microprocessor 01 calculates a correction gain of power, for the source signal, in dBSPL, based on the value of ΔP(f) in dB Phons, using the component 14 which utilizes the Gain equation; and
10. whereupon the apparatus 100 reconstitutes the audio signal with the corrective gain to the source signal at the frequency, comprising:
    a. feeding the correction gain to the amplifier, wherein the amplifier multiplies the source signal at the frequency according to the corresponding corrective gain 53, producing $X_{out}(f)$;
    b. performing an inverse Fourier transform using the Summer Block Component 21 producing $x_{out}(t)$;
11. whereupon the audio signal is fed through the Digital to Analog Converter 17;
wherein the dBSPL to dBPhon Conversion equation 07 is:

$$P_{dBPhon}(F) = \frac{P_{dBSPL}(F) - ATH(F)}{1 + kATH(F)}$$

wherein the Gain equation 14 is:

$$\Delta P_{dBSPL}(F) = \Delta P_{dBPhon}(F)(1 + kATH(F))$$

where
F=frequency
ATH(F)=Absolute Threshold of Hearing

K=−1/120 when ATH(F)>0
=+1/240 when ATH(F)<0

In some embodiments, all or part of the present invention could be implemented using a parallel processing architecture such that some or all of the set of computations from step 3 to 5 above may be computed simultaneously using multiple processing units.

It should be apparent that any combinations of the use of a computational model or explicit computation for the Earspring and Conductor equations, parallel or series computation, or a pattern library versus the Hearing loss estimate will also fall within the scope of the present invention.

In some embodiments, the apparatus may be attached to an Amplifier 17 and Speaker 18 for outputting the audio signal.

Computer Readable Media

In some embodiments, as explained by FIG. 7 and its description, the present invention can be enabled on a computer readable medium, the computer-readable medium comprising:

a. code for extracting an input audio signal x(t) 02;
b. code for obtaining the value of a user controlled input 03 *b*, which is to be a parameter of the personalized sound adjustment model 06;
c. code for filtering x(t) into a plurality of channels 03 where the audio signal is broken down into separate channels $\bar{x}(t)$ corresponding to various critical bands;
d. code for solving for the corrective gains 10 which comprises:
  i. code for extracting a power value of the source signal P(f) in the various bands, in dBFS with a power estimator block 06, comprising:
    (A) identifying the source signal band, wherein the source signal band is a particular channel of the audio signal corresponding to the frequency 50;
    (B) feeding the source signal through a squared summer equation 51 whereby the source signal is squared and added up N times, whereby the sum of the signal at the end block divided by N generates a mean power value for the source signal, whereby said power value is then fed into a dB Converter to generate a power value $P_{dBFS}(f)$ for the source signal in dBFS 52;
  ii. code for calculating a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12;
  iii. code for converting the power value of the source signal to dB Phons 08 by applying a dBSPL to dBPhon Conversion equation, producing P(f);
  iv. code for computing the critical band center frequency F 09 corresponding to the frequency f for the current signal band in kHz;
  v. code for determining the value of the threshold elevation $P_0(f)$ in dB Phons, where said value is defined by the personalized sound adjustment model 10, which is parameterized by the user adjustable input 03 *b*;
  vi. code for computing the value of S(P(f)) and S(P$_0$(f)) 11,12 for the Earspring model, which take the source signal P and threshold elevation P$_0$ in dBPhons and computes perceptual sound levels in Sones
  vii. code for computing the value of ΔP(f) needed to correct for the perceived hearing loss, for a frequency f, using the Conductor Equation 13
e. code for calculating a correction gain of power G(f) 14, for the source signal, in dBSPL, based on the value of ΔP(f) in dB Phons, using a Gain equation 14;
f. code for reconstituting the audio signal with the corrective gain to the source signal at the frequency, comprising
  i. feeding the correction gains G(f) to an Amplifier 53 wherein the Amplifier 53 multiplies the source signal channels $\bar{x}(t)$ by the corresponding corrective gains G(f), producing $\bar{x}_{out}(t)$;
  ii. combining, using a Summer Block 15, the channels of the corrected audio signal to reconstitute the audio signal producing x$_{out}$(t),
g. code for feeding the audio signal through a Digital to Analog Converter 16;

wherein the dBSPL to dBPhon Conversion equation 08 is:

$$P_{dBPhon}(F) = \frac{P_{dBSPL}(F) - ATH(F)}{1 + kATH(F)}$$

wherein the Gain equation 13 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH(F)>0
=+1/240 when ATH(F)<0

In some embodiments, as explained by FIG. 8 and its description, the present invention can be enabled on a computer readable medium, the computer-readable medium comprising:

a. code for extracting an input audio signal x(t) 02;
b. code for obtaining the value of a user controlled input 03 *b*, which is to be a parameter of the personalized sound adjustment model 06;
c. code for applying a Fourier transform 20 to the audio signal producing X(f);
d. code for solving for the corrective gains 10 which comprises:
  i. code for extracting a power value of the source signal P(f) at a particular frequency, in dBFS with a power estimator block 06, comprising:
  ii. identifying the source signal component X(f) of the audio signal corresponding to the frequency 50;
  iii. Generating a power value $P_{dBFS}(f)$ for the source signal at the frequency f, by squaring the value of X(f) 51 whereby the squared value is then fed into a dB Converter to generate a power value $P_{dBFS}(f)$ for the source signal in dBFS 52;
  iv. code for calculating a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $$P_{dBSPL}(F) = P_{dBFS}(F) + (P_{dBSPL_0}(F) = P_{dBFS_0}(F))$$

wherein $P_{dBSPL0}$ is nominally a value between 65 and 83, and wherein $P_{dBFS0}$ is nominally a value between $-20$ and $-12$;

v. code for converting the power value of the source signal to dB Phons 08 by applying a dBSPL to dBPhon Conversion equation, producing P(f);

vi. code for computing the critical band center frequency F 09 corresponding to the frequency f for the current signal band in kHz;

vii. code for determining the value of the threshold elevation $P_0(f)$ in dB Phons, where said value is defined by the Personalized sound adjustment model 10, where the personalized sound adjustment model takes the value of the frequency F and the user adjustable input b 03 as parameters;

viii. code for computing the value of $S(P(f))$ and $S(P_0(f))$ 11,12 for the Earspring model, which take the source signal P and threshold elevation $P_0$ in dBPhons and computes perceptual sound levels in Sones ix. code for computing the value of $\Delta P(f)$ needed to correct for the perceived hearing loss, for a frequency f, using the Conductor Equation 13 e. code for calculating a correction gain of power G(f) 14, for the source signal, in dBSPL, based on the value of $\Delta P(f)$ in dB Phons, using a Gain equation 14;

f. code for reconstituting the audio signal with the corrective gain to the source signal at the frequency, comprising i. feeding the correction gains G(f) to an Amplifier 53 wherein the Amplifier 53 multiplies the source signal X(f) at the frequency according to the corrective gain G(f), producing $X_{out}(f)$;

ii. performing, using a Summer Block Component 21, an inverse Fourier transform on the corrected audio signal, producing $x_{out}(t)$;

g. code for feeding the audio signal $x_{out}(t)$ through a Digital to Analog Converter 16;

wherein the dBSPL to dBPhon Conversion equation 08 is:

$$P_{dBPhon}(F) = \frac{P_{dBSPL}(F) - ATH(F)}{1 + kATH(F)}$$

wherein the Gain equation 13 is:

$$\Delta P_{dBSPL}(F) = \Delta P_{dBPhon}(F)(1 + kATH(F))$$

where

F=frequency

ATH(F)=Absolute Threshold of Hearing

K=$-\frac{1}{120}$ when ATH(F)>0

=$+\frac{1}{240}$ when ATH(F)<0

In some embodiment, s the absolute threshold of hearing may be computed by the formula:

$$ATH(F) = \frac{3.64}{F_{KHz}^{0.8}} - 6.5e^{-0.6(F_{kHz}-3.3)^2} + 0.001 F_{kHz}^4 - 3.37$$

As shown in FIG. 3, in some embodiments, a computational model may be used in place of explicit computation of the Earspring and Conductor equations:

$$\Delta P \cong \frac{AP^2 + BP + C}{DP^2 + EP + 1}$$

where parameters A, B, C, D, and E are fit against the combined solution to the Earspring and Conductor equations, for each $P_0$, in 5 dB increments.

Similar to FIG. 3, in some embodiments, it is also possible to use separate computational models for S(P) and for $S^{-1}(S)$, with separate sets of parameters fit against the solutions for various boundary parameters and values of $P_0$.

One example of the critical band center frequency is the Bark frequency which may be computed by, $$CBR(F_{kHz}) = \frac{26.81}{1 + \frac{1.960}{F_{kHz}}} - 0.53$$

In some embodiments, a pattern library may be used in place of the linear slope equation, where the user input and frequency are used to index into the pattern library and locate estimates of the threshold elevation $P_0$. These estimates may be used explicitly, or interpolation may be used to find a more precise estimate. Where the pattern library is ordered such that the user input relates monotonically to an increase in the approximate slope of estimates $P_0$ with respect to f.

As shown in FIGS. 9 and 10, in some embodiments, the computations performed in FIGS. 7, and 8 may also be performed in parallel, through the use of threaded processes, or through the use of a parallel computing device, such as a multi-core processing unit.

As shown in FIG. 12, a typical loud but comfortable music spectral envelope, as shown in light blue, and that of the present invention, as show in dark blue, diverge at higher frequencies where the gains produced by the invention occur.

It should be apparent that any combinations of the use of a computational model or explicit computation for the Earspring and Conductor equations, parallel or series computation, or a pattern library versus the Linear slope equation will also fall within the scope of the present invention.

In some embodiments, the point where the estimate of $X_0$ is computed, may be earlier in the sequence relative to processing of the source signal.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIGS. 1 and 2, with appropriate interfaces implemented between the microprocessor and the programmable logic devices.

In some embodiments, an FFT coprocessor may be used to facilitate generation of Fourier transforms as shown in FIG. 3 and FIG. 8. In this case the FFT co-processor would take the place of the Frequency Analysis and Frequency Synthesis Modules.

In some embodiments, the user adjustable input or input device is controlled by a knob, or a roller, or wheel or slider, keypad or lever, which is connected to a potentiometer or a variable resistor, which thus produces an output voltage on the electronic device which can be read by the microprocessor through an A/D converter.

In some embodiments, the user adjustable input may also be a stored setting that is adjusted through an electronic menu system using buttons to select menu parameters, or a touchscreen device in which buttons and inputs are detected when the users touches the screen or uses an implement to touch the screen.

In some embodiments, the user selectable input can be controlled through a voice command menu, for use by physically disabled people who are unable to adjust a physical input device.

In embodiments where a pattern library or lookup table is used, the elements in the pattern library of lookup table may be obtained by collecting audiograms across a significant population and finding mean hearing loss patterns for varying degrees of hearing loss, thereby producing patterns of varying slope with respect to critical band center frequency.

In some embodiments, adjustments to the underlying linear estimation may be added to the linear equation to produce variations in the threshold elevation. For instance, these adjustments may be derived from higher order polynomial equation that modifies the estimated threshold elevation, where the adjustments are within +/−10% of the linear slope with respect to critical band center frequency.

In some embodiments, adjustments to the underlying linear estimation may be added to the linear equation or pattern library, to produce variations in the threshold elevation to more accurately compensate for the average hearing loss profile of humans. For instance, adjustments derived from collecting audiograms across a large population.

In some embodiments, adjustments to the underlying linear estimation may be added to the linear equation or pattern library, to produce variations in the threshold elevation to more accurately compensate for the individual's hearing loss profile. For instance, these adjustments may be derived from an audiogram for that individual.

In some embodiments, a library of stored threshold elevation patterns, for which a varying slope, linear in critical band center frequency, could be fit to each pattern, may be stored in memory, with the user input selecting between or interpolating between stored patterns, where the patterns are arranged in order of increasing or decreasing slope, such that monotonic changes in the user input are translated into monotonic changes in the slope of the pattern being used, and the patterns remain approximately linear in critical band center frequency.

In some embodiments, a lookup table may be stored in memory, where for each quantized value of the frequency and user input, a threshold elevation is returned, where the threshold elevation varies monotonically with respect to both the frequency and user input. (Alternatively, the threshold elevation returned is approximately linear with respect to critical band center frequency and monotonically increasing with respect to user input).

In some embodiments, the user adjustable input may be a setting on an electronic device such as a cell phone or music player, which the user modifies through a touch screen menu, trackpad, or other instrument which is used with the electronic device.

In some embodiments the user-adjustable input may be a setting on a computer, or in a software application, which the user modifies using a push button, scrollbar, or other GUI input.

In some embodiments the present invention may be accessed via a web application or interface, where this web application resides on a web page, an electronic device such as a mobile phone, or any other general computing device.

In some embodiments, the present invention features an apparatus for enhancing an audio signal. The apparatus, or audio source as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal at a given frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In some embodiments, the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Without wishing to limit the present invention to any theory or mechanism, it is believed that the present invention is advantageous because the present invention features a maximum output volume, for example the source signal will be amplified to only a certain degree. This can help protect against damage to the user's hearing.

In some embodiments, steps for converting analog audio input signals to digital input signals can be bypassed where the invention utilizes digital input audio sources capable of receiving digital audio signals and transmitting the same to the processor.

Description of Additional Preferred Embodiments

In some broad embodiments, the present invention comprises an apparatus 100, effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain $\Delta P$ for the signal, corresponding to the threshold elevation at that frequency component, which can suffice to raise the volume of the audio signal so that the user can perceive the audio signal, at each frequency component, the way the user prefers.

In some embodiments, the apparatus comprises an audio source 02, configured to identify an audio signal x(t) where the audio signal is a broadband audio signal of interest. The audio source can be operatively connected to a microprocessor. The audio source can comprise any electronic device capable of receiving, extracting, or storing audio signals such as computer media, a receiver, microphone or the like. The microprocessor can be an 8 bit design, a 16 bit device, a 32 bit device, a 64 bit device, a multicore design, Reduced Construction Set Computer chip, a special purpose design such as a digital signal processor, or the like.

In some embodiments, the apparatus comprises an input source 03, controllable by a user, which allows the user to adjust a single parameter b, of a personalized sound adjustment model 10, the input source operatively connected to the microprocessor 01. The input source can comprise a touch pad, dial, series of controls, a graphical user interface, or any further devices capable of allowing the present invention to receive the user-preferred parameter setting.

In some embodiments, the microprocessor 01 can be configured to execute applications for an Analog to Digital converter ("ADC") 04 which can suffice to convert the audio signal from analog to digital form. The converter can be electronic, non-electronic or only partially electronic. Said converters are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage.

In some embodiments, the microprocessor 01 can be configured to execute applications for a Frequency Analysis Module 05. See "Glossary of Terms".

In some embodiments, the microprocessor 01 can be configured to execute applications for a Power Estimator Block 06. See "Glossary of Terms".

In some embodiments, the microprocessor 01 can be configured to execute applications for a dBFS to dBSPL Converter 07. This is also described herein as the Calibration equation. See "Glossary of Terms".

In some embodiments, the microprocessor 01 can be configured to execute applications for a dBSPL to dB Phon Converter 08. See "Glossary of Terms".

In some embodiments, the microprocessor 01 can be configured to execute applications for a kHz to critical band center frequency converter 09. See "Glossary of Terms".

In some embodiments, the microprocessor 01 can be configured to execute applications for the personalized sound adjustment model 10, where the personalized sound adjustment model 10 generates a spectrum of threshold elevations corresponding to a plurality of frequency components, based on the parameter b set to the input source 03 and where the parameter b is applied to the model 10. See "Glossary of Terms".

In some embodiments, the microprocessor 01 can be configured to execute applications for a perceptual model component 25, effective for computing gains from threshold elevations. See "Glossary of Terms".

In some embodiments, the microprocessor 01 can be configured to execute applications for a Gain Block component 14. See "Glossary of Terms".

In some embodiments, the microprocessor 01 can be configured to execute applications for a Summer Block Component 15. See "Glossary of Terms".

In some embodiments, the microprocessor 01 can be configured to execute applications for a Digital to Analog Converter ("DAC") 16. A DAC is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.

In some embodiments, audio signals can be processed by the present invention according to the following steps:

1. The audio source 02 extracts the audio signal x(t), where said audio signal is then transmitted to the Analog to Digital Converter 03 thereby converting the audio signal into digital format
2. whereupon the audio signal is fed through the Frequency Analysis Module 04, breaking down the audio signal into frequency components,
3. whereupon, for each frequency component, the microprocessor 01 identifies a source signal corresponding to a particular frequency component of the audio signal 50,
4. whereupon, for each frequency component, the source signal is fed to the Power Estimator 06 whereby the Power Estimator generates a mean power value for the source signal, whereby said power value is then fed into a dB Converter to generate a power value for the source signal $P_{dBFS}(f)$ in dBFS 52,
5. whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$,
6. whereupon, for each frequency component, the dBSPL-dB Phon Converter 08 converts the power value of the source signal $P_{dBSPL}(f)$ to dB Phons by applying a dBSPL to dBPhon Conversion equation, producing P(f),
7. whereupon, for each frequency component, the critical band frequency converter 09 converts the frequency value f of a given input from kHz to critical band frequency,
8. whereupon, for each frequency component, the personalized sound adjustment model 10 computes a value for $P_0(f)$ in dB Phons corresponding to the current frequency component and the user adjustable parameter b 03,
9. whereupon, for each frequency component, the microprocessor 01 applies the power value of the source signal P(f) and $P_0(f)$, now in dB Phons, to the perceptual model 25, which outputs a gain value ΔP(f) in dBPhons,
10. whereupon, for each frequency component, the microprocessor 01 calculates a correction gain of power G(f), for the source signal, in dBSPL, based on the value of ΔP(f) in dB Phons, using the Gain Block component 14 which utilizes the Gain equation, and
11. whereupon the apparatus 100 adjusts the audio signal at each frequency component according to the corrective gains computed for each respective frequency component, comprising:
    (i) for each frequency component, multiplying the source signal according to the corresponding corrective gain ΔP(f), producing an adjusted audio signal at the frequency component, and
    (ii) combining the frequency components of the adjusted audio signal using the Summer block Component 18.

In some embodiments, the present invention does not need to calculate gains. Instead, the apparatus is effective for selecting a plurality of threshold elevations for a given user, without requiring individual measurement of each threshold elevation, where the apparatus calculates a plurality of spectrally varying threshold elevations across a plurality of channels, where the threshold elevations are computed from a single parameter set by a user-adjustable setting, each of the threshold elevations being represented as X0, in dBHL at a given frequency F, and where each of the threshold elevations can be used to determine corresponding correction gains.

The aforementioned embodiment can comprise only an input device 03, which allows a user to set a single parameter for a personalized sound adjustment model 10; and a microprocessor 01, in electronic communication with the input device 03, the microprocessor 01 configured to execute an application comprising the personalized sound adjustment model 06, where the personalized sound adjustment model 10 generates a spectrum of threshold elevations corresponding to a plurality of frequency components, based on the parameter set to the input device 03.

With the aforementioned embodiment, the user sets the single parameter via the input device 03, and thereafter, the input device 03 transmits information about the single parameter to the microprocessor 01, whereupon the microprocessor 01 applies the parameter to the personalized sound adjustment model 06, whereupon the personalized sound adjustment model 06, using the single parameter, generates a spectrum of threshold elevations, per frequency component, and where said threshold elevations are effective for identifying threshold levels of hearing for users with impaired hearing or for users with normal hearing who wish to optimize their perceived hearing.

In some embodiments, the apparatus of claim 2 can further comprise all of the components recited in claim 1 that can be used to generate gains for threshold elevations.

In some embodiments, for the apparatus of claim 1 and claim 3, the perceptual model 25 for $\Delta P$ comprises a novel Conductor Equation 13, $$S(P)=S(P+\Delta P)-S(P_0)+S(0) \text{ or,}$$

$$\Delta P=S^{-1}(S(P)+S(P_0)-S(0))-P,$$

where S(P) is a function in Sones, a measure of perceived loudness, in terms of Phons, a measure of objective sound intensity, where S(P) is found by solving an EarSpring equation 11,12 for particular boundary values and input sound intensities, where P is a measure of sound intensity of a given frequency component of the audio signal in dBPhons, where $P_0$ is an estimated hearing loss or threshold elevation at a given frequency, where the Earspring equation 11,12 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency component, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

In some embodiments, the aforementioned set of experimental boundary conditions comprise: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz. In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

In some embodiments, the perceptual model 25 can be a computational model 19 used to estimate S(P) and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $$S(P)=S(P+\Delta P)-S(P_0)+S(0) \text{ or,}$$

$$\Delta P=S^{-1}(S(P)+S(P_0)-S(0))-P,$$

where S(0) is a known constant offset, whereupon this equation is solved using the values of P and $P_0$, where these values are obtained from the power value of the signal and the estimated hearing loss.

In some embodiments, the perceptual model 25 can be a computational model 19 used to estimate $\Delta P$, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$. In some embodiments, the parameters A, B, C, D, and E are fit against the Earspring and conductor equations for every $P_0$ in increments.

In some embodiments, the computational model 19 may be any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the Frequency Analysis Module 20 may be a digital filter bank of IIR filters that breaks the signal down into various sub-band frequency components $\bar{x}(t)$, where the power of each frequency component is found by passing the frequency component through a Square Summer equation, whereby the signal is squared and added up N times, whereby the sum of the signals at the end block divided by N generates mean power values for the source signal 51, and where the Summer Block Component 21 is a summer operation that combines the various frequency components into output $x_{out}(t)$.

In some embodiments, the various sub-band frequency components correspond to critical bands of hearing.

In some embodiments, the Frequency Analysis Module 20 may be an FFT co-processor, which outputs the Fourier transform of the input signal X(f), where the power value of the signal is found by squaring the components of this Fourier transform and where the Summer Block Component 21 is an FFT co-processor that performs an inverse Fourier transform, outputting the time domain signal $x_{out}(t)$.

In some embodiments, the frequency components are grouped together to approximate sub-bands correspond to critical bands of hearing.

In some embodiments, the personalized sound adjustment model 10 is a linear estimator, which uses a linear function of the critical band center frequency F, where the Linear Slope equation is $$X_0 = [F-Y] \times b$$

where $X_0$ is the threshold elevation at a frequency F, where the setting (b) adjustable by the user 03, represents the slope of the line in dBHL/critical band, where Y is a value selected from a range of 2-3 Bark, and where F is the critical band center frequency. In some embodiments, the aforementioned range is 0-1 Bark, 2-4 Bark, 1-5 Bark, Or 5-10 Bark.

In some embodiments, the personalized sound adjustment model 10 is composed of a pattern library which is stored in long term memory, where the patterns are composed of points which measure threshold elevations $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency. In some embodiments, the patterns are composed of points which measure threshold elevations, X0, with respect to frequency, of which 0-20% are within +/−5 dBHL of a mean squared error linear fit to the pattern with respect to critical band center frequency. In some embodiments, the patterns are composed of points which measure threshold elevations, X0, with respect to frequency, of which 20-40% are within +/−5 dBHL of a mean squared error linear fit to the pattern with respect to critical band center frequency. In some embodiments, the patterns are composed of points which measure threshold elevations, X0, with respect to frequency, of which 40-60% are within +/−5 dBHL of a mean squared error linear fit to the pattern with respect to critical band center frequency. In some embodiments, the patterns are composed of points which measure threshold elevations, X0, with respect to frequency, of which 60-80% are within +/−5 dBHL of a mean squared error linear fit to the pattern with respect to critical band center frequency. In some embodiments, the patterns are composed of points which measure threshold elevations, X0, with respect to frequency, of which 80-100% are within +/−5 dBHL of a mean squared error linear fit to the pattern with respect to critical band center frequency. In some embodiments, the patterns are composed of points which measure threshold elevations, X0, with respect to frequency, of which 66% are within +/−5 dBHL of a mean squared error linear fit to the pattern with respect to critical band center frequency. In some embodiments, the patterns are composed of points which measure threshold elevations, X0, with respect to frequency, of which 66% are within +/−1 dBHL of a mean squared error linear fit to the pattern with respect to critical band center frequency. In some embodiments, the patterns are composed of points which measure threshold elevations, X0, with respect to frequency, of which 66% are within +/−2 dBHL of a mean squared error linear fit to the pattern with respect to critical band center frequency. In some embodiments, the patterns are composed of points which measure threshold elevations, X0, with respect to frequency, of which 66% are within 3-6 dBHL of a mean squared error linear fit to the pattern with respect to critical band center frequency. In some embodiments, the patterns are composed of points which measure threshold elevations, X0, with respect to frequency, of which 66% are within 6-10 dBHL of a mean squared error linear fit to the pattern with respect to critical band center frequency.

In some embodiments, the personalized sound adjustment model 10 is composed of a lookup table indexed by values of parameter b and frequency, where the threshold elevation $X_0$ is found by selecting the corresponding element of the lookup table or interpolating between points in the lookup table.

In some embodiments, the corrective gains are computed in parallel for multiple frequency components using multiple processing units. In some embodiments, the corrective gains are computed in part in parallel and in part in serial for multiple frequency components using multiple processing units. In some embodiments, the corrective gains are computed in serial for multiple frequency components using multiple processing units.

In some embodiments, the apparatus includes a speaker 18 and an amplifier 17 for outputting the audio signal.

In some embodiments, the apparatus is a mobile phone, media player, headset, or virtual audio port.

In some embodiments, the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

In some embodiments, the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

In some embodiments, the present invention comprises a method of obtaining the solution to the Earspring equation S(P) and it's inverse function $S^{-1}(S)$ in a computationally efficient manner, using a computational model in which parameters are selected which fit the computational model to a variety of solutions of the Earspring equation, and it's inverse, for various input amplitudes and/or frequencies, where the parameters are stored within a long term memory component, where the computational model that estimates S(P) or $S^{-1}(S)$ may consist of a quadratic function $$S(P) \cong \frac{AP^2 + BP + C}{DP^2 + EP + 1},$$

where A, B, C, D, and E are parameters which fit the quadratic function against the solution to the Earspring equation and are stored in long term memory. In some embodiments, the method further comprises obtaining corrective gains ΔP an array of gains for various frequencies using the Conductor equation and perceived loudness models S(P) and $S^{-1}(S)$ based on solutions to the Earspring equation, the Conductor Equation 10 being, $$S(P)=S(P+\Delta P)-S(P_0)+S(0) \text{ or,}$$

$$\Delta P = S^{-1}(S(P)+S(P_0)-S(0))-P,$$

where S(P)=a Sones equation from an EarSpring equation 09 solution for the given frequency, as a function of Phons Pressure, and $S^{-1}(S)$ is an inverse function of this solution that gives the sound intensity P in Phons needed for a normal listener to perceive the sound at loudness S in Sones, where P(f)=a Phons amplitude of the frequency component at f of a source signal of interest, and $P_0$(f)=an output of the Linear Slope equation at a frequency f, where Sones is a measure of perceived loudness under subjective experience and Phons is a measure of objective sound intensity.

In some embodiments, the gains, ΔP, are computed in a computationally efficient manner using a single computational model 19 that combines S(P) and its inverse in the Conductor Equation to obtain a single computational model $$\Delta P \cong \frac{AP^2 + BP + C}{DP^2 + EP + 1},$$

where A, B, C, D, and E are parameters which fit the quadratic function against the combined Earspring and Conductor equation and are stored in long term memory, where for each value of $P_0$ a different set of parameters is stored in a lookup table.

In some embodiments parameters are stored for every $P_0$ in increments.

In some embodiments the corrective gains ΔP are obtained in a computationally efficient manner using a single computational model 19, where the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the present invention comprises a method of selecting a personalized sound adjustment at a given frequency, using a linear function of the critical band center frequency to establish a spectrum of threshold elevations, where the threshold elevation is computed via, $$X_0 = [F-Y] \times b$$

where $X_0$ is the threshold elevation at a frequency F, the slope of the line is a variable dB HL/critical band ratio (b), adjustable by the user 03, where Y is a value selected from a range of 2-3 Bark, and where F is the current critical band center frequency.

In some embodiments, the present invention comprises a method, of selecting a spectrum of threshold elevations across various frequencies, using a pattern library which is stored in long term memory, where the patterns are composed of spectrums of threshold elevations $X_0$ with respect to frequency, of which ⅔ are within +/−5 dB HL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

In some embodiments, the present invention comprises a method, of selecting personalized sound adjustments at a given frequency using a lookup table indexed by values of parameter b and frequency, where the hearing loss estimate or threshold elevation $X_0$ is found by selecting the corresponding element of the lookup table or interpolating between points in the lookup table.

In some embodiments, the present invention comprises computer-readable medium 70 storing a set of instructions executable by one or more microprocessors, where the computer-readable medium 70 is effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers. This embodiment takes the systems of the invention and implements the system on a computer as a software/hardware platform, using a smartphone, tablet, laptop, or any other such computer media capable of executing the claimed software applications. Any of the foregoing applications can be executed external to the computer media and can instead by in electronic communication with the microprocessor or controller for the computer media.

In some embodiments, the computer-readable medium comprises code for extracting an input audio signal x(t) 02. This step can involve the computer media interpreting a stored audio signal, processing a new signal, or the like.

In some embodiments, the computer-readable medium comprises code for obtaining the value of a user controlled input 03 *b*, which is to be a parameter of a personalized sound adjustment model 10. This step essentially involves interpreting the value set by the user to the computer media for the parameter b.

In some embodiments, the computer-readable medium comprises code for filtering the audio signal, x(t) into a plurality of frequency components using the Frequency Analysis Module 20.

In some embodiments, the computer-readable medium comprises code for solving for corrective gains 10 to the audio signal x(t). This can involve extracting a power value for each of a plurality of source signals P(f), each of the source signals corresponding to the frequency components of the audio signal, in dBFS, with a power estimator block 06, identifying each source signal, wherein the source signal is a portion of the audio signal at a particular frequency component of the audio signal 50, and generating a power value for the source signal, whereby said power value is then fed into a dB Converter to generate a power value $P_{dBFS}(f)$ for the source signal in dBFS 52. Thereafter, the present invention can calculate a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12.

In some embodiments, the computer-readable medium comprises code for converting the power value of the source signals to dB Phons 08 by applying a dBSPL to dBPhon Conversion equation (See Glossary of Terms), producing P(f).

In some embodiments, the computer-readable medium comprises code for computing the critical band center frequency F 09 (See Glossary of Terms), corresponding to the frequency component for the source signal in kHz.

In some embodiments, the computer-readable medium comprises code for determining threshold elevations values, $P_0(f)$ in dB Phons, where said values are defined by the personalized sound adjustment model 10, which is parameterized by the user adjustable input 03 b.

In some embodiments, the computer-readable medium comprises code for computing gains to the audio signal corresponding to the threshold elevations values in dBPhons, at each frequency component, using the perceptual model 25.

In some embodiments, the computer-readable medium comprises code for calculating correction gains of power G(f) 14, for the source signals, in dBSPL, based on the value of $\Delta P(f)$ in dB Phons, using a Gain equation 14 (See Glossary of Terms).

In some embodiments, the computer-readable medium comprises code for reconstituting the audio signal with the corrective gains to the source signals at each of the frequency components, comprising feeding the correction gains G(f) to an amplifier 53 wherein the amplifier 53 multiplies the source signal by the corresponding corrective gains G(f) and using the Summer Block Component 21 to reconstitute the audio signal from the source signals, producing an adjusted audio signal $x_{out}(t)$.

In some embodiments, the computer-readable medium comprises code for feeding the adjusted audio signal through a Digital to Analog Converter 16.

In some embodiments, the computer-readable medium comprises code where the Frequency Analysis Module 20 is a digital filter bank of IIR filters that breaks the signal down into various sub-band frequency components At), where the power of each frequency component is found by passing the frequency component through a Square Summer equation, whereby the signal is squared and added up N times, whereby the sum of the signals at the end block divided by N generates mean power values for the source signal 51, and where the Summer Block Component 21 is a summer operation that combines the various frequency components into output $x_{out}(t)$.

In some embodiments, the aforementioned various sub-band frequency components correspond to critical bands of hearing.

In some embodiments, the Frequency Analysis Module 20 is an FFT operation, which outputs the Fourier transform of the input signal X(f), where the power value of the signal is found by squaring the components of this Fourier transform and where the Summer Block Component 21 is an FFT operation that performs an inverse Fourier transform, outputting the time domain signal $x_{out}(t)$.

In some embodiments, the personalized sound adjustment model 10 is a linear estimator, which uses a linear function of the critical band center frequency F, where the Linear Slope equation is $$X_0 = [F-Y] \times b$$

where $X_0$ is the threshold elevation at a frequency F, where the setting (b) adjustable by the user 03, represents the slope of the line in dBHL/critical band, where Y is a value selected from a range of 2-3 Bark, and where F is the critical band center frequency.

In some embodiments, the personalized sound adjustment model 10 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

In some embodiments, the personalized sound adjustment model 10 is composed of a lookup table indexed by values of parameter b and frequency, where the threshold elevation $X_0$ is found by selecting the corresponding element of the lookup table or interpolating between points in the lookup table.

In some embodiments, the perceptual model for $\Delta P$ comprises a novel Conductor Equation 13, $$S(P)=S(P+\Delta P)-S(P_0)+S(0) \text{ or,}$$

$$\Delta P = S^{-1}(S(P)+S(P_0)-S(0))-P,$$

where S(P) is a function in Sones, a measure of perceived loudness, in terms of Phons, a measure of objective sound intensity, where S(P) is found by solving the EarSpring equation for particular boundary values and input sound intensities, where P is a measure of sound intensity of a given frequency component of the audio signal, where $P_0$ is an estimated threshold elevation at a given frequency, where the Earspring equation is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency component, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P, a solution y(t) to this equation can be found, which if put into the frequency domain as Y (the amplitude of the steady state response to the forcing function F(t)) can be used to compute $\langle y^2 \rangle = \frac{1}{2}|Y|^2 = S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

In some embodiments, the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

In some embodiments a computational model 19 is used to estimate S(P) and $S^{-1}(S)$ consisting of quadratic functions such as $$S(P) \cong \frac{AP^2 + BP + C}{DP^2 + EP + 1},$$

where A, B, C, D, and E are parameters which fit the quadratic function against the solution to the Earspring and Conductor equations and are stored in long term memory.

In some embodiments the computational model 19 is used to estimate ΔP consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in long term memory.

In some embodiments the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments the corrective gains are computed in parallel for multiple frequency components using multiple processing units. In some embodiments the corrective gains are computed in part in parallel and in part in serial for multiple frequency components using multiple processing units. In some embodiments the corrective gains are computed in serial for multiple frequency components using multiple processing units.

In some embodiments, the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

In some embodiments the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

In some embodiments the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
  =+1/240 when ATH(F)<0
In some embodiments, the Gain equation 17 is:

$$\Delta P_{dBSPL}(F) = \Delta P_{dBPhon}(F)(1 + kATH(F))$$

where
F=frequency
ATH(F)=Absolute Threshold of Hearing
K=−1/120 when ATH(F)>0
  =+1/240 when ATH(F)<0
In some embodiments, the absolute threshold of hearing is computed by the formula:

$$ATH(F) = \frac{3.64}{F_{kHz}^{0.8}} - 6.5 e^{-0.6(F_{kHz}-3.3)^2 + 0.001 F_{kHz}^4} - 3.37$$

In some embodiments, the critical band center frequency is the Bark frequency, which is computed by, $$CBR(F_{kHz}) = \frac{26.81}{1 + \frac{1.960}{F_{kHz}}} - 0.53$$

In some embodiments, the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12.

In some embodiments there are multiple source audio signals corresponding to both ears and hearing loss is estimated independently with separate user inputs for each ear, and separate gains computed for each frequency component.

The present invention, in some embodiments, may be combined with a number of possible known psychoacoustic models, derived from the audiology literature, which are used to compute gains needed to amplify sound to overcome the effects of ambient noise on sound perception or gains needed to account for preferred threshold elevations computed for users' of normal hearing. The gains may be computed over the entire spectrum or by dividing the spectrum up into any number of smaller bandwidth or frequency components. The present invention is not limited to one particular psychoacoustic model and many potential appropriate models can be used in accordance with the present invention.

An example of a psychoacoustic model which may be combined with the present invention may be found in works such as (Moore, Brian C. et al., "A model for the prediction of thresholds, loudness and partial loudness", *Journal of the Audio Engineering Society*, JAES Volume 45 Issue 4 pp. 224-240; April (1997)) (Also available at http://www.aes.org/e-lib/browse.cfm?elib=10272) and (Rosengrad, Peniah, S., "Relationship Between Measures Related to the Cochlear Active Mechanism and Speech Reception Thresholds in backgrounds with and without Spectral and/or Temporal Fluctuations" PhD Thesis MIT (2004)) (Also available at http://hdl.handle.net/1721.1/28598).

These models define a mathematical relationship between the sound impinging on the ear and the apparent loudness of the sound as perceived by a human.

The models above may be used to derive a formula for the gains needed to amplify sound and the formula may be written:

$$\sqrt[\alpha]{\frac{P_{SIG}^{\alpha} + P_{NOISE}^{\alpha} - P_{THRQ}^{\alpha}}{P_{SIG}}}$$

where G is the gain ratio, PSIG is the signal intensity at a frequency in units of power, PNOISE is the signal intensity of the background noise, PTHRQ is the absolute threshold of hearing, and α=0.2 is a constant.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:

1. An apparatus 100, effective for enhancing an audio signal according to a user's preference, across a spectrum of frequency components, by applying corrective gains to a frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers, the apparatus comprising:

(a) an audio source 02, configured to identify the audio signal x(t) where the audio signal is a broadband audio signal of interest, the audio source operatively connected to a microprocessor 01;

(b) an input source 03, controllable by a user, which allows the user to adjust a single parameter b, of a personalized sound adjustment model 10, the input source operatively connected to the microprocessor 01;

(c) the microprocessor 01, configured to execute applications for:
      i. an Analog to Digital converter 04,
      ii. a Frequency Analysis Module 05,
      iii. a Power Estimator Block 06,
      iv. a dBFS to dBSPL Converter 07,
      v. a dBSPL to dB Phon Converter 08,
      vi. a kHz to critical band center frequency converter 09,
      vii. the personalized sound adjustment model 10, where the personalized sound adjustment model 10 generates a spectrum of threshold elevations corresponding to a plurality of frequency components, based on the parameter b set to the input source 03 when the parameter b is applied to the model 10,
      viii. a perceptual model component 13, effective for computing gains from threshold elevations,
      ix. a Gain Block component 14,
      x. a Summer Block Component 15, and
      xi. a Digital to Analog Converter 16 wherein the audio source 02 extracts the audio signal x(t), where said audio signal is then transmitted to the Analog to Digital Converter 03 thereby converting the audio signal into digital format, whereupon the audio signal is fed through the Frequency Analysis Module 04, breaking down the audio signal into frequency components, whereupon, for each frequency component, the microprocessor 01 identifies a source signal corresponding to a particular frequency component of the audio signal, whereupon, for each frequency component, the source signal is fed to the Power Estimator 06 whereby the Power Estimator generates a mean power value for the source signal, whereby said power value is then fed into a dB Converter to generate a power value for the source signal $P_{dBFS}(f)$ in dBFS 52, whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$, whereupon, for each frequency component, the dBSPL-dB Phon Converter 08 converts the power value of the source signal $P_{dBSPL}(f)$ to dB Phons by applying a dBSPL to dBPhon Conversion equation, producing P(f), whereupon, for each frequency component, the critical band frequency converter 09 converts the frequency value f of a given input from kHz to critical band frequency, whereupon, for each frequency component, the personalized sound adjustment model 10 computes a value for $P_0(f)$ in dB Phons corresponding to the current frequency component and the user adjustable parameter b 03, whereupon, for each frequency component, the microprocessor 01 applies the power value of the source signal P(f) and $P_0(f)$, now in dB Phons, to the perceptual model 13, which outputs a gain value ΔP(f) in dBPhons, whereupon, for each frequency component, the microprocessor 01 calculates a correction gain of power G(f), for the source signal, in dBSPL, based on the value of ΔP(f) in dB Phons, using the Gain Block component 14 which utilizes the Gain equation, and whereupon the apparatus 100 adjusts the audio signal at each frequency component according to the corrective gains computed for each respective frequency component, comprising:

(i) for each frequency component, multiplying the source signal according to the corresponding corrective gain ΔP(f), producing an adjusted audio signal at the frequency component, (ii) combining the frequency components of the adjusted audio signal using the Summer block Component 15, and whereupon the adjusted audio signal is fed through the Digital to Analog Converter 16.

2. An apparatus 700, effective for selecting a plurality of threshold elevations for a given user, without requiring individual measurement of each threshold elevation, where the apparatus 700 calculates a plurality of spectrally varying threshold elevations across a plurality of channels, where the threshold elevations are computed from a single parameter set by a user-adjustable setting, each of the threshold elevations being represented as X0, in dBHL at a given frequency F, and where each of the threshold elevations may be used to determine corresponding correction gains, the apparatus comprising:

a. an input device 703, which allows a user to set a single parameter for a personalized sound adjustment model 710; and b. a microprocessor 701, in electronic communication with the input device 703, the microprocessor 701 configured to execute an application comprising the personalized sound adjustment model 710, where the personalized sound adjustment model 710 generates a spectrum of threshold elevations corresponding to a plurality of frequency components, based on the parameter set to the input device 703;

wherein the user sets the single parameter via the input device 703, and thereafter, the input device 703 transmits information about the single parameter to the microprocessor 701, whereupon the microprocessor 701 applies the parameter to the personalized sound adjustment model 706, whereupon the personalized sound adjustment model 706, using the single parameter, generates a spectrum of threshold elevations, per frequency component, and where said threshold elevations are effective for identifying threshold levels of hearing for users with impaired hearing or for users with normal hearing who wish to optimize their perceived hearing.

3. The apparatus of claim 2, wherein the apparatus further comprises:

a. an audio device 702, configured to identify an audio signal x(t) where the audio signal is a broadband audio signal of interest, the audio device operatively connected to the microprocessor 701; where the microprocessor is further configured to execute applications for:

i. an Analog to Digital converter 704,
ii. a Frequency Analysis Module 705,
iii. a Power Estimator Block 706,
iv. a dBFS to dBSPL Converter 707,
v. a dBSPL to dB Phon Converter 708,
vi. a kHz to critical band center frequency converter 709,
vii. the personalized sound adjustment model 710, where the personalized sound adjustment model 710 generates a spectrum of threshold elevations corresponding to a plurality of frequency components, based on the parameter b set to the input source 703,
viii. a perceptual model component 725,
ix. a Gain Block component 714,
x. a Summer Block Component 715, and
xi. a Digital to Analog Converter 716.

4. The apparatus of claim 1 and claim 3, wherein the perceptual model 13, 713 for ΔP comprises a novel Conductor Equation, $$S(P)=S(P+\Delta P)-S(P_0)+S(0) \text{ or,}$$

$$\Delta P=S^{-1}(S(P)+S(P_0)-S(0))-P,$$

where S(P) is a function in Sones, a measure of perceived loudness, in terms of Phons, a measure of objective sound intensity, where S(P) is found by solving an EarSpring equation 11,12 for particular boundary values and input sound intensities, where P is a measure of sound intensity of a given frequency component of the audio signal in dBPhons, where $P_0$ is an estimated hearing loss or threshold elevation at a given frequency, where the Earspring equation 11,12 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency component, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(p))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

5. The apparatus of claim 4, where the set of experimental boundary conditions comprise: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

6. The apparatus of claim 1 and claim 3, where the perceptual model 25 is a computational model 19 used to estimate S(P) and $S^{-1}(S)$, consisting of a quadratic function comprising $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $$S(P)=S(P+\Delta P)-S(P_0)+S(0) \text{ or,}$$

$$\Delta P=S^{-1}(S(P)+S(P_0)-S(0))-P,$$

where S(0) is a known constant offset, whereupon this equation is solved using the values of P and $P_0$, where these values are obtained from the power value of the signal and the estimated hearing loss.

7. The apparatus of claim 1 and claim 3 where the perceptual model 25 is a computational model 19 used to estimate $\Delta P$, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$.

8. The apparatus of claim 6 and claim 7, where values of the parameters A, B, C, D, and E are fit against the Earspring and conductor equations for every $P_0$ in increments.

9. The apparatus of claim 6 and claim 7, where the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

10. The apparatus of claim 1 and claim 3, where the Frequency Analysis Module 20 is a digital filter bank of IIR filters that breaks the signal down into various sub-band frequency components $\bar{x}(t)$, where the power of each frequency component is found by passing the frequency component through a Square Summer equation, whereby the signal is squared and added up N times, whereby the sum of the signals at the end block divided by N generates mean power values for the source signal 51, and where the Summer Block Component 21 is a summer operation that combines the various frequency components into output $x_{out}(t)$.

11. The apparatus of claim 10, where the various sub-band frequency components correspond to critical bands of hearing.

12. The apparatus of claim 1 and claim 3, where the Frequency Analysis Module 20 is an FFT co-processor, which outputs the Fourier transform of the input signal X(f), where the power value of the signal is found by squaring the components of this Fourier transform and where the Summer Block Component 21 is an FFT co-processor that performs an inverse Fourier transform, outputting the time domain signal $x_{out}(t)$.

13. The apparatus of claim 10, where the frequency components are grouped together to approximate sub-bands correspond to critical bands of hearing.

14. The apparatus of claim 1 and claim 3, wherein the personalized sound adjustment model 10 is a linear estimator, which uses a linear function of the critical band center frequency F, where the Linear Slope equation is $$X_0 = [F-Y] \times b$$

where $X_0$ is a threshold elevation at the frequency F, where the setting (b) adjustable by the user 03, represents the slope of the line in dBHL/critical band, where Y is a value selected from a range of 2-3 Bark, and where F is the critical band center frequency.

15. The apparatus of claim 1 and claim 3, wherein the personalized sound adjustment model 10 is composed of a pattern library which is stored in long term memory, where the patterns are composed of points which measure threshold elevations $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

16. The apparatus of claim 1 and claim 3, wherein the personalized sound adjustment model 10 is composed of a lookup table indexed by values of parameter b and frequency, where the threshold elevation $X_0$ is found by selecting the corresponding element of the lookup table or interpolating between points in the lookup table.

17. The apparatus of claim 1 and claim 3, wherein the corrective gains are computed in parallel for multiple frequency components using multiple processing units.

18. The apparatus of claim 1 and claim 3, wherein the corrective gains are computed in part in parallel and in part in serial for multiple frequency components using multiple processing units.

19. The apparatus of claim 1 and claim 3, wherein the corrective gains are computed in serial for multiple frequency components using multiple processing units.

20. The apparatus of claim 1 and claim 3, wherein the apparatus includes a speaker 18 and an amplifier 17 for outputting the audio signal.

21. The apparatus of claim 1 and claim 3, wherein the apparatus is a mobile phone.

22. The apparatus of claim 1 and claim 3 wherein the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

23. The apparatus of claim 1 and claim 3, wherein the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

24. The apparatus of claim 1 and the apparatus of claim 3, wherein the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
  =+1/240 when ATH(F)<0

25. The apparatus of claim 1 and the apparatus of claim 3, wherein the Gain equation 17 is:

$$\Delta P_{dBSPL}(F) = \Delta P_{dBPhon}(F)(1 + k\mathrm{ATH}(F))$$

where
F=frequency
ATH(F)=Absolute Threshold of Hearing
K=−1/120 when ATH(F)>0
 =+1/240 when ATH(F)<0

26. The apparatus of claim 1 and the apparatus of claim 3, where the absolute threshold of hearing is computed by the formula:

$$ATH(F) = \frac{3.64}{F_{KHz}^{0.8}} - 6.5e^{-0.6(F_{kHz}-3.3)^2} + 0.001 F_{kHz}^4 - 3.37$$

27. The apparatus of claim 1 and the apparatus of claim 3, where the critical band center frequency is the Bark frequency, which is computed by, $$CBR(F_{kHz}) = \frac{26.81}{1 + \frac{1.960}{F_{kHz}}} - 0.53$$

28. The apparatus of claim 1 and claim 3, where the calibration equation 07 comprises configuring a microprocessor to calculate and interpret a baseline relationship between dBFS and dBPSL such that a zero point in dBFS can be computed and conversion from values in dBFS to values in dBSPL is enabled; wherein the calibration offset equation is $P_{dBSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.

29. The apparatus of claim 1 and the apparatus of claim 3, where there are multiple source audio signals corresponding to both ears and hearing loss is estimated independently with separate user inputs for each ear, and separate gains computed for each frequency component.

30. A method of determining accurate gains corresponding to threshold elevations, whereby the solution to the Earspring equation S(P) and it's inverse function $S^{-1}(S)$ are obtained in a computationally efficient manner, the method comprising:
  i. using a computational model in which parameters are selected which fit the computational model to a variety of solutions of the Earspring equation, and it's inverse, for various input amplitudes and/or frequencies, where the parameters are stored within a long term memory component;
  ii. estimating, using the computational model, that S(P) or $S^{-1}(S)$ consist of a quadratic function $$S(P) \cong \frac{AP^2 + BP + C}{DP^2 + EP + 1},$$

where A, B, G, D, and E are parameters which fit the quadratic function against the solution to the Earspring equation and are stored in long term memory,
  where the Earspring equation 11,12 is written $[d^2/dt^2 + 2\beta(d/dt) + k(1 + \gamma\gamma<y^2>)]y(t) = \eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency component, identified as the Sones power in the following equations, β=damping constant, k=spring constant, γ=coefficient of power dependence of spring constant, and η=the scale factor,
  where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

31. The apparatus of claim 30, where the set of experimental boundary conditions comprise: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

32. The method of claim 30, where the method further comprises a method of obtaining corrective gains ΔP an array of gains for various frequencies using the Conductor equation and perceived loudness models S(P) and $S^{-1}(S)$ based on solutions to the Earspring equation, the Conductor Equation 10 being, $$S(P) = S(P + \Delta P) - S(P_0) + S(0) \text{ or,}$$

$$\Delta P = S^{-1}(S(P) + S(P_0) - S(0)) - P,$$

where S(P)=a Sones equation from an EarSpring equation 09 solution for the given frequency, as a function of Phons Pressure, and $S^{-1}(S)$ is an inverse function of this solution that gives the sound intensity P in Phons needed for a normal listener to perceive the sound at loudness S in Sones, where P(f)=a Phons amplitude of the frequency component at f of a source signal of interest, and $P_0(f)$=an output of the Linear Slope equation at a frequency f, where Sones is a measure of perceived loudness under subjective experience and Phons is a measure of objective sound intensity.

33. The method of claim 30, in which the gains, ΔP, are computed in a computationally efficient manner using a single computational model 19 that combines S(P) and its inverse in the Conductor Equation to obtain a single computational model $$\Delta P \cong \frac{AP^2 + BP + C}{DP^2 + EP + 1},$$

where A, B, C, D, and E are parameters which fit the quadratic function against the combined Earspring and Conductor equation and are stored in long term memory, where for each value of $P_0$ a different set of parameters is stored in a lookup table.

34. The method of claim 33, where parameters are stored for a plurality of values of $P_0$ in discrete increments.

35. The method of claim 30, where the gains ΔP are obtained in a computationally efficient manner using a single computational model 19, where the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

36. A method creating a personalized sound adjustment spectrum, comprising:
   a. Obtaining a parameter b from a user; and
   b. Selecting a personalized sound adjustment at a given frequency, using a linear function of the critical band center frequency to establish a spectrum of threshold elevations, where the threshold elevation is computed via, $$X_0 = [F - Y] \times b$$

where $X_0$ is a threshold elevation at the frequency F, where the slope of the line is a variable dB HL/critical band ratio (b), adjustable by the user 03, where Y is a value selected from a range of 2-3 Bark, and where F is the current critical band center frequency.

37. A method of selecting a spectrum of threshold elevations across various frequencies, the method comprising:
   a. using a pattern library which is stored in long term memory, where the patterns are composed of spectrums of threshold elevations $X_0$ with respect to frequency, of which ⅔ are within +/−5 dB HL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

38. The method of claim 30, wherein the dBSPL to dBPhon Conversion equation 12,13 is:

$$P_{dBPhon}(F) = \frac{P_{dBSPL} - ATH(F)}{1 + kATH(F)}$$

where
F=frequency
ATH(F)=Absolute Threshold of Hearing
K=−1/120 when ATH(F)>0
 =+1/240 when ATH(F)<0

39. The method of claim 30, wherein the Gain equation 17 is:

$$\Delta P_{dBSPL}(F) = \Delta P_{dBPhon}(F)(1 + kATH(F))$$

where
F=frequency
ATH(F)=Absolute Threshold of Hearing
K=−1/120 when ATH(F)>0
 =+1/240 when ATH(F)<0

40. The method of claim 30, where the absolute threshold of hearing is computed by the formula:

$$ATH(F) = \frac{3.64}{F_{kHz}^{0.8}} - 6.5 e^{-0.6(F_{kHz} - 3.3)^2} + 0.001 F_{kHz}^4 - 3.37$$

41. The method of claim 30, where the critical band center frequency is the Bark frequency, which is computed by, $$CBR(F_{kHz}) = \frac{26.81}{1 + \frac{1.960}{F_{kHz}}} - 0.53$$

42. The method of claim 30, where the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.

43. The method of claim 30, where there are multiple source audio signals corresponding to both ears and hearing loss is estimated independently with separate user inputs for each ear, and separate gains computed for each frequency component.

44. A method, of selecting personalized sound adjustments at a given frequency using a lookup table indexed by values of parameter b and frequency, where the hearing loss estimate or threshold elevation $X_0$ is found by selecting the corresponding element of the lookup table or interpolating between points in the lookup table.

45. A computer-readable medium 70 storing a set of instructions executable by one or more microprocessors, where the computer-readable medium 70 is effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers,
   the computer-readable medium comprising:
   a. code for extracting an input audio signal x(t) 702;
   b. code for obtaining the value of a user controlled input 703 b, which is to be a parameter of a personalized sound adjustment model 710;
   c. code for filtering x(t) into a plurality of frequency components using a Frequency Analysis Module 750;

d. code for solving for corrective gains to the audio signal x(t) which comprises:
  i. code for extracting a power value for each of a plurality of source signals P(f), each of the source signals corresponding to the frequency components of the audio signal 751, in dBFS, with a power estimator block, comprising:
    (A) identifying the source signal, wherein the source signal is a portion of the audio signal at a particular frequency component of the audio signal,
    (B) generating a power value for the source signal 751, whereby said power value is then fed into a dB Converter to generate a power value $P_{dBFS}(f)$ for the source signal in dBFS 752,
  ii. code for calculating a calibration offset to convert the power value of the source signal $P_{dBFS}(f)$ in dBFS to a power value $P_{dBSPL}(f)$ in dBSPL using a calibration equation 707 wherein calibration comprises configuring a microprocessor to calculate and interpret a baseline relationship between dBFS and dBPSL such that a zero point in dBSPL can be computed and conversion from values in dBFS to values in dBSPL is enabled, wherein the calibration offset equation is $P_{dBSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12,
  iii. code for converting the power value of the source signal to dB Phons 708 by applying a dBSPL to dBPhon Conversion equation, producing P(f),
  iv. code for computing the critical band center frequency F 709 corresponding to the frequency component for the source signal in kHz,
  v. code for determining threshold elevations values, $P_0(f)$ in dB Phons, where said values are defined by the personalized sound adjustment model 710, which is parameterized by the user adjustable input 703 b,
  vi. code for computing gains to the audio signal corresponding to the threshold elevations values in dBPhons, at each frequency component, using the perceptual model 713,
e. code for calculating correction gains of power G(f) 714, for the source signals, in dBSPL, based on the value of ΔP(f) in dB Phons, using a Gain equation 714;
f. code for reconstituting the audio signal with the corrective gains to the source signals of the audio signal, at each of the frequency components, comprising:
  i. feeding the correction gains G(f) to an amplifier 753 wherein the amplifier 753 multiplies the source signal by the corresponding corrective gains G(f),
  ii. using the Summer Block Component 715 to reconstitute the audio signal from the source signals, producing an adjusted audio signal $x_{out}(t)$; and
g. code for feeding the adjusted audio signal through a Digital to Analog Converter 716.

46. The computer readable medium storing a set of instruction of claim 45, where the Frequency Analysis Module 705 is a digital filter bank of IIR filters that breaks the signal down into various sub-band frequency components $\bar{x}(t)$, where the power of each frequency component is found by passing the frequency component through a Square Summer equation, whereby the signal is squared and added up N times, whereby the sum of the signals at the end block divided by N generates mean power values for the source signal, and where the Summer Block Component 715 is a summer operation that combines the various frequency components into output $x_{out}(t)$.

47. The computer readable medium storing a set of instruction of claim 46, where the various sub-band frequency components correspond to critical bands of hearing.

48. The computer readable medium storing a set of instruction of claim 45, where the Frequency Analysis Module 705 is an FFT operation, which outputs the Fourier transform of the input signal X(f), where the power value of the signal is found by squaring the components of this Fourier transform and where the Summer Block Component 715 is an FFT operation that performs an inverse Fourier transform, outputting the time domain signal $x_{out}(t)$.

49. The computer readable medium storing a set of instruction of claim 48, where the frequency components are grouped together to approximate sub-bands correspond to critical bands of hearing.

50. The computer-readable medium storing a set of instructions of claim 45, wherein the personalized sound adjustment model 10 is a linear estimator, which uses a linear function of the critical band center frequency F, where the Linear Slope equation is $$X_0 = [F-Y] \times b$$

Where $X_0$ is the threshold elevation at the frequency F, where the setting (b) adjustable by the user 03, represents the slope of the line in dBHL/critical band, where Y is a value selected from a range of 2-3 Bark, and where F is the critical band center frequency.

51. The computer-readable medium storing a set of instructions of claim 45, wherein the personalized sound adjustment model 10 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

52. The computer-readable medium storing a set of instructions of claim 45, wherein the personalized sound adjustment model 10 is composed of a lookup table indexed by values of parameter b and frequency, where the threshold elevation $X_0$ is found by selecting the corresponding element of the lookup table or interpolating between points in the lookup table.

53. The computer-readable medium storing a set of instructions of claim 45, wherein the perceptual model for ΔP comprises a novel Conductor Equation 13, $$S(P) = S(P + \Delta P) - S(P_0) + S(0) \text{ or,}$$

$$\Delta P = S^{-1}(S(P) + S(P_0) - S(0)) - P,$$

where S(P) is a function in Sones, a measure of perceived loudness, in terms of Phons, a measure of objective sound intensity, where S(P) is found by solving the EarSpring equation for particular boundary values and input sound intensities, where P is a measure of sound intensity of a given frequency component of the audio signal, where $P_0$ is an estimated threshold elevation at a given frequency, where the Earspring equation is written $[d^2/dt^2 + 2\beta(d/dt) + k(1 + \gamma\gamma <y^2>)]y(t) = \eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $\langle y^2 \rangle$=mean power of vibration for a given frequency component, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P, a solution y(t) to this equation can be found, which if put into the frequency domain as Y (the amplitude of the steady state response to the forcing function F(t)) can be used to compute $\langle y^2 \rangle = \frac{1}{2}|Y|^2 = S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

54. The computer-readable medium storing a set of instructions of claim 53, where the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

55. The computer readable media storing a set of instruction of claims 45 and 53, where a computational model 19 is used to estimate S(P) and $S^{-1}(S)$ consisting of a quadratic function comprising $$S(P) \cong \frac{AP^2 + BP + C}{DP^2 + EP + 1},$$

where A, B, C, D, and E are parameters which fit the quadratic function against the solution to the Earspring and Conductor equations and are stored in long term memory.

56. The computer readable media storing a set of instruction of claims 45 and 53, where the computational model 19 is used to estimate $\Delta P$ consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in long term memory.

57. The computer readable media storing a set of instruction of claims 45 and 53, where the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

58. The computer-readable medium storing a set of instructions of claim 45, wherein the corrective gains are computed in parallel for multiple frequency components using multiple processing units.

59. The computer-readable medium storing a set of instructions of claim 45, wherein the corrective gains are computed in part in parallel and in part in serial for multiple frequency components using multiple processing units.

60. The computer-readable medium storing a set of instructions of claim 45, wherein the corrective gains are computed in serial for multiple frequency components using multiple processing units.

61. The computer-readable medium storing a set of instructions of claim 45, wherein the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

62. The computer-readable medium storing a set of instructions of claim 45, wherein the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

63. The computer readable medium storing a set of instructions of claim 45, wherein the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=$-\frac{1}{120}$ when ATH(F)>0
   =$+\frac{1}{240}$ when ATH(F)<0

64. The computer readable medium storing a set of instructions of claim 45, wherein the Gain equation 17 is:

$$\Delta P_{dBSPL}(F) = \Delta P_{dBPhon}(F)(1 + kATH(F))$$

where
F=frequency
ATH(F)=Absolute Threshold of Hearing
K=$-\frac{1}{120}$ when ATH(F)>0
   =$+\frac{1}{240}$ when ATH(F)<0

65. The computer readable medium storing a set of instructions of claim 45, where the absolute threshold of hearing is computed by the formula:

$$ATH(F) = \frac{3.64}{F_{kHz}^{0.8}} - 6.5e^{-0.6(F_{kHz}-3.3)^2} + 0.001F_{kHz}^4 - 3.37$$

66. The computer readable medium storing a set of instructions of claim 45, where the critical band center frequency is the Bark frequency, which is computed by, $$CBR(F_{kHz}) = \frac{26.81}{1 + \frac{1.960}{F_{kHz}}} - 0.53$$

67. The computer readable medium storing a set of instructions of claim 45, where the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dbSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.
68. The computer readable medium storing a set of instructions of claim 45, where there are multiple source audio signals corresponding to both ears and hearing loss is estimated independently with separate user inputs for each ear, and separate gains computed for each frequency component.
69. The apparatus of claim 1 and claim 2, where the microprocessor is a DSP chip.

HEADSET FEATURING AUTOMATIC SPECTRAL ENHANCEMENT OF AUDIO SIGNALS

Background of the Invention

The present invention relates to the field of audio processing for the correction of hearing loss and also personalization of sound.

Hearing loss is a normal part of the aging process for most humans, which can also be accelerated or produced through repetitive exposure to loud noises such as rock concerts or construction equipment. Most humans begin to lose awareness of high frequency noises in their 20s. Hearing loss starts in the higher frequency register and gradually progresses to lower registers. As a result, a constant volume increase in loudness will fail to correct for the change in the frequency composition of the sound perceived by the listener, thereby distorting the perception of the sound by the listener. The aging of a large segment of the population which has been repetitively exposed to loud rock music is likely to result in a significant portion of the elderly in the near future having more progressive hearing loss in their old age than in the past.

Most hearing aids focus on the enhancement of signals specifically for speech perception. However, hearing loss affects sound across the spectrum in a consistent manner. These losses affect the enjoyment of music by causing the listener to lose his perception of sounds in a higher register. The application of standard hearing aid corrections to a musical performance can produce a displeasing effect by amplifying sound in a spectrally inconsistent manner and failing to correct for the higher register losses. In order to hear the higher frequency registers a user may increase the volume of music to potentially damaging levels.

There are many systems for sound level equalization from an audio processing standpoint. However, most of these systems use measures of sound intensity prior to impingement on the ear as a target for correction. Few systems use perceptual loudness—that is, sound as it is apparent to the listener. The human ear introduces many non-linear effects on apparent loudness, consequently, sound intensity as measured by the sound pressure level (SPL) does not correlate linearly with the sound level perceived by a human. Moreover, after hearing loss, the perceived sound level is degraded by an increasing function of frequency (higher frequencies are more degraded than lower ones).

Microphones and mechanical systems (e.g., computer software) can measure dBSPL; a sound (e.g., ~40 dBSPL) at particular frequency (e.g., 1 kHz) sounds just as loud as the sound (e.g., ~40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Iso-loudness contours are most often displayed in terms of dB intensity versus log frequency. The log frequency axis provides excessive emphasis on the lower frequencies and less emphasis on high frequencies where audiological damage most often occurs in sensioneural hearing loss.

It can be observed that everyone is "impaired" at higher frequencies unless the volume of sounds at those frequencies are very loud. Most of the spice of music is found in the high frequency region—sibilant speech, breathiness, cymbals, etc. Further, nearly everyone enjoys music more when it is played loudly. That gives that the opportunity to hear this musical spice. By using the present invention, users can gain a sense of enjoyment without needing to raise the volume of music and sounds to potentially damaging levels.

Using the equations described herein for correction of signal source amplitudes, it is found that most people with normal hearing prefer a parameter setting of around 2.5 dB per Bark, when listening at 77 dB SPL through headphones. That corresponds to a working threshold elevation of 50 dB at the highest frequencies. But since we don't live in a world of threshold level sounds, the actual gain needed for a 50 dB threshold elevation, when the sound is at 60 dBSPL and 10 kHz, is only on the order of approximately 5 dB. The gains applied are nonlinear compression to overcome the "recruitment" gain expansion produced by ear physics.

When offered the opportunity to listen through the corrective systems of the present invention, based on the hearing equations discussed herein, people with very normal hearing uniformly prefer some degree of modulation at varying frequencies.

In some prior art systems, an individualized audiogram is used to measure hearing loss for a particular individual. The sound can then be spectrally corrected using this stored audiogram pattern to reproduce a spectral correct sound in the individual's perception. This method is disadvantageous since it requires a significant number of parameters to be stored and these parameters are cumbersome and difficult to adjust accurately, even when performed by a medical professional.

The perceived loudness of sound can be modeled by a harmonic oscillator with spring constant that varies according to the mean power of vibration. This model is called the Earspring model. The Earspring equation 10,11 is written $[d^2/dt^2+2\beta(d/dt)+k(1+\gamma\gamma<y^2>)]y(t)=\eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude P in dBPhons, a solution to the Earspring equation y(t) can be found, for a particular set of boundary conditions, which is the steady state response to the forcing function. Transforming into the frequency domain we can obtain the mean power of vibration $<y^2>=\frac{1}{2}|Y|^2$, which is the Sones power of the perceived sound.

A possible set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Using the boundary conditions, we can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

Summary of the Invention

The present invention features a headset effective for enhancing audio signals to correct across a spectrum of frequencies according to a model of the spectral characteristics of hearing loss, and a model of the perceptual loudness of sound as a function of sound intensity. A method of the present invention estimates hearing loss from a function of the critical band center frequency and a single user input. A model of perceptual loudness is applied across frequencies, taking the estimated hearing loss per frequency as an input. The model allows the system to compute corrections which will cause the sound to be perceived as loudly as it should be from the perspective of the user, and in a way in which the perceived spectral composition of the sound is unaltered. The systems of the present invention compute a user-determined degree of correction to sounds at varying frequencies, allowing a listener to hear sounds, across varying frequencies, as the listener wishes to hear them without needing to raise the volume of the sounds to potentially damaging levels.

Allowing the user to control the slope with respect to frequency of the correction pattern through a user adjustable setting allows the user to tune the corrections, across the frequency spectrum, to his or her taste through a single adjustment.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.

8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12;

where P=Phons amplitude of a source signal of interest
F=Frequency
dBSPL=decibels according to sound pressure
dBFS=decibels relative to full scale 9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.

10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.

11. Digital Signal Processor ("DSP") Chip: A specialized microprocessor with an architecture for the fast operational needs of digital signal processing.

12. FFT Co-Processor: A specialized microprocessor designed for the purpose of rapidly computing Fourier transforms using a algorithm for computing Fourier transforms commonly known as the 'Fast Fourier Transform' (FFT).

13. Field Programmable Gate Array ("FPGA"): a reprogrammable electronic chip.

14. Filter banks: An array of band-pass filters that separate an input signal into multiple components, or as used herein, frequency components, each frequency component carrying a single frequency subband of the original signal.

15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.

16. Fourier transforms: A mathematical operation that computes the frequency content of an audio signal, taking a given audio signal as input and outputting magnitudes and phases across the frequency spectrum.

17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.

18. Frequency component and Frequency Component Spectrum: A frequency component, as used herein, identifies a portion of the frequency range of an audio signal. A frequency component may comprise a particular, individual frequency, frequency channels, or frequency bands. A frequency component spectrum is a plurality of frequency components.

19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.

20. Gain Block component—This component applies the gains to each corresponding frequency component or band. In some embodiments, the term gain block component is used interchangeably with a "means for applying gains to a audio signal." Said means may be, for example, an amplifier, or gain block component.

21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.

22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.

23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F_{kHz}) = \frac{26.81}{1 + \frac{1.960}{F_{kHz}}} - 0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G = g0 + (P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical value that when input to the Personalized Sound adjustment, may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference.

In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

34. RF Transceiver: Radio Frequency Transmitter/Receiver—this device interfaces directly with the antenna and can modulate an audio signal with its radio carrier frequency for transmission as well as demodulate a received radio frequency signal 35. Source signal: The Source signal, as used herein refers to a portion of the first audio signal or the audio signal of interest at a given frequency component.

36. Speaker: The speaker can be any speaker or the like capable of receiving and projecting a sound signal adjusted or corrected by the present invention.

37. Storage media: A computer readable media used for storing data, such as a hard disk, RAM, or flash memory 38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

39. Threshold elevation: Threshold elevations correlate to the minimum sound pressures required to perceive sounds at various frequencies.

Additional Terms:

1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.

2. dBSPL: Decibels sound power level—a unit of measure of sound intensity at the ear 3. dBSPL to dBPhon Conversion equation: This equation converts sound pressure level to Phons in decibels: P_dBPhon(F)=(P_dBSPL(F)−ATH(F))/(1+kATH(F)) where
F=Frequency
ATH=Absolute Threshold of Hearing
P=Phons amplitude of a source signal of interest
dBSPL=decibels according to sound pressure 4. dBFS to dBSPL Converter: This equation converts the audio signal power from audio power in decibels to audio sound pressure level in decibels 5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.

6. Gain Equation: This equation converts the gain in Phons to a gain in sound pressure level $\Delta P\_dBSPL(F)=[\Delta P]\_dBPhon(F)(1+kATH(F))$.

where:
F=Frequency
ATH=Absolute Threshold of Hearing
P=Phons amplitude of a source signal of interest
dBSPL=decibels according to sound pressure 7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.

8. Phons: Phons are objective units of sound intensity impinging upon the ear. Sound power may be converted from decibels (dBFS) to Phons using a conversion first to dBSPL then to Phons 9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.

10. Sones: Sones are subjective units of perceived sound loudness

11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1 Is a general systems architecture drawing for a wired headset.

FIG. 2 Is a general systems architecture drawing for a wireless headset.

FIG. 3. Diagrams the processing architecture of the hearing loss correction system implemented on the microprocessor.

FIG. 4 Diagrams an implementation of the Perceptual Model of the present invention using analytical solutions to the Earspring model.

FIG. 5 Diagrams an implementation of the Perceptual Model in which a Numerical approximation to the solution is made using a function approximator for which parameters have been stored in a lookup table for various values of $P_0$.

FIG. 6 Diagrams a number of possible realizations of the Personalized Sound Adjustment Model, including a linear slope function, a pattern library or lookup table, or estimation of hearing loss from ambient noise.

FIG. 7 is a graphical representation of the invention's adjustment to sound intensities at varying frequencies.

Description of Preferred Embodiments

Headset

As shown in FIG. 1, a preferred embodiment of the present invention comprises a headset 01, effective in enhancing an audio signal, across a spectrum of frequencies, to correct for hearing loss, by applying corrective gains across the frequency spectrum to a first audio signal, wherein the value of the gains are computed using a perceptual model of loudness as a function of sound intensity, as subjectively experienced by a normal human, where this perceptual model takes as inputs the sound intensity of the audio signal P and an estimate of the user's hearing loss $P_0$, wherein corrective gains are generated for each frequency by solving for a correction gain $\Delta P$ for the signal which will suffice to raise the volume of each channel so that the user will perceive it as if he had no hearing loss the headset 01 comprising:

a) an audio device 13,
b) a user input 02,
c) a microprocessor 03, coupled to the audio device and the speaker the microprocessor configured to execute applications for:
  i. an Analog to Digital converter 04;
  ii. a Frequency Analysis Module 05;
  iii. a Power Estimator Block 06;
  iv. a dBFS to dBSPL Converter 07;
  v. a dBSPL to dB Phon Converter 08;
  vi. a kHz to critical band center frequency converter 09;
  vii. a Personalized Sound Adjustment Model 10, parameterized by b;
  viii. a perceptual model component 25;
  ix. a Gain Block component 14;
  x. a Summer Block Component 15; and
  xi. a Digital to Analog Converter 16;

whereupon the microprocessor 03 receives a first audio signal which is the signal of interest via the audio device 13, whereupon, said audio signal is then transmitted to the Analog to Digital Converter 03 thereby converting the audio signal into digital format;

whereupon the audio signal is fed through the Frequency Analysis Module 04, breaking down the audio signal into frequency components;

whereupon, for each frequency component, the microprocessor 01 identifies the source signal corresponding to a particular frequency 50;

whereupon, for each frequency component, the source signal is fed to the Power Estimator 06 and whereby the Power Estimator generates a mean power value for the source signal, whereby said power value is then fed into a dB Converter to generate a power value for the source signal $P_{dBFS}(f)$ in dBFS 52;

whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$;

whereupon, for each frequency component, the dBSPL-dB Phon Converter 08 converts the power value of the source signal $P_{dBSPL}(f)$ to dB Phons by applying a dBSPL to dBPhon Conversion equation, producing $P(f)$;

whereupon, for each frequency component, the critical band frequency converter 09 converts the frequency value f of a given input from kHz to critical band frequency;

whereupon, for each frequency component, the Personalized Sound Adjustment Model 10 generates a value for $P_0(f)$ in dB Phons for the current frequency and the user adjustable input b 03, whereupon, for each frequency component, the microprocessor 01 applies the power value of the source signal $P(f)$ and the power value of the background signal $P_0(f)$, at each frequency, now in dB Phons, to the perceptual model 25, which outputs a gain value $\Delta P(f)$ in dBPhons;

whereupon, for each frequency component, the microprocessor 01 calculates a correction gain of power $G(f)$, for the source signal, in dBSPL, based on the value of $\Delta P(f)$ in dB Phons, using the Gain Block component 14 which utilizes the Gain equation; and whereupon the headset 100 reconstitutes the audio signal with the corrective gain to the source signal at the frequency, comprising:
  (i) feeding the correction gain to the amplifier, wherein the amplifier multiplies the source signal at the frequency by the corresponding corrective gain 53;
  (ii) using the Summer Block Component 16, reconstituting the audio signal, producing $x_{out}(t)$;

whereupon the audio signal is fed through the Digital to Analog Converter 17;

As shown in FIG. 2, in an alternative embodiment of the present invention, the headset may also operate via a wireless receiver such as a Bluetooth receiver module.

As shown in FIG. 3, one possible embodiment of the perceptual model involves analytically computing the value in Sones of the input signal at a given frequency $S(P)$, along with the estimated hearing loss in Sones at that frequency $S(P_0)$, and applying these values of the conductor equation to derive a gain in Phons for the signal that will correct for the perceived hearing loss, the Conductor Equation 13 being, $$S(P)=S(P+\Delta P)-S(P_0)+S(0) \text{ or,}$$

$$\Delta P=S^{-1}(S(P)+S(P_0)-S(0))-P$$

As shown in FIG. 4, an alternative embodiment for the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for $\Delta P$ for any given P and $P_0$.

As shown in FIG. 5, the Personalized Sound Adjustment Model may be implemented through various means. Since the typical hearing loss profile is approximately linear with respect to Bark frequency, hearing loss may be estimated using a linear function of Bark frequency, while allowing the user to adjust the slope of the line. In this way, a single user adjustable input may be used to estimate hearing loss by frequency. Alternatively, a library of patterns may be stored in memory, where each pattern is a typical hearing loss profile, of increasing slope relative to bark frequency. The user could then adjust a setting the selects or interpolates between these patterns, with higher settings corresponding to more hearing loss. Finally, since ambient noise is known to indice a degree of hearing loss in normal individuals an ambient noise signal could be used to compute an estimated hearing loss.

It should be apparent that any combinations of the use of a computational model or explicit computation for the Earspring and Conductor equations, parallel or series computation, or a pattern library versus the Hearing loss estimate will also fall within the scope of the present invention.

In varying embodiments, the headset may be attached to an Amplifier 17 and Speaker 18 for outputting the audio signal.

The absolute threshold of hearing may be computed in one example by the formula:

$$ATH(F) = \frac{3.64}{F_{KHz}^{0.8}} - 6.5e^{-0.6(F_{kHz}-3.3)^2} + 0.001F_{kHz}^4 - 3.37$$

As shown in FIG. 3, a computational model may be used in place of explicit computation of the Earspring and Conductor equations:

$$\Delta P \cong \frac{AP^2 + BP + C}{DP^2 + EP + 1}$$

where parameters A, B, C, D, and E are fit against the combined solution to the Earspring and Conductor equations, for each $P_0$, in 5 dB increments.

Similar to FIG. 3, it is also possible to use separate computational models for S(P) and for $S^{-1}(S)$, with separate sets of parameters fit against the solutions for various boundary parameters and values of $P_0$.

One example of the critical band center frequency is the Bark frequency which may be computed by, $$CBR(F_{kHz}) = \frac{26.81}{1 + \frac{1.960}{F_{kHz}}} - 0.53$$

In some embodiments, a pattern library may be used in place of the linear slope equation, where the user input and frequency are used to index into the pattern library and locate estimates of the threshold elevation $P_0$. These estimates may be used explicitly, or interpolation may be used to find a more precise estimate. Where the pattern library is ordered such that the user input relates monotonically to an increase in the approximate slope of estimates $P_0$ with respect to f.

As shown in FIGS. 9 and 10, the computations perform in FIGS. 7, and 8 may also be performed in parallel, through the use of threaded processes, or through the use of a parallel computing device, such as a multi-core processing unit.

As shown in FIG. 12, a typical loud but comfortable music spectral envelope, as shown in light blue, and that of the present invention, as show in dark blue, diverge at higher frequencies where the gains produced by the invention occur.

It should be apparent that any combinations of the use of a computational model or explicit computation for the Earspring and Conductor equations, parallel or series computation, or a pattern library versus the Linear slope equation will also fall within the scope of the present invention.

In some embodiments, the point where the estimate of $X_0$ is computed, may be earlier in the sequence relative to processing of the source signal.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIGS. 1 and 2, with appropriate interfaces implemented between the microprocessor and the programmable logic devices.

In some embodiments, an FFT coprocessor may be used to facilitate generation of Fourier transforms as in FIG. 3 and FIG. 8. In this case the FFT co-processor would take the place of the Frequency Analysis and Summer Block Components.

In some embodiments, the user adjustable input is controlled by a knob, or a roller, or wheel or slider, or lever, which is connected to a potentiometer or a variable resistor, which thus produces an output voltage on the electronic device which can be read by the microprocessor through an A/D converter.

In some embodiments, the user adjustable input may also be a stored setting that is adjusted through an electronic menu system using buttons to select menu parameters, or a touch-screen device in which buttons and inputs are detected when the users touches the screen or uses an implement to touch the screen.

In some embodiments, the user selectable input might also be controlled through a voice command menu, for use by physically disabled people who are unable to adjust a physical input device.

In embodiments where a pattern library or lookup table is used, the elements in the pattern library of lookup table may be obtained by collecting audiograms across a significant population and finding mean hearing loss patterns for varying degrees of hearing loss, thereby producing patterns of varying slope with respect to critical band center frequency.

In some embodiments, adjustments to the underlying linear estimation may be added to the linear equation to produce variations in the threshold elevation. For instance, these adjustments may be derived from higher order polynomial equation that modifies the estimated threshold elevation, where the adjustments are within +/−10% of the linear slope with respect to critical band center frequency.

In some embodiments, adjustments to the underlying linear estimation may be added to the linear equation or pattern library, to produce variations in the threshold elevation to more accurately compensate for the average hearing loss profile of humans. For instance, adjustments derived from collecting audiograms across a large population.

In some embodiments, adjustments to the underlying linear estimation may be added to the linear equation or pattern library, to produce variations in the threshold elevation to more accurately compensate for the individual's hearing loss profile. For instance, these adjustments may be derived from an audiogram for that individual.

In some embodiments, a library of stored threshold elevation patterns, for which a varying slope, linear in critical band center frequency, could be fit to each pattern, may be stored in memory, with the user input selecting between or interpolating between stored patterns, where the patterns are arranged in order of increasing or decreasing slope, such that monotonic changes in the user input are translated into monotonic changes in the slope of the pattern being used, and the patterns remain approximately linear in critical band center frequency.

In some embodiments, a lookup table may be stored in memory, where for each quantized value of the frequency and user input, a threshold elevation is returned, where the threshold elevation varies monotonically with respect to both the frequency and user input. (Alternatively, the threshold elevation returned is approximately linear with respect to critical band center frequency and monotonically increasing with respect to user input).

In some embodiments, the user adjustable input may be a setting on an electronic device such as a cell phone or headset, which the user modifies through a touch screen menu, trackpad, or other instrument which is used with the electronic device.

In some embodiments the user-adjustable input may be a setting on a computer, or in a software application, which the user modifies using a push button, scrollbar, or other GUI input.

In some embodiments the present invention may be accessed via a web application or interface, where this web application resides on a web page, an electronic device such as a mobile phone, or any other general computing device.

The present invention features an headset for enhancing an audio signal. The headset, or audio source as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal at a given frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In one exemplary embodiment, the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz. This equation can be solved for numerically though in practice it is more efficient to use a computational model to estimate the solution. In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

Without wishing to limit the present invention to any theory or mechanism, it is believed that the present invention is advantageous because the present invention features a maximum output volume, for example the source signal will be amplified to only a certain degree. This can help protect against damage to the user's hearing.

In some embodiments, steps for converting analog audio input signals to digital input signals can be bypassed where the invention utilizes digital input audio sources capable of receiving digital audio signals and transmitting the same to the processor.

In some embodiments, the present invention further comprises a Class D Amp which may be an electronic amplifier where all power devices are operated as binary switches. Said amplifier may be in electronic communication with the microprocessor or DSP.

In some embodiments, the present invention further comprises a low power audio codec, which may contain vDBM. Said feature may be a computer program implementing an algorithm and said codec may reside or be in electronic communication with the microprocessor or DSP.

In some embodiments, the present invention further comprises a form-fitting, insulated headset effective for comfortable receipt of a user's head while minimizing the receipt of interfering ambient noise by the user.

In some embodiments, the present invention further comprises sound sensors. Said sensors may be advantageous because they can be placed at one or more locations on the device, thereby increasing the ability of the device to detect audio signals. Said sensors may be in electronic communication with the microprocessor.

In some embodiments, the present invention further comprises an ambient noise non-speech identifier that may notify a user if sound extracted corresponds to sound in a database that is ambient, i.e., aircraft noise. In some embodiments, the headset can alert the user of the same. For example, the headset may alert the user as to the detection of sound associated with incoming enemy aircraft. Said feature may be, for example, a software feature programmed to the microprocessor.

In some embodiments, the present invention further comprises directional ambient sound microphones effective for extracting ambient noise signals from a variety of sources. Said microphones may be at predetermined locations on the external portion of the headset.

In some embodiments, the present invention further comprises voice command technology and additional devices configured to interpret and project voice commands. Said feature may utilize known speech recognition algorithms and additional software programmed to the microprocessor. Said feature may require but is not limited to extraction of audio signals from the audio device or microphone.

In some embodiments, the present invention further comprises an interconnection port which may allow the headset to communicate with additional devices where said interconnection port is in electronic communication with the microprocessor.

In some embodiments, the present invention further comprises a microphone boom. In some embodiments, the boom is foldable, flexible, or removable or a combination thereof and may function to extract sound projected by the user. Said boom may be disposed at predetermined locations on the headset and may be in electronic communication with the microprocessor.

In some embodiments, the present invention further comprises a multi-port microphone which allows multiple connections to the microphone. Said microphone may be in electronic communication with the microprocessor.

In some embodiments, the present invention further comprises a mounted ear piece for simple non-intrusive wear by a user.

In some embodiments, the present invention further comprises an intra-concha headset—where the ear piece is configured to be positioned inside the concha—the cavity surrounding the opening to the ear canal, a supranatual headset in which the ear piece is configured to rest against the pinna, or a circumatural headset in which the ear piece is configured to surround the pinna.

In some embodiments, the input component comprises an RF ("Radio Frequency") audio jack, an audio jack, a general radio connector, a Motorola Connector, a radio receiver, a transmission plug, an antennae, or any combination thereof.

Description of Additional Preferred Embodiments

In some embodiments, the present invention comprises a headset 01, effective in enhancing an audio signal across a spectrum of frequency components by applying corrective gains across the frequency component spectrum to the audio signal, where the gains correspond to a plurality of predetermined threshold elevations, said threshold elevations computed from a single parameter set by a user-adjustable setting and determined without requiring individual measurement of each threshold elevation, wherein the value of the gains are computed using a perceptual model of loudness as a function of sound intensity, as subjectively experienced by a normal human and where this perceptual model takes as inputs the sound intensity of the audio signal P and the threshold elevations at each frequency component, wherein corrective gains are generated for each frequency component by solving for a correction gain $\Delta P$.

In some embodiments, the headset further comprises:
a) an audio device 13;
b) a user input device 02, which allows a user to set a single parameter for a Personalized Sound Adjustment Model 10;
c) a microprocessor 03, coupled to the audio device and a speaker, the microprocessor 03 configured to execute applications for:
 i. an Analog to Digital converter 04,
 ii. a Frequency Analysis Module 05,
 iii. a Power Estimator Block 06,
 iv. a dBFS to dBSPL Converter 07,
 v. a dBSPL to dB Phon Converter 08,
 vi. a kHz to critical band center frequency converter 09,
 vii. the Personalized Sound Adjustment Model 10, parameterized by b, which generates a spectrum of threshold elevations,
 viii. a perceptual model component 25, which computes the gain necessary to amplify the audio signal, at each frequency component, to an amount consistent with the threshold elevation computed for said frequency component,
 ix. a Gain Block component 14 which applies the gains to each frequency component;
 x. a Summer Block Component 15, and
 xi. a Digital to Analog Converter 16, In some embodiments, a possible process flow may be as follows:

The microprocessor 03 receives the audio signal which is the signal of interest via the audio device 13, whereupon, said audio signal is then transmitted to the Analog to Digital Converter 03 thereby converting the audio signal into digital format, whereupon the audio signal is fed through the Frequency Analysis Module 04, breaking down the audio signal into frequency components, whereupon, for each frequency component, the microprocessor 01 identifies a source signal corresponding to a particular frequency component 50, whereupon, for each frequency component, the source signal is fed to the Power Estimator 06 whereby the Power Estimator generates a mean power value for the source signal, whereby said power value is then fed into a dB Converter to generate a power value for the source signal $P_{dBFS}(f)$ in dBFS 52, whereupon, at each frequency component, the microprocessor 01 completes a calibration offset to the audio signal such that the dBFS to dBSPL Converter 07 converts the power value of the source signal $P_{dBFS}(f)$ from dBFS to dBSPL, producing $P_{dBSPL}(f)$, whereupon, at each frequency component, the dBSPL-dB Phon Converter 08 converts the power value of the source signal $P_{dBSPL}(f)$ to dB Phons by applying a dBSPL to dBPhon Conversion equation, producing P(f), whereupon, at each frequency component, the critical band frequency converter 09 converts the frequency value f of the source signal from kHz to critical band frequency, whereupon, for each frequency component, the Personalized Sound Adjustment Model 10 generates a threshold elevation value for $P_0(f)$ in dB Phons derived from the current frequency and the user adjustable input parameter b 03, whereupon, for each frequency component, the microprocessor 01 applies the power value of the source signal P(f) and the corresponding threshold elevation, $P_0(f)$, to the perceptual model 25, which outputs a gain value $\Delta P(f)$ in dBPhons for the source signal at that frequency component, whereupon, for each frequency component, the microprocessor 01 calculates a correction gain of power G(f), for the source signal, in dBSPL, based on the value of $\Delta P(f)$ in dB Phons, using the Gain Block component 14 which utilizes the Gain equation, and whereupon the headset 100 reconstitutes the audio signal with the corrective gains to the audio signal at each of the frequency components, comprising:

(i) feeding the correction gain to the amplifier, wherein the amplifier multiplies the source signal at the frequency component by the corresponding corrective gain 53, (ii) using the Summer Block Component 16, reconstituting the audio signal, producing $x_{out}(t)$, whereupon the audio signal is fed through the Digital to Analog Converter 17 and wherein the headset is effective for enhancing the audio signal for users with normal hearing and also for users with impaired hearing.

In some embodiments, the audio device is a wired audio jack.

In some embodiments, the audio device is a wireless receiver.

In some embodiments, the perceptual model for ΔP comprises a novel Conductor Equation 13, $S(P)=S(P+\Delta P)-S(P_0)+S(0)$ or, $\Delta P = S^{-1}(S(P)+S(P_0)-S(0))-P,$ where S(P) is a function in Sones, a measure of perceived loudness, in terms of Phons, a measure of objective sound intensity, where S(P) is found by solving the EarSpring equation 11,12 for particular boundary values and input sound intensities, where P is a measure of sound intensity of a given channel of the audio signal in dBPhons, where $P_0$ is an estimated hearing loss at a given frequency, where the Earspring equation 11,12 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

In some embodiments, the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

In some embodiments, the perceptual model 25 is a computational model 19 used to estimate S(P) and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $S(P)=S(P+\Delta P)-S(P_0)+S(0)$ or, $\Delta P = S^{-1}(S(P)+S(P_0)-S(0))-P,$ where S(0) is a known constant offset, whereupon this equation is solved using the values of P and $P_0$, where these values are obtained from the power value of the signal and the estimated hearing loss.

In some embodiments, the perceptual model 25 is a computational model 19 used to estimate ΔP, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$.

In some embodiments, the parameters A, B, C, D, and E are fit against the Earspring and conductor equations for every $P_0$ in increments.

In some embodiments, the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the Frequency Analysis Module 20 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal 51, and where the Summer Block Component 21 is a summer operation that combines the various channels into output $x_{out}(t)$.

In some embodiments, the various sub-band channels correspond to critical bands of hearing.

In some embodiments, the Frequency Analysis Module 20 is an FFT co-processor, which outputs the Fourier transform of the input signal X(f), where the power value of the signal is found by squaring the components of this Fourier transform and where the Summer Block Component 21 is an FFT co-processor that performs an inverse Fourier transform, outputting the time domain signal $x_{out}(t)$.

In some embodiments, the frequency components are grouped together to approximate sub-bands correspond to critical bands of hearing.

In some embodiments, the personalized sound adjustment model 10 is a linear estimator, which uses a linear function of the critical band center frequency F, where the Linear Slope equation is $$X_0 = [F-Y] \times b$$

where the setting (b) adjustable by the user 03, represents the slope of the line in dBHL/critical band, where Y is a value selected from a range of 2-3 bark, and where F is the critical band center frequency. In some embodiments, the aforementioned range is 0-1 Bark, 2-4 Bark, 1-5 Bark, Or 5-10 Bark.

In some embodiments, the personalized sound adjustment model 10 is composed of a pattern library which is stored in long term memory, where the patterns are composed of points which measure threshold elevations $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency. In some embodiments, the patterns are composed of points which measure threshold elevations, X0, with respect to frequency, of which 0-20% are within +/−5 dBHL of a mean squared error linear fit to the pattern with respect to critical band center frequency. In some embodiments, the patterns are composed of points which measure threshold elevations, X0, with respect to frequency, of which 20-40% are within +/−5 dBHL of a mean squared error linear fit to the pattern with respect to critical band center frequency. In some embodiments, the patterns are composed of points which measure threshold elevations, X0, with respect to frequency, of which 40-60% are within +/−5 dBHL of a mean squared error linear fit to the pattern with respect to critical band center frequency. In some embodiments, the patterns are composed of points which measure threshold elevations, X0, with respect to frequency, of which 60-80% are within +/−5 dBHL of a mean squared error linear fit to the pattern with respect to critical band center frequency. In some embodiments, the patterns are composed of points which measure threshold elevations, X0, with respect to frequency, of which 80-100% are within +/−5 dBHL of a mean squared error linear fit to the pattern with respect to critical band center frequency. In some embodiments, the patterns are composed of points which measure threshold elevations, X0, with respect to frequency, of which 66% are within +/−5 dBHL of a mean squared error linear fit to the pattern with respect to critical band center frequency. In some embodiments, the patterns are composed of points which measure threshold elevations, X0, with respect to frequency, of which 66% are within +/−1 dBHL of a mean squared error linear fit to the pattern with respect to critical band center frequency. In some embodiments, the patterns are composed of points which measure threshold elevations, X0, with respect to frequency, of which 66% are within +/−2 dBHL of a mean squared error linear fit to the pattern with respect to critical band center frequency. In some embodiments, the patterns are composed of points which measure threshold elevations, X0, with respect to frequency, of which 66% are within 3-6 dBHL of a mean squared error linear fit to the pattern with respect to critical band center frequency. In some embodiments, the patterns are composed of points which measure threshold elevations, X0, with respect to frequency, of which 66% are within 6-10 dBHL of a mean squared error linear fit to the pattern with respect to critical band center frequency.

In some embodiments, the personalized sound adjustment model 10 is composed of a lookup table indexed by values of parameter b and frequency, where the threshold elevation $X_0$ is found by selecting the corresponding element of the lookup table or interpolating between points in the lookup table.

In some embodiments, the corrective gains are computed in parallel for multiple channels using multiple processing units.

In some embodiments, the audio signal comprises a plurality of frequency components corresponding to various frequencies and wherein a corrective gain corresponding to each respective frequency component is processed and applied to each respective frequency component before the audio signal is reconstituted with the Summer Block Component.

In some embodiments, the audio signal comprises a plurality of frequency components corresponding to various frequencies and wherein a corrective gain corresponding to each respective is processed and applied to each frequency component before the audio signal is reconstituted with the Summer Block Component, partially in series and partially in parallel.

In some embodiments, the corrective gains are computed in part in parallel and in part in serial for multiple frequency components using multiple processing units.

In some embodiments, the corrective gains are computed in serial for multiple frequency components using multiple processing units.

In some embodiments, the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
 =+1/240 when ATH(F)<0

In some embodiments, the Gain equation 17 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH(F)>0
 =+1/240 when ATH(F)<0

In some embodiments, the absolute threshold of hearing is computed by the formula:

$$ATH(F) = \frac{3.64}{F_{KHz}^{0.8}} - 6.5e^{-0.6(F_{kHz}-3.3)^2} + 0.001F_{kHz}^4 - 3.37$$

In some embodiments, the critical band center frequency is the Bark frequency, which is computed by, $$CBR(F_{kHz}) = \frac{26.81}{1 + \frac{1.960}{F_{kHz}}} - 0.53$$

In some embodiments, there are multiple source audio signals corresponding to both ears and the hearing loss is estimated independently with separate user inputs for each ear, and separate gains computed for each channel.

In some embodiments, the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.

In some embodiments, there are multiple source audio signals corresponding to both ears and hearing loss is estimated independently with separate user inputs for each ear, and separate gains computed for each frequency component.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.
These are not Claims, they are Additional Disclosure:
1. A headset 01, effective in enhancing an audio signal across a spectrum of frequency components by applying corrective gains across the frequency component spectrum to the audio signal, where the gains correspond to a plurality of predetermined threshold elevations, said threshold elevations computed from a single parameter set by a user-adjustable setting and determined without requiring individual measurement of each threshold elevation, wherein the value of the gains are computed using a perceptual model of loudness as a function of sound intensity, as subjectively experienced by a normal human and where this perceptual model takes as inputs the sound intensity of the audio signal P and the threshold elevations at each frequency component, wherein corrective gains are generated for each frequency component by solving for a correction gain $\Delta P$, the headset 01 comprising:
a) an audio device 13;
b) a user input device 02, which allows a user to set a single parameter for a Personalized Sound Adjustment Model 10;
c) a microprocessor 03, coupled to the audio device and a speaker, the microprocessor 03 configured to execute applications for:
   i. an Analog to Digital converter 04,
   ii. a Frequency Analysis Module 05,
   iii. a Power Estimator Block 06,
   iv. a dBFS to dBSPL Converter 07,
   v. a dBSPL to dB Phon Converter 08,
   vi. a kHz to critical band center frequency converter 09,
   vii. the Personalized Sound Adjustment Model 10, parameterized by b, which generates a spectrum of threshold elevations,
   viii. a perceptual model component 25, which computes the gain necessary to amplify the audio signal, at each frequency component, to an amount consistent with the threshold elevation computed for said frequency component,
   ix. a Gain Block component 14 which applies the gains to each frequency component;
   x. a Summer Block Component 15 and
   xi. a Digital to Analog Converter 16,
wherein the microprocessor 03 receives the audio signal 14 which is the signal of interest via the audio device 13,
whereupon, said audio signal 14 is then transmitted to the Analog to Digital Converter 04 thereby converting the audio signal into digital format,
whereupon the audio signal is fed through the Frequency Analysis Module 05, breaking down the audio signal into frequency components,
whereupon, for each frequency component, the microprocessor 03 identifies a source signal corresponding to a particular frequency component,
whereupon, for each frequency component, the source signal is fed to the Power Estimator 06 whereby the Power Estimator generates a mean power value for the source signal, whereby said power value is then fed into a dB Converter to generate a power value for the source signal $P_{dBFS}(f)$ in dBFS,
whereupon, at each frequency component, the microprocessor 03 completes a calibration offset to the audio signal such that the dBFS to dBSPL Converter 07 converts the power value of the source signal $P_{dBFS}(f)$ from dBFS to dBSPL, producing $P_{dBSPL}(f)$,
whereupon, at each frequency component, the dBSPL-dB Phon Converter 08 converts the power value of the source signal $P_{dBSPL}(f)$ to dB Phons by applying a dBSPL to dBPhon Conversion equation, producing P(f),
whereupon, at each frequency component, the critical band frequency converter 09 converts the frequency value f of the source signal from kHz to critical band frequency,
whereupon, for each frequency component, the Personalized Sound Adjustment Model 10 generates a threshold elevation value for $P_0(f)$ in dB Phons derived from the current frequency and the user adjustable input parameter b 02,
whereupon, for each frequency component, the microprocessor 03 applies the power value of the source signal P(f) and the corresponding threshold elevation, $P_0(f)$, to the perceptual model 25, which outputs a gain value $\Delta P(f)$ in dBPhons for the source signal at that frequency component,
whereupon, for each frequency component, the microprocessor 03 calculates a correction gain of power G(f), for the source signal, in dBSPL, based on the value of $\Delta P(f)$ in dB Phons, using the Gain Block component 14 which utilizes the Gain equation, and
whereupon the headset 01 reconstitutes the audio signal with the corrective gains to the audio signal at each of the frequency components, comprising:

(i) feeding the correction gain to the amplifier, wherein the amplifier multiplies the source signal at the frequency component by the corresponding corrective gain 14,
(ii) using the Summer Block Component 15, reconstituting the audio signal, producing $x_{out}(t)$,
whereupon the audio signal is fed through the Digital to Analog Converter 16 and
wherein the headset is effective for enhancing the audio signal for users with normal hearing and also for users with impaired hearing.

2. The headset of claim 1, where the audio device is a wired audio jack.

3. The headset of claim 1, where the audio device is a wireless receiver.

4. The headset of claim 1, wherein the perceptual model for ΔP comprises a novel Conductor Equation 313, $$S(P)=S(P+\Delta P)-S(P_0)+S(0) \text{ or,}$$

$$\Delta P=S^{-1}(S(P)+S(P_0)-S(0))-P,$$

where S(P) is a function in Sones, a measure of perceived loudness, in terms of Phons, a measure of objective sound intensity, where S(P) is found by solving the EarSpring equation 311,312 for particular boundary values and input sound intensities, where P is a measure of sound intensity of a given channel of the audio signal in dBPhons, where $P_0$ is an estimated hearing loss at a given frequency, where the Earspring equation 311,312 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

5. The headset of claim 4, where the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

6. The headset of claim 1, where the perceptual model 25 is a computational model 19 used to estimate S(P) and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $$S(P)=S(P+\Delta P)-S(P_0)+S(0) \text{ or,}$$

$$\Delta P=S^{-1}(S(P)+S(P_0)-S(0))-P,$$

where S(0) is a known constant offset, whereupon this equation is solved using the values of P and $P_0$, where these values are obtained from the power value of the signal and the estimated hearing loss.

7. The headset of claim 1, where the perceptual model 25 is a computational model used to estimate ΔP, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$.

8. The headset of claim 7, where values of the parameters A, B, C, D, and E are fit against the Earspring and conductor equations for every $P_0$ in increments.

9. The headset of claim 1, where the computational model is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

10. The headset of claim 1, where the Frequency Analysis Module 05 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal, and where the Summer Block Component 15 is a summer operation that combines the various channels into output $x_{out}(t)$ 11. The headset of claim 10, where the various sub-band channels correspond to critical bands of hearing.

12. The headset of claim 1, where the Frequency Analysis Module 05 is an FFT co-processor, which outputs the Fourier transform of the input signal X(f), where the power value of the signal is found by squaring the components of this Fourier transform and where the Summer Block Component 15 is an FFT co-processor that performs an inverse Fourier transform, outputting the time domain signal $x_{out}(t)$.

13. The headset of claim 1, where the frequency components are grouped together to approximate sub-bands correspond to critical bands of hearing.

14. The headset of claim 1, wherein the personalized sound adjustment model 10 is a linear estimator, which uses a linear function of the critical band center frequency F, where the Linear Slope equation is $$X_0 = [F-Y] \times b$$

where the setting (b) adjustable by the user 02, represents the slope of the line in dBHL/critical band, where Y is a value selected from a range of 2-3 bark, and where F is the critical band center frequency.

15. The headset of claim 1, wherein the personalized sound adjustment model 10 is composed of a pattern library which is stored in long term memory, where the patterns are composed of points which measure threshold elevations $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 02 bears a monotonic relationship to the estimated $X_0$ for each critical band center frequency.

16. The headset of claim 1, wherein the personalized sound adjustment model 10 is composed of a lookup table indexed by values of parameter b and frequency, where the threshold elevation $X_0$ is found by selecting the corresponding element of the lookup table or interpolating between points in the lookup table.

17. The headset of claim 1, wherein the corrective gains are computed in parallel for multiple channels using multiple processing units.

18. The headset of claim 1 wherein the audio signal comprises a plurality of frequency components corresponding to various frequencies and wherein a corrective gain corresponding to each respective frequency component is processed and applied to each respective frequency component before the audio signal is reconstituted with the Summer Block Component.

19. The headset of claim 1, wherein the audio signal comprises a plurality of frequency components corresponding to various frequencies and wherein a corrective gain corresponding to each respective is processed and applied to each frequency component before the audio signal is reconstituted with the Summer Block Component, partially in series and partially in parallel.

20. The headset of claim 1, wherein the corrective gains are computed in part in parallel and in part in serial for multiple frequency components using multiple processing units.

21. The headset of claim 1 wherein the corrective gains are computed in serial for multiple frequency components using multiple processing units.

22. The headset of claim 1, wherein the dBSPL to dBPhon Conversion equation 08,208 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
=+1/240 when ATH(F)<0

23. The headset of claim 1, wherein the Gain equation 17 is:

$$\Delta P_{dBSPL}(F) = \Delta P_{dBPhon}(F)(1 + kATH(F))$$

where
F=frequency
ATH(F)=Absolute Threshold of Hearing
K=−1/120 when ATH(F)>0
=+1/240 when ATH(F)<0

24. The headset of claim 1, where the absolute threshold of hearing is computed by the formula:

$$ATH(F) = \frac{3.64}{F_{kHz}^{0.8}} - 6.5e^{-0.6(F_{kHz}-3.3)^2} + 0.001 F_{kHz}^4 - 3.37$$

25. The headset of claim 1, where the critical band center frequency is the Bark frequency, which is computed by, $$CBR(F_{kHz}) = \frac{26.81}{1 + \frac{1.960}{F_{kHz}}} - 0.53$$

26. The headset of claim 1, where there are multiple source audio signals corresponding to both ears and the hearing loss is estimated independently with separate user inputs for each ear, and separate gains computed for each channel.

27. The headset of claim 1 wherein the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.

28. The headset of claim 1 where there are multiple source audio signals corresponding to both ears and hearing loss is estimated independently with separate user inputs for each ear, and separate gains computed for each frequency component.

PERSONAL COMMUNICATIONS DEVICE WITH SPECTRAL ENHANCEMENT OF AUDIO SIGNALS

Background of the Invention

The present invention relates to the field of audio processing for the correction of hearing loss and also personalization of sound.

Hearing loss is a normal part of the aging process for most humans, which can also be accelerated or produced through repetitive exposure to loud noises such as rock concerts or construction equipment. Most humans begin to lose awareness of high frequency noises in their 20s. Hearing loss starts in the higher frequency register and gradually progresses to lower registers. As a result, a constant volume increase in loudness will fail to correct for the change in the frequency composition of the sound perceived by the listener, thereby distorting the perception of the sound by the listener. The aging of a large segment of the population which has been repetitively exposed to loud rock music is likely to result in a significant portion of the elderly in the near future having more progressive hearing loss in their old age than in the past.

Most hearing aids focus on the enhancement of signals specifically for speech perception. However, hearing loss affects sound across the spectrum in a consistent manner. These losses affect the enjoyment of music by causing the listener to lose his perception of sounds in a higher register. The application of standard hearing aid corrections to a musical performance can produce a displeasing effect by amplifying sound in a spectrally inconsistent manner and failing to correct for the higher register losses. In order to hear the higher frequency registers a user may increase the volume of music to potentially damaging levels.

There are many systems for sound level equalization from an audio processing standpoint. However, most of these systems use measures of sound intensity prior to impingement on the ear as a target for correction. Few systems use perceptual loudness—that is, sound as it is apparent to the listener. The human ear introduces many non-linear effects on apparent loudness, consequently, sound intensity as measured by the sound pressure level (SPL) does not correlate linearly with the sound level perceived by a human. Moreover, after hearing loss, the perceived sound level is degraded by an increasing function of frequency (higher frequencies are more degraded than lower ones).

Microphones and mechanical systems (e.g., computer software) can measure dBSPL; a sound (e.g., ~40 dBSPL) at particular frequency (e.g., 1 kHz) sounds just as loud as the sound (e.g., ~40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL (incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Iso-loudness contours are most often displayed in terms of dB intensity versus log frequency. The log frequency axis provides excessive emphasis on the lower frequencies and less emphasis on high frequencies where audiological damage most often occurs in sensioneural hearing loss.

It can be observed that everyone is "impaired" at higher frequencies unless the volume of sounds at those frequencies are very loud. Most of the spice of music is found in the high frequency region—sibilant speech, breathiness, cymbals, etc. Further, nearly everyone enjoys music more when it is played loudly. That gives that the opportunity to hear this musical spice. By using the present invention, users can gain a sense of enjoyment without needing to raise the volume of music and sounds to potentially damaging levels.

Using the equations described herein for correction of signal source amplitudes, it is found that most people with normal hearing prefer a parameter setting of around 2.5 dB per Bark, when listening at 77 dB SPL through headphones. That corresponds to a working threshold elevation of 50 dB at the highest frequencies. But since we don't live in a world of threshold level sounds, the actual gain needed for a 50 dB threshold elevation, when the sound is at 60 dBSPL and 10 kHz, is only on the order of approximately 5 dB. The gains applied are nonlinear compression to overcome the "recruitment" gain expansion produced by ear physics.

When offered the opportunity to listen through the corrective systems of the present invention, based on the hearing equations discussed herein, people with very normal hearing uniformly prefer some degree of modulation at varying frequencies.

In some prior art systems, an individualized audiogram is used to measure hearing loss for a particular individual. The sound can then be spectrally corrected using this stored audiogram pattern to reproduce a spectral correct sound in the individual's perception. This method is disadvantageous since it requires a significant number of parameters to be stored and these parameters are cumbersome and difficult to adjust accurately, even when performed by a medical professional.

The perceived loudness of sound can be modeled by a harmonic oscillator with spring constant that varies according to the mean power of vibration. This model is called the Earspring model. The Earspring equation 10,11 is written $[d^2/dt^2 + 2\beta(d/dt) + k(1+\gamma\gamma<y^2>)]y(t) = \eta F(t)$, where $t$=time, $y(t)$=amplitude of vibration, $F(t)$=driving force in terms of Phons amplitude or sound intensity, $<y^2>$=mean power of vibration or S(P), identified as the Sones power in the following equations, $\beta$=damping constant, $k$=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of $y$, this equation is nonlinear.

For a particular driving force $F(t)$, which we will consider to be a sinusoid at a given frequency and amplitude P in dBPhons, a solution to the Earspring equation $y(t)$ can be found, for a particular set of boundary conditions, which is the steady state response to the forcing function. Transforming into the frequency domain we can obtain the mean power of vibration $<y^2>=\frac{1}{2}|Y|^2$, which is the Sones power of the perceived sound.

A possible set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Using the boundary conditions, we can derive an equation for S(P), $$S(P) = \frac{(4\hat{\beta}^2 + \Gamma_{40}^2)}{(4\hat{\beta}^2 + (\Gamma_{40} S(P))^2)} 10^{(P-40)/10},$$

where S(P) is the perceived loudness in Sones which the listener experiences, and P is the sound intensity impinging on the ear in dBPhons. Where $\hat{\beta} = \beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

Summary of the Invention

The present invention features a personal communications device effective for enhancing audio signals to correct across a spectrum of frequencies according to a model of the spectral characteristics of hearing loss, and a model of the perceptual loudness of sound as a function of sound intensity. A method of the present invention estimates hearing loss from a function of the critical band center frequency and a single user input. A model of perceptual loudness is applied across frequencies, taking the estimated hearing loss per frequency as an input. The model allows the system to compute corrections which will cause the sound to be perceived as loudly as it should be from the perspective of the user, and in a way in which the perceived spectral composition of the sound is unaltered. The systems of the present invention compute a user-determined degree of correction to sounds at varying frequencies, allowing a listener to hear sounds, across varying frequencies, as the listener wishes to hear them without needing to raise the volume of the sounds to potentially damaging levels. Systems may be incorporated into apparatuses including but not limited to mobile phones, music players and virtual audio ports.

Allowing the user to control the slope with respect to frequency of the correction pattern through a user adjustable setting allows the user to tune the corrections, across the frequency spectrum, to his or her taste through a single adjustment.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12; where P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.

16. Fourier transforms: A mathematical operation that computes the frequency content of an audio signal, taking a given audio signal as input and outputting magnitudes and phases across the frequency spectrum.

17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.

18. Frequency component and Frequency Component Spectrum: A frequency component, as used herein, identifies a portion of the frequency range of an audio signal. A frequency component may comprise a particular, individual frequency, frequency channels, or frequency bands. A frequency component spectrum is a plurality of frequency components.

19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.

20. Gain Block component—This component applies the gains to each corresponding frequency component or band. In some embodiments, the term gain block component is used interchangeably with a "means for applying gains to a audio signal." Said means may be, for example, an amplifier, or gain block component.

21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.

22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.

23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F_{kHz}) = \frac{26.81}{1 + \frac{1.960}{F_{kHz}}} - 0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G=g0+(P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression,
whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical value that when input to the Personalized Sound adjustment, may generate a spectrum of threshold elevations.
30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.
31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference.

In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.
33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^{\alpha} + P_{NOISE}^{\alpha} - P_{THRQ}^{\alpha}}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.
34. RF Transceiver: Radio Frequency Transmitter/Receiver—this device interfaces directly with the antenna and can modulate an audio signal with its radio carrier frequency for transmission as well as demodulate a received radio frequency signal
35. Source signal: The Source signal, as used herein refers to a portion of the first audio signal or the audio signal of interest at a given frequency component.
36. Speaker: The speaker can be any speaker or the like capable of receiving and projecting a sound signal adjusted or corrected by the present invention.

37. Storage media: A computer readable media used for storing data, such as a hard disk, RAM, or flash memory
38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.
39. Threshold elevation: Threshold elevations correlate to the minimum sound pressures required to perceive sounds at various frequencies.

Additional Terms:
1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.
2. dBSPL: Decibels sound power level—a unit of measure of sound intensity at the ear
3. dBSPL to dBPhon Conversion equation: This equation converts sound pressure level to Phons in decibels: P_dBPhon(F)=(P_dBSPL(F)−ATH(F))/(1+kATH(F))
    where
    F=Frequency
    ATH=Absolute Threshold of Hearing
    P=Phons amplitude of a source signal of interest
    dBSPL=decibels according to sound pressure
4. dBFS to dBSPL Converter: This equation converts the audio signal power from audio power in decibels to audio sound pressure level in decibels
5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
6. Gain Equation: This equation converts the gain in Phons to a gain in sound pressure level $$\Delta P\_dBSPL(F)=[\Delta P]\_dBPhon(F)(1+kATH(F)).$$

where:
    F=Frequency
    ATH=Absolute Threshold of Hearing
    P=Phons amplitude of a source signal of interest
    dBSPL=decibels according to sound pressure
7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
8. Phons: Phons are objective units of sound intensity impinging upon the ear. Sound power may be converted from decibels (dBFS) to Phons using a conversion first to dBSPL then to Phons
9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
10. Sones: Sones are subjective units of perceived sound loudness
11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1. is a general systems architecture drawing for a mobile phone where the hearing loss correction is implemented in an integrated DSP chip.

FIG. 2. is a general systems architecture drawing for a mobile phone where the hearing loss correction is implemented in an external DSP chip after the audio codec.

FIG. 3. Diagrams the processing architecture of the hearing loss correction system implemented on the microprocessor.

FIG. 4 Diagrams an implementation of the Perceptual Model of the present invention using analytical solutions to the Earspring model.

FIG. 5 Diagrams an implementation of the Perceptual Model in which a Numerical approximation to the solution is made using a function approximator for which parameters have been stored in a lookup table for various values of $P_0$.

FIG. 6 Diagrams a number of possible realizations of the personalized sound adjustment model, including a linear slope function, a pattern library or lookup table, or estimation of hearing loss from ambient noise.

FIG. 7 is a drawing of a possible process flow for the present invention in which all computations are performed in series.

FIG. 8 is a drawing of a possible process flow for the present invention, in which all computations are performed in parallel.

FIG. 9 is a graphical representation of the invention's adjustment to sound intensities at varying frequencies.

Description of Preferred Embodiments

Personal Communications Device

A personal communications device 01, effective in enhancing an audio signal, across a spectrum of frequencies, to correct for hearing loss, by applying corrective gains across the frequency spectrum to a first audio signal, wherein the value of the gains are computed using a perceptual model of loudness as a function of sound intensity, as subjectively experienced by a normal human, where this perceptual model takes as inputs the sound intensity of the audio signal P and an estimate of the user's hearing loss $P_0$, wherein corrective gains are generated for each frequency by solving for a correction gain ΔP for the signal which will suffice to raise the volume of each channel so that the user will perceive it as if he had no hearing loss the personal communications device 01 comprising:
  a) a microprocessor 02, the microprocessor being a mucticore processor with an integrated digital signal processor (DSP) 03,
  b) a RF transmitter/receiver 04, coupled to the microprocessor,
  c) an audio codec 05, coupled to the microprocessor, which effectuates the decoding of audio signals for output by a speaker, and the encoding of voice and noise audio received by the first and second microphones,
  d) a display screen 06, coupled to the microprocessor, upon which the microprocessor may display information for the user to view,
  e) a keypad 07, couple to the microprocessor, which the user actuates to enter data into the microprocessor,
  f) a data storage/program memory unit 08, coupled to the microprocessor, which the microprocessor uses to store program code and variables,
  g) a speaker 10, coupled to the audio codec 05, disposed upon the phone in a location ergonomically suitable for listening through the user's ear when using the phone,
  h) the digital signal processor (DSP) 03, the DSP configured to execute applications for:
    i. an Analog to Digital converter 04;
    ii. a Frequency Analysis Module 05;
    iii. a Power Estimator Block 06;
    iv. a dBFS to dBSPL Converter 07;
    v. a dBSPL to dB Phon Converter 08;
    vi. a kHz to critical band center frequency converter 09;
    vii. a Personalized sound adjustment model 10, parameterized by b;
    viii. a perceptual model component 25;
    ix. a Gain Block component 14;
    x. a Summer block component 15; and
    xi. a Digital to Analog Converter 16;

whereupon the microprocessor 02 receives a first audio signal which is the signal of interest via the RF transmitter 03,
whereupon the first audio signal 202 is input to the DSP,
whereupon, said audio signal is then transmitted to the Analog to Digital Converter 03 thereby converting the audio signal into digital format;
whereupon the audio signal is fed through the Frequency Analysis Module 04, breaking down the audio signal into frequency components;
whereupon, for each frequency component, the microprocessor 01 identifies the source signal corresponding to a particular frequency 50;
whereupon, for each frequency component, the source signal is fed to the Power Estimator 06 and whereby the Power Estimator generates a mean power value for the source signal, whereby said power value is then fed into a dB Converter to generate a power value for the source signal $P_{dBFS}(f)$ in dBFS 52;
whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$;
whereupon, for each frequency component, the dBSPL-dB Phon Converter 08 converts the power value of the source signal $P_{dBSPL}(f)$ to dB Phons by applying a dBSPL to dBPhon Conversion equation, producing $P(f)$;
whereupon, for each frequency component, the critical band frequency converter 09 converts the frequency value f of a given input from kHz to critical band frequency;
whereupon, for each frequency component, the Personalized sound adjustment model 10 generates a value for $P_0(f)$ in dB Phons for the current frequency and the user adjustable input b 03,
whereupon, for each frequency component, the microprocessor 01 applies the power value of the source signal $P(f)$ and the power value of the background signal $P_0(f)$, at each frequency, now in dB Phons, to the perceptual model 25, which outputs a gain value $\Delta P(f)$ in dBPhons;
whereupon, for each frequency component, the microprocessor 01 calculates a correction gain of power $G(f)$, for the source signal, in dBSPL, based on the value of $\Delta P(f)$ in dB Phons, using the Gain Block component 14 which utilizes the Gain equation; and
whereupon the personal communications device 100 reconstitutes the audio signal with the corrective gain to the source signal at the frequency, comprising:
  (i) feeding the correction gain to the amplifier, wherein the amplifier multiplies the source signal at the frequency by the corresponding corrective gain 53;
  (ii) using the Summer block component 16, reconstituting the audio signal, producing $x_{out}(t)$;
whereupon the audio signal is fed through the Digital to Analog Converter 17;

As shown in FIG. 3, one possible embodiment of the perceptual model involves analytically computing the value in Sones of the input signal at a given frequency $S(P)$, along with the estimated hearing loss in Sones at that frequency $S(P_0)$, and applying these values of the conductor equation to derive a gain in Phons for the signal that will correct for the perceived hearing loss, the Conductor Equation 13 being, $$S(P)=S(P+\Delta P)-S(P_0)+S(0) \text{ or,}$$

$$\Delta P=S^{-1}(S(P)+S(P_0)-S(0))-P$$

As shown in FIG. 4, an alternative embodiment for the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for ΔP for any given P and $P_0$.

As shown in FIG. 5, the personalized sound adjustment model may be implemented through various means. Since the typical hearing loss profile is approximately linear with respect to Bark frequency, hearing loss may be estimated using a linear function of Bark frequency, while allowing the user to adjust the slope of the line. In this way, a single user adjustable input may be used to estimate hearing loss by frequency. Alternatively, a library of patterns may be stored in memory, where each pattern is a typical hearing loss profile, of increasing slope relative to bark frequency. The user could then adjust a setting the selects or interpolates between these patterns, with higher settings corresponding to more hearing loss. Finally, since ambient noise is know to indice a degree of hearing loss in normal individuals an ambient noise signal could be used to compute an estimated hearing loss.

It should be apparent that any combinations of the use of a computational model or explicit computation for the Earspring and Conductor equations, parallel or series computation, or a pattern library versus the Hearing loss estimate will also fall within the scope of the present invention.

In varying embodiments, the personal communications device may be attached to an Amplifier 17 and Speaker 18 for outputting the audio signal.

Computer Readable Media

In some embodiments, as explained by FIG. 7 and its description, the present invention can be enabled on a computer readable medium, the computer-readable medium comprising:

a. code for extracting an input audio signal x(t) 02;
b. code for obtaining the value of a user controlled input 03 *b*, which is to be a parameter of the personalized sound adjustment model 06;
c. code for filtering x(t) into a plurality of channels 03 where the audio signal is broken down into separate channels $\bar{x}(t)$ corresponding to various critical bands;
d. code for solving for the corrective gains 10 which comprises:
   i. code for extracting a power value of the source signal P(f) in the various bands, in dBFS with a power estimator block 06, comprising:
      (A) identifying the source signal band, wherein the source signal band is a particular channel of the audio signal corresponding to the frequency 50;
      (B) feeding the source signal through a squared summer equation 51 whereby the source signal is squared and added up N times, whereby the sum of the signal at the end block divided by N generates a mean power value for the source signal, whereby said power value is then fed into a dB Converter to generate a power value $P_{dBFS}(f)$ for the source signal in dBFS 52;
   ii. code for calculating a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dbSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12;
   iii. code for converting the power value of the source signal to dB Phons 08 by applying a dBSPL to dBPhon Conversion equation, producing P(f);
   iv. code for computing the critical band center frequency F 09 corresponding to the frequency f for the current signal band in kHz;
   v. code for determining the value of the threshold elevation $P_0(f)$ in dB Phons, where said value is defined by the personalized sound adjustment model 10, which is parameterized by the user adjustable input 03 *b*;
   vi. code for computing the value of S(P(f)) and $S(P_0(f))$ 11,12 for the Earspring model, which take the source signal P and threshold elevation $P_0$ in dBPhons and computes perceptual sound levels in Sones
   vii. code for computing the value of ΔP(f) needed to correct for the perceived hearing loss, for a frequency f, using the Conductor Equation 13
h. code for calculating a correction gain of power G(f) 14, for the source signal, in dBSPL, based on the value of ΔP(f) in dB Phons, using a Gain equation 14;
i. code for reconstituting the audio signal with the corrective gain to the source signal at the frequency, comprising i. feeding the correction gains G(f) to an Amplifier 53 wherein the Amplifier 53 multiplies the source signal channels $\bar{x}(t)$ by the corresponding corrective gains G(f), producing $\bar{x}_{out}(t)$;
   ii. combining, using a Summer Block 15, the channels of the corrected audio signal to reconstitute the audio signal producing $x_{out}(t)$;
j. code for feeding the audio signal through a Digital to Analog Converter 16;

wherein the dBSPL to dBPhon Conversion equation 08 is:

$$P_{dBPhon}(F) = \frac{P_{dBSPL}(F) - ATH(F)}{1 + kATH(F)}$$

wherein the Gain equation 13 is:

$$\Delta P_{dBSPL}(F) = \Delta P_{dBPhon}(F)(1 + kATH(F))$$

where
F=frequency
ATH(F)=Absolute Threshold of Hearing
K=−1/120 when ATH(F)>0
=+1/240 when ATH(F)<0

The absolute threshold of hearing may be computed in one example by the formula:

$$ATH(F) = \frac{3.64}{F_{KHz}^{0.8}} - 6.5e^{-0.6(F_{kHz}-3.3)^2} + 0.001F_{kHz}^4 - 3.37$$

As shown in FIG. 3, a computational model may be used in place of explicit computation of the Earspring and Conductor equations:

$$\Delta P \cong \frac{AP^2 + BP + C}{DP^2 + EP + 1}$$

where parameters A, B, C, D, and E are fit against the combined solution to the Earspring and Conductor equations, for each $P_0$, in 5 dB increments.

Similar to FIG. 3, it is also possible to use separate computational models for S(P) and for $S^{-1}(S)$, with separate sets of parameters fit against the solutions for various boundary parameters and values of $P_0$.

One example of the critical band center frequency is the Bark frequency which may be computed by, $$CBR(F_{kHz}) = \frac{26.81}{1 + \frac{1.960}{F_{kHz}}} - 0.53$$

In some embodiments, a pattern library may be used in place of the linear slope equation, where the user input and frequency are used to index into the pattern library and locate estimates of the threshold elevation $P_0$. These estimates may be used explicitly, or interpolation may be used to find a more precise estimate. Where the pattern library is ordered such that the user input relates monotonically to an increase in the approximate slope of estimates $P_0$ with respect to f.

As shown in FIG. 9, a typical loud but comfortable music spectral envelope, as shown in light blue, and that of the present invention, as show in dark blue, diverge at higher frequencies where the gains produced by the invention occur.

It should be apparent that any combinations of the use of a computational model or explicit computation for the Earspring and Conductor equations, parallel or series computation, or a pattern library versus the Linear slope equation will also fall within the scope of the present invention.

In some embodiments, the point where the estimate of $X_0$ is computed, may be earlier in the sequence relative to processing of the source signal.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, an FFT coprocessor may be used to facilitate generation of Fourier transform. In this case the FFT co-processor would take the place of the Frequency Analysis and Summer block components.

In varying embodiments, the user adjustable input is controlled by a knob, or a roller, or wheel or slider, or lever, which is connected to a potentiometer or a variable resistor, which thus produces an output voltage on the electronic device which can be read by the microprocessor through an A/D converter.

The user adjustable input may also be a stored setting that is adjusted through an electronic menu system using buttons to select menu parameters, or a touchscreen device in which buttons and inputs are detected when the users touches the screen or uses an implement to touch the screen.

The user selectable input might also be controlled through a voice command menu, for use by physically disabled people who are unable to adjust a physical input device.

In embodiments where a pattern library or lookup table is used, the elements in the pattern library of lookup table may be obtained by collecting audiograms across a significant population and finding mean hearing loss patterns for varying degrees of hearing loss, thereby producing patterns of varying slope with respect to critical band center frequency.

In some embodiments, adjustments to the underlying linear estimation may be added to the linear equation to produce variations in the threshold elevation. For instance, these adjustments may be derived from higher order polynomial equation that modifies the estimated threshold elevation, where the adjustments are within +/−10% of the linear slope with respect to critical band center frequency.

In some embodiments, adjustments to the underlying linear estimation may be added to the linear equation or pattern library, to produce variations in the threshold elevation to more accurately compensate for the average hearing loss profile of humans. For instance, adjustments derived from collecting audiograms across a large population.

In some embodiments, adjustments to the underlying linear estimation may be added to the linear equation or pattern library, to produce variations in the threshold elevation to more accurately compensate for the individual's hearing loss profile. For instance, these adjustments may be derived from an audiogram for that individual.

In some embodiments, a library of stored threshold elevation patterns, for which a varying slope, linear in critical band center frequency, could be fit to each pattern, may be stored in memory, with the user input selecting between or interpolating between stored patterns, where the patterns are arranged in order of increasing or decreasing slope, such that monotonic changes in the user input are translated into monotonic changes in the slope of the pattern being used, and the patterns remain approximately linear in critical band center frequency.

In some embodiments, a lookup table may be stored in memory, where for each quantized value of the frequency and user input, a threshold elevation is returned, where the threshold elevation varies monotonically with respect to both the frequency and user input. (Alternatively, the threshold elevation returned is approximately linear with respect to critical band center frequency and monotonically increasing with respect to user input).

In some embodiments, the user adjustable input may be a setting on an electronic device such as a cell phone or personal communications device, which the user modifies through a touch screen menu, trackpad, or other instrument which is used with the electronic device.

In some embodiments the user-adjustable input may be a setting on a computer, or in a software application, which the user modifies using a push button, scrollbar, or other GUI input.

In some embodiments the present invention may be accessed via a web application or interface, where this web application resides on a web page, an electronic device such as a mobile phone, or any other general computing device.

The present invention features an personal communications device for enhancing an audio signal. The personal communications device, or audio source as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal at a given frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In one exemplary embodiment, the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Without wishing to limit the present invention to any theory or mechanism, it is believed that the present invention is advantageous because the present invention features a maximum output volume, for example the source signal will be amplified to only a certain degree. This can help protect against damage to the user's hearing.

In some embodiments, steps for converting analog audio input signals to digital input signals can be bypassed where the invention utilizes digital input audio sources capable of receiving digital audio signals and transmitting the same to the processor.

Personal communications devices are becoming more sophisticated, including using features such as streaming audio, streaming video and radio reception.

The term "personal communication device" is used throughout this document to refer to a device which has the capacity to send and receive a wide variety of audio signals and video signals between a remote system and a network infrastructure.

As discussed herein, "networks" may be conventional land line, wireless, radio transmission, satellite transmission, microwave transmission, fiber optic, or any combination thereof.

In some embodiments, the present invention further comprises an output transducer. Said transducer may be a substance or device, such as a piezoelectric crystal, microphone, or photoelectric cell. Said transducers are effective to convert input energy of one form into output energy of another. An output transducer may be in electronic communication with the microprocessor or DSP.

In some embodiments, the present invention further comprises one or more sensors for sensing audio signals. Said sensors may be advantageous because they can be placed at one or more locations on the device, thereby increasing the ability of the device to detect audio signals. Said sensors may be in electronic communication with the microprocessor or DSP.

In some embodiments, the present invention further comprises a remote server for storing user information such as parameters. In some embodiments, the remote server can process audio information. Said feature may be in communication with the microprocessor or DSP.

In some embodiments, the present invention further comprises a server provider network. For example, the present invention may communicate with a cell phone service network and may make audio adjustments at various locations throughout the network. Said feature greatly enhances the flexibility of the present invention. Said feature may be in communication with the microprocessor or DSP.

In some embodiments, the present invention further comprises a combination of vTuning and vDBM. For example, the present invention may dynamically adjust audio signals to account for interfering ambient noise while also making a spectral sound adjustment to the signal of interest to personalize sound according to a user's preference. Said feature may be enabled, for example, where the microprocessor or DSP contains both instructions for vTuning and vDBM.

In some embodiments, the present invention further comprises removable memory devices for storing hearing preferences and profiles. Said memory devices may be, for example, zip drives, memory sticks, memory cards, or the like. Said feature may be in communication with the microprocessor or DSP.

In some embodiments, the present invention further comprises a composite profile. Said feature may, for example, be electronically stored on the microprocessor or DSP.

In some embodiments, the present invention further comprises accessory ports. Said ports are effective for allowing the present invention to communicate with additional devices. Said feature may be in communication with the microprocessor or DSP and may be in predetermined locations on the device in places convenient for contact with external devices and connecting peripherals.

In some embodiments, the present invention further comprises streaming audio, or audio that is constantly received by and presented to an end-user while being delivered by a streaming provider. Said audio may be received be received by the present invention at the audio device.

In some embodiments, the present invention further comprises streaming video, or video that is constantly received by and presented to an end-user while being delivered by a streaming provider. Said video may be received be received by the present invention at the audio device.

In some embodiments, the present invention further comprises radio reception. Radio reception may be via the of, for example, an antennae where said antennae is in electronic communication with the microprocessor or DSP.

In some embodiments, the present invention further comprises resources configured to prompt the user to provide information such as sound alerts, or messages displayed on a screen. Said feature may be instructions encoded to or programmed on the microprocessor or DSP.

In some embodiments, the present invention further comprises a communication network, effective for sharing information with external devices and systems. Said network may be wired, or wireless.

In some embodiments, the present invention further comprises an input/output controller. Said device may bea device that interfaces between an input or output device and a computer or hardware device, such as, for example, the microprocessor or DSP.

In some embodiments, the present invention further comprises one or more of the following peripherals: a USB port, an infrared port, or a storage device. Said peripherals enable the present invention communicate with one or more external devices. Said peripherals may be located at predetermined locations on the personal communications device and be in electronic communication with the microprocessor or DSP.

In some embodiments, the present invention further comprises common network protocols, which may be stored on the microprocessor or DSP, for sending and receiving information to and from a mobile phone include AMPS (analog signal), TDMA (Time division multiple access), including GSM (General system for mobile), CDMA (code division multiple access), and GPRS (general packet radio service). There are other standards that comprise a sub or super set of these general classifications. The aforementioned are mentioned to include signal means between network and mobile phone that span analog, circuit switched, analog digital and packet based wireless services. Mobile phones adapted to communication with the protocols are provided with signal processing capability that is increasing in power and flexibility.

In some embodiments, the present invention further comprises a side tone and side tone adder. Side tone may be the effect of sound that is picked up by the telephone's mouthpiece and in real-time introduced at a low level into the earpiece of the same handset, acting as controlled feedback. Adding the side tone may be via an electric adder. Side tone may also be sound diverted from a telephone microphone to the earpiece so that a speaker hears his own voice at the same level and position as that of the respondent.

In some embodiments, the present invention can be utilized with a standard television set. As such the television may be in electronic communication with the personal communications device through a wired or wireless connection. Said embodiment may allow a standard television to utilize vTuning or VDBM via the personal communications device.

In some embodiments, the present invention further comprises a maximum gain filter in electronic communication with the microprocessor or DSP and the amplifier or gain block. Said feature may prevent the gains applied to the audio signal of interest to exceed a certain level of gain.

In some embodiments, the present invention further comprises a peak detector, which may be time varying. Said peak detector may be a series connection of a diode and a capacitor outputting a DC voltage equal to the peak value of an applied AC signal. Said peak detector may be in electronic communication with the microprocessor or DSP, gain block, amplifier, or audio device or any combination thereof.

In some embodiments, the present invention further comprises a touch screen controller in electronic communication with the microprocessor or DSP.

In some embodiments, the present invention further comprises an LCD (Liquid Crystal Display). In some embodiments, the present invention further comprises an LCD controller. Said features are effective for display of information pertaining to the present invention to the user and may be in electronic communication with the microprocessor or DSP.

In some embodiments, the present invention further comprises a baseboard processor. Said feature may be in electronic communication with the microprocessor or DSP, or be utilized in place of the microprocessor or DSP.

In some embodiments, the present invention further comprises a GPS antenna effective for receiving GPS signals.

In some embodiments, the present invention further comprises an application processor which may be an integrated Circuit chip similar to the microprocessor or DSP and may control the applications and flow of data on the present invention. Said applications processor may be in communication with and in addition to the microprocessor or DSP, or may exist in place of the microprocessor or DSP.

In some embodiments, the present invention further comprise a Class D Amp which may be an electronic amplifier where all power devices are operated as binary switches. Said amplifier may be in electronic communication with the microprocessor or DSP.

In some embodiments, the present invention further comprises a low power audio codec, which may contain vDBM. Said feature may be a computer program implementing an algorithm and said codec may reside or be in electronic communication with the microprocessor or DSP.

In some embodiments, the present invention further comprises echo cancellation which describes the process by which echo is removed from a voice communication in order to improve sound quality during, for example, a phone call. Said process may be conducted via the DSP or in a software implementation and may use echo suppressors, echo cancelers, or any combination thereof.

In some embodiments, the present invention further comprises a packet switching network which optimizes data transmission to and from the present invention by grouping data into blocks, called packets, irrespective as to the type of data being transmitted. Said feature may be implemented via a network adapter, transceiver, or the like.

The present invention, in some embodiments, may be combined with a number of possible known psychoacoustic models, derived from the audiology literature, which are used to compute gains needed to amplify sound to overcome the effects of ambient noise on sound perception or gains needed to account for preferred threshold elevations computed for users' of normal hearing. The gains may be computed over the entire spectrum or by dividing the spectrum up into any number of smaller bandwidth or frequency components. The present invention is not limited to one particular psychoacoustic model and many potential appropriate models can be used in accordance with the present invention.

One potential example of a psychoacoustic model which may be combined with the present invention may be found in works such as (Moore, Brian C. et al., "A model for the prediction of thresholds, loudness and partial loudness", Journal of the Audio Engineering Society, JAES Volume 45 Issue 4 pp. 224-240; April (1997)) and (Rosengrad, Peniah, S., "Relationship Between Measures Related to the Cochlear Active Mechanism and Speech Reception Thresholds in backgrounds with and without Spectral and/or Temporal Fluctuations" PhD Thesis MIT (2004)). These models define a mathematical relationship between the sound impinging on the ear and the apparent loudness of the sound as perceived by a human.

The models above may be used to derive a formula for the gains needed to amplify sound and the formula may be written:

$$\frac{\sqrt[\alpha]{P_{SIG}^{\alpha} + P_{NOISE}^{\alpha} - P_{THRQ}^{\alpha}}}{P_{SIG}}$$

where G is the gain ratio, PSIG is the signal intensity at a frequency in units of power, PNOISE is the signal intensity of the background noise, PTHRQ is the absolute threshold of hearing, and □=0.2 is a constant, Description of Additional Preferred Embodiments In some embodiments, the present invention comprises a personal communications device 01, effective in enhancing an audio signal according to a user's preference, across a spectrum of frequency components, by applying corrective gains to a frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain $\Delta P$ for the signal, corresponding to the threshold elevation at that frequency component, which can suffice to raise the volume of the audio signal so that the user can perceive the audio signal, at each frequency component, the way the user prefers.

In some embodiments, the personal communications device comprises:
a) a microprocessor 02, the microprocessor being a multi-core processor with an integrated digital signal processor (DSP) 03;
b) a RF transmitter/receiver 04, coupled to the microprocessor;
c) an audio codec 05, coupled to the microprocessor 02, which effectuates the decoding of audio signals for output by a speaker;
d) a display screen 06, coupled to the microprocessor 02, upon which the microprocessor 02 may display information for a user to view;
e) an input device 07, coupled to the microprocessor 02, which the user actuates to enter data into the microprocessor;
f) a data storage/program memory unit 08, coupled to the microprocessor 02, which the microprocessor uses to store program code and variables;
g) a speaker 10, coupled to the audio codec 05, disposed upon the phone in a location ergonomically suitable for listening through the user's ear when using the phone;
h) the digital signal processor (DSP) 03, the DSP configured to execute applications for:
   i. an Analog to Digital converter 04,
   ii. a Frequency Analysis Module 05,
   iii. a Power Estimator Block 06, iv. a dBFS to dBSPL Converter 07,
v. a dBSPL to dB Phon Converter 08,
vi. a kHz to critical band center frequency converter 09,
vii. a personalized sound adjustment model 10, parameterized by b,
viii. a perceptual model component 25,
ix. a Gain Block component 14,
x. a Summer block component 15, and
xi. a Digital to Analog Converter 16

In some embodiments, a possible process flow for the personal communications device 01 comprises the following:

The microprocessor 02 receives an audio signal which is the signal of interest via the RF transmitter 03, whereupon the audio signal is input to the DSP, along with a user adjustable parameter b, obtained via the input device, whereupon, said audio signal is then transmitted to the Analog to Digital Converter 03 thereby converting the audio signal into digital format, whereupon the audio signal is fed through the Frequency Analysis Module 04, breaking down the audio signal into frequency components, whereupon, for each frequency component, the microprocessor 01 identifies a source signal corresponding to the particular frequency component 50, whereupon, for each frequency component, the source signal is fed to the Power Estimator 06 and whereby the Power Estimator generates a mean power value for the source signal, whereby said power value is then fed into a dB Converter to generate a power value for the source signal $P_{dBFS}(f)$ in dBFS 52, whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$, whereupon, for each frequency component, the dBSPL-dB Phon Converter 08 converts the power value of the source signal $P_{dBSPL}(f)$ to dB Phons by applying a dBSPL to dBPhon Conversion equation, producing P(f), whereupon, for each frequency component, the critical band frequency converter 09 converts the frequency value f of a given input from kHz to critical band frequency, whereupon, for each frequency component, the Personalized sound adjustment model 10 generates a value for $P_0(f)$ in dB Phons for the current frequency component using the user adjustable input b 03, whereupon, for each frequency component, the microprocessor 01 applies the power value of the source signal P(f) and $P_0(f)$, at each frequency, now in dB Phons, to the perceptual model 25, which outputs a gain value ΔP(f) in dBPhons, whereupon, for each frequency component, the microprocessor 01 calculates a correction gain of power G(f), for the source signal, in dBSPL, based on the value of ΔP(f) in dB Phons, using the Gain Block component 14 which utilizes the Gain equation, and whereupon the personal communications device 100 reconstitutes the audio signal with the corrective gain to the source signal at the frequency component, comprising:
 (i) feeding the correction gain to the amplifier, wherein the amplifier multiplies the source signal at the frequency component by the corresponding corrective gain 53,
 (ii) using the Summer block component 16, reconstituting the audio signal, producing $x_{out}(t)$, whereupon the audio signal is fed through the Digital to Analog Converter 17.

In some embodiments, the present invention comprises a personal communications device 01, effective in enhancing an audio signal according to a user's preference, across a spectrum of frequency components, by applying corrective gains to a frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers.

In some embodiments, the personal communications device comprises:
 a) a microprocessor 102;
 b) a RF transmitter receiver 104, coupled to the microprocessor 102;
 c) a display screen 106, coupled to the microprocessor 102, upon which the microprocessor may display information for a user to view;
 d) an input device 107, coupled to the microprocessor 102, which the user actuates to enter data into the microprocessor;
 e) a data storage/program memory unit 108, coupled to the microprocessor 102, which the microprocessor uses to store program code and variables,
 f) a speaker 110, coupled to the audio codec 105, disposed upon the phone in a location ergonomically suitable for listening through the user's ear when using the phone;
 g) a digital signal processor (DSP) 103, coupled to the microprocessor 102 and speaker, the DSP configured to execute applications for:
  i. an Analog to Digital converter 104,
  ii. a Frequency Analysis Module 105,
  iii. a Power Estimator Block 106,
  iv. a dBFS to dBSPL Converter 107,
  v. a dBSPL to dB Phon Converter 108,
  vi. a kHz to critical band center frequency converter 109,
  vii. a Personalized sound adjustment model 110, parameterized by b,
  viii. a perceptual model component 125,
  ix. a Gain Block component 114,
  x. a Summer block component 115, and
  xi. a Digital to Analog Converter 116

In some embodiments, the personal communications device utilizes the following process flow:

The microprocessor 102 receives an audio signal which is the signal of interest by receiving the signal from the RF transceiver 104, whereupon the audio signal is transmitted to the digital signal processor ("DSP") 103, along with a user adjustable parameter b, obtained via the input device, whereupon, said audio signal is then transmitted to the Analog to Digital Converter 103 thereby converting the audio signal into digital format, whereupon the audio signal is fed through the Frequency Analysis Module 104, breaking down the audio signal into frequency components, whereupon, for each frequency component, the DSP 103 identifies the source signal corresponding to a particular frequency component 150, whereupon, for each frequency component, the source signal is fed to the Power Estimator 106 and whereby the Power Estimator generates a mean power value for the source signal, whereby said power value is then fed into a dB Converter to generate a power value for the source signal $P_{dBFS}(f)$ in dBFS 152, whereupon, for each frequency component, the DSP 103 computes a calibration offset such that the dBFS to dBSPL Converter 107 converts the power value of the source signal $P_{dBFS}(f)$ from dBFS to dBSPL, producing $P_{dBSPL}(f)$, whereupon, for each frequency component, the dBSPL-dB Phon Converter 108 converts the power value of the source signal $P_{dBSPL}(f)$ to dB Phons by applying a dBSPL to dBPhon Conversion equation, producing P(f), whereupon, for each frequency component, the critical band frequency converter 109 converts the frequency value f of a given input from kHz to critical band frequency, whereupon, for each frequency component, the Personalized sound adjustment model 110 generates a value for $P_0(f)$ in dB Phons using the user adjustable input b 103, whereupon, for each frequency component, the microprocessor applies the power value of the source signal P(f) and $P_0(f)$, at each frequency, now in dB Phons, to the perceptual model, which outputs a gain value $\Delta P(f)$ in dBPhons, whereupon, for each frequency component, the microprocessor calculates a correction gain of power G(f), for the source signal, in dBSPL, based on the value of $\Delta P(f)$ in dB Phons, using the Gain Block component which utilizes the Gain equation, and whereupon the DSP 103 reconstitutes the audio signal with the corrective gain to the source signal at the frequency component, comprising:

(i) feeding the correction gain to the amplifier, wherein the amplifier multiplies the source signal at the frequency component by the corresponding corrective gain 53, (ii) using the Summer block component 116, reconstituting the audio signal, producing $x_{out}(t)$, whereupon the audio signal is fed through the Digital to Analog Converter 117.

In some embodiments, the perceptual model for $\Delta P$ comprises a novel Conductor Equation 13, $S(P)=S(P+\Delta P)-S(P_0)+S(0)$ or, $\Delta P=S^{-1}(S(P)+S(P_0)-S(0))-P,$ where S(P) is a function in Sones, a measure of perceived loudness, in terms of Phons, a measure of objective sound intensity, where S(P) is found by solving the EarSpring equation 11,12 for particular boundary values and input sound intensities, where P is a measure of sound intensity of a given channel of the audio signal in dBPhons, where $P_0$ is an estimated hearing loss at a given frequency, where the Earspring equation 11,12 is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

In some embodiments, the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz. In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

In some embodiments, the perceptual model 25 is a computational model 19 used to estimate S(P) and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $S(P)=S(P+\Delta P)-S(P_0)+S(0)$ or, $\Delta P=S^{-1}(S(P)+S(P_0)-S(0))-P,$ where S(0) is a known constant offset, whereupon this equation is solved using the values of P and $P_0$, where these values are obtained from the power value of the signal and the estimated threshold elevation.

In some embodiments, the perceptual model 25 is a computational model 19 used to estimate ΔP, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$.

In some embodiments, values of the parameters A, B, C, D, and E are fit against the Earspring and conductor equations for every $P_0$ in increments.

In some embodiments, the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the Frequency Analysis Module 20 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal 51, and where the Summer block component 21 is a summer operation that combines the various channels into output $x_{out}(t)$.

In some embodiments, the various sub-band channels correspond to critical bands of hearing.

In some embodiments, the Frequency Analysis Module 20 is an FFT co-processor, which outputs the Fourier transform of the input signal X(f), where the power value of the signal is found by squaring the components of this Fourier transform and where the Summer block component 21 is an FFT co-processor that performs an inverse Fourier transform, outputting the time domain signal $x_{out}(t)$.

In some embodiments, the frequency components are grouped together to approximate sub-bands correspond to critical bands of hearing.

In some embodiments, the personalized sound adjustment model 10 is a linear estimator, which uses a linear function of the critical band center frequency F, where the Linear Slope equation is $$X_0 = [F - Y] \times b$$

where the setting (b) adjustable by the user 03, represents the slope of the line in dBHL/critical band, where Y is a value selected from a range of 2-3 bark, and where F is the critical band center frequency. In some embodiments, the aforementioned range is 0-1 Bark, 2-4 Bark, 1-5 Bark, Or 5-10 Bark.

In some embodiments, the personalized sound adjustment model 10 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency. In some embodiments, the patterns are composed of points which measure threshold elevations, X0, with respect to frequency, of which 0-20% are within +/−5 dBHL of a mean squared error linear fit to the pattern with respect to critical band center frequency. In some embodiments, the patterns are composed of points which measure threshold elevations, X0, with respect to frequency, of which 20-40% are within +/−5 dBHL of a mean squared error linear fit to the pattern with respect to critical band center frequency. In some embodiments, the patterns are composed of points which measure threshold elevations, X0, with respect to frequency, of which 40-60% are within +/−5 dBHL of a mean squared error linear fit to the pattern with respect to critical band center frequency. In some embodiments, the patterns are composed of points which measure threshold elevations, X0, with respect to frequency, of which 60-80% are within +/−5 dBHL of a mean squared error linear fit to the pattern with respect to critical band center frequency. In some embodiments, the patterns are composed of points which measure threshold elevations, X0, with respect to frequency, of which 80-100% are within +/−5 dBHL of a mean squared error linear fit to the pattern with respect to critical band center frequency. In some embodiments, the patterns are composed of points which measure threshold elevations, X0, with respect to frequency, of which 66% are within +/−5 dBHL of a mean squared error linear fit to the pattern with respect to critical band center frequency. In some embodiments, the patterns are composed of points which measure threshold elevations, X0, with respect to frequency, of which 66% are within +/−1 dBHL of a mean squared error linear fit to the pattern with respect to critical band center frequency. In some embodiments, the patterns are composed of points which measure threshold elevations, X0, with respect to frequency, of which 66% are within +/−2 dBHL of a mean squared error linear fit to the pattern with respect to critical band center frequency. In some embodiments, the patterns are composed of points which measure threshold elevations, X0, with respect to frequency, of which 66% are within 3-6 dBHL of a mean squared error linear fit to the pattern with respect to critical band center frequency. In some embodiments, the patterns are composed of points which measure threshold elevations, X0, with respect to frequency, of which 66% are within 6-10 dBHL of a mean squared error linear fit to the pattern with respect to critical band center frequency.

In some embodiments, the personalized sound adjustment model 10 is composed of a lookup table indexed by values of parameter b and frequency, where the threshold elevation $X_0$ is found by selecting the corresponding element of the lookup table or interpolating between points in the lookup table.

In some embodiments, the corrective gains are computed in parallel for multiple channels using multiple processing units.

In some embodiments, the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

In some embodiments, the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

In some embodiments, the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=-1/120 when ATH(F)>0
=+1/240 when ATH(F)<0
In some embodiments, the Gain equation 17 is:

$$\Delta P_{dBSPL}(F) = \Delta P_{dBPhon}(F)(1+kATH(F))$$

where
F=frequency
ATH(F)=Absolute Threshold of Hearing
K=-1/120 when ATH(F)>0
=+1/240 when ATH(F)<0
In some embodiments, the absolute threshold of hearing is computed by the formula:

$$ATH(F) = \frac{3.64}{F_{KHz}^{0.8}} - 6.5e^{-0.6(F_{kHz}-3.3)^2} + 0.001F_{kHz}^4 - 3.37$$

In some embodiments, the critical band center frequency is the Bark frequency, which is computed by, $$CBR(F_{kHz}) = \frac{26.81}{1 + \frac{1.960}{F_{kHz}}} - 0.53$$

In some embodiments, the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12.

In some embodiments there are multiple source audio signals corresponding to both ears and hearing loss is estimated independently with separate user inputs for each ear, and separate gains computed for each frequency component.

In some embodiments the personal communications device is a mobile phone, land line telephone, smartphone, two-way radio, walkie-talkie, personal digital assistant, tablet, or digital telephone.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:

1. A personal communications device 01, effective in enhancing an audio signal according to a user's preference, across a spectrum of frequency components, by applying corrective gains to a frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_o$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers, the personal communications device 01 comprising:
   a) a microprocessor 02, the microprocessor being a multi-core processor with an integrated digital signal processor (DSP) 03;
   b) a RF transmitter/receiver 04, coupled to the microprocessor;
   c) an audio codec 05, coupled to the microprocessor 02, which effectuates the decoding of audio signals for output by a speaker;
   d) a display screen 06, coupled to the microprocessor 02, upon which the microprocessor 02 may display information for a user to view;
   e) an input device 07, coupled to the microprocessor 02, which the user actuates to enter data into the microprocessor;
   f) a data storage/program memory unit 08, coupled to the microprocessor 02, which the microprocessor uses to store program code and variables;
   g) a speaker 10, coupled to the audio codec 05, disposed upon the phone in a location ergonomically suitable for listening through the user's ear when using the phone;
   h) the digital signal processor (DSP) 03, the DSP configured to execute applications for:
      i. an Analog to Digital converter 204,
      ii. a Frequency Analysis Module 220,
      iii. a Power Estimator Block 206,
      iv. a dBFS to dBSPL Converter 207,
      v. a dBSPL to dB Phon Converter 208,
      vi. a kHz to critical band center frequency converter 209,
      vii. a personalized sound adjustment model 210, parameterized by b,
      viii. a perceptual model component 225,
      ix. a Gain Block component 214,
      x. a Summer block component 215, and
      xi. a Digital to Analog Converter 216
   whereupon the microprocessor 02 receives an audio signal which is the signal of interest via the RF transmitter 04, whereupon the audio signal is input to the DSP, along with a user adjustable parameter b, obtained via the input device, whereupon, said audio signal is then transmitted to the Analog to Digital Converter 204 thereby converting the audio signal into digital format, whereupon the audio signal is fed through the Frequency Analysis Module 220, breaking down the audio signal into frequency components, whereupon, for each frequency component, the microprocessor 02 identifies a source signal corresponding to the particular frequency component, whereupon, for each frequency component, the source signal is fed to the Power Estimator 206 and whereby the Power Estimator generates a mean power value for the source signal, whereby said power value is then fed into a dB Converter to generate a power value for the source signal $P_{dBFS}(f)$ in dBFS 52, whereupon, for each frequency component, the microprocessor 02 completes a calibration offset such that the dBFS to dBSPL Converter 207 converts the power value of the source signal $P_{dBFS}(f)$ from dBFS to dBSPL, producing $P_{dBSPL}(f)$, whereupon, for each frequency component, the dBSPL-dB Phon Converter 208 converts the power value of the source signal $P_{dBSPL}(f)$ to dB Phons by applying a dBSPL to dBPhon Conversion equation, producing P(f), whereupon, for each frequency component, the critical band frequency converter 209 converts the frequency value f of a given input from kHz to critical band frequency, whereupon, for each frequency component, the Personalized sound adjustment model 210 generates a value for $P_0(f)$ in dB Phons for the current frequency component using the user adjustable input b 03, whereupon, for each frequency component, the microprocessor 02 applies the power value of the source signal P(f) and $P_0(f)$, at each frequency, now in dB Phons, to the perceptual model 225, which outputs a gain value ΔP(f) in dBPhons, whereupon, for each frequency component, the microprocessor 02 calculates a correction gain of power G(f), for the source signal, in dBSPL, based on the value of ΔP(f) in dB Phons, using the Gain Block component 214 which utilizes the Gain equation, and whereupon the personal communications device 01 reconstitutes the audio signal with the corrective gain to the source signal at the frequency component, comprising:

(i) feeding the correction gain to the amplifier, wherein the amplifier multiplies the source signal at the frequency component by the corresponding corrective gain 214, (ii) using the Summer block component 221, reconstituting the audio signal, producing $x_{out}(t)$, whereupon the audio signal is fed through the Digital to Analog Converter 216.

2. A personal communications device 01, effective in enhancing an audio signal according to a user's preference, across a spectrum of frequency components, by applying corrective gains to a frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers, the personal communications device 101 comprising:

a) a microprocessor 102;
b) a RF transmitter receiver 104, coupled to the microprocessor 102;
c) a display screen 106, coupled to the microprocessor 102, upon which the microprocessor may display information for a user to view;
d) an input device 107, coupled to the microprocessor 102, which the user actuates to enter data into the microprocessor;
e) a data storage/program memory unit 108, coupled to the microprocessor 102, which the microprocessor uses to store program code and variables,
f) a speaker 110, coupled to the audio codec 105, disposed upon the phone in a location ergonomically suitable for listening through the user's ear when using the phone;
g) a digital signal processor (DSP) 103, coupled to the microprocessor 102 and speaker, the DSP configured to execute applications for:
  i. an Analog to Digital converter 204,
  ii. a Frequency Analysis Module 220,
  iii. a Power Estimator Block 206,
  iv. a dBFS to dBSPL Converter 207,
  v. a dBSPL to dB Phon Converter 208,
  vi. a kHz to critical band center frequency converter 209,
  vii. a Personalized sound adjustment model 210, parameterized by b,
  viii. a perceptual model component 225,
  ix. a Gain Block component 214,
  x. a Summer block component 221, and
  xi. a Digital to Analog Converter 216 whereupon the microprocessor 102 receives an audio signal which is the signal of interest by receiving the signal from the RF transceiver 104, whereupon the audio signal is transmitted to the digital signal processor ("DSP") 103, along with a user adjustable parameter b, obtained via the input device, whereupon, said audio signal is then transmitted to the Analog to Digital Converter 203 thereby converting the audio signal into digital format, whereupon the audio signal is fed through the Frequency Analysis Module 220, breaking down the audio signal into frequency components, whereupon, for each frequency component, the DSP 103 identifies the source signal corresponding to a particular frequency component 150, whereupon, for each frequency component, the source signal is fed to the Power Estimator 206 and whereby the Power Estimator generates a mean power value for the source signal, whereby said power value is then fed into a dB Converter to generate a power value for the source signal $P_{dBFS}(f)$ in dBFS 152, whereupon, for each frequency component, the DSP 103 computes a calibration offset such that the dBFS to dBSPL Converter 207 converts the power value of the source signal $P_{dBFS}(f)$ from dBFS to dBSPL, producing $P_{dBSPL}(f)$, whereupon, for each frequency component, the dBSPL-dB Phon Converter 208 converts the power value of the source signal $P_{dBSPL}(f)$ to dB Phons by applying a dBSPL to dBPhon Conversion equation, producing P(f), whereupon, for each frequency component, the critical band frequency converter 209 converts the frequency value f of a given input from kHz to critical band frequency, whereupon, for each frequency component, the Personalized sound adjustment model 210 generates a value for $P_0(f)$ in dB Phons using the user adjustable input b 103, whereupon, for each frequency component, the microprocessor applies the power value of the source signal P(f) and $P_0(f)$, at each frequency, now in dB Phons, to the perceptual model, which outputs a gain value $\Delta P(f)$ in dBPhons, whereupon, for each frequency component, the microprocessor calculates a correction gain of power $G(f)$, for the source signal, in dBSPL, based on the value of $\Delta P(f)$ in dB Phons, using the Gain Block component which utilizes the Gain equation, and whereupon the DSP 103 reconstitutes the audio signal with the corrective gain to the source signal at the frequency component, comprising:
  (i) feeding the correction gain to the amplifier 214, wherein the amplifier multiplies the source signal at the frequency component by the corresponding corrective gain 53,
  (ii) using the Summer block component 221, reconstituting the audio signal, producing $x_{out}(t)$,
whereupon the audio signal is fed through the Digital to Analog Converter 216.

3. The personal communications device of claim 1 and claim 2, wherein the perceptual model for $\Delta P$ comprises a novel Conductor Equation 313, $S(P)=S(P+\Delta P)-S(P_0)+S(0)$ or, $\Delta P=S^{-1}(S(P)+S(P_0)-S(0))-P,$ where $S(P)$ is a function in Sones, a measure of perceived loudness, in terms of Phons, a measure of objective sound intensity, where $S(P)$ is found by solving the EarSpring equation 311, 312 for particular boundary values and input sound intensities, where P is a measure of sound intensity of a given channel of the audio signal in dBPhons, where $P_0$ is an estimated hearing loss at a given frequency,
where the Earspring equation 311, 312 is written $[d^2/dt^2+ 2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, $y(t)$=amplitude of vibration, $F(t)$=driving force in terms of Phons amplitude or sound intensity, $<y^2>$=mean output power of vibration for a given frequency channel, identified as the Sones power in the following equations, $\beta$=damping constant, k=spring constant, $\gamma$=coefficient of power dependence of spring constant, and $\eta$=the scale factor,
where for a particular frequency of the driving force $F(t)$, which represents a pure sinusoid of intensity P (the input sound intensity), a solution $y(t)$ to this equation can be found, which if put into the frequency domain as Y (the amplitude of the steady state response to the forcing function $F(t)$) can be used to compute $<y^2>=\frac{1}{2}|Y|^2=S$, which represents the perceived loudness S in Sones, producing a function $S(P)$, $$S(P) = \frac{(4\hat{\beta}^2 + \Gamma_{40}^2)}{(4\hat{\beta}^2 + (\Gamma_{40}S(P))^2)} 10^{(P-40)/10},$$

where $S(P)$ is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

4. The personal communications device of claim 3, where the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz;

5. The personal communications device of claim 1 and claim 2, where the perceptual model 225 is a computational model 19 used to estimate $S(P)$ and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of $S(P)$ and $S^{-1}(S)$ are then used in the conductor equation, where Conductor Equation 313 is, $S(P)=S(P+\Delta P)-S(P_0)+S(0)$ or, $\Delta P=S^{-1}(S(P)+S(P_0)-S(0))-P,$ where $S(0)$ is a known constant offset, whereupon this equation is solved using the values of P and $P_0$, where these values are obtained from the power value of the signal and the estimated threshold elevation.

6. The personal communications device of claim 1 and claim 2, where the perceptual model 225 is a computational model used to estimate $\Delta P$, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$.

7. The personal communications device of claim 6, where values of the parameters A, B, C, D, and E are fit against the Earspring and conductor equations for every $P_0$ in increments.

8. The personal communications device of claim 1 and claim 2, where the computational model is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

9. The personal communications device of claim 1 and claim 2, where the Frequency Analysis Module 220 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal, and where the Summer block component 221 is a summer operation that combines the various channels into output $x_{out}(t)$.

10. The personal communications device of claim 9, where the various sub-band channels correspond to critical bands of hearing.

11. The personal communications device of claim 1 and claim 2, where the Frequency Analysis Module 220 is an FFT co-processor, which outputs the Fourier transform of the input signal X(f), where the power value of the signal is found by squaring the components of this Fourier transform and where the Summer block component 221 is an FFT co-processor that performs an inverse Fourier transform, outputting the time domain signal $x_{out}(t)$.

12. The personal communications device of claim 1 and claim 2, where the frequency components are grouped together to approximate sub-bands correspond to critical bands of hearing.

13. The personal communications device of claim 1 and claim 2, wherein the personalized sound adjustment model 210 is a linear estimator, which uses a linear function of the critical band center frequency F, where the Linear Slope equation is $$X_0 = [F-Y] \times b$$

where the setting (b) adjustable by the user 03, represents the slope of the line in dBHL/critical band, where Y is a value selected from a range of 2-3 bark, and where F is the critical band center frequency;

14. The personal communications device of claim 1 and claim 2, wherein the personalized sound adjustment model 210 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

15. The personal communications device of claim 1 and claim 2, wherein the personalized sound adjustment model 210 is composed of a lookup table indexed by values of parameter b and frequency, where the threshold elevation $X_0$ is found by selecting the corresponding element of the lookup table or interpolating between points in the lookup table.

16. The personal communications device of claim 1 and claim 2, wherein the corrective gains are computed in parallel for multiple channels using multiple processing units.

17. The personal communications device of claim 1 and claim 2 wherein the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

18. The personal communications device of claim 1 and claim 2, wherein the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

19. The personal communications device of claim 1 and claim 2, wherein the dBSPL to dBPhon Conversion equation is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
 =+1/240 when ATH(F)<0

20. The personal communications device of claim 1 and claim 2, wherein the Gain equation is:

$$\Delta P_{dBSPL}(F) = \Delta P_{dBPhon}(F)(1 + kATH(F))$$

where
F=frequency
ATH(F)=Absolute Threshold of Hearing
K=−1/120 when ATH(F)>0
 =+1/240 when ATH(F)<0

21. The personal communications device of claim 1 and claim 2, where the absolute threshold of hearing is computed by the formula:

$$ATH(F) = \frac{3.64}{F_{kHz}^{0.8}} - 6.5e^{-0.6(F_{kHz}-3.3)^2} + 0.001 F_{kHz}^4 - 3.37$$

22. The personal communications device of claim 1 and claim 2, where the critical band center frequency is the Bark frequency, which is computed by, $$CBR(F_{kHz}) = \frac{26.81}{1 + \frac{1.960}{F_{kHz}}} - 0.53$$

23. The personal communications device of claim 1 and claim 2, where the calibration equation comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dbSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.

24. The personal communications device of claim 1 and claim 2, where there are multiple source audio signals corresponding to both ears and hearing loss is estimated independently with separate user inputs for each ear, and separate gains computed for each frequency component.

25. The personal communications device of claim 1 and claim 2, wherein the personal communications device is a mobile phone, land line telephone, smartphone, two-way radio, walkie-talkie, personal digital assistant, tablet, or digital telephone.

Extra:

26. A computer-readable medium 70 storing a set of instructions executable by one or more microprocessors, where the computer-readable medium 70 is effective in enhancing an audio signal, across a spectrum of frequencies, to correct for hearing loss, by applying corrective gains across the frequency spectrum to a first audio signal, wherein the value of the gains are computed using a perceptual model of loudness as a function of sound intensity, as subjectively experienced by a normal human, where this perceptual model takes as inputs the sound intensity of the audio signal P and an estimate of the user's hearing loss $P_0$, wherein corrective gains are generated for each frequency by solving for a correction gain ΔP for the signal which will suffice to raise the volume of each channel so that the user will perceive it as if he had no hearing loss, the computer-readable medium comprising:

a. code for extracting an input audio signal x(t) 02;
b. code for obtaining the value of a user controlled input 03 b, which is to be a parameter of the personalized sound adjustment model 10;
c. code for filtering x(t) into a plurality of frequencies using the Frequency Analysis Module 20;
d. code for solving for the corrective gains 10 which comprises:
   i. code for extracting a power value of the source signal P(f) in the various bands, in dBFS with a power estimator block 06, comprising:
      (A) identifying the source signal band, wherein the source signal band is a particular component of the audio signal 50;
      (B) generating a power value for the source signal, whereby said power value is then fed into a dB Converter to generate a power value $P_{dBFS}(f)$ for the source signal in dBFS 52;
   ii. code for calculating a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12;
   iii. code for converting the power value of the source signal to dB Phons 08 by applying a dBSPL to dBPhon Conversion equation, producing P(f);
   iv. code for computing the critical band center frequency F 09 corresponding to the frequency f for the current signal component in kHz;
   v. code for determining the value of the threshold elevation $P_0(f)$ in dB Phons, where said value is defined by the personalized sound adjustment model 10, which is parameterized by the user adjustable input 03 b;
   vi. code for computing the gains in dBPhons using the perceptual model 25;
h. code for calculating a correction gain of power G(f) 14, for the source signal, in dBSPL, based on the value of ΔP(f) in dB Phons, using a Gain equation 14;
i. code for reconstituting the audio signal with the corrective gain to the source signal at the frequency, comprising
   iii. feeding the correction gains G(f) to an amplifier 53 wherein the amplifier 53 multiplies the source signal components by the corresponding corrective gains G(f);
   iv. using the Summer block component 21 to reconstitute the audio signal producing $x_{out}(t)$;
j. code for feeding the audio signal through a Digital to Analog Converter 16;

27. The computer readable medium storing a set of instruction of claim 33, where the Frequency Analysis Module 20 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal 51, and where the Summer block component 21 is a summer operation that combines the various channels into output $x_{out}(t)$ 28. The computer readable medium storing a set of instruction of claim 34, where the various sub-band channels correspond to critical bands of hearing.

29. The computer readable medium storing a set of instruction of claim 33, where the Frequency Analysis Module 20 is an FFT operation, which outputs the Fourier transform of the input signal X(f), where the power value of the signal is found by squaring the components of this Fourier transform and where the Summer block component 21 is an FFT operation that performs an inverse Fourier transform, outputting the time domain signal $x_{out}(t)$.

30. The computer-readable medium storing a set of instructions of claim 33, wherein the personalized sound adjustment model 10 is a linear estimator, which uses a linear function of the critical band center frequency F, where the Linear Slope equation is $$X_0=[F-Y]\times b$$

where the setting (b) adjustable by the user 03, represents the slope of the line in dBHL/critical band, where Y is a value selected from a range of 200-300, and where F is the critical band center frequency;

31. The computer-readable medium storing a set of instructions of claim 33, wherein the personalized sound adjustment model 10 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

32. The computer-readable medium storing a set of instructions of claim 33, wherein the personalized sound adjustment model 10 is composed of a lookup table indexed by values of parameter b and frequency, where the hearing loss estimate $X_0$ is found by selecting the corresponding element of the lookup table or interpolating between points in the lookup table.

33. The computer-readable medium storing a set of instructions of claim 33, wherein the perceptual model for ΔP comprises a novel Conductor Equation 13, $$S(P)=S(P+\Delta P)-S(P_0)+S(0) \text{ or,}$$

$$\Delta P=S^{-1}(S(P)+S(P_0)-S(0))-P,$$

where S(P) is a function in Sones, a measure of perceived loudness, in terms of Phons, a measure of objective sound intensity, where S(P) is found by solving the EarSpring equation for particular boundary values and input sound intensities, where P is a measure of sound intensity of a given channel of the audio signal, where $P_0$ is an estimated hearing loss at a given frequency, where the Earspring equation is written $[d^2/dt^2+2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P, a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

34. The computer-readable medium storing a set of instructions of claim 33, where the set of boundary parameters comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz;

35. The computer readable media storing a set of instruction of claim 33, where a computational model 19 is used to estimate S(P) and $S^{-1}(S)$ consisting of quadratic functions such as $$S(P) \cong \frac{AP^2 + BP + C}{DP^2 + EP + 1},$$

where A, B, C, D, and E are parameters which fit the quadratic function against the solution to the Earspring and Conductor equations and are stored in long term memory.

36. The computer readable media storing a set of instruction of claim 33, where the computational model 19 is used to estimate $\Delta P$ consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in long term memory.

37. The computer readable media storing a set of instruction of claim 33, where the computational model 19 is any numerical function approximator that is fit against the Earspring and Conductor equation and approximates their solutions, where these approximators may include, but are not limited to linear regression, neural networks, and others.

38. The computer-readable medium storing a set of instructions of claim 33, wherein the audio signal contains more than one frequency component and steps (d) through (e) are repeated in series for all frequencies in the spectrum, before proceeding to step (f).

39. The computer-readable medium storing a set of instructions of claim 33, wherein the audio signal contains more than one frequency component and steps (d) through (e) are computed in parallel for all frequencies in the spectrum, before proceeding to step (f).

40. The computer-readable medium storing a set of instructions of claim 33, wherein the audio signal contains more than one frequency component and steps (d) through (e) are in part computed in parallel and in part computed in series, before proceeding to step (f).

MEDIA PLAYER FEATURING SPECTRAL ENHANCEMENT OF AUDIO SIGNALS

Background of the Invention

The present invention relates to the field of audio processing for the correction of hearing loss and also personalization of sound.

Hearing loss is a normal part of the aging process for most humans, which can also be accelerated or produced through repetitive exposure to loud noises such as rock concerts or construction equipment. Most humans begin to lose awareness of high frequency noises in their 20s. Hearing loss starts in the higher frequency register and gradually progresses to lower registers. As a result, a constant volume increase in loudness will fail to correct for the change in the frequency composition of the sound perceived by the listener, thereby distorting the perception of the sound by the listener. The aging of a large segment of the population which has been repetitively exposed to loud rock music is likely to result in a significant portion of the elderly in the near future having more progressive hearing loss in their old age than in the past.

Most hearing aids focus on the enhancement of signals specifically for speech perception. However, hearing loss affects sound across the spectrum in a consistent manner. These losses affect the enjoyment of music by causing the listener to lose his perception of sounds in a higher register. The application of standard hearing aid corrections to a musical performance can produce a displeasing effect by amplifying sound in a spectrally inconsistent manner and failing to correct for the higher register losses. In order to hear the higher frequency registers a user may increase the volume of music to potentially damaging levels.

There are many systems for sound level equalization from an audio processing standpoint. However, most of these systems use measures of sound intensity prior to impingement on the ear as a target for correction. Few systems use perceptual loudness—that is, sound as it is apparent to the listener. The human ear introduces many non-linear effects on apparent loudness, consequently, sound intensity as measured by the sound pressure level (SPL) does not correlate linearly with the sound level perceived by a human. Moreover, after hearing loss, the perceived sound level is degraded by an increasing function of frequency (higher frequencies are more degraded than lower ones).

Microphones and mechanical systems (e.g., computer software) can measure dBSPL; a sound (e.g., ~40 dBSPL) at particular frequency (e.g., 1 kHz) sounds just as loud as the sound (e.g., ~40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL(incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Iso-loudness contours are most often displayed in terms of dB intensity versus log frequency. The log frequency axis provides excessive emphasis on the lower frequencies and less emphasis on high frequencies where audiological damage most often occurs in sensioneural hearing loss.

It can be observed that everyone is "impaired" at higher frequencies unless the volume of sounds at those frequencies are very loud. Most of the spice of music is found in the high frequency region—sibilant speech, breathiness, cymbals, etc. Further, nearly everyone enjoys music more when it is played loudly. That gives that the opportunity to hear this musical spice. By using the present invention, users can gain a sense of enjoyment without needing to raise the volume of music and sounds to potentially damaging levels.

Using the equations described herein for correction of signal source amplitudes, it is found that most people with normal hearing prefer a parameter setting of around 2.5 dB per Bark, when listening at 77 dB SPL through headphones. That corresponds to a working threshold elevation of 50 dB at the highest frequencies. But since we don't live in a world of threshold level sounds, the actual gain needed for a 50 dB threshold elevation, when the sound is at 60 dBSPL and 10 kHz, is only on the order of approximately 5 dB. The gains applied are nonlinear compression to overcome the "recruitment" gain expansion produced by ear physics.

When offered the opportunity to listen through the corrective systems of the present invention, based on the hearing equations discussed herein, people with very normal hearing uniformly prefer some degree of modulation at varying frequencies.

In some prior art systems, an individualized audiogram is used to measure hearing loss for a particular individual. The sound can then be spectrally corrected using this stored audiogram pattern to reproduce a spectral correct sound in the individual's perception. This method is disadvantageous since it requires a significant number of parameters to be stored and these parameters are cumbersome and difficult to adjust accurately, even when performed by a medical professional.

The perceived loudness of sound can be modeled by a harmonic oscillator with spring constant that varies according to the mean power of vibration. This model is called the Earspring model. The Earspring equation 10,11 is written $[d^2/dt^2 + 2\beta(d/dt) + k(1+\gamma\gamma<y^2>)]y(t) = \eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude P in dBPhons, a solution to the Earspring equation y(t) can be found, for a particular set of boundary conditions, which is the steady state response to the forcing function. Transforming into the frequency domain we can obtain the mean power of vibration $<y^2> = \frac{1}{2}|Y|^2$, which is the Sones power of the perceived sound.

A possible set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Using the boundary conditions, we can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta} = \beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

Summary of the Invention

The present invention features a media player effective for enhancing audio signals to correct across a spectrum of frequencies according to a model of the spectral characteristics of hearing loss, and a model of the perceptual loudness of sound as a function of sound intensity. A method of the present invention estimates hearing loss from a function of the critical band center frequency and a single user input. A model of perceptual loudness is applied across frequencies, taking the estimated hearing loss per frequency as an input. The model allows the system to compute corrections which will cause the sound to be perceived as loudly as it should be from the perspective of the user, and in a way in which the perceived spectral composition of the sound is unaltered. The systems of the present invention compute a user-determined degree of correction to sounds at varying frequencies, allowing a listener to hear sounds, across varying frequencies, as the listener wishes to hear them without needing to raise the volume of the sounds to potentially damaging levels.

Allowing the user to control the slope with respect to frequency of the correction pattern through a user adjustable setting allows the user to tune the corrections, across the frequency spectrum, to his or her taste through a single adjustment.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention
1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.
6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between −20 and −12; where P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component may comprise a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest.

The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.

20. Gain Block component—This component applies the gains to each corresponding frequency component or band. In some embodiments, the term gain block component is used interchangeably with a "means for applying gains to a audio signal." Said means may be, for example, an amplifier, or gain block component.

21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.

22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, a keypad, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.

23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F_{kHz}) = \frac{26.81}{1+\frac{1.960}{F_{kHz}}} - 0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G = g0 + (P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical value that when input to the Personalized Sound adjustment, may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference.

In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^2 + P_{NOISE}^2 - P_{THRQ}^2}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

34. RF Transceiver: Radio Frequency Transmitter/Receiver—this device interfaces directly with the antenna and can modulate an audio signal with its radio carrier frequency for transmission as well as demodulate a received radio frequency signal 35. Source signal: The Source signal, as used herein refers to a portion of the first audio signal or the audio signal of interest at a given frequency component.

36. Speaker: The speaker can be any speaker or the like capable of receiving and projecting a sound signal adjusted or corrected by the present invention.

37. Storage media: A computer readable media used for storing data, such as a hard disk, RAM, or flash memory 38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

39. Threshold elevation: Threshold elevations correlate to the minimum sound pressures required to perceive sounds at various frequencies.

Additional Terms:

1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.

2. dBSPL: Decibels sound power level—a unit of measure of sound intensity at the ear 3. dBSPL to dBPhon Conversion equation: This equation converts sound pressure level to Phons in decibels: P_dBPhon(F)=(P_dBSPL(F)−ATH(F))/(1+kATH(F))
   where
   F=Frequency
   ATH=Absolute Threshold of Hearing
   P=Phons amplitude of a source signal of interest
   dBSPL=decibels according to sound pressure
4. dBFS to dBSPL Converter: This equation converts the audio signal power from audio power in decibels to audio sound pressure level in decibels
5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.
6. Gain Equation: This equation converts the gain in Phons to a gain in sound pressure level $$\Delta P\_dBSPL(F)=[\Delta P]\_dBPhon(F)(1+kATH(F)).$$

where:
   F=Frequency
   ATH=Absolute Threshold of Hearing
   P=Phons amplitude of a source signal of interest
   dBSPL=decibels according to sound pressure
7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.
8. Phons: Phons are objective units of sound intensity impinging upon the ear. Sound power may be converted from decibels (dBFS) to Phons using a conversion first to dBSPL then to Phons
9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.
10. Sones: Sones are subjective units of perceived sound loudness
11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1 Is a general systems architecture drawing for a media player where the sound enhancement is implemented in an integrated DSP chip.

FIG. 2 Is a general systems architecture drawing for a media player where the sound enhancement is implemented in an external DSP chip after the audio codec.

FIG. 3 Diagrams the processing architecture of the correction system implemented on the microprocessor.

FIG. 4 Diagrams an implementation of the Perceptual Model of the present invention using analytical solutions to the Earspring model.

FIG. 5 Diagrams an implementation of the Perceptual Model in which a Numerical approximation to the solution is made using a function approximator for which parameters have been stored in a lookup table for various values of $P_0$.

FIG. 6 Diagrams a number of possible realizations of the personalized sound adjustment model, including a linear slope function, a pattern library or lookup table, or estimation of threshold elevations.

FIG. 7 is a drawing of a possible process flow for the present invention in which all computations are performed in series.

FIG. 8 is a drawing of a possible process flow for the present invention, in which all computations are performed in parallel.

FIG. 9 is a graphical representation of the invention's adjustment to sound intensities at varying frequencies.

Description of Preferred Embodiments

Media Player

As shown in FIG. 1, a preferred embodiment of the present invention comprises a media player 01, effective in enhancing an audio signal, across a spectrum of frequencies, to correct for hearing loss, by applying corrective gains across the frequency spectrum to a first audio signal, wherein the value of the gains are computed using a perceptual model of loudness as a function of sound intensity, as subjectively experienced by a normal human, where this perceptual model takes as inputs the sound intensity of the audio signal P and an estimate of the user's hearing loss $P_0$, wherein corrective gains are generated for each frequency by solving for a correction gain ΔP for the signal which will suffice to raise the volume of each channel so that the user will perceive it as if he had no hearing loss the media player 01 comprising:
   a) a microprocessor 02, the microprocessor configured to execute a noise correction application 03,
   b) a storage media 04, coupled to the microprocessor, containing media recordings,
   c) a digital signal processing chip configured to implement an audio codec 05, coupled to the microprocessor, which effectuates the decoding of audio signals for output by a speaker, and the encoding of voice and noise audio received by the first and second microphones,
   d) a display screen 06, coupled to the microprocessor, upon which the microprocessor may display information for the user to view,
   e) a input device 07, couple to the microprocessor, which the user actuates to enter data into the microprocessor,
   f) a data storage/program memory unit 08, coupled to the microprocessor, which the microprocessor uses to store program code and variables,
   g) a speaker 10, coupled to the audio codec 05, disposed upon the phone in a location ergonomically suitable for listening through the user's ear when using the phone,
   h) the noise correction application 03, the noise correction algorithm comprising:
      i. an Analog to Digital converter 04;
      ii. a Frequency Analysis Module 05;

iii. a Power Estimator Block 06;
iv. a dBFS to dBSPL Converter 07;
v. a dBSPL to dB Phon Converter 08;
vi. a kHz to critical band center frequency converter 09;
vii. a Personalized sound adjustment model 10, parameterized by b;
viii. a perceptual model component 25;
ix. a Gain Block component 14;
x. a Summer block component 15; and
xi. a Digital to Analog Converter 16;
whereupon the microprocessor 02 receives a first audio signal which is the signal of interest by reading the signal from the storage media 04,
whereupon the first audio signal 202 is input to the noise correction algorithm,
whereupon, said audio signal is then transmitted to the Analog to Digital Converter 03 thereby converting the audio signal into digital format;
whereupon the audio signal is fed through the Frequency Analysis Module 04, breaking down the audio signal into frequency components;
whereupon, for each frequency component, the microprocessor 01 identifies the source signal corresponding to a particular frequency 50;
whereupon, for each frequency component, the source signal is fed to the Power Estimator 06 and whereby the Power Estimator generates a mean power value for the source signal, whereby said power value is then fed into a dB Converter to generate a power value for the source signal $P_{dBFS}(f)$ in dBFS 52;
whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$;
whereupon, for each frequency component, the dBSPL-dB Phon Converter 08 converts the power value of the source signal $P_{dBSPL}(f)$ to dB Phons by applying a dBSPL to dBPhon Conversion equation, producing P(f);
whereupon, for each frequency component, the critical band frequency converter 09 converts the frequency value f of a given input from kHz to critical band frequency;
whereupon, for each frequency component, the Personalized sound adjustment model 10 generates a value for $P_0(f)$ in dB Phons for the current frequency and the user adjustable input b 03,
whereupon, for each frequency component, the microprocessor 01 applies the power value of the source signal P(f) and the power value of the background signal $P_0(f)$, at each frequency, now in dB Phons, to the perceptual model 25, which outputs a gain value $\Delta P(f)$ in dBPhons;
whereupon, for each frequency component, the microprocessor 01 calculates a correction gain of power G(f), for the source signal, in dBSPL, based on the value of $\Delta P(f)$ in dB Phons, using the Gain Block component 14 which utilizes the Gain equation; and
whereupon the media player 100 reconstitutes the audio signal with the corrective gain to the source signal at the frequency, comprising:
  (i) feeding the correction gain to the amplifier, wherein the amplifier multiplies the source signal at the frequency by the corresponding corrective gain 53;
  (ii) using the Summer block component 16, reconstituting the audio signal, producing $x_{out}(t)$;
whereupon the audio signal is fed through the Digital to Analog Converter 17;

As shown in FIG. 3, one possible embodiment of the perceptual model involves analytically computing the value in Sones of the input signal at a given frequency S(P), along with the estimated hearing loss in Sones at that frequency $S(P_0)$, and applying these values of the conductor equation to derive a gain in Phons for the signal that will correct for the perceived hearing loss, the Conductor Equation 13 being, $$S(P)=S(P+\Delta P)-S(P_0)+S(0) \text{ or,}$$

$$\Delta P=S^{-1}(S(P)+S(P_0)-S(0))-P$$

As shown in FIG. 4, an alternative embodiment for the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for $\Delta P$ for any given P and $P_0$.

As shown in FIG. 5, the personalized sound adjustment model may be implemented through various means. Since the typical hearing loss profile is approximately linear with respect to Bark frequency, hearing loss may be estimated using a linear function of Bark frequency, while allowing the user to adjust the slope of the line. In this way, a single user adjustable input may be used to estimate hearing loss by frequency. Alternatively, a library of patterns may be stored in memory, where each pattern is a typical hearing loss profile, of increasing slope relative to bark frequency. The user could then adjust a setting the selects or interpolates between these patterns, with higher settings corresponding to more hearing loss. Finally, since ambient noise is know to indice a degree of hearing loss in normal individuals an ambient noise signal could be used to compute an estimated hearing loss.

It should be apparent that any combinations of the use of a computational model or explicit computation for the Earspring and Conductor equations, parallel or series computation, or a pattern library versus the Hearing loss estimate will also fall within the scope of the present invention.

In varying embodiments, the media player may be attached to an Amplifier 17 and Speaker 18 for outputting the audio signal.

Computer Readable Media

In some embodiments, as explained by FIG. 7 and its description, the present invention can be enabled on a computer readable medium, the computer-readable medium comprising:
  a. code for extracting an input audio signal x(t) 02;
  b. code for obtaining the value of a user controlled input 03 b, which is to be a parameter of the personalized sound adjustment model 06;
  c. code for filtering x(t) into a plurality of channels 03 where the audio signal is broken down into separate channels $\bar{x}(t)$ corresponding to various critical bands;
  d. code for solving for the corrective gains 10 which comprises:
    i. code for extracting a power value of the source signal P(f) in the various bands, in dBFS with a power estimator block 06, comprising:
      (A) identifying the source signal band, wherein the source signal band is a particular channel of the audio signal corresponding to the frequency 50;
      (B) feeding the source signal through a squared summer equation 51 whereby the source signal is squared and added up N times, whereby the sum of the signal at the end block divided by N generates a mean power value for the source signal, whereby said power value is then fed into a dB Converter to generate a power value $P_{dBFS}(f)$ for the source signal in dBFS 52;

ii. code for calculating a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dbSPL}(F){=}P_{dBFS}(F){+}(P_{dBSPL_0}(F){-}P_{dBFS_0}(F))$ wherein $P_{dBSPL0}$ is nominally a value between 65 and 83, and wherein $P_{dBFS0}$ is nominally a value between −20 and −12;

iii. code for converting the power value of the source signal to dB Phons 08 by applying a dBSPL to dBPhon Conversion equation, producing P(f);

iv. code for computing the critical band center frequency F 09 corresponding to the frequency f for the current signal band in kHz;

v. code for determining the value of the threshold elevation $P_0(f)$ in dB Phons, where said value is defined by the personalized sound adjustment model 10, which is parameterized by the user adjustable input 03 b;

vi. code for computing the value of S(P(f)) and $S(P_0(f))$ 11,12 for the Earspring model, which take the source signal P and threshold elevation $P_0$ in dBPhons and computes perceptual sound levels in Sones vii. code for computing the value of $\Delta P(f)$ needed to correct for the perceived hearing loss, for a frequency f, using the Conductor Equation 13 k. code for calculating a correction gain of power G(f) 14, for the source signal, in dBSPL, based on the value of $\Delta P(f)$ in dB Phons, using a Gain equation 14;

l. code for reconstituting the audio signal with the corrective gain to the source signal at the frequency, comprising i. feeding the correction gains G(f) to an Amplifier 53 wherein the Amplifier 53 multiplies the source signal channels $\bar{x}(t)$ by the corresponding corrective gains G(f), producing $\bar{x}_{out}(t)$;

ii. combining, using a Summer Block 15, the channels of the corrected audio signal to reconstitute the audio signal producing $x_{out}(t)$;

m. code for feeding the audio signal through a Digital to Analog Converter 16;

wherein the dBSPL to dBPhon Conversion equation 08 is:

$$P_{dBPhon}(F) = \frac{P_{dBSPL}(F) - ATH(F)}{1 + kATH(F)}$$

wherein the Gain equation 13 is:

$$\Delta P_{dBSPL}(F) {=} \Delta P_{dBPhon}(F)(1{+}kATH(F))$$

where
F=frequency
ATH(F)=Absolute Threshold of Hearing
K=−1/120 when ATH(F)>0
=+1/240 when ATH(F)<0

The absolute threshold of hearing may be computed in one example by the formula:

$$ATH(F) = \frac{3.64}{F_{KHz}^{0.8}} - 6.5e^{-0.6(F_{kHz}-3.3)^2} + 0.001F_{kHz}^4 - 3.37$$

As shown in FIG. 3, a computational model may be used in place of explicit computation of the Earspring and Conductor equations:

$$\Delta P \cong \frac{AP^2 + BP + C}{DP^2 + EP + 1}$$

where parameters A, B, C, D, and E are fit against the combined solution to the Earspring and Conductor equations, for each $P_0$, in 5 dB increments.

Similar to FIG. 3, it is also possible to use separate computational models for S(P) and for $S^{-1}(S)$, with separate sets of parameters fit against the solutions for various boundary parameters and values of $P_0$.

One example of the critical band center frequency is the Bark frequency which may be computed by, $$CBR(F_{kHz}) = \frac{26.81}{1 + \frac{1.960}{F_{kHz}}} - 0.53$$

In some embodiments, a pattern library may be used in place of the linear slope equation, where the user input and frequency are used to index into the pattern library and locate estimates of the threshold elevation $P_0$. These estimates may be used explicitly, or interpolation may be used to find a more precise estimate. Where the pattern library is ordered such that the user input relates monotonically to an increase in the approximate slope of estimates $P_0$ with respect to f.

As shown in FIG. 9, a typical loud but comfortable music spectral envelope, as shown in light blue, and that of the present invention, as show in dark blue, diverge at higher frequencies where the gains produced by the invention occur.

It should be apparent that any combinations of the use of a computational model or explicit computation for the Earspring and Conductor equations, parallel or series computation, or a pattern library versus the Linear slope equation will also fall within the scope of the present invention.

In some embodiments, the point where the estimate of $X_0$ is computed, may be earlier in the sequence relative to processing of the source signal.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIG. 3, with appropriate interfaces implemented between the microprocessor and the programmable logic devices.

In some embodiments, an FFT coprocessor may be used to facilitate generation of Fourier transforms. In this case the FFT co-processor would take the place of the Frequency Analysis and Summer block components.

In varying embodiments, the user adjustable input is controlled by a knob, or a roller, or wheel or slider, or lever, which is connected to a potentiometer or a variable resistor, which thus produces an output voltage on the electronic device which can be read by the microprocessor through an A/D converter.

The user adjustable input may also be a stored setting that is adjusted through an electronic menu system using buttons to select menu parameters, or a touchscreen device in which buttons and inputs are detected when the users touches the screen or uses an implement to touch the screen.

The user selectable input might also be controlled through a voice command menu, for use by physically disabled people who are unable to adjust a physical input device.

In embodiments where a pattern library or lookup table is used, the elements in the pattern library of lookup table may be obtained by collecting audiograms across a significant population and finding mean hearing loss patterns for varying degrees of hearing loss, thereby producing patterns of varying slope with respect to critical band center frequency.

In some embodiments, adjustments to the underlying linear estimation may be added to the linear equation to produce variations in the threshold elevation. For instance, these adjustments may be derived from higher order polynomial equation that modifies the estimated threshold elevation, where the adjustments are within +/−10% of the linear slope with respect to critical band center frequency.

In some embodiments, adjustments to the underlying linear estimation may be added to the linear equation or pattern library, to produce variations in the threshold elevation to more accurately compensate for the average hearing loss profile of humans. For instance, adjustments derived from collecting audiograms across a large population.

In some embodiments, adjustments to the underlying linear estimation may be added to the linear equation or pattern library, to produce variations in the threshold elevation to more accurately compensate for the individual's hearing loss profile. For instance, these adjustments may be derived from an audiogram for that individual.

In some embodiments, a library of stored threshold elevation patterns, for which a varying slope, linear in critical band center frequency, could be fit to each pattern, may be stored in memory, with the user input selecting between or interpolating between stored patterns, where the patterns are arranged in order of increasing or decreasing slope, such that monotonic changes in the user input are translated into monotonic changes in the slope of the pattern being used, and the patterns remain approximately linear in critical band center frequency.

In some embodiments, a lookup table may be stored in memory, where for each quantized value of the frequency and user input, a threshold elevation is returned, where the threshold elevation varies monotonically with respect to both the frequency and user input. (Alternatively, the threshold elevation returned is approximately linear with respect to critical band center frequency and monotonically increasing with respect to user input).

In some embodiments, the user adjustable input may be a setting on an electronic device such as a cell phone or media player, which the user modifies through a touch screen menu, trackpad, or other instrument which is used with the electronic device.

In some embodiments the user-adjustable input may be a setting on a computer, or in a software application, which the user modifies using a push button, scrollbar, or other GUI input.

In some embodiments the present invention may be accessed via a web application or interface, where this web application resides on a web page, an electronic device such as a mobile phone, or any other general computing device.

The present invention features an media player for enhancing an audio signal. The media player, or audio source as claimed, (e.g., a mobile phone) may, for example, comprise a standard mobile phone receiver, a standard mobile phone microphone, and a standard mobile phone speaker, all of which are well known to one of ordinary skill in the art. The receiver can function to extract an amplitude of a source signal at a given frequency (or within a frequency range).

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In one exemplary embodiment, the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Without wishing to limit the present invention to any theory or mechanism, it is believed that the present invention is advantageous because the present invention features a maximum output volume, for example the source signal will be amplified to only a certain degree. This can help protect against damage to the user's hearing.

In some embodiments, steps for converting analog audio input signals to digital input signals can be bypassed where the invention utilizes digital input audio sources capable of receiving digital audio signals and transmitting the same to the processor.

A media player may, in some embodiments, produce audio information via an internal speaker or external speakers in communication with audio output connections. In some embodiments, a media player reproduces decoded video information and/or provides decoded information to a video output.

In some embodiments, the media player utilizes a transreceiver configured to negotiate a communication channel with an external device and to convert the audio channel into the appropriate format before transmission. Communication could be wired or wireless.

In some embodiments, the present invention comprises a Media System. Said system may be: a Media player incorporated into a media system, such as a set-to-box device used to decode an input signal. STB Devices may include an input interface that can be coupled to coaxial cable, fiber-optic cable, Ethernet cable, or wirelessly to receive encoded media content such as audio, video, combination audio/video, etc. An STB may also be connected to a processor.

In some embodiments, the present invention resides on an electronic device external to but in communication with separate media players. For example, the present invention resides on a receiver, and communicates with media players via a network, which may be wired or wireless.

In some embodiments, the present invention comprises at least one output terminal for providing the enhanced audio for playback.

In some embodiments, the present invention comprises a touch screen controller in electronic communication with the microprocessor or DSP.

In some embodiments, the present invention comprises an LCD, LCD Controller, or any combination thereof. Said features are effective for display of information pertaining to the present invention to the user and may be in electronic communication with the microprocessor or DSP.

In some embodiments, the present invention comprises a baseboard processor. Said feature may be in electronic communication with the microprocessor.

In some embodiments, the present invention comprises an application processor, which may be an integrated Circuit chip similar to the microprocessor and may control the applications and flow of data on the present invention. Said applications processor may be in communication with and in addition to the microprocessor, or may exist in place of the microprocessor.

In some embodiments, the present invention comprises a Class D amp which may be an electronic amplifier where all power devices are operated as binary switches. Said amplifier may be in electronic communication with the microprocessor or DSP.

In some embodiments, the present invention comprises a low power audio codec. Said codec may for example, contain vDBM. Said feature may be a computer program implementing an algorithm and said codec may reside or be in electronic communication with the microprocessor.

In some embodiments, the present invention comprises sensors for sensing audio signals. Said sensors may be advantageous because they can be disposed at one or more locations on the device, thereby increasing the ability of the device to detect audio signals. Said sensors may be in electronic communication with the microprocessor.

In some embodiments, the present invention comprises a combination of vTuning and vDBM. For example, the present invention may dynamically adjust audio signals to account for interfering ambient noise while also making a spectral sound adjustment to the signal of interest to personalize sound according to a user's preference. Said feature may be enabled, for example, where the microprocessor contains both instructions for vTuning and vDBM.

In some embodiments, the present invention comprises removable memory devices for storing hearing preferences and profiles. Said memory devices may be, for example, zip drives, memory sticks, memory cards, or the like. Said feature may be in communication with the microprocessor.

In some embodiments, the present invention comprises a composite profile which may be data stored on the microprocessor.

In some embodiments, the present invention further comprises accessory ports. Said ports are effective for allowing the present invention to communicate with additional devices. Said feature may be in communication with the microprocessor or DSP and may be in predetermined locations on the device in places convenient for contact with external devices and connecting peripherals.

In some embodiments, the present invention further comprises streaming audio, or audio that is constantly received by and presented to an end-user while being delivered by a streaming provider. Said audio may be received be received by the present invention at the audio device.

In some embodiments, the present invention further comprises streaming video, or video that is constantly received by and presented to an end-user while being delivered by a streaming provider. Said video may be received be received by the present invention at the audio device.

In some embodiments, the present invention further comprises radio reception. Radio reception may be via the of, for example, an antennae where said antennae is in electronic communication with the microprocessor or DSP.

In some embodiments, the present invention comprises resources to prompt the user to provide information, resources to project information to a user, and any combination thereof. Said feature may be, use of the microprocessor, executing a software application where the microprocessor is configured to display message to the user on a screen and/or present messages to a user via a speaker.

In some embodiments, the present invention comprises an input/output controller. Said device may be a device that interfaces between an input or output device and a computer or hardware device, such as, for example, the microprocessor or DSP.

In some embodiments, the present invention comprises a USB port, infrared port, storage device or any combination thereof. Said peripherals enable the present invention communicate with one or more external devices. Said peripherals may be located at predetermined locations on the personal communications device and be in electronic communication with the microprocessor or DSP.

In some embodiments, the present invention comprises a transreceiver. Said transreceiver may be configured to negotiate a communication channel with an external device and to convert the audio channel into the appropriate format before transmission. Said receiver may be a combination of hardware and software in electronic communication with the microprocessor.

In some embodiments, the present invention comprises a transmitter. Said transmitter may be a mini stereo plug, RCA cable, USB, HDMI, or wireless device. Said transmitter may be in electronic communication with the microprocessor.

In some embodiments, the present invention comprises a Hearing aid/Media Player combo where the Hearing aid may be in communication with Media player, where hearing aid adjusts sound from the media player according to the technology discussed herein.

In some embodiments, the present invention comprises a remote control device in wireless or wired electronic communication with the microprocessor, said remote control configured to enable a user to interact with the present invention.

The present invention, in some embodiments, may be combined with a number of possible known psychoacoustic models, derived from the audiology literature, which are used to compute gains needed to amplify sound to overcome the effects of ambient noise on sound perception or gains needed to account for preferred threshold elevations computed for users' of normal hearing. The gains may be computed over the entire spectrum or by dividing the spectrum up into any number of smaller bandwidth or frequency components. The present invention is not limited to one particular psychoacoustic model and many potential appropriate models can be used in accordance with the present invention.

One potential example of a psychoacoustic model which may be combined with the present invention may be found in works such as (Moore, Brian C. et al., "A model for the prediction of thresholds, loudness and partial loudness", Journal of the Audio Engineering Society, JAES Volume 45 Issue 4 pp. 224-240; April (1997)) and (Rosengrad, Peniah, S., "Relationship Between Measures Related to the Cochlear Active Mechanism and Speech Reception Thresholds in backgrounds with and without Spectral and/or Temporal Fluctuations" PhD Thesis MIT (2004)). These models define a mathematical relationship between the sound impinging on the ear and the apparent loudness of the sound as perceived by a human.

The models above may be used to derive a formula for the gains needed to amplify sound and the formula may be written:

$$\frac{\sqrt[\alpha]{P_{SIG}^\alpha + P_{NOISE}^\alpha - P_{THRQ}^\alpha}}{P_{SIG}}$$

where G is the gain ratio, PSIG is the signal intensity at a frequency in units of power, PNOISE is the signal intensity of the background noise, PTHRQ is the absolute threshold of hearing, and ☐=02 is a constant.

Description of Additional Preferred Embodiments

In some embodiments, the present invention comprises a media player 01, effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers.

In some embodiments, the media player comprises:
a) a microprocessor 02, the microprocessor configured to execute an audio adjustment application 03;
b) a storage media 04, coupled to the microprocessor 02, containing media recordings;
c) a digital signal processing chip configured to implement an audio codec 05, coupled to the microprocessor 02, which effectuates the decoding of audio signals in the media recordings for output by a speaker;
d) a display screen 06, coupled to the microprocessor 02, upon which the microprocessor may display information for a user to view;
e) a input device 07, coupled to the microprocessor 02, which the user actuates to enter data into the microprocessor including an input parameter b;
f) a data storage/program memory unit 08, coupled to the microprocessor 02, which the microprocessor uses to store program code and variables;
g) a speaker 10, coupled to the audio codec 05, wherein the speaker is effective for presenting the audio signal after it has been adjusted;
h) the audio adjustment application 03 comprising:
  i. an Analog to Digital converter 04,
  ii. a Frequency Analysis Module 05,
  iii. a Power Estimator Block 06,
  iv. a dBFS to dBSPL Converter 07,
  v. a dBSPL to dB Phon Converter 08,
  vi. a kHz to critical band center frequency converter 09,
  vii. a Personalized sound adjustment model 10, parameterized by b,
  viii. a perceptual model component 25,
  ix. a Gain Block component 14,
  x. a Summer block component 15, and
  xi. a Digital to Analog Converter 16

In some embodiments, the media player can operate according to the following process flow:
The microprocessor 02 receives an audio signal which is the signal of interest by reading the signal from the storage media 04,
whereupon the audio signal 202 is processed the audio adjustment application 03,
whereupon, said audio signal is then transmitted to the Analog to Digital Converter 03 thereby converting the audio signal into digital format,
whereupon the audio signal is fed through the Frequency Analysis Module 04, breaking down the audio signal into frequency components,
whereupon, for each frequency component, the microprocessor 01 identifies a source signal corresponding to a particular frequency component 50,
whereupon, for each frequency component, the source signal is fed to the Power Estimator 06 and whereby the Power Estimator generates a mean power value for the source signal, whereby said power value is then fed into a dB Converter to generate a power value for the source signal $P_{dBFS}(f)$ in dBFS 52,
whereupon, for each frequency component, the microprocessor 01 completes a calibration offset such that the dBFS to dBSPL Converter 07 converts the power value of the source signal $P_{dBFS}(f)$ from dBFS to dBSPL, producing $P_{dBSPL}(f)$,
whereupon, for each frequency component, the dBSPL-dB Phon Converter 08 converts the power value of the source signal $P_{dBSPL}(f)$ to dB Phons by applying a dBSPL to dBPhon Conversion equation, producing P(f),
whereupon, for each frequency component, the critical band frequency converter 09 converts the frequency value f of a given input from kHz to critical band frequency,
whereupon, for each frequency component, the Personalized sound adjustment model 10 generates a value for $P_0(f)$ in dB Phons for the current frequency component using the user adjustable input parameter b 03,
whereupon, for each frequency component, the microprocessor 01 applies the power value of the source signal P(f) and $P_0(f)$, at each frequency component, now in dB Phons, to the perceptual model 25, which outputs a gain value ΔP(f) in dBPhons,
whereupon, for each frequency component, the microprocessor 01 calculates a correction gain of power G(f), for the source signal, in dBSPL, based on the value of ΔP(f) in dB Phons, using the Gain Block component 14 which utilizes the Gain equation, and
whereupon, for each frequency component, the media player 100 reconstitutes the audio signal with the corrective gain to the source signal at the frequency component, comprising:
  (i) feeding the correction gain to the amplifier, wherein the amplifier multiplies the source signal at the frequency component by the corresponding corrective gain 53,
  (ii) using the Summer block component 16, reconstituting the audio signal, producing $x_{out}(t)$
whereupon the audio signal is fed through the Digital to Analog Converter 17.

In some embodiments, the present invention comprises a media player 01, effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain $\Delta P$ for the signal, corresponding to the threshold elevation at that frequency component, which can suffice to raise the volume of the audio signal so that the user can perceive the audio signal, at each frequency component, the way the user prefers.

In some embodiments, the media player comprises:
a) a microprocessor 102;
b) a storage media 104, coupled to the microprocessor, the storage media containing media recordings;
c) a display screen 106, coupled to the microprocessor 102, upon which the microprocessor may display information for the user to view;
d) a input device 107, coupled to the microprocessor 102, which the user actuates to enter data into the microprocessor including an input parameter b;
e) a data storage/program memory unit 108, coupled to the microprocessor 102, which the microprocessor uses to store program code and variables;
f) a speaker 110, coupled to an audio codec 105 wherein the speaker is effective for presenting the audio signal after it has been adjusted;
g) a digital signal processor ("DSP") 103, coupled to the microprocessor 102 and speaker, the DSP configured to execute applications for:
  i. an Analog to Digital converter 104,
  ii. a Frequency Analysis Module 105,
  iii. a Power Estimator Block 106,
  iv. a dBFS to dBSPL Converter 107,
  v. a dBSPL to dB Phon Converter 108,
  vi. a kHz to critical band center frequency converter 109,
  vii. a Personalized sound adjustment model 110, parameterized by the input parameter b,
  viii. a perceptual model component 125,
  ix. a Gain Block component 114,
  x. a Summer block component 115, and
  xi. a Digital to Analog Converter 116

In some embodiments, the media player can operate according to the following process flow:
The microprocessor 102 receives an audio signal which is the signal of interest by reading the signal from the storage media 104,
whereupon the audio signal is transmitted to the digital signal processor 103, along with a user adjustable parameter b,
whereupon, said audio signal is then transmitted to the Analog to Digital Converter 103 thereby converting the audio signal into digital format,
whereupon the audio signal is fed through the Frequency Analysis Module 104, breaking down the audio signal into frequency components,
whereupon, for each frequency component, the DSP 103 identifies a source signal corresponding to a particular frequency 150,
whereupon, for each frequency component, the source signal is fed to the Power Estimator 106 and whereby the Power Estimator generates a mean power value for the source signal, whereby said power value is then fed into a dB Converter to generate a power value for the source signal $P_{dBFS}(f)$ in dBFS 152,
whereupon, for each frequency component, the DSP 103 computes a calibration offset such that the dBFS to dBSPL Converter 107 converts the power value of the source signal $P_{dBFS}(f)$ from dBFS to dBSPL, producing $P_{dBSPL}(f)$,
whereupon, for each frequency component, the dBSPL-dB Phon Converter 108 converts the power value of the source signal $P_{dBSPL}(f)$ to dB Phons by applying a dBSPL to dBPhon Conversion equation, producing P(f),
whereupon, for each frequency component, the critical band frequency converter 109 converts the frequency value f of a given input from kHz to critical band frequency,
whereupon, for each frequency component, the Personalized sound adjustment model 110 generates a value for $P_0(f)$ in dB Phons for the current frequency component, using the user adjustable input b 103,
whereupon, for each frequency component, the microprocessor 101 applies the power value of the source signal P(f) and $P_0(f)$, at each frequency component, now in dB Phons, to the perceptual model 125, which outputs a gain value $\Delta P(f)$ in dBPhons,
whereupon, for each frequency component, the DSP 103 calculates a correction gain of power G(f), for the source signal, in dBSPL, based on the value of $\Delta P(f)$ in dB Phons, using the Gain Block component 114 which utilizes the Gain equation, and
whereupon the DSP 103 reconstitutes the audio signal with the corrective gain to the source signal for each of the frequency components, comprising:
  (i) feeding the correction gain to the amplifier, wherein the amplifier multiplies the source signal at the frequency component by the corresponding corrective gain 53,
  (ii) using the Summer block component 116, reconstituting the audio signal, producing $x_{out}(t)$,
whereupon the audio signal is fed through the Digital to Analog Converter 117.

In some embodiments, the perceptual model for $\Delta P$ comprises a novel Conductor Equation 13, $$S(P)=S(P+\Delta P)-S(P_0)+S(0) \text{ or,}$$

$$\Delta P=S^{-1}(S(P)+S(P_0)-S(0))-P,$$

where S(P) is a function in Sones, a measure of perceived loudness, in terms of Phons, a measure of objective sound intensity, where S(P) is found by solving the EarSpring equation 11,12 for particular boundary values and input sound intensities, where P is a measure of sound intensity of a given channel of the audio signal in dBPhons, where $P_0$ is an estimated hearing loss at a given frequency,
where the Earspring equation 11,12 is written $[d^2/dt^2+2\beta (d/dt)+k\ (1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency channel, identified as the Sones power in the following equations, $\beta$=damping constant, k=spring constant, γ=coefficient of power dependence of spring constant, and η=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $\langle y^2 \rangle = \frac{1}{2}|Y|^2 = S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

In some embodiments, the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz. In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

In some embodiments, the perceptual model 25 is a computational model 19 used to estimate S(P) and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $$S(P)=S(P+\Delta P)-S(P_0)+S(0) \text{ or,}$$

$$\Delta P=S^{-1}(S(P)+S(P_0)-S(0))-P,$$

where S(0) is a known constant offset, whereupon this equation is solved using the values of P and $P_0$, where these values are obtained from the power value of the signal and the estimated threshold elevation.

In some embodiments, the perceptual model 25 is a computational model 19 used to estimate ΔP, consisting of a quadratic function $$\Delta P \cong \frac{AP^2 + BP + C}{DP^2 + EP + 1},$$

where A, B, C, D, and E are parameters which fit the quadratic function against solutions to the combined Earspring and Conductor equations for various values of $P_0$ and where sets of values for A, B, C, D, and E are stored in a lookup table references to various $P_0$.

In some embodiments, values of the parameters A, B, C, D, and E are fit against the Earspring and conductor equations for every $P_0$ in increments.

In some embodiments, the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the Frequency Analysis Module 20 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal 51, and where the Summer block component 21 is a summer operation that combines the various channels into output $x_{out}(t)$.

In some embodiments, the various sub-band channels correspond to critical bands of hearing.

In some embodiments, the Frequency Analysis Module 20 is an FFT co-processor, which outputs the Fourier transform of the input signal X(f), where the power value of the signal is found by squaring the components of this Fourier transform and where the Summer block component 21 is an FFT co-processor that performs an inverse Fourier transform, outputting the time domain signal $x_{out}(t)$.

In some embodiments, the frequency components are grouped together to approximate sub-bands correspond to critical bands of hearing.

In some embodiments, the personalized sound adjustment model 10 is a linear estimator, which uses a linear function of the critical band center frequency F, where the Linear Slope equation is $$X_0=[F-Y] \times b$$

where the setting (b) adjustable by the user 03, represents the slope of the line in dBHL/critical band, where Y is a value selected from a range of 2-3 bark, and where F is the critical band center frequency. In some embodiments, the aforementioned range is 0-1 Bark, 2-4 Bark, 1-5 Bark, Or 5-10 Bark.

In some embodiments, the personalized sound adjustment model 10 is composed of a pattern library which is stored in long term memory, where the patterns are composed of points which measure threshold elevations $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency. In some embodiments, the patterns are composed of points which measure threshold elevations, X0, with respect to frequency, of which 0-20% are within +/−5 dBHL of a mean squared error linear fit to the pattern with respect to critical band center frequency. In some embodiments, the patterns are composed of points which measure threshold elevations, X0, with respect to frequency, of which 20-40% are within +/−5 dBHL of a mean squared error linear fit to the pattern with respect to critical band center frequency. In some embodiments, the patterns are composed of points which measure threshold elevations, X0, with respect to frequency, of which 40-60% are within +/−5 dBHL of a mean squared error linear fit to the pattern with respect to critical band center frequency. In some embodiments, the patterns are composed of points which measure threshold elevations, X0, with respect to frequency, of which 60-80% are within +/−5 dBHL of a mean squared error linear fit to the pattern with respect to critical band center frequency. In some embodiments, the patterns are composed of points which measure threshold elevations, X0, with respect to frequency, of which 80-100% are within +/−5 dBHL of a mean squared error linear fit to the pattern with respect to critical band center frequency. In some embodiments, the patterns are composed of points which measure threshold elevations, X0, with respect to frequency, of which 66% are within +/−5 dBHL of a mean squared error linear fit to the pattern with respect to critical band center frequency. In some embodiments, the patterns are composed of points which measure threshold elevations, X0, with respect to frequency, of which 66% are within +/−1 dBHL of a mean squared error linear fit to the pattern with respect to critical band center frequency. In some embodiments, the patterns are composed of points which measure threshold elevations, X0, with respect to frequency, of which 66% are within +/−2 dBHL of a mean squared error linear fit to the pattern with respect to critical band center frequency. In some embodiments, the patterns are composed of points which measure threshold elevations, X0, with respect to frequency, of which 66% are within 3-6 dBHL of a mean squared error linear fit to the pattern with respect to critical band center frequency. In some embodiments, the patterns are composed of points which measure threshold elevations, X0, with respect to frequency, of which 66% are within 6-10 dBHL of a mean squared error linear fit to the pattern with respect to critical band center frequency.

In some embodiments, the personalized sound adjustment model 10 is composed of a lookup table indexed by values of parameter b and frequency, where the threshold elevation $X_0$ is found by selecting the corresponding element of the lookup table or interpolating between points in the lookup table.

In some embodiments, the corrective gains are computed in parallel for multiple channels using multiple processing units.

In some embodiments, the corrective gains are computed in part in parallel and in part in serial for multiple frequency components using multiple processing units.

In some embodiments, the corrective gains are computed in serial for multiple frequency components using multiple processing units.

In some embodiments, the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

In some embodiments, the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=−1/120 when ATH(F)>0
=+1/240 when ATH(F)<0
In some embodiments, the Gain equation 17 is:

$$\Delta P_{dBSPL}(F) = \Delta P_{dBPhon}(F)(1 + kATH(F))$$

where
F=frequency
ATH(F)=Absolute Threshold of Hearing
=−1/120 when ATH(F)>0
=+1;240 when ATH(F)<0
In some embodiments, the absolute threshold of hearing is computed by the formula:

$$ATH(F) = \frac{3.64}{F_{KHz}^{0.8}} - 6.5e^{-0.6(F_{kHz}-3.3)^2} + 0.001 F_{kHz}^4 - 3.37$$

In some embodiments, the critical band center frequency is the Bark frequency, which is computed by, $$CBR(F_{kHz}) = \frac{26.81}{1 + \frac{1.960}{f_{kHz}}} - 0.53$$

In some embodiments, the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F) = P_{dBFS}(F) + (P_{dBSPL_0}(F) = P_{dBFS_0}(F))$ wherein $P_{dBSPL0}$ is nominally a value between 65 and 83, and wherein $P_{dBFS0}$ is nominally a value between −20 and −12.

In some embodiments, there are multiple source audio signals corresponding to both ears and hearing loss is estimated independently with separate user inputs for each ear, and separate gains computed for each frequency component.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:
1. A media player 01, effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain $\Delta P$ for the signal, corresponding to the threshold elevation at that frequency component, which can suffice to raise the volume of the audio signal so that the user can perceive the audio signal, at each frequency component, the way the user prefers, the media player 01 comprising:

a) a microprocessor 102, the microprocessor configured to execute an audio adjustment application 03;
b) a storage media 104, coupled to the microprocessor 02, containing media recordings;
c) a digital signal processing chip 103 configured to implement an audio codec 105, coupled to the microprocessor 102, which effectuates the decoding of audio signals in the media recordings for output by a speaker;
d) a display screen 106, coupled to the microprocessor 102, upon which the microprocessor may display information for a user to view;
e) a input device 107, coupled to the microprocessor 102, which the user actuates to enter data into the microprocessor including an input parameter b;
f) a data storage/program memory unit 108, coupled to the microprocessor 102, which the microprocessor uses to store program code and variables;
g) a speaker 110, coupled to the audio codec 105, wherein the speaker is effective for presenting the audio signal after it has been adjusted;
h) the audio adjustment application 03 comprising:
  i. an Analog to Digital converter 204,
  ii. a Frequency Analysis Module 220,
  iii. a Power Estimator Block 206,
  iv. a dBFS to dBSPL Converter 207,
  v. a dBSPL to dB Phon Converter 208,
  vi. a kHz to critical band center frequency converter 209,
  vii. a Personalized sound adjustment model 210, parameterized by b,
  viii. a perceptual model component 225,
  ix. a Gain Block component 214,
  x. a Summer block component 221, and
  xi. a Digital to Analog Converter 216 wherein the microprocessor 102 receives an audio signal which is the signal of interest by reading the signal from the storage media 104,
whereupon the audio signal 202 is processed the audio adjustment application 03,
whereupon, said audio signal is then transmitted to the Analog to Digital Converter 204 thereby converting the audio signal into digital format,
whereupon the audio signal is fed through the Frequency Analysis Module 220, breaking down the audio signal into frequency components,
whereupon, for each frequency component, the microprocessor 01 identifies a source signal corresponding to a particular frequency component 50,
whereupon, for each frequency component, the source signal is fed to the Power Estimator 206 and whereby the Power Estimator generates a mean power value for the source signal, whereby said power value is then fed into a dB Converter to generate a power value for the source signal $P_{dBFS}(f)$ in dBFS,
whereupon, for each frequency component, the microprocessor 01 completes a calibration offset such that the dBFS to dBSPL Converter 207 converts the power value of the source signal $P_{dBFS}(f)$ from dBFS to dBSPL, producing $P_{dBSPL}(f)$,
whereupon, for each frequency component, the dBSPL-dB Phon Converter 208 converts the power value of the source signal $P_{dBSPL}(f)$ to dB Phons by applying a dBSPL to dBPhon Conversion equation, producing P(f),
whereupon, for each frequency component, the critical band frequency converter 209 converts the frequency value f of a given input from kHz to critical band frequency,
whereupon, for each frequency component, the Personalized sound adjustment model 210 generates a value for $P_0(f)$ in dB Phons for the current frequency component using the user adjustable input parameter b 03,
whereupon, for each frequency component, the microprocessor 01 applies the power value of the source signal P(f) and $P_0(f)$, at each frequency component, now in dB Phons, to the perceptual model 225, which outputs a gain value $\Delta P(f)$ in dBPhons,
whereupon, for each frequency component, the microprocessor 01 calculates a correction gain of power G(f), for the source signal, in dBSPL, based on the value of $\Delta P(f)$ in dB Phons, using the Gain Block component 214 which utilizes the Gain equation, and
whereupon, for each frequency component, the media player 100 reconstitutes the audio signal with the corrective gain to the source signal at the frequency component, comprising:
  (i) feeding the correction gain to the amplifier, wherein the amplifier multiplies the source signal at the frequency component by the corresponding corrective gain 53,
  (ii) using the Summer block component 216, reconstituting the audio signal, producing $x_{out}(t)$
whereupon the audio signal is fed through the Digital to Analog Converter 216.

2. A media player 01, effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain $\Delta P$ for the signal, corresponding to the threshold elevation at that frequency component, which can suffice to raise the volume of the audio signal so that the user can perceive the audio signal, at each frequency component, the way the user prefers, the media player 01 comprising:

a) a microprocessor 102;
b) a storage media 104, coupled to the microprocessor, the storage media containing media recordings;
c) a display screen 106, coupled to the microprocessor 102, upon which the microprocessor may display information for the user to view;
d) a input device 107, coupled to the microprocessor 102, which the user actuates to enter data into the microprocessor including an input parameter b;
e) a data storage/program memory unit 108, coupled to the microprocessor 102, which the microprocessor uses to store program code and variables;
f) a speaker 110, coupled to an audio codec 105 wherein the speaker is effective for presenting the audio signal after it has been adjusted;

g) a digital signal processor ("DSP") 103, coupled to the microprocessor 102 and speaker, the DSP configured to execute applications for:
   i. an Analog to Digital converter 204,
   ii. a Frequency Analysis Module 220,
   iii. a Power Estimator Block 206,
   iv. a dBFS to dBSPL Converter 207,
   v. a dBSPL to dB Phon Converter 208,
   vi. a kHz to critical band center frequency converter 209,
   vii. a Personalized sound adjustment model 210, parameterized by the input parameter b,
   viii. a perceptual model component 225,
   ix. a Gain Block component 214,
   x. a Summer block component 215, and
   xi. a Digital to Analog Converter 216 wherein the microprocessor 102 receives an audio signal which is the signal of interest by reading the signal from the storage media 104,
whereupon the audio signal is transmitted to the digital signal processor 103, along with a user adjustable parameter b,
whereupon, said audio signal is then transmitted to the Analog to Digital Converter 204 thereby converting the audio signal into digital format,
whereupon the audio signal is fed through the Frequency Analysis Module 220, breaking down the audio signal into frequency components,
whereupon, for each frequency component, the DSP 103 identifies a source signal corresponding to a particular frequency 150,
whereupon, for each frequency component, the source signal is fed to the Power Estimator 206 and whereby the Power Estimator generates a mean power value for the source signal, whereby said power value is then fed into a dB Converter to generate a power value for the source signal $P_{dBFS}(f)$ in dBFS,
whereupon, for each frequency component, the DSP 103 computes a calibration offset such that the dBFS to dBSPL Converter 207 converts the power value of the source signal $P_{dBFS}(f)$ from dBFS to dBSPL, producing $P_{dBSPL}(f)$,
whereupon, for each frequency component, the dBSPL-dB Phon Converter 208 converts the power value of the source signal $P_{dBSPL}(f)$ to dB Phons by applying a dBSPL to dBPhon Conversion equation, producing P(f),
whereupon, for each frequency component, the critical band frequency converter 209 converts the frequency value f of a given input from kHz to critical band frequency,
whereupon, for each frequency component, the Personalized sound adjustment model 210 generates a value for $P_0(f)$ in dB Phons for the current frequency component, using the user adjustable input b 103,
whereupon, for each frequency component, the microprocessor 101 applies the power value of the source signal P(f) and $P_0(f)$, at each frequency component, now in dB Phons, to the perceptual model 225, which outputs a gain value $\Delta P(f)$ in dBPhons,
whereupon, for each frequency component, the DSP 103 calculates a correction gain of power G(f), for the source signal, in dBSPL, based on the value of $\Delta P(f)$ in dB Phons, using the Gain Block component 214 which utilizes the Gain equation, and
whereupon the DSP 103 reconstitutes the audio signal with the corrective gain to the source signal for each of the frequency components, comprising:
   (i) feeding the correction gain to the amplifier, wherein the amplifier multiplies the source signal at the frequency component by the corresponding corrective gain 53,
   (ii) using the Summer block component 221, reconstituting the audio signal, producing $x_{out}(t)$, whereupon the audio signal is fed through the Digital to Analog Converter 117.

3. The media player of claim 1 and claim 2, wherein the perceptual model for $\Delta P$ comprises a novel Conductor Equation 313, $$S(P)=S(P+\Delta P)-S(P_0)+S(0) \text{ or,}$$

$$\Delta P=S^{-1}(S(P)+S(P_0)-S(0))-P,$$

where S(P) is a function in Sones, a measure of perceived loudness, in terms of Phons, a measure of objective sound intensity, where S(P) is found by solving the EarSpring equation 311, 312 for particular boundary values and input sound intensities, where P is a measure of sound intensity of a given channel of the audio signal in dBPhons, where $P_0$ is an estimated hearing loss at a given frequency, where the Earspring equation 311,312 is written $[d^2/dt^2 + 2\beta(d/dt)+k(1+\gamma\gamma<y^2>)]y(t)=\eta F(t)$, which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, $<y^2>$=mean output power of vibration for a given frequency channel, identified as the Sones power in the following equations, $\beta$=damping constant, k=spring constant, $\gamma$=coefficient of power dependence of spring constant, and $\eta$=the scale factor, where for a particular frequency of the driving force F(t), which represents a pure sinusoid of intensity P (the input sound intensity), a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary conditions.

4. The media player of claim 3, where the set of boundary conditions comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

5. The media player of claim 1 and claim 2, where the perceptual model 25 is a computational model 19 used to estimate S(P) and $S^{-1}(S)$, consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}$(S) are then used in the conductor equation, where Conductor Equation 313 is, $$S(P)=S(P+\Delta P)-S(P_0)+S(0) \text{ or,}$$

$$\Delta P=S^{-1}(S(P)+S(P_0)-S(0))-P,$$

where S(0) is a known constant offset, whereupon this equation is solved using the values of P and $P_0$, where these values are obtained from the power value of the signal and the estimated threshold elevation.

6. The media player of claim 1 and claim 2, where the perceptual model 225 is a computational model 19 used to estimate $\Delta P$, consisting of a quadratic function $$\Delta P \cong \frac{AP^2+BP+C}{DP^2+EP+1},$$

where, A, B, C, D, and E are parameters which fit the quadratic function against solutions to the combined Earspring and Conductor equations for various values of $P_0$ and where sets of values for A, B, C, D, and E are stored in a lookup table references to various $P_0$.

7. The media player of claim 6, where values of the parameters A, B, C, D, and E are fit against the Earspring and conductor equations for every $P_0$ in increments.

8. The media player of claim 1 and claim 2, where the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

9. The media player of claim 1 and claim 2, where the Frequency Analysis Module 220 is a digital filter bank of IIR filters that breaks the signal down into various sub-band channels x̂(t), where the power of each channel is found by passing the channel through a Square Summer equation, whereby the signal is squared and added up N times, whereby the sum of the signals at the end block divided by N generates mean power values for the source signal 51, and where the Summer block component 21 is a summer operation that combines the various channels into output $x_{out}(t)$.

10. The media player of claim 9, where the various sub-band channels correspond to critical bands of hearing.

11. The media player of claim 1 and claim 2, where the Frequency Analysis Module 220 is an FFT co-processor, which outputs the Fourier transform of the input signal X(f), where the power value of the signal is found by squaring the components of this Fourier transform and where the Summer block component 221 is an FFT co-processor that performs an inverse Fourier transform, outputting the time domain signal $x_{out}(t)$.

12. The media player of claim 1 and claim 2, where the frequency components are grouped together to approximate sub-bands correspond to critical bands of hearing.

13. The media player of claim 1 and claim 2, wherein the personalized sound adjustment model 210 is a linear estimator, which uses a linear function of the critical band center frequency F, where the Linear Slope equation is $$X_0 = [F-Y] \times b$$

where the setting (b) adjustable by the user 03, represents the slope of the line in dBHL/critical band, where Y is a value selected from a range of 2-3 bark, and where F is the critical band center frequency.

14. The media player of claim 1 and claim 2, wherein the personalized sound adjustment model 210 is composed of a pattern library which is stored in long term memory, where the patterns are composed of points which measure threshold elevations $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

15. The media player of claim 1 and claim 2, wherein the personalized sound adjustment model 210 is composed of a lookup table indexed by values of parameter b and frequency, where the threshold elevation $X_0$ is found by selecting the corresponding element of the lookup table or interpolating between points in the lookup table.

16. The media player of claim 1 and claim 2, wherein the corrective gains are computed in parallel for multiple channels using multiple processing units.

17. The media player of claim 1 and claim 2, wherein the corrective gains are computed in part in parallel and in part in serial for multiple frequency components using multiple processing units.

18. The media player of claim 1 and claim 2, wherein the corrective gains are computed in serial for multiple frequency components using multiple processing units.

19. The media player of claim 1 and claim 2 wherein the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

20. The media player of claim 1 and claim 2, wherein the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

21. The media player of claim 1 and claim 2, wherein the dBSPL to dBPhon Conversion equation 312,313 is:

$$P_{dBPhon}(F) = \frac{P_{dBSPL}(F)-ATH(F)}{1+kATH(F)}$$

where
F=frequency
ATH(F)=Absolute Threshold of Hearing
K=−1/120 when ATH(F)>0
=+1/240 when ATH(F)<0

22. The media player of claim 1 and claim 2, wherein the Gain equation 17 is:

$$\Delta P_{dBSPL}(F) = \Delta P_{dBPhon}(F)(1+kATH(F))$$

where
F=frequency
ATH(F)=Absolute Threshold of Hearing
K=−1/120 when ATH(F)>0
 =+1/240 when ATH(F)<0

23. The media player of claim 1 and claim 2, wherein the absolute threshold of hearing is computed by the formula:

$$ATH(F) = \frac{3.64}{F_{KHz}^{0.8}} - 6.5e^{-0.6(F_{kHz}-3.3)^2} + 0.001F_{kHz}^4 - 3.37$$

24. The media player of claim 1, and claim 2, wherein the critical band center frequency is the Bark frequency, which is computed by, $$CBR(F_{kHz}) = \frac{26.81}{1 + \frac{1.960}{F_{kHz}}} - 0.53$$

25. The media player of claim 1, and claim 2, where the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F) = P_{dBFS}(F) + (P_{dBSPL_0}(F) - P_{dBFS_0}(F))$ wherein $P_{dBSPL0}$ is nominally a value between 65 and 83, and wherein $P_{dBFS0}$ is nominally a value between −20 and −12.

26. The media player of claim 1, and claim 2, where there are multiple source audio signals corresponding to both ears and hearing loss is estimated independently with separate user inputs for each ear, and separate gains computed for each frequency component.

VIRTUAL AUDIO PORT WITH AUTOMATIC SPECTRAL ENHANCEMENT OF AUDIO SIGNALS

Background of the Invention

The present invention relates to the field of audio processing for the correction of hearing loss and also personalization of sound.

Hearing loss is a normal part of the aging process for most humans, which can also be accelerated or produced through repetitive exposure to loud noises such as rock concerts or construction equipment. Most humans begin to lose awareness of high frequency noises in their 20s. Hearing loss starts in the higher frequency register and gradually progresses to lower registers. As a result, a constant volume increase in loudness will fail to correct for the change in the frequency composition of the sound perceived by the listener, thereby distorting the perception of the sound by the listener. The aging of a large segment of the population which has been repetitively exposed to loud rock music is likely to result in a significant portion of the elderly in the near future having more progressive hearing loss in their old age than in the past.

Most hearing aids focus on the enhancement of signals specifically for speech perception. However, hearing loss affects sound across the spectrum in a consistent manner. These losses affect the enjoyment of music by causing the listener to lose his perception of sounds in a higher register. The application of standard hearing aid corrections to a musical performance can produce a displeasing effect by amplifying sound in a spectrally inconsistent manner and failing to correct for the higher register losses. In order to hear the higher frequency registers a user may increase the volume of music to potentially damaging levels.

There are many systems for sound level equalization from an audio processing standpoint. However, most of these systems use measures of sound intensity prior to impingement on the ear as a target for correction. Few systems use perceptual loudness—that is, sound as it is apparent to the listener. The human ear introduces many non-linear effects on apparent loudness, consequently, sound intensity as measured by the sound pressure level (SPL) does not correlate linearly with the sound level perceived by a human. Moreover, after hearing loss, the perceived sound level is degraded by an increasing function of frequency (higher frequencies are more degraded than lower ones).

Microphones and mechanical systems (e.g., computer software) can measure dBSPL; a sound (e.g., ~40 dBSPL) at particular frequency (e.g., 1 kHz) sounds just as loud as the sound (e.g., ~40 dBSPL) at a different frequency (e.g., 4 kHz) to a microphone or mechanical system. However, our hearing can be affected by the mechanical construction of our outer ear and/or slow variation in sensitivity across the basilar membrane due to fluid damping of the incident waves in the cochlear fluid. The variable sensitivity of human hearing is reflected in the Fletcher-Munson equal loudness contours and the equal-loudness contours from ISO 226:3003 revision (Phons). The equations of the systems of the present invention utilize conversions from dBSPL to Phons and from Phons to dBSPL(incoming sounds levels are converted from dBSPL to Phons for use in the equations, then subsequently the Phons are converted to dBSPL for expression to speakers and headphones. Conversion from dBSPL to Phons and from Phons to dBSPL is in accordance with the Fletcher-Munson equal-loudness contours and the equal-loudness contours from ISO 226:3003 revision.

Iso-loudness contours are most often displayed in terms of dB intensity versus log frequency. The log frequency axis provides excessive emphasis on the lower frequencies and less emphasis on high frequencies where audiological damage most often occurs in sensioneural hearing loss.

It can be observed that everyone is "impaired" at higher frequencies unless the volume of sounds at those frequencies are very loud. Most of the spice of music is found in the high frequency region—sibilant speech, breathiness, cymbals, etc. Further, nearly everyone enjoys music more when it is played loudly. That gives that the opportunity to hear this musical spice. By using the present invention, users can gain a sense of enjoyment without needing to raise the volume of music and sounds to potentially damaging levels.

Using the equations described herein for correction of signal source amplitudes, it is found that most people with normal hearing prefer a parameter setting of around 2.5 dB per Bark, when listening at 77 dB SPL through headphones. That corresponds to a working threshold elevation of 50 dB at the highest frequencies. But since we don't live in a world of threshold level sounds, the actual gain needed for a 50 dB threshold elevation, when the sound is at 60 dBSPL and 10 kHz, is only on the order of approximately 5 dB. The gains applied are nonlinear compression to overcome the "recruitment" gain expansion produced by ear physics.

When offered the opportunity to listen through the corrective systems of the present invention, based on the hearing equations discussed herein, people with very normal hearing uniformly prefer some degree of modulation at varying frequencies.

In some prior art systems, an individualized audiogram is used to measure hearing loss for a particular individual. The sound can then be spectrally corrected using this stored audiogram pattern to reproduce a spectral correct sound in the individual's perception. This method is disadvantageous since it requires a significant number of parameters to be stored and these parameters are cumbersome and difficult to adjust accurately, even when performed by a medical professional.

The perceived loudness of sound can be modeled by a harmonic oscillator with spring constant that varies according to the mean power of vibration. This model is called the Earspring model. The Earspring equation 10,11 is written $[d^2/dt^2+2\beta(d/dt)+k(1+\gamma\gamma<y^2>)]y(t)=\eta F(t)$, where t=time, y(t)=amplitude of vibration, F(t)=driving force in terms of Phons amplitude or sound intensity, $<y^2>$=mean power of vibration or S(P), identified as the Sones power in the following equations, $\beta$=damping constant, k=spring constant, $\gamma$=coefficient of power dependence of spring constant, and $\eta$=the scale factor. Thus the resonant frequency of the Earspring varies with the amplitude of the $<y^2>$ term. Since $<y^2>$ is a function of y, this equation is nonlinear.

For a particular driving force F(t), which we will consider to be a sinusoid at a given frequency and amplitude P in dBPhons, a solution to the Earspring equation y(t) can be found, for a particular set of boundary conditions, which is the steady state response to the forcing function. Transforming into the frequency domain we can obtain the mean power of vibration $<y^2>=\frac{1}{2}|Y|^2$, which is the Sones power of the perceived sound.

A possible set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Using the boundary conditions, we can derive an equation for S(P), $$S(P) = \frac{(4\hat{\beta}^2 + \Gamma_{40}^2)}{(4\hat{\beta}^2 + (\Gamma_{40}S(P))^2)} 10^{(P-40)/10}$$

where S(P) is the perceived loudness in Sones which the listener experiences, and P is the sound intensity impinging on the ear in dBPhons. Where $\hat{\beta}=\beta/\sqrt{k}$ and where $\Gamma_{40}$ represents the mean power of vibration at the resonant frequency for a ~40 dBSPL amplitude driving force. The constants $\hat{\beta}$ and $\Gamma_{40}$ are found by solving the Earspring equation according to experimental boundary conditions. Note that this formula is independent of frequency although the sound intensity P of any given signal may vary as a function of frequency.

Summary of the Invention

The present invention features systems for enhancing audio signals to correct across a spectrum of frequencies according to a model of the spectral characteristics of hearing loss, and a model of the perceptual loudness of sound as a function of sound intensity. A method of the present invention estimates hearing loss from a function of the critical band center frequency and a single user input. A model of perceptual loudness is applied across frequencies, taking the estimated hearing loss per frequency as an input. The model allows the system to compute corrections which will cause the sound to be perceived as loudly as it should be from the perspective of the user, and in a way in which the perceived spectral composition of the sound is unaltered. The systems of the present invention compute a user-determined degree of correction to sounds at varying frequencies, allowing a listener to hear sounds, across varying frequencies, as the listener wishes to hear them without needing to raise the volume of the sounds to potentially damaging levels. Systems may be incorporated into apparatuses including but not limited to mobile phones, music players and virtual audio ports.

Allowing the user to control the slope with respect to frequency of the correction pattern through a user adjustable setting allows the user to tune the corrections, across the frequency spectrum, to his or her taste through a single adjustment.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description.

Glossary of Terms

The Following Information Regarding Terms is Non-Limiting and Exemplary in Nature for the Purpose of Understanding the Spirit of the Invention 1. Amplifier: This component can be any amplifier or related device capable of applying gains to an audio signal.
2. Audio Codec: Audio Encoder/Decoder converts an audio signal to and from its encoded format either for storing in a file or transmission over a network
3. A/D Converter: Converts audio signals from analog to digital format. In some embodiments, the term A/D Converter is used interchangeably with a means for converting an audio signal from analog to digital form. Analog-to-digital and digital-to-analog converters can be assumed to exist at interface points between analog elements and digital elements of any embodiment. Said means may be electronic, non-electronic or only partially electronic. Said converters, also commonly referred to as Analog to Digital Converters or ADCS, are well known within the art and would be understood by one skilled in the same. Said converters could include but are not limited to direct-conversion ADCs, successive approximation ADCs, a ramp-compare ADC, Wilkinson ADCs, integrating ADCs, Delta-encoded ADCs, pipeline ADCs, time interleaved ADCs, or ADCs with intermediate FM Stage
4. Audio Device: As used herein, an audio device is any audio device capable of extracting, storing or receiving an audio signal. In some embodiments, the term audio device is used interchangeably with a "means for extracting and/or identifying an audio signal of interest and/or ambient noise signal." Said means may be, for example, a microphone, receiver, or storage media containing a signal of interest in an audio file and code for reading the signal from an audio file.
5. Audiogram: One form of defining a person's hearing loss which plots thresholds of hearing relative to a standardized curve that represents 'normal' hearing, in dB(HL). An audiogram can be obtained using a behavioral hearing test called Audiometry. The "Tone" test involves presenting different tones at a specific frequency (pitch) and intensity (loudness) and determining thresholds of hearing for each tone where the thresholds correspond to how loud the tone must be presented in order for the person to perceive the tone sound.

6. Audio Jack: An input by which an audio signal can be received. i.e. from a microphone.
7. Background signal: The background signal, as used herein, refers to a portion of the second audio signal or the ambient noise signal at the same frequency component as that of the source signal. The source signal and the background signal are paired.
8. Calibration equation: Calibration comprises configuring a microprocessor to calculate and interpret a baseline relationship between dBFS and dBPSL such that a zero point in dBSPL can be computed. It is represented by: $P_{dbSPL}(F)=P_{dBFS}(F)+(P_{dBSPL_0}(F)-P_{dBFS\_0}(F))$ wherein $P_{dBSPL0}$ is nominally a value between 65 and 83, and wherein $P_{dBFS0}$ is nominally a value between −20 and −12; where P=Phons amplitude of a source signal of interest
F=Frequency
dBSPL=decibels according to sound pressure
dBFS=decibels relative to full scale
9. Bark frequency: The bark scale is a psychoacoustic scale for subjective measurements of loudness. The scale is broken down into critical bands of hearing. Critical bands are known frequency bandwidths that correspond to limitations of the human ear to perceive sounds with frequency differences smaller than the critical bandwidths.
10. D/A Converter: Converts audio signals from digital to analog format. In some embodiments, the term D/A Converter is used interchangeably with a means for converting an audio signal from digital to analog form. Analog-to-digital and digital-to-analog converters can be assumed to exist at interface points between analog elements and digital elements of any embodiment. A D/A converter, or DAC, is capable of converting a digital, usually binary signal code to an analog signal (current voltage or electric charge). DACs may include but are not limited to pulse width modulators, oversampling or interpolating DACs, binary weighted DACs, R-2R Ladder DACs, Successive approximation or cyclic DACs, thermometer coded DACs, and hybrid DACs.
11. Digital Signal Processor ("DSP") Chip: A specialized microprocessor with an architecture for the fast operational needs of digital signal processing.
12. FFT Co-Processor: A specialized microprocessor designed for the purpose of rapidly computing Fourier transforms using a algorithm for computing Fourier transforms commonly known as the 'Fast Fourier Transform' (FFT).
13. Field Programmable Gate Array ("FPGA"): a reprogrammable electronic chip.
14. Filter banks: An array of band-pass filters that separate an input signal into multiple components, or as used herein, frequency components, each frequency component carrying a single frequency subband of the original signal.
15. FIR Filter: A filter with an impulse response (or response to any finite length input) of finite duration, because it settles to zero in finite time. This is in contrast to infinite impulse response (IIR) filters, which have internal feedback and may continue to respond indefinitely (usually decaying). FIR filters can be discrete-time or continuous-time, and digital or analog.
16. Fourier transforms: A mathematical operation that computes the frequency content of an audio signal, taking a given audio signal as input and outputting magnitudes and phases across the frequency spectrum.
17. Frequency Analysis Model: This model can use a variety of known methods to divide the audio signal of interest into a plurality of frequency components. Such methods may include, but are not limited to methods such as filter banks, Fourier transforms, wavelet transforms or other signal processing techniques. In some embodiments, the term Frequency Analysis Model is used interchangeably with a "means for dividing an audio signal into a plurality of frequency components. Said means may be, for example, a digital filter bank, analog filter bank, FFT Co-processor, or code for computing a Fourier transform analysis to an audio signal on computer-readable media.
18. Frequency component and Frequency Component Spectrum: A frequency component, as used herein, identifies a portion of the frequency range of an audio signal. A frequency component may comprise a particular, individual frequency, frequency channels, or frequency bands. A frequency component spectrum is a plurality of frequency components.
19. Frequency Synthesis Module: A module which the present invention can use to reconstitute the various frequency components of a particular audio signal of interest. The frequency synthesis Module may perform summation of the various frequency components of the signal of interest, or may perform an inverse Fourier transform, or other transform, after said frequency components have been adjusted, to create a new signal or waveform, depending on whether the Frequency analysis module was a filter bank or a fourier transform, or other transform. "Sound Systems: Design and Optimization: Modern Techniques and Tools for Sound System Design and Alignment", McCarthy, Bob (2010) (Focal Press) Second Edition. In some embodiments, the term Frequency Synthesis Module is used interchangeably with a "means for reconstituting an audio signal". Said means may be, for example, a summer block, a frequency synthesis module, an FFT-Co processor, an inverse FFT transform, or code for implementing an inverse FFT transform on computer-readable media.
20. Gain Block component—This component applies the gains to each corresponding frequency component or band. In some embodiments, the term gain block component is used interchangeably with a "means for applying gains to a audio signal." Said means may be, for example, an amplifier, or gain block component.
21. Infinite Impulse Response ("IIR") Filter: A signal processing filter with an impulse response function that is non-zero over an infinite length of time. May be implemented as either digital or analog IIR filters. IIR filters use fewer computing resources because they use fewer taps.
22. Input Device: An device configured to enable a user to set a parameter b of a personalized sound adjustment model. In some embodiments, the term input device is used interchangeably with "a means for enabling a user to set a parameter b of a personalized sound adjustment model". Said means may be, for example, a physical input device such as a user adjustable input, a knob, a slider, a keypad, or any combination thereof. Said means may alternatively be an electronic means or a combination of physical hardware and electronics such as graphical user interface. Said means may further be a touch screen configured to accept a user's choice of parameter b. Additional means would be recognized and understood by one skilled in the relevant art.
23. Inverse Fourier Transform: A mathematical operation which computes a time domain signal corresponding to a given frequency spectrum.

24. kHz frequency to critical band center frequency converter: The critical bands of hearing are natural bands in the audio frequency spectrum in the human ear. These bands are characterized by the masking of tones by other tones in the same critical band. There are several experimentally derived frequency scales that attempt to approximate the critical bands including the Bark scale—a psychoacoustic model proposed by Eberhard Zwicker in 1961, and named after Heinrich Barkhausen who proposed the first subjective measurements of loudness. One example of the equation for converting from kHz to critical band frequency is the conversion to Bark frequency:

$$CBR(F_{kHz}) = \frac{26.81}{1 + \frac{1.960}{F_{kHz}}} - 0.53$$

In some embodiments, the term kHz frequency to critical band center frequency converter is used interchangeably with a "means for converting a frequency component or series of frequency components to critical band frequency. Said mean may be, for example, a summer.

25. Linear slope equation: This equation is part of the Personalized sound adjustment model, and is a novel mathematical equation, and one potential embodiment by which threshold elevations are generated for vTuning. In some embodiments, the term Linear Slope equation is used interchangeably with a "means for estimating threshold elevations specific to a particular person." Said means may be, for example, the Linear Slope equation, an audiogram, or a pattern library.

26. Lookup Table: A tabular list of parameters indexed by some given variable, such as signal power. Used by the model to select a parameter or set of parameters depending on the current real-time value of a variable. In some embodiments, the term Lookup Table is used interchangeably with a "means for determining threshold elevations by using a lookup table." Said means may be, for example, computer-readable media code for retrieving a threshold elevation value from a memory device using a user adjustable parameter b and frequency as indexes.

27. Microphone: The microphone can be any microphone or the like capable of receiving an audio signal.

28. Parallel Compression: applying a linear gain to a signal which amplifies softer sounds and subsequently adding this amplified sound back in to the original signal. Also known as New York compression. In some embodiments, the term parallel compression is used interchangeably with a "means for computing and/or applying corrective gains to an audio signal where said gains correspond to threshold elevations, using a combination of parallel compression and known psychoacoustic models" or a "means for using parallel compression to approximate a desired non-linear dynamic range compression curve." Said means can for example, be any known psychoacoustic model such as the model disclosed herein. Said means may for example, be a model where a compression curve defines the output loudness in decibels versus the input loudness in decibels of a signal of interest, wherein the compression is implemented by applying a gain G to the signal of interest according to the following equation:

$$G = g0 + (P-T)*(1/R-1)$$

where G is the gain in dB to be applied to a frequency component of the signal of interest, P is the sound intensity of the frequency component in dB, g0 is the makeup gain in dB, T is the threshold in dB, and R is the compression ratio of linear compression, whereupon the linearly compressed signal is added together with the original signal of interest, producing a parallel compressed output signal, where the overall amplitude of the input versus the output signal defines a parallel compression curve, where g0, T, and R are thus parameters that vary the shape of the parallel compression curve, and P is the input loudness of the signal of interest. In some embodiments, the term parallel compression is used interchangeably with a "means for applying parallel compression to a signal of interest." Said means may be, for example, a parallel compression chip or combining a compressed signal with an original signal. In some embodiments, parallel compression may be a "means for applying linear compression to a signal." Said means may for example be an amplifier. In some embodiments, the term parallel compression is used interchangeably with a "means for controlling the shape of a parallel compression curve." Said means may be, for example threshold elevations, makeup gains, and compression ratios. In some embodiments, the term parallel compression is used interchangeably with a "means for finding the parameters which best fit a parallel compression curve against a psychoacoustic model". Said means may be, for example, linear regression, least squares fit, and function approximation. In some embodiments, the term parallel compression is used interchangeably with a "means for storing parameters". Said means may be, for example, use of a lookup table, flash memory, hard disk, and long-term memory. In some embodiments, the term parallel compression is used interchangeably with a "means for retrieving the parameters to be applied to a parallel compression module." Said means may be, for example, a lookup table, polynomials, and a parameter estimation module.

29. Parameter: The parameter is a single mathematical value that when input to the Personalized Sound adjustment, may generate a spectrum of threshold elevations.

30. Pattern Library: A numerical library composed of points and values which measure threshold elevations. In some embodiments, the term Pattern Library is used interchangeably with a "means for creating a pattern library for storing threshold elevations." Said means may be, for example, obtaining sample threshold elevation patterns for varying frequency for various typical users (users indexed by b) or computer-readable media code for storing a set of patterns in memory indexed by a user adjustable parameter b and a frequency.

31. Personalized sound adjustment model: A novel mathematical model which enhances sound through a process of non-linear compression. Bark frequency is one of several types of measures of the natural bandwidth of human hearing referred to as critical bandwidth. Critical bands are defined by the distances in frequency in which masking of tones occurs in human ear, roughly correspond to linear position on the cochlea. Thus, the present invention utilizes an equation that, using a single parameter, chosen by a user, generates a spectrum of threshold elevations that generally fall along a straight line when plotted on models using dBHL against Bark frequency where said threshold elevations can be used to adjust a sound signal for persons with hearing loss or persons who simply wish to enhance the audio signal to their preference.

In some embodiments, the term personalized sound adjustment model is used interchangeably with "a means for executing a personalized sound adjustment model". Said means may be computing the model on a microprocessor, a digital signal processor, or using code for executing the model on computer-readable media. In some embodiments, the term personalized sound adjustment model is used interchangeably with a "means for determining threshold elevations from ambient noise." Said means may be, for example, dividing an ambient noise signal into frequency components, estimating the ambient noise power of a frequency component, and determining threshold elevations corresponding to a frequency component.

32. Power Estimation Model/Block: estimating the power value of an audio signal. In some embodiments, the term Power Estimation Block/Model is used interchangeably with a "means for estimating a power value of an audio signal." Audio power estimation can be conducted using a variety of known techniques which would be understood by one skilled in the art. For example, some use a Minimum Statistics approach which is based on tracking minima of a short term power estimate of the audio signal in bands, over time. If a Fourier transform of the signal is used the power estimate is the square of the magnitude of the frequency component.

33. Psychoacoustic model: Any appropriate psychoacoustic models can be used by the present invention to compute gains needed to amplify sound to overcome the effects of ambient noise on sound perception or gains needed to account for preferred threshold elevations computed for users' of normal hearing. One example of a known psychoacoustic model is as follows:

$$\frac{\sqrt[\alpha]{P_{SIG}^\alpha + P_{NOISE}^\alpha - P_{THRQ}^\alpha}}{P_{SIG}}$$

where G is the gain ratio, $P_{SIG}$ is the signal intensity at a frequency in units of power, $P_{NOISE}$ is the signal intensity of the background noise, $P_{THRQ}$ is the absolute threshold of hearing, and $\alpha=0.2$ is a constant. In some embodiments, the term psychoacoustic model is used interchangeably with a "means for generating or computing corrective gains corresponding to predetermined threshold elevations". Said means may be, for example, additional known psychoacoustic models, perceptual models, computational models, and models utilizing parallel compression fit against known psychoacoustic models.

34. RF Transceiver: Radio Frequency Transmitter/Receiver—this device interfaces directly with the antenna and can modulate an audio signal with its radio carrier frequency for transmission as well as demodulate a received radio frequency signal 35. Source signal: The Source signal, as used herein refers to a portion of the first audio signal or the audio signal of interest at a given frequency component.

36. Speaker: The speaker can be any speaker or the like capable of receiving and projecting a sound signal adjusted or corrected by the present invention.

37. Storage media: A computer readable media used for storing data, such as a hard disk, RAM, or flash memory 38. Summer block: Summation occurs when two or more audio signals are combined together to create a new wave form. Summation is the combining of two audio signals at the same frequency—not to be confused with mixing, which involves the combining of audio signals at different frequencies. Electrical summation occurs inside an electrical circuit. In some embodiments, the term summer block is used interchangeably with a "means for combining an audio signal with another audio signal". Said means may be, for example, a summer.

39. Threshold elevation: Threshold elevations correlate to the minimum sound pressures required to perceive sounds at various frequencies.

Additional Terms:

1. Conductor Equation (Perceptual Model Component): This is a novel equation which computes the gain necessary to amplify sound sufficiently to make the subjectively perceived sound appear to be as loud, to a hearing impaired subject, as if the subject had no hearing loss. In some embodiments, the term Conductor equation is used interchangeably with a means for determining the gain necessary to make a sound perceived to be as loud as if a threshold elevation were not present.

2. dBSPL: Decibels sound power level—a unit of measure of sound intensity at the ear 3. dBSPL to dBPhon Conversion equation: This equation converts sound pressure level to Phons in decibels: P_dBPhon(F)=(P_dBSPL(F)–ATH(F))/(1+kATH(F))
    where
       F=Frequency
       ATH=Absolute Threshold of Hearing
       P=Phons amplitude of a source signal of interest
       dBSPL=decibels according to sound pressure 4. dBFS to dBSPL Converter: This equation converts the audio signal power from audio power in decibels to audio sound pressure level in decibels 5. Ear Spring Equation/Crescendo (Psychoacoustic Model): This is a novel equation which computes the apparent subjective loudness for a normal subject, of a sound in Sones as a function of the input sound intensity of the sound in Phons. In some embodiments, the term "Ear Spring Equation/Crescendo" is used interchangeably with a "means for computing the loudness in Sones from the intensity in Phons at a person ear." Said means may be the Earspring Equation and may also be any known psychoacoustic models.

6. Gain Equation: This equation converts the gain in Phons to a gain in sound pressure level $\Delta P\_dBSPL(F)=[\Delta P]\_dBPhon(F)(1+kATH(F))$.

where:
       F=Frequency
       ATH=Absolute Threshold of Hearing
       P=Phons amplitude of a source signal of interest
       dBSPL=decibels according to sound pressure 7. Output Device: A device configured to output an audio signal. In some embodiments, the term Output Device is used interchangeably with Audio Device. In some embodiments, the term Output Device is used interchangeably with a "mean for outputting an audio signal." Said means may be, for example, a speaker, a transmitter, computer-readable media code for transmitting an audio signal or audio file and computer-readable media code for writing an audio signal to an audio file.

8. Phons: Phons are objective units of sound intensity impinging upon the ear. Sound power may be converted from decibels (dBFS) to Phons using a conversion first to dBSPL then to Phons 9. Psychoacoustic model (Crescendo): This is a novel equation derived from a complex combination of physics and mathematical equations, which computes gains needed to compensate for ambient noise using two major input values, a source signal of interest, and an ambient noise signal. In some embodiments, the term psychoacoustic model is used interchangeably with a "means for determining the gains to be applied to a signal of interest." Said means may be, for example, a known psychoacoustic model or Crescendo.

10. Sones: Sones are subjective units of perceived sound loudness

11. Square Summer Equation: This equation squares the audio signal and adds the signal up N times, whereby the sum of the signal at the end block, divided by N, generates a mean power value for the audio signal. In some embodiments, this term is used interchangeably with a "means for extracting power values of an ambient noise signal."

Brief Description of the Drawings

FIG. 1. Diagrams an example of an application of the present invention in which the virtual audio port is used with a VOIP application.

FIG. 2 Is a general systems architecture drawing for the virtual audio port.

FIG. 3 Diagrams an implementation of the Perceptual Model of the present invention using analytical solutions to the Earspring model.

FIG. 4 Diagrams an implementation of the Perceptual Model in which a Numerical approximation to the solution is made using a function approximator for which parameters have been stored in a lookup table for various values of $P_0$.

FIG. 5 Diagrams a number of possible realizations of the personalized sound adjustment model, including a linear slope function, a pattern library or lookup table, or estimation of threshold elevations.

FIG. 6 is a drawing of a possible process flow for the present invention in which all computations are performed in series.

FIG. 7 is a drawing of a possible process flow for the present invention, in which all computations are performed in parallel.

FIG. 8 is a graphical representation of the invention's adjustment to sound intensities at varying frequencies.

Description of Preferred Embodiments

Virtual Audio Port

As shown in FIG. 3, one possible embodiment of the perceptual model involves analytically computing the value in Sones of the input signal at a given frequency S(P), along with the estimated hearing loss in Sones at that frequency $S(P_0)$, and applying these values of the conductor equation to derive a gain in Phons for the signal that will correct for the perceived hearing loss, the Conductor Equation 13 being, $S(P)=S(P+\Delta P)-S(P_0)+S(0)$ or, $\Delta P=S^{-1}(S(P)+S(P_0)-S(0))-P$ As shown in FIG. 4, an alternative embodiment for the perceptual model is to use a numerical estimate of these equations, combining the conductor equation and the Earspring equation solutions into one equation. In this embodiment, a function approximator, such as a quadratic estimate, linear regression with quadratic feature, neural network, or other computational model, can be fit against the solutions to the Earspring equation, and the parameters of the model then stored in memory. During operation, these parameters can be retrieved by the microprocessor from a lookup table, and used to compute an approximate value for $\Delta P$ for any given P and $P_0$.

As shown in FIG. 5, the personalized sound adjustment model may be implemented through various means. Since the typical hearing loss profile is approximately linear with respect to Bark frequency, hearing loss may be estimated using a linear function of Bark frequency, while allowing the user to adjust the slope of the line. In this way, a single user adjustable input may be used to estimate hearing loss by frequency. Alternatively, a library of patterns may be stored in memory, where each pattern is a typical hearing loss profile, of increasing slope relative to bark frequency. The user could then adjust a setting the selects or interpolates between these patterns, with higher settings corresponding to more hearing loss. Finally, since ambient noise is know to indice a degree of hearing loss in normal individuals an ambient noise signal could be used to compute an estimated hearing loss.

In some embodiments, all or part of the present invention could be implemented using a parallel processing architecture such that some or all of the set of computations from step 3 to 5 above may be computed simultaneously using multiple processing units.

It should be apparent that any combinations of the use of a computational model or explicit computation for the Earspring and Conductor equations, parallel or series computation, or a pattern library versus the Hearing loss estimate will also fall within the scope of the present invention.

In varying embodiments, the present invention may be attached to an Amplifier 17 and Speaker 18 for outputting the audio signal.

Computer Readable Media

In some embodiments, as explained by FIG. 6 and its description, the present invention can be enabled on a computer readable medium, the computer-readable medium comprising:

a. code for extracting an input audio signal x(t) 02;
b. code for obtaining the value of a user controlled input 03 b, which is to be a parameter of the personalized sound adjustment model 06;
c. code for filtering x(t) into a plurality of channels 03 where the audio signal is broken down into separate channels $\bar{x}(t)$ corresponding to various critical bands;
d. code for solving for the corrective gains 10 which comprises:
   i. code for extracting a power value of the source signal P(f) in the various bands, in dBFS with a power estimator block 06, comprising:
      (A) identifying the source signal band, wherein the source signal band is a particular channel of the audio signal corresponding to the frequency 50;
      (B) feeding the source signal through a squared summer equation 51 whereby the source signal is squared and added up N times, whereby the sum of the signal at the end block divided by N generates a mean power value for the source signal, whereby said power value is then fed into a dB Converter to generate a power value $P_{dBFS}(f)$ for the source signal in dBFS 52;
   ii. code for calculating a calibration offset to convert the power value of the source signal $P_{dBFS}(f)$ in dBFS to a power value $P_{dBSPL}(f)$ in dBSPL using a calibration equation 07 wherein calibration comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between $-20$ and $-12$;

iii. code for converting the power value of the source signal to dB Phons 08 by applying a dBSPL to dBPhon Conversion equation, producing P(f);

iv. code for computing the critical band center frequency F 09 corresponding to the frequency f for the current signal band in kHz;

v. code for determining the value of the threshold elevation $P_0(f)$ in dB Phons, where said value is defined by the personalized sound adjustment model 10, which is parameterized by the user adjustable input 03 b;

vi. code for computing the value of $S(P(f))$ and $S(P_0(f))$ 11,12 for the Earspring model, which take the source signal P and threshold elevation $P_0$ in dBPhons and computes perceptual sound levels in Sones vii. code for computing the value of $\Delta P(f)$ needed to correct for the perceived hearing loss, for a frequency f, using the Conductor Equation 13 n. code for calculating a correction gain of power G(f) 14, for the source signal, in dBSPL, based on the value of $\Delta P(f)$ in dB Phons, using a Gain equation 14;

o. code for reconstituting the audio signal with the corrective gain to the source signal at the frequency, comprising iii. feeding the correction gains G(f) to an Amplifier 53 wherein the Amplifier 53 multiplies the source signal channels $\bar{x}(t)$ by the corresponding corrective gains G(f), producing $\bar{x}_{out}(t)$;

iv. combining, using a Summer Block 15, the channels of the corrected audio signal to reconstitute the audio signal producing $\bar{x}_{out}(t)$;

p. code for feeding the audio signal through a Digital to Analog Converter 16;

wherein the dBSPL to dBPhon Conversion equation 08 is:

$$P_{dBPhon}(F) = \frac{P_{dBSPL}(F) - ATH(F)}{1 + kATH(F)}$$

wherein the Gain equation 13 is:

$$\Delta P_{dBSPL}(F) = \Delta P_{dBPhon}(F)(1 + kATH(F))$$

where
F=frequency
ATH(F)=Absolute Threshold of Hearing
K=$-1/120$ when ATH(F)>0
  =$+1/240$ when ATH(F)<0

The absolute threshold of hearing may be computed in one example by the formula:

$$ATH(F) = \frac{3.64}{F_{KHz}^{0.8}} - 6.5e^{-0.6(F_{kHz}-3.3)^2} + 0.001F_{kHz}^4 - 3.37$$

As shown in FIG. 3, a computational model may be used in place of explicit computation of the Earspring and Conductor equations:

$$\Delta P \cong \frac{AP^2 + BP + C}{DP^2 + EP + 1}$$

where parameters A, B, C, D, and E are fit against the combined solution to the Earspring and Conductor equations, for each $P_0$, in 5 dB increments.

Similar to FIG. 3, it is also possible to use separate computational models for S(P) and for $S^{-1}(S)$, with separate sets of parameters fit against the solutions for various boundary parameters and values of $P_0$.

One example of the critical band center frequency is the Bark frequency which may be computed by, $$CBR(F_{kHz}) = \frac{26.81}{1 + \frac{1.960}{F_{kHz}}} - 0.53$$

In some embodiments, a pattern library may be used in place of the linear slope equation, where the user input and frequency are used to index into the pattern library and locate estimates of the threshold elevation $P_0$. These estimates may be used explicitly, or interpolation may be used to find a more precise estimate. Where the pattern library is ordered such that the user input relates monotonically to an increase in the approximate slope of estimates $P_0$ with respect to f.

As shown in FIG. 7, the computations may also be performed in parallel, through the use of threaded processes, or through the use of a parallel computing device, such as a multi-core processing unit.

As shown in FIG. 8, a typical loud but comfortable music spectral envelope, as shown in light blue, and that of the present invention, as show in dark blue, diverge at higher frequencies where the gains produced by the invention occur.

It should be apparent that any combinations of the use of a computational model or explicit computation for the Earspring and Conductor equations, parallel or series computation, or a pattern library versus the Linear slope equation will also fall within the scope of the present invention.

In some embodiments, the point where the estimate of $X_0$ is computed, may be earlier in the sequence relative to processing of the source signal.

In some embodiments, some elements of the above process flow might be performed using analog circuitry before being input to the microprocessor.

Analog-to-digital and digital-to-analog converters are assumed to exist at interface points between analog elements and digital elements of any embodiment.

In some embodiments, programmable logic devices, including but not limited to FPGAs, may be used to implement parts of the processing shown in FIGS. 1 and 2, with appropriate interfaces implemented between the microprocessor and the programmable logic devices.

In some embodiments, an FFT coprocessor may be used to facilitate generation of Fourier transforms as in FIG. 3 and FIG. 8. In this case the FFT co-processor would take the place of the Frequency Analysis and Summer block components.

In varying embodiments, the user adjustable input is controlled by a knob, or a roller, or wheel or slider, or lever, which is connected to a potentiometer or a variable resistor, which thus produces an output voltage on the electronic device which can be read by the microprocessor through an A/D converter.

The user adjustable input may also be a stored setting that is adjusted through an electronic menu system using buttons to select menu parameters, or a touchscreen device in which buttons and inputs are detected when the users touches the screen or uses an implement to touch the screen.

The user selectable input might also be controlled through a voice command menu, for use by physically disabled people who are unable to adjust a physical input device.

In embodiments where a pattern library or lookup table is used, the elements in the pattern library of lookup table may be obtained by collecting audiograms across a significant population and finding mean hearing loss patterns for varying degrees of hearing loss, thereby producing patterns of varying slope with respect to critical band center frequency.

In some embodiments, adjustments to the underlying linear estimation may be added to the linear equation to produce variations in the threshold elevation. For instance, these adjustments may be derived from higher order polynomial equation that modifies the estimated threshold elevation, where the adjustments are within +/−10% of the linear slope with respect to critical band center frequency.

In some embodiments, adjustments to the underlying linear estimation may be added to the linear equation or pattern library, to produce variations in the threshold elevation to more accurately compensate for the average hearing loss profile of humans. For instance, adjustments derived from collecting audiograms across a large population.

In some embodiments, adjustments to the underlying linear estimation may be added to the linear equation or pattern library, to produce variations in the threshold elevation to more accurately compensate for the individual's hearing loss profile. For instance, these adjustments may be derived from an audiogram for that individual.

In some embodiments, a library of stored threshold elevation patterns, for which a varying slope, linear in critical band center frequency, could be fit to each pattern, may be stored in memory, with the user input selecting between or interpolating between stored patterns, where the patterns are arranged in order of increasing or decreasing slope, such that monotonic changes in the user input are translated into monotonic changes in the slope of the pattern being used, and the patterns remain approximately linear in critical band center frequency.

In some embodiments, a lookup table may be stored in memory, where for each quantized value of the frequency and user input, a threshold elevation is returned, where the threshold elevation varies monotonically with respect to both the frequency and user input. (Alternatively, the threshold elevation returned is approximately linear with respect to critical band center frequency and monotonically increasing with respect to user input).

In some embodiments, the user adjustable input may be a setting on an electronic device such as a cell phone which the user modifies through a touch screen menu, trackpad, or other instrument which is used with the electronic device.

In some embodiments the user-adjustable input may be a setting on a computer, or in a software application, which the user modifies using a push button, scrollbar, or other GUI input.

In some embodiments the present invention may be accessed via a web application or interface, where this web application resides on a web page, an electronic device such as a mobile phone, or any other general computing device.

In some embodiments, the systems of the present invention can evaluate sounds within pre-determined ranges of frequencies, e.g., any appropriate set or group of ranges. Microphones, and/or receivers and/or the like can collect information for the particular frequency range (the pre-determined frequency range). In some embodiments, a first range is 500 Hz and below, a second range is between 500 Hz and 2 kHz, and a third range is above 2 kHz. In some embodiments a first range is 1 kHz and below and a second range is above 1 kHz. The present invention is not limited to the aforementioned ranges.

In one exemplary embodiment, the set of boundary parameters comprises (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz; This equation can be solved for numerically though in practice it is more efficient to use a computational model to estimate the solution.

Without wishing to limit the present invention to any theory or mechanism, it is believed that the present invention is advantageous because the present invention features a maximum output volume, for example the source signal will be amplified to only a certain degree. This can help protect against damage to the user's hearing.

In some embodiments, steps for converting analog audio input signals to digital input signals can be bypassed where the invention utilizes digital input audio sources capable of receiving digital audio signals and transmitting the same to the processor.

In some embodiments, the present invention comprises a combination of virtually all known voice processing algorithms including but not limited to: echo cancellation, adaptive level control, noise reduction, voice encoders and decoders, acoustic coupling elimination and non-linear processing voice activity detection, double-talk detection, signaling detection relay and regeneration, silence suppression, discontinuous transmission, comfort noise generation and noise substitution, lost packet substitution/reconstruction and buffer and jitter control.

In some embodiments, the present invention comprises pulse code modulation and may be a method to digitally represent analog signals and may be implemented on a single integrated circuit generally referred to as an analog-to-digital converter (ADC).

In some embodiments, the present invention comprises accessory ports disposed at predetermined locations on the external portion of the present invention. Said ports can allow the present invention to communicate with peripherals such as, for example, removable memory sticks.

In some embodiments, the present invention comprises streaming audio, streaming video, or any combination thereof. Streaming video or audio is constantly received by and presented to an end-user while being delivered by a streaming provider. Said audio/video may be received be received by the present invention at the audio device.

In some embodiments, the present invention comprises radio reception via for example, an RF transmitter which allows the present invention to extract radio signals.

In some embodiments, the present invention comprises a graphical user interface which enables the user to interact, graphically, with the present invention and can be the product of a software program hosted and executed by the microprocessor.

The present invention, in some embodiments, may be combined with a number of possible known psychoacoustic models, derived from the audiology literature, which are used to compute gains needed to amplify sound to overcome the effects of ambient noise on sound perception or gains needed to account for preferred threshold elevations computed for users' of normal hearing. The gains may be computed over the entire spectrum or by dividing the spectrum up into any number of smaller bandwidth or frequency components. The present invention is not limited to one particular psychoacoustic model and many potential appropriate models can be used in accordance with the present invention.

One potential example of a psychoacoustic model which may be combined with the present invention may be found in works such as (Moore, Brian C. et al., "A model for the prediction of thresholds, loudness and partial loudness", Journal of the Audio Engineering Society, JAES Volume 45 Issue 4 pp. 224-240; April (1997)) and (Rosengrad, Peniah, S., "Relationship Between Measures Related to the Cochlear Active Mechanism and Speech Reception Thresholds in backgrounds with and without Spectral and/or Temporal Fluctuations" PhD Thesis MIT (2004)). These models define a mathematical relationship between the sound impinging on the ear and the apparent loudness of the sound as perceived by a human.

The models above may be used to derive a formula for the gains needed to amplify sound and the formula may be written:

$$\frac{\sqrt[\alpha]{P_{SIG}^\alpha + P_{NOISE}^\alpha - P_{THRQ}^\alpha}}{P_{SIG}}$$

where G is the gain ratio, PSIG is the signal intensity at a frequency in units of power, PNOISE is the signal intensity of the background noise, PTHRQ is the absolute threshold of hearing, and α=0.2 is a constant.

Description of Additional Preferred Embodiments

In some embodiments, the present invention comprises a computer-readable medium 70 storing a set of instructions executable by one or more microprocessors, where the computer-readable medium 70 is effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers.

In some embodiments, the computer-readable medium further comprises:
a. code for extracting an audio signal x(t) 02;
b. code for obtaining the value of a user controlled input parameter 03 b, which is to be a parameter of the personalized sound adjustment model 10;
c. code for filtering x(t) into a plurality of frequency components using a Frequency Analysis Module 20;
d. code for solving for corrective gains to each of the frequency components 10 which comprises:
 i. code for extracting a power value of the source signal P(f) in the various frequency components, in dBFS with a power estimator block 06, comprising:
  (A) identifying a source signal, wherein the source signal is a particular component of the audio signal 50 at a frequency component,
  (B) generating a power value for the source signal, whereby said power value is then fed into a dB Converter to generate a power value $P_{dBFS}(f)$ for the source signal in dBFS 52,
 ii. code for calculating a calibration offset to convert the power value of the source signal $P_{dBFS}(f)$ in dBFS to a power value $P_{dBSPL}(f)$ in dBSPL using a calibration equation 07 wherein the calibration comprises configuring a microprocessor to calculate and interpret a baseline relationship between dBFS and dBPSL such that a zero point in dBSPL can be computed and conversion from values in dBFS to values in dBSPL is enabled, wherein the calibration offset equation is
 $P_{dBSPL}(F)=P_{dBFS}(F)+(P_{dBSPL_0}(F)-P_{dBFS_0}(F))$
 wherein $P_{dBSPL0}$ is nominally a value between 65 and 83, and wherein $P_{dBFS0}$ is nominally a value between −20 and −12,
 iii. code for converting the power value of the source signal to dB Phons 08 by applying a dBSPL to dBPhon Conversion equation, producing P(f),
 iv. code for computing the critical band center frequency F 09 corresponding to the frequency f for the source signal in kHz,
 v. code for determining the value of the threshold elevation $P_0(f)$ in dB Phons, where said value is defined by the personalized sound adjustment model 10, which is parameterized by the user adjustable input parameter 03 b,
 vi. code for computing the gains in dBPhons using the perceptual model 25,
 vii. code for calculating a correction gain of power G(f) 14, for the source signal, in dBSPL, based on the value of ΔP(f) in dB Phons, using a Gain equation 14,
e. code for reconstituting the audio signal with the corrective gains to the source signal at each of the frequency components, comprising
 i. feeding the correction gains G(f) to an amplifier 53 wherein the amplifier 53 multiplies the source signal by the corresponding corrective gains G(f) at each frequency component,
 ii. using the Summer block component 21 to reconstitute the audio signal producing and adjusted audio signal $x_{out}(t)$, and
f. code for feeding the adjusted audio signal through a Digital to Analog Converter 16.

In some embodiments, the Frequency Analysis Module 20 is a digital filter bank of IIR filters that breaks the signal down into various sub-band channels At), where the power of each channel is found by passing the channel through a Square Summer equation, whereby the signal is squared and added up N times, whereby the sum of the signals at the end block divided by N generates mean power values for the source signal 51, and where the Summer block component 21 is a summer operation that combines the various channels into output $x_{out}(t)$.

In some embodiments, the various sub-band frequency components correspond to critical bands of hearing.

In some embodiments, the frequency components are grouped together to approximate sub-bands correspond to critical bands of hearing.

In some embodiments, the Frequency Analysis Module 20 is an FFT operation, which outputs the Fourier transform of the input signal X(f), where the power value of the signal is found by squaring the components of this Fourier transform and where the Summer block component 21 is an FFT operation that performs an inverse Fourier transform, outputting the time domain signal $x_{out}(t)$.

In some embodiments, the personalized sound adjustment model 10 is a linear estimator, which uses a linear function of the critical band center frequency F, where the Linear Slope equation is $$X_0 = [(F-Y)] \times b$$

where the setting (b) adjustable by the user 03, represents the slope of the line in dBHL/critical band, where Y is a value selected from a range of 2-3 bark, and where F is the critical band center frequency. In some embodiments, the aforementioned range is 0-1 Bark, 2-4 Bark, 1-5 Bark, Or 5-10 Bark.

In some embodiments, the personalized sound adjustment model 10 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency. In some embodiments, the patterns are composed of points which measure threshold elevations, X0, with respect to frequency, of which 0-20% are within +/−5 dBHL of a mean squared error linear fit to the pattern with respect to critical band center frequency. In some embodiments, the patterns are composed of points which measure threshold elevations, X0, with respect to frequency, of which 20-40% are within +/−5 dBHL of a mean squared error linear fit to the pattern with respect to critical band center frequency. In some embodiments, the patterns are composed of points which measure threshold elevations, X0, with respect to frequency, of which 40-60% are within +/−5 dBHL of a mean squared error linear fit to the pattern with respect to critical band center frequency. In some embodiments, the patterns are composed of points which measure threshold elevations, X0, with respect to frequency, of which 60-80% are within +/−5 dBHL of a mean squared error linear fit to the pattern with respect to critical band center frequency. In some embodiments, the patterns are composed of points which measure threshold elevations, X0, with respect to frequency, of which 80-100% are within +/−5 dBHL of a mean squared error linear fit to the pattern with respect to critical band center frequency. In some embodiments, the patterns are composed of points which measure threshold elevations, X0, with respect to frequency, of which 66% are within +/−5 dBHL of a mean squared error linear fit to the pattern with respect to critical band center frequency. In some embodiments, the patterns are composed of points which measure threshold elevations, X0, with respect to frequency, of which 66% are within +/−1 dBHL of a mean squared error linear fit to the pattern with respect to critical band center frequency. In some embodiments, the patterns are composed of points which measure threshold elevations, X0, with respect to frequency, of which 66% are within +/−2 dBHL of a mean squared error linear fit to the pattern with respect to critical band center frequency. In some embodiments, the patterns are composed of points which measure threshold elevations, X0, with respect to frequency, of which 66% are within 3-6 dBHL of a mean squared error linear fit to the pattern with respect to critical band center frequency. In some embodiments, the patterns are composed of points which measure threshold elevations, X0, with respect to frequency, of which 66% are within 6-10 dBHL of a mean squared error linear fit to the pattern with respect to critical band center frequency.

In some embodiments, the personalized sound adjustment model 10 is composed of a lookup table indexed by values of parameter b and frequency, where the threshold elevation estimate $X_0$ is found by selecting the corresponding element of the lookup table or interpolating between points in the lookup table.

In some embodiments, the perceptual model for ΔP comprises a novel Conductor Equation 13, $$S(P) = S(P + \Delta P) - S(P_0) + S(0) \text{ or,}$$

$$\Delta P = S^{-1}(S(P) + S(P_0) - S(0)) - P,$$

where S(P) is a function in Sones, a measure of perceived loudness, in terms of Phons, a measure of objective sound intensity, where S(P) is found by solving the EarSpring equation for particular boundary values and input sound intensities, where P is a measure of sound intensity of a given channel of the audio signal, where $P_0$ is an estimated hearing loss at a given frequency, where the Earspring equation is written $[d^2/dt^2 + 2\beta(d/dt) + k(1 + \gamma\gamma <y^2>)]y(t) = \eta F(t)$, which is a harmonic oscillator model of the signal processing performed by the ear, the cochlea, and immediate processing by the auditory cortex, where t=time, y(t)=amplitude of vibration, F(t)= driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P, a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta} = \beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary parameters.

In some embodiments, the set of boundary parameters comprises: (i) a

Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz. In some embodiments, the aforementioned set of experimental boundary conditions comprise: (i) a Sones ratio between the hearing threshold level and the reference level of ~20-30 dBSPL at 1 kHz, and (ii) the detuning (flattening) of tones by about 50-75 cents as tones range in intensity from ~0 dBSPL to ~40 dBSPL near 1 kHz. In some embodiments, the aforementioned set of experimental boundary conditions comprise: (i) a Sones ratio between the hearing threshold level and the reference level of ~40-60 dBSPL at 1 kHz, and (ii) the detuning (flattening) of tones by about 50-100 cents as tones range in intensity from ~0 dBSPL to ~100 dBSPL near 1 kHz.

In some embodiments, a computational model 19 is used to estimate S(P) and $S^{-1}$(S) consisting of quadratic functions such as $$S(P) \cong \frac{AP^2 + BP + C}{DP^2 + EP + 1},$$

where A, B, C, D, and E are parameters which fit the quadratic function against the solution to the Earspring equation and are stored in long term memory, whereupon the estimates of S(P) and $S^{-1}$(S) are then used in the conductor equation 10, where Conductor Equation 13 is, $$S(P)=S(P+\Delta P)-S(P_0)+S(0) \text{ or,}$$

$$\Delta P=S^{-1}(S(P)+S(P_0)-S(0))-P,$$

where S(0) is a known constant offset, whereupon this equation is solved using the values of P and $P_0$, where these values are obtained from the power value of the signal and the estimated hearing loss.

In some embodiments, the computational model 19 is used to estimate $\Delta P$ consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in long term memory.

In some embodiments, values of the parameters A, B, C, D, and E are fit against the Earspring and conductor equations for every $P_0$ in increments.

In some embodiments, the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

In some embodiments, the corrective gains are computed in parallel for multiple frequency components using multiple processing units.

In some embodiments, the computer-readable medium includes a speaker 18 and an amplifier 17 for outputting the audio signal.

In some embodiments, the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

In some embodiments, the corrective gains are computed in part parallel and in part in serial for multiple frequency components using multiple processing units.

In some embodiments, the audio signal contains more than one frequency component and the various source signals are processed in parallel before the audio signal is reconstituted by the summer block component.

In some embodiments, the corrective gains are computed in serial for multiple frequency components using multiple processing units.

In some embodiments, the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.

In some embodiments, the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.

In some embodiments, the dBSPL to dBPhon Conversion equation 12,13 is:

$$P_{dBPhon}(F) = \frac{P_{dBSPL}(F) - ATH(F)}{1 + kATH(F)}$$

where
F=frequency
ATH(F)=Absolute Threshold of Hearing
K=$-1/120$ when ATH(F)>0
 =$+1/240$ when ATH(F)<0

In some embodiments, the Gain equation 17 is:

$$\Delta P_{dBSPL}(F)=\Delta P_{dBPhon}(F)(1+kATH(F))$$

where
F=frequency
ATH(F)=Absolute Threshold of Hearing
K=$-1/120$ when ATH(F)>0
 =$+1/240$ when ATH(F)<0

In some embodiments, the absolute threshold of hearing is computed by the formula:

$$ATH(F) = \frac{3.64}{F_{kHz}^{0.8}} - 6.5e^{-0.6(F_{kHz}-3.3)^2} + 0.001F_{kHz}^4 - 3.37$$

In some embodiments, the critical band center frequency is the Bark frequency, which is computed by, $$CBR(F_{kHz}) = \frac{26.81}{1 + \frac{1.960}{F_{kHz}}} - 0.53$$

In some embodiments, there are multiple source audio signals corresponding to both ears and hearing loss is estimated independently with separate user inputs for each ear, and separate gains computed for each channel.

In some embodiments, the calibration equation 07 comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dBSPL}(F)=P_{dBFS}+(P_{dBSPL_0}(F)-$ $P_{dBFS_0}(F))$ wherein $P_{dBSPL0}$ is nominally a value between 65 and 83, and wherein $P_{dBFS0}$ is nominally a value between −20 and −12.

In some embodiments, there are multiple source audio signals corresponding to both ears and hearing loss is estimated independently with separate user inputs for each ear, and separate gains computed for each frequency component.

As used herein, the term "about" refers to plus or minus 10% of the referenced number. For example, an embodiment wherein the frequency is about 1,000 Hz includes an embodiment wherein the frequency is 900 to 1,100 Hz.

Various modifications of the invention, in addition to those described herein, will be apparent to those skilled in the art from the foregoing description. Such modifications are also intended to fall within the scope of the invention. Each reference cited in the present application is incorporated herein by reference in its entirety.

Although there has been shown and described the preferred embodiment of the present invention, it will be readily apparent to those skilled in the art that modifications may be made thereto which do not exceed the scope of the invention.

These are not Claims, they are Additional Disclosure:

1. A computer-readable medium 70 storing a set of instructions executable by one or more microprocessors, where the computer-readable medium 70 is effective in enhancing an audio signal according to a user's preference, across a spectrum of frequency components, by applying corrective gains to the frequency component spectrum of an audio signal, wherein the value of the gains are computed using a perceptual model of loudness as a function of sound intensity, as subjectively experienced by a human, where this perceptual model takes as inputs the sound intensity of the audio signal P and an estimate of the user's threshold elevations, each threshold elevation represented by $P_0$, where the threshold elevations are computed from a single parameter set by a user-adjustable setting, wherein corrective gains can be generated for each frequency component by solving for a correction gain ΔP for the signal, corresponding to the threshold elevation at that frequency component, which can suffice to raise the volume of the audio signal so that the user can perceive the audio signal, at each frequency component, the way the user prefers,
the computer-readable medium comprising:
   a. code for extracting an audio signal x(t) 02;
   b. code for obtaining the value of a user controlled input parameter 03 b, which is to be a parameter of the personalized sound adjustment model 110;
   c. code for filtering x(t) into a plurality of frequency components using a Frequency Analysis Module 120;
   d. code for solving for corrective gains to each of the frequency components which comprises:
      i. code for extracting a power value of the source signal P(f) in the various frequency components, in dBFS with a power estimator block 106, comprising:
         (A) identifying a source signal, wherein the source signal is a particular component of the audio signal 02 at a frequency component,
         (B) generating a power value for the source signal, whereby said power value is then fed into a dB Converter to generate a power value $P_{dBFS}(f)$ for the source signal in dBFS 52,
      ii. code for calculating a calibration offset to convert the power value of the source signal $P_{dBFS}(f)$ in dBFS to a power value $P_{dBSPL}(f)$ in dBSPL using a calibration equation 107 wherein the calibration comprises configuring a microprocessor to calculate and interpret a baseline relationship between dBFS and dBPSL such that a zero point in dBSPL can be computed and conversion from values in dBFS to values in dBSPL is enabled, wherein the calibration offset equation is
$P_{dBSPL}(F)=P_{dBFS}(F)+(P_{dBSPL_0}(F)-P_{dBFS_0}(F))$
wherein $P_{dBSPL0}$ is nominally a value between 65 and 83, and wherein $P_{dBFS0}$ is nominally a value between −20 and −12,
      iii. code for converting the power value of the source signal to dB Phons 108 by applying a dBSPL to dBPhon Conversion equation, producing P(f),
      iv. code for computing the critical band center frequency F 109 corresponding to the frequency f for the source signal in kHz,
      v. code for determining the value of the threshold elevation $P_0(f)$ in dB Phons, where said value is defined by the personalized sound adjustment model 110, which is parameterized by the user adjustable input parameter 03 b,
      vi. code for computing the gains in dBPhons using the perceptual model 125,
      vii. code for calculating a correction gain of power G(f) 114, for the source signal, in dBSPL, based on the value of ΔP(f) in dB Phons, using a Gain equation,
   g. code for reconstituting the audio signal with the corrective gains to the source signal at each of the frequency components, comprising
      iii. feeding the correction gains G(f) to an amplifier 53 wherein the amplifier 53 multiplies the source signal by the corresponding corrective gains G(f) at each frequency component,
      iv. using the Summer block component 121 to reconstitute the audio signal producing and adjusted audio signal $x_{out}(t)$, and
   h. code for feeding the adjusted audio signal through a Digital to Analog Converter 116.

2. The computer readable medium storing a set of instruction of claim 1, where the Frequency Analysis Module 120 is a digital filter bank of IIR filters that breaks the signal down into various sub-band channels $\bar{x}(t)$, where the power of each channel is found by passing the channel through a Square Summer equation, whereby the signal is squared and added up N times, whereby the sum of the signals at the end block divided by N generates mean power values for the source signal 02, and where the Summer block component 121 is a summer operation that combines the various channels into output $x_{out}(t)$.

3. The computer readable medium storing a set of instruction of claim 1 and claim 2, where the various sub-band frequency components correspond to critical bands of hearing.

4. The computer readable medium storing a set of instruction of claim 1 and claim 2, where the frequency components are grouped together to approximate sub-bands correspond to critical bands of hearing.

5. The computer readable medium storing a set of instruction of claim 1, where the Frequency Analysis Module 120 is an FFT operation, which outputs the Fourier transform of the input signal X(f), where the power value of the signal is found by squaring the components of this Fourier transform and where the Summer block component b 121 is an FFT operation that performs an inverse Fourier transform, outputting the time domain signal $x_{out}(t)$.

6. The computer-readable medium storing a set of instructions of claim 1, wherein the personalized sound adjustment model 110 is a linear estimator, which uses a linear function of the critical band center frequency F, where the Linear Slope equation is $$X_0 = [F-Y] \times b$$

where the setting (b) adjustable by the user, represents the slope of the line in dBHL/critical band, where Y is a value selected from a range of 2-3 bark, and where F is the critical band center frequency.

7. The computer-readable medium storing a set of instructions of claim 1, wherein the personalized sound adjustment model 110 is composed of a pattern library which is stored in long term memory, where the patterns are composed of points which measure hearing loss estimates $X_0$ with respect to frequency, of which ⅔ are within +/−5 dBHL of a mean squared error linear fit to the pattern with respect to critical band center frequency, where the parameter b is used to select a pattern or interpolate between points in the pattern, and the frequency is used to select an element of the pattern or interpolate between elements, and where the user adjustable input (b) 03 bears a monotonic relationship to the estimated $X_0$ for each critical band center frequency.

8. The computer-readable medium storing a set of instructions of claim 1, wherein the personalized sound adjustment model 110 is composed of a lookup table indexed by values of parameter b and frequency, where the threshold elevation estimate $X_0$ is found by selecting the corresponding element of the lookup table or interpolating between points in the lookup table.

9. The computer-readable medium storing a set of instructions of claim 1, wherein the perceptual model for ΔP comprises a novel Conductor Equation 313, $$S(P) = S(P+\Delta P) - S(P_0) + S(0) \text{ or,}$$

$$\Delta P = S^{-1}(S(P) + S(P_0) - S(0)) - P,$$

where S(P) is a function in Sones, a measure of perceived loudness, in terms of Phons, a measure of objective sound intensity, where S(P) is found by solving the EarSpring equation for particular boundary values and input sound intensities, where P is a measure of sound intensity of a given channel of the audio signal, where $P_0$ is an estimated hearing loss at a given frequency, where the Earspring equation is written $[d^2/dt^2 + 2\beta(d/dt) + k(1+\gamma\gamma<y^2>)]y(t) = \eta F(t)$, which is a harmonic oscillator model of the signal processing performed by the ear, the cochlea, and immediate processing by the auditory cortex, where t=time, y(t)=amplitude of vibration, F(t)= driving force in terms of Phons amplitude or sound intensity, $<y^2>$=mean power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P, a solution y(t) to this equation can be found, which if put into the frequency domain as Y (the amplitude of the steady state response to the forcing function F(t)) can be used to compute $<y^2>=\frac{1}{2}|Y|^2=S$, which represents the perceived loudness S in Sones, producing a function S(P), $$S(P) = \frac{(4\hat{\beta}^2 + \Gamma_{40}^2)}{(4\hat{\beta}^2 + (\Gamma_{40}S(P))^2)} 10^{(P-40)/10},$$

where S(P) is the perceived loudness in Sones which the listener experiences for a particular frequency, and P is the sound intensity impinging on the ear in dBPhons for a particular frequency, where $\hat{\beta}=\beta/\sqrt{k}$ and where $\Gamma_{40}$ represents the mean power of vibration at the resonant frequency of the Earspring, for a ~40 dBSPL amplitude driving force, where the constants $\hat{\beta}$ and $\Gamma_{40}$ are found by solving the Earspring equation according to experimental boundary parameters.

10. The computer-readable medium storing a set of instructions of claim 1 and claim 9, where the set of boundary parameters comprises: (i) a Sones ratio between the hearing threshold level and the reference level of ~40 dBSPL at 1 kHz, and (ii) the detuning (flattening) of tones by about 75-80 cents as tones range in intensity from ~40 dBSPL to ~90 dBSPL near 1 kHz.

11. The computer readable media storing a set of instruction of claim 1, where a computational model 19 is used to estimate S(P) and $S^{-1}(S)$ consisting of quadratic functions such as $$S(P) \cong \frac{AP^2 + BP + C}{DP^2 + EP + 1},$$

where A, B, U, D, and E are parameters which fit the quadratic function against the solution to the Earspring equation and are stored in long term memory, whereupon the estimates of S(P) and $S^{-1}(S)$ are then used in the conductor equation 10, where Conductor Equation 13 is, $$S(P) = S(P+\Delta P) - S(P_0) + S(0) \text{ or,}$$

$$\Delta P = S^{-1}(S(P) + S(P_0) - S(0)) - P,$$

where S(0) is a known constant offset, whereupon this equation is solved using the values of P and $P_0$, where these values are obtained from the power value of the signal and the estimated hearing loss.

12. The computer readable media storing a set of instruction of claim 1, where the computational model 19 is used to estimate ΔP consists of a quadratic function $$\Delta P \cong \frac{AP^2 + BP + C}{DP^2 + EP + 1},$$

where A, B, C, D, and E are parameters which fit the quadratic function against the solution to the Earspring and Conductor equations and are stored in long term memory.

13. The computer readable media of claim 12, where values of the parameters A, B, C, D, and E are fit against the Earspring and conductor equations for every $P_0$ in increments.

14. The computer readable media storing a set of instruction of claim 1, where the computational model 19 is any numerical function approximator that is fit against the Earspring and Conductor equation and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

15. The computer-readable medium of claim 1, wherein the corrective gains are computed in parallel for multiple frequency components using multiple processing units.
16. The computer-readable medium of claim 1, wherein the computer-readable medium includes a speaker 118 and an amplifier 117 for outputting the audio signal.
17. The computer-readable medium of claim 1, wherein the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.
18. The computer-readable medium storing a set of instructions of claim 1, wherein the corrective gains are computed in part in parallel and in part in serial for multiple frequency components using multiple processing units.
19. The computer-readable medium storing a set of instructions of claim 1, wherein the audio signal contains more than one frequency component and the various source signals are processed in parallel before the audio signal is reconstituted by the summer block component.
20. The computer-readable medium storing a set of instructions of claim 1, wherein the corrective gains are computed in serial for multiple frequency components using multiple processing units.
21. The computer-readable medium storing a set of instructions of claim 1, wherein the audio signal comprises a plurality of frequency components corresponding to various frequencies or frequency ranges and wherein a corrective gain corresponding to each respective frequency component is processed and applied to each respective frequency component before the audio signal is reconstituted by the Summer Block Component.
22. The computer-readable medium storing a set of instructions of claim 1, wherein the audio signal comprises a plurality of frequency components corresponding to various frequencies and frequency ranges and wherein a corrective gain corresponding to each respective frequency component is processed and applied to each respective frequency component and partially in parallel, before the audio signal is reconstituted by the Summer Block Component.
23. The computer readable medium storing a set of instructions of claim 1, wherein the dBSPL to dBPhon Conversion equation 312, 313 is:

$$P_{dBPhon}(F) = \frac{P_{dBSPL}(F) - ATH(F)}{1 + kATH(F)}$$

where
F=frequency
ATH(F)=Absolute Threshold of Hearing
K=$-1/120$ when ATH(F)>0
   =$+1/240$ when ATH(F)<0

24. The computer readable medium storing a set of instructions of claim 1, wherein the Gain equation 17 is:

$$\Delta P_{dBSPL}(F) = \Delta P_{dBPhon}(F)(1+kATH(F))$$

where
F=frequency
ATH(F)=Absolute Threshold of Hearing
K=$-1/120$ when ATH(F)>0
   =$+1/240$ when ATH(F)<0

25. The computer readable medium storing a set of instructions of claim 1, where the absolute threshold of hearing is computed by the formula:

$$ATH(F) = \frac{3.64}{F_{kHz}^{0.8}} - 6.5e^{-0.6(F_{kHz}-3.3)^2} + 0.001 F_{kHz}^4 - 3.37$$

26. The computer readable medium storing a set of instructions of claim 1, where the critical band center frequency is the Bark frequency, which is computed by, $$CBR(F_{kHz}) = \frac{26.81}{1 + \frac{1.960}{F_{kHz}}} - 0.53$$

27. The computer readable medium storing a set of instructions of claim 1, where there are multiple source audio signals corresponding to both ears and hearing loss is estimated independently with separate user inputs for each ear, and separate gains computed for each channel.
28. The computer readable medium storing a set of instructions of claim 1, where the calibration equation comprises configuring a microprocessor to calculate and interpret a baseline relationship between dBFS and dBPSL such that a zero point in dBSPL can be computed and conversion from values in dBFS to values in dBSPL is enabled; wherein the calibration offset equation is $P_{dbSPL}(F)=P_{dBFS}(F)+(P_{dBSPL_0}(F)-P_{dBFS_0}(F))$ wherein $P_{dBSPL0}$ is nominally a value between 65 and 83, and wherein $P_{dBFS0}$ is nominally a value between $-20$ and $-12$.
29. The computer readable medium storing a set of instructions of claim 1, where there are multiple source audio signals corresponding to both ears and hearing loss is estimated independently with separate user inputs for each ear, and separate gains computed for each frequency component.

What is claimed:
1. An apparatus (100), effective in enhancing a first audio signal in the face of ambient background noise, by applying corrective gains to a plurality of frequency components which constitute the first audio signal, wherein the value of the gains are computed using a nonlinear psychoacoustic model of loudness as a function of sound intensity, as subjectively experienced by a normal human, where this psychoacoustic model takes as inputs the sound intensity of the audio signal P as well as the ambient background noise Po, wherein corrective gains are generated for each frequency component by solving for a correction gain $\Delta P$ for the first audio signal which will suffice to raise the volume of each frequency component of the first audio signal so that the user will perceive it above background noise, by the loudness amount equivalent to how the first audio signal would be perceived in a noiseless environment, the apparatus (100) comprising:
   a. a first audio source (02), configured to extract a first audio signal where the first audio signal is a broadband audio signal of interest, the first audio source operatively connected to a microprocessor (01);
   b. a second audio source (03), configured for extracting a second audio signal comprising ambient broadband audio in the environment, the second audio source operatively connected to the microprocessor (01); the microprocessor (01), configured to execute applications for:

i. a first Analog to Digital converter (04);
ii. a second Analog to Digital converter (05);
iii. a first Frequency Analysis Module (06);
iv. a second Frequency Analysis Module (07);
v. a first Power Estimator Block (08);
vi. a second Power Estimator Block (09);
vii. a first dBFS to dBSPL Converter (10);
viii. a second dBFS to dBSPL Converter (11);
ix. a first dBSPL to dB Phon Converter (12);
x. a second dBSPL to dB Phon Converter (13);
xi. a Psychoacoustic model (22);
xii. a Gain Block component (17);
xiii. a Frequency Synthesis Module (18); and
xiv. a Digital to Analog Converter (19);
wherein (i) the first audio source (02) extracts the first audio signal x(t), where the first audio signal is then transmitted to the first Analog to Digital Converter 04 thereby converting the first audio signal into digital format; and, (ii) the second audio source 03 extracts a second audio signal xo(t), where said second audio signal is then transmitted to the second Analog to Digital Converter (05) thereby converting the second audio signal into digital format, whereupon the first audio signal and the second audio signal are fed, respectively, through the First Frequency Analysis Module (06) and Second Frequency Analysis Module (07) breaking down each respective audio signal into separate pluralities of frequency components, whereupon, for each frequency component of the first audio signal, the apparatus (100) identifies a source signal and a background signal, where said source signal is a frequency component of the first audio signal and the background signal is the frequency component of the second audio signal (50), whereupon both the source signal and the background signal are fed, respectively, through the first Power Estimator (08) and the Second Power Estimator (09), which compute power values for the source signal PdBFS(f) and the background signal PO dBFS(f) in dBFS (52), whereupon (i) the microprocessor (01) completes a calibration offset such that a first dBFS to dBSPL Converter (10) converts the power value of the source signal from dBFS to dBSPL, and (ii) the microprocessor (01) completes a calibration offset such that a second dBFS to dBSPL Converter (11) converts the power value of the background signal from dBFS to dBSPL, producing PdBS PL(f) for the source signal and Po dBsP L(f) fo r the background signal, whereupon (i) a first dBSPL-dB Phon Converter (12) converts the power value of the source signal to dB Phons by applying a dBSPL to dBPhon Conversion equation, giving P(f) and (ii) a second dBSPL-dB Phon Converter (13) converts the power value of the background signal to dB Phons by applying the dBSPL to dBPhon Conversion equation, giving Po(f), whereupon the microprocessor (01) applies the power value of the source signal and the power value of the background signal, now in dB Phons, to the psychoacoustic model (22) whereupon the microprocessor 01 calculates A P(f) in dBPhons, whereupon the microprocessor (01) calculates a correction gain of power to the source signal G(f), at the frequency, in dBSPL, based on the value of A P(f) in dB Phons, using the Gain Block component (17) which utilizes the Gain equation, whereupon the apparatus (100) reconstitutes the first audio signal with the corrective gains to the source signals corresponding to each of the frequency components, comprising:

(i) multiplying the source signal corresponding to each of the frequency components according to the corresponding corrective gain A P(f), producing a corrected source signal, (ii) combining the corrected source signals using the Frequency Synthesis Module 18, to producing a corrected first audio signal whereupon the corrected first audio signal is fed through the Digital to Analog Converter (19), resulting in analog signal xout(t).

2. An apparatus (200), effective in enhancing an audio signal, by applying corrective gains to a plurality of frequency components which constitute a first audio signal, wherein parallel compression is used to approximate gain curves derived from a psychoacoustic model, wherein the parallel compression is implemented by applying a gain G to a signal of interest according to a linear compression and then combining this compressed signal with the source audio signal, such that the combined parallel compression of the source signal forms a non-linear compression curve, where the linear compression is found by the equation, $G = g0 + (P-T)*(1/R-1)$ where G is the gain in dB to be applied to the signal, where g0 is the makeup gain in dB, T is the threshold in dB, and R is the compression ratio, and where P is the sound intensity in dB of the source audio signal in a channel, such that g0, T, and R are parameters that vary the shape of the resulting parallel compression curve, where the psychoacoustic model takes as inputs the source signal loudness and the noise signal loudness, where the model computes the gain in sound loudness at a given frequency required to correct for the effect of an ambient noise signal, where the parameters g0, T, and R, for a plurality of noise loudness levels, are predetermined by fitting the parallel compression curves against the desired behavior, where a different set of parameters is retrieved at each instant depending on the ambient noise volume in each frequency, where the dynamically changing noise loudness results in a dynamically changing selection of parameters for the parallel compression module, the apparatus (200) comprising:

a) a first audio source (202), configured to extract a first audio signal, where the first audio signal is a broadband audio signal of interest, the first audio source operatively connected to a microprocessor (201);

b) a second audio source (203) configured for extracting a second audio signal from the environment where the second audio signal is ambient noise, the second audio source operatively connected to the microprocessor (201);

c) the microprocessor (201) operatively connected to a Speaker (220), and an Amplifier (219);

the microprocessor (201) configured to execute applications for:

i. a first Analog to Digital converter (204), ii. a second Analog to Digital converter (205), iii. a first frequency analysis module (206), configured to extract a plurality of frequency components from the first audio signal, iv. a second frequency analysis module (207), configured to extract a plurality of frequency components from the second audio signal, v. a first power estimation block (208), configured to calculate the sound intensity in decibels of each frequency component of the first audio signal (002), vi. a second power estimation block (209), configured to calculate the sound intensity of decibels of each frequency component of the second audio signal (003), vii. a first dBFS to dBSPL Converter (210), viii. a second dBFS to dBSPL Converter (211), ix. a parameter estimation module, which determines parameter settings for a parallel compression module, according to information stored in memory, x. the parallel compression module (215), parameterized by threshold T, compression ratio R, and makeup gain g0, where the parameters may by dynamically varied, where the parallel compression module is comprised of:
a. a linear compression module (214), which applies gains to the first audio signal according to the equation G=g0+(P−T)*(1/R+1), where G is the gain in dB to be applied to a frequency component of the first audio signal, P is the sound intensity of the frequency component in dB, g0 is the makeup gain in dB, T is the threshold in dB, and R is the compression ratio of the linear compression, b. a summer, which combines the resulting amplified first audio signal component with the original first audio signal component, xi. a Frequency Synthesis Module (216); and xii. a Digital to Analog Converter (219);
wherein (i) the first audio source (202) extracts the first audio signal x(t), where the first audio signal is then transmitted to the first Analog to Digital Converter (204) thereby converting the first audio signal into digital format; and, (ii) the second audio source (203) extracts the second audio signal xo(t), where said second audio signal is then transmitted to the second Analog to Digital Converter (205) thereby converting the second audio signal into digital format, whereupon the first audio signal and the second audio signal are fed, respectively, through the First Frequency Analysis Module (206) and Second Frequency Analysis Module (207) breaking down each respective audio signal into separate components, whereupon, for each frequency component, the apparatus (200) identifies a source signal and a background signal corresponding to a frequency component (250), and said signals are thereafter transmitted to the microprocessor (201), whereupon, for each frequency component, both the source signal and the background signal are fed, respectively, through the first Power Estimator (208) and the Second Power Estimator (209), which compute power values for the signals, whereby said power values are then fed into the dB Converter to generate power values for the source signal PdBFS(f) and the background signal Po dBFs(f) in dBFS (252), whereupon, for each frequency component, and at each instant, the microprocessor, using the power estimates of the source signal and background signal, obtains parameters for the parallel compression, depending on the sound intensity of the background signal at each instant, whereupon the microprocessor, applies the parameters to a parallel compression module, whereupon the parallel compression module applies a linear compression, according to the selected parameters, to each of the frequency components of the first audio signal, whereupon the parallel compression module sums each frequency component of the first audio signal with the corresponding compressed audio signal, whereupon the apparatus (200) reconstitutes the plurality of frequency components of the corrected first audio signal using the Frequency Synthesis Module (218), to produce a corrected first audio signal, whereupon the corrected first audio signal is fed through the Digital to Analog Converter (219), resulting in analog signal xout(t).

3. The apparatus of claim 1 or 2, where the First and Second Frequency Analysis Modules are composed of digital filter banks which are IIR filters that break the signal down into various sub-band channels x.prime.(t) and x.prime.sub.o(t), where the power of each channel is found by passing the channel through a Square Summer equation, whereby said signals are squared and added up N times, whereby the sum of the signals at the end block divided by N generates mean power values for the source signal and background signal, and where the Frequency Synthesis Module is a summer operation that combines the various channels into output xout(t).

4. The apparatus of claim 3, where the various sub-band channels correspond to critical bands of hearing.

5. The apparatus of claim 1 or 2, where the First and second Frequency Analysis Modules are digital filter banks composed of wavelet filters.

6. The apparatus of claim 1 or 2, where the First and Second Frequency Analysis Modules are composed of FFT coprocessors that perform Fourier transforms on the input signals producing X(t) and Xo(t), where the power of each component is found by squaring the Fourier component, and the Frequency Synthesis Module is an FFT coprocessor that performs an inverse Fourier transform, resulting in output signal xout(t).

7. The apparatus of claim 6, where the frequency components are grouped together to approximate sub-bands correspond to critical bands of hearing.

8. The apparatus of claim 1 or 2, where the psychoacoustic model (22) consists of a forward model which computes subjectively perceived Sones in terms of Phons, and an inverse model which computes Phons in terms of Sones, allowing the Psychoacoustic model to be combined into the Conductor Equation, the Conductor Equation (116) being, S(P)=S(P+A P)−S(Po)+S(0) or, A P=S1(S(P)+S(Po)−S(0))−P, where this equation may be stated as the desired gain in Phons being the Phons amplification necessary to amplify the sound over background noise so that it's subjectively perceived loudness over background noise is the same as the subjectively perceived loudness without the noise, where the function S(P) is found by solving the Earspring equation under experimental boundary conditions, where the Earspring equation (114),(115) is written [d2/dt2+2p(d/dt)+k(1+(y<y2>)]y(t)=U F(t), which is a harmonic oscillator model of the signal processing performed by the ear, the cochlea, and immediate processing by the auditory cortex, where t=time, y(t)=amplitude of vibration, F(t)=driving force in terms of Phons amplitude or sound intensity, <y2>=mean power of vibration for a given frequency channel, identified as the Sones power in the following equations, β=damping constant, k=spring constant, γ=coefficient of power dependence of spring constant, and η=the scale factor, where for a particular frequency of the driving force F(t), which represents a pure sinusoid of intensity P, a solution y(t) to this equation can be found, which can then be converted to <y2>, which represents the perceived loudness S in Sones, resulting in a function S(P), $$S(P) = \frac{(4\beta^2 + \rho_{40}^2)}{(4\beta^2 + (\rho_{40}S(P))^3)} 10^{(P-40)/10}$$

is the perceived loudness in Sones which the listener experiences for a particular sub-band, and P is the sound intensity impinging on the ear in dBPhons for a particular subband, where β.prime.=β/√k, and where $\rho_{40}$ represents the mean power of vibration at the resonant frequency of the earspring, where the constants β.prime. and $\rho_{40}$ are found by solving the Earspring equation according to experimental boundary conditions.

9. The apparatus of claim 8, where the set of boundary parameters used to obtain solutions to the Earspring Equation comprises: (i) a Sones ratio between the hearing threshold level and the reference level of ~40 dBSPL at 1 kHz, and (ii)

the detuning (flattening) of tones by about 75-80 cents as tones range in intensity from ~40 dBSPL to ~90 dBSPL near 1 kHz.

10. The apparatus of claim 9, where a computational model is used to estimate Earspring equation solutions S(P) and $S^{-1}$(S) consisting of quadratic functions such as $$S(P) = \frac{AP^2 + BP + C}{DP^2 + EP + 1},$$

where A, B, C, D, and E are parameters which fit the quadratic function against the solution to the Earspring equation and are stored in long term memory.

11. The apparatus of claim 9, where the psychoacoustic model is replaced by a computational model (124) which is used to approximate the output of the combined psychoacoustic model and conductor equation, where the computation model comprises a quadratic function $$AP \cong \frac{AP^2 + BP + C}{DP^2 + EP + 1},$$

where A, B, C, D, and E are parameters which fit the quadratic function against the solution to the Conductor equation (116), for various values of the threshold elevation Po and are stored in a lookup table (123).

12. The apparatus of claim 9, where the psychoacoustic model (122) is replaced by any numerical function approximator (124) that is fit against the Earspring (114), (115) and Conductor equations (116), and approximates their solutions, where these approximators may include, but are not limited to linear regression, neural networks, polynomial regression, logistic regression, kernel regression, factor analysis, spline fitting, piecewise curve fitting, radial basis functions, and any other suitable approximator now known or later discovered.

13. The apparatus of claim 2, where discrete sets of parameters are found by dividing the range of possible noise volumes into discrete levels, and where sets of parameters are found for each discrete noise loudness level, where the parameter estimation module (111) is a lookup table, where during real-time processing the ambient noise intensity is measured and used to select the corresponding set of parameters.

14. The apparatus of claim 2, where the parameter estimation module (111) is a polynomial continuous curve defining the relationship between the ambient noise loudness and each of the parameters, where polynomial regression is used to find parameters which define this curve, where these parameters are then stored in memory, so that during processing the parameters can then be computed using a polynomial equation.

15. The apparatus of claim 2, where one or more parameters (e.g. T) is defined as a function of the ambient noise intensity (e.g. T=PN−T', where PN is noise loudness), such that the parameters stored (e.g. T') are the parameters of the function defining the relationship between sound intensity (e.g. PN) and the parameter (e.g. T) of the parallel compression.

16. The apparatus of claim 2, where the gain equation is expressed as a function of the difference between signal intensity and noise intensity:
G=g0+(dP−T')/R−dP where dP is the difference between the signal loudness and noise loudness in decibels, and T' is the threshold offset from the ambient noise intensity to the threshold T.

17. The apparatus of claim 16, where a fixed set of parameters is used.

18. The apparatus of claim 17, where the fixed parameters fall in the range of 2 to 6 for compression ratio, 15 dB to 25 dB for makeup gain, and −15 to −25 dB for threshold offset.

19. The apparatus (100) of claim 1 or 2, wherein the apparatus is a mobile phone.

\* \* \* \* \*